United States Patent
Yoo et al.

(10) Patent No.: US 10,096,782 B2
(45) Date of Patent: *Oct. 9, 2018

(54) ORGANIC LIGHT EMITTING DISPLAY DEVICE

(71) Applicant: LG Display Co., Ltd., Seoul (KR)

(72) Inventors: Seonkeun Yoo, Gyeonggi-do (KR); Sunghoon Joo, Gyeonggi-do (KR); Jeongdae Seo, Incheon (KR); Hyoseok Kim, Daejeon (KR); Hyeseung Kang, Seoul (KR); Min Yun, Gyeonggi-do (KR); SeungHee Yoon, Seoul (KR)

(73) Assignee: LG Display Co., Ltd., Seoul (KR)

( * ) Notice: Subject to any disclaimer, the term of this patent is extended or adjusted under 35 U.S.C. 154(b) by 430 days.

This patent is subject to a terminal disclaimer.

(21) Appl. No.: 14/805,941

(22) Filed: Jul. 22, 2015

(65) Prior Publication Data

US 2016/0043327 A1  Feb. 11, 2016

(30) Foreign Application Priority Data

Aug. 1, 2014 (KR) .................. 10-2014-0099044
Oct. 17, 2014 (KR) .................. 10-2014-0141054
Apr. 22, 2015 (KR) .................. 10-2015-0056702

(51) Int. Cl.
*H01L 51/00* (2006.01)
*H01L 51/50* (2006.01)
*H01L 51/52* (2006.01)

(52) U.S. Cl.
CPC ...... *H01L 51/0072* (2013.01); *H01L 51/0052* (2013.01); *H01L 51/0054* (2013.01); *H01L 51/0058* (2013.01); *H01L 51/0067* (2013.01); *H01L 51/0068* (2013.01); *H01L 51/0073* (2013.01); *H01L 51/0074* (2013.01); *H01L 51/504* (2013.01); *H01L 51/5072* (2013.01); *H01L 51/5088* (2013.01); *H01L 51/5092* (2013.01); *H01L 51/5278* (2013.01)

(58) Field of Classification Search
CPC ............. H01L 51/0072; H01L 51/0052; H01L 51/0067; H01L 51/0068; H01L 51/0073; H01L 51/5072; H01L 51/5088; H01L 51/504; H01L 51/0058; H01L 51/0054; H01L 51/0074; H01L 51/5092; H01L 51/5278
USPC ................. 428/690, 411.1; 252/301.16, 582
See application file for complete search history.

(56) References Cited

U.S. PATENT DOCUMENTS

| | | | |
|---|---|---|---|
| 2013/0087773 A1 | 4/2013 | Suzuki et al. | |
| 2015/0097167 A1* | 4/2015 | Song | H01L 51/5044 257/40 |
| 2015/0144897 A1* | 5/2015 | Kang | H01L 51/5076 257/40 |
| 2015/0303380 A1* | 10/2015 | Kambe | C07D 487/14 257/40 |
| 2015/0311453 A1* | 10/2015 | Tsuji | C07D 413/14 257/40 |
| 2017/0054084 A1* | 2/2017 | Kim | H01L 51/0058 |
| 2017/0346023 A1* | 11/2017 | Jankus | H01L 51/5068 |
| 2017/0346037 A1* | 11/2017 | Huang | H01L 51/5278 |

FOREIGN PATENT DOCUMENTS

| | | | | |
|---|---|---|---|---|
| EP | 2 752 907 A1 | 7/2014 | | |
| EP | 2833700 A1 * | 2/2015 | ........... | C07D 487/14 |
| EP | 2 927 978 A1 | 10/2015 | | |
| WO | WO-2013145666 A1 * | 10/2013 | ........... | C07D 487/14 |
| WO | 2014/083786 A1 | 6/2014 | | |

OTHER PUBLICATIONS

CAS, reg. No. 1877378-14-7, Mar. 1, 2016. (Year: 2016).*
Extended European Search Report dated Jan. 12, 2016 by the European Patent Office in corresponding European Patent Application No. 15178787.6.

* cited by examiner

*Primary Examiner* — Douglas J McGinty
(74) *Attorney, Agent, or Firm* — Morgan, Lewis & Bockius LLP

(57) ABSTRACT

An organic light emitting display device is disclosed. The organic light emitting display device includes at least two light emitting parts each including a light emitting layer and an electron transport layers, and at least one charge generation layer between the light emitting parts, wherein at least one among the charge generation layer or the electron transport layer includes a compound having nitrogen atoms and a substituent for enhancing electron mobility.

11 Claims, 27 Drawing Sheets

ORGANIC LIGHT EMITTING DISPLAY DEVICE

This application claims the priority benefit of Korean Patent Application No. 10-2014-0099044 filed on Aug. 1, 2014, No. 10-2014-0141054 filed on Oct. 17, 2014, No. 10-2015-0056702 filed on Apr. 22, 2015, all of which are incorporated herein by reference for all purposes as if fully set forth herein.

BACKGROUND

Field of the Invention

The present invention relates to an organic light emitting display device, and more particularly, to an organic light emitting display device with reduced operating voltage, improved current efficiency, and improved lifetime characteristics.

Discussion of the Related Art

Image display devices used for displaying a variety of information on the screen are one of the core technologies of the information and communication era. Such image display devices have been developed to be thinner, lighter, and more portable, and furthermore to have high performance. With the development of the information society, various demands for display devices are increasing. To meet these demands, research on flat panel displays such as liquid crystal displays (LCD), plasma display panels (PDP), electroluminescent displays (ELD), field emission displays (FED), organic light emitting diodes (OLED), etc is actively under way.

Among the panel displays, the OLED devices are a type of devices that emit light as electrons and holes are paired and extinguished, when a charge is injected into an organic light emitting layer between an anode and a cathode. The OLED devices are advantageous in that they may be formed on a flexible transparent substrate such as plastic, and are operable at relatively low voltage as compared to plasma display panels or inorganic EL displays, less power consumption, and represent excellent color sensitivity. Especially, white OLED devices are used for various purposes in lighting, thin light sources, backlights for liquid crystal displays, or full-color displays employing color filters.

In the development of white OLED devices, high efficiency, long lifetime, color purity, color stability against current and voltage variations, ease of manufacture, etc are important, so research and development are being done depending on which of these features should be taken into account. White OLED device structures may be roughly classified into a single-layer emitting structure and a multi-layer emitting structure. Of these structures, the multilayer emitting structure having a blue fluorescent emitting layer and a yellow phosphorescent emitting layer stacked in tandem is mainly employed to realize white OLED devices with long lifetime.

Specifically, a phosphorescent emitting structure is used, which is a lamination of a first light emitting part using a blue fluorescent diode as a light emitting layer and a second light emitting part using a yellow-green phosphorescent diode as a light emitting layer. Such a white OLED device produces white light by mixing blue light emitted from the blue fluorescent diode and yellow light emitted from the yellow-green phosphorescent diode. In this case, a charge generation layer is formed between the first light emitting part and the second light emitting part to double the current efficiency generated in the light emitting layers and facilitate charge distribution. The charge generation layer is a layer that generates a charge, i.e., electrons and holes, in it, which can prevent a rise in operating voltage because it doubles the current efficiency generated in the light emitting layers and facilitates charge distribution.

However, the overall operating voltage of a device having the aforementioned multilayer emitting structure may be higher than the sum of the operating voltages of individual light emitting parts, or the multilayer emitting device may suffer a decrease in efficiency compared to a single-layer emitting structure. The charge generation layer includes an N-type charge generation layer and a P-type charge generation layer. Especially, if the N-type charge generation layer is doped with an alkali metal or alkali earth metal, the alkali metal or alkali earth metal may be diffused into the P-type charge generation layer, causing a decrease in device lifetime. Also, the difference in LUMO (lowest unoccupied molecular orbital) energy level between the P-type charge generation layer and the N-type charge generation layer deteriorates the feature of injecting electrons generated at the interface between the P-type charge generation layer and the hole transport layer into the N-type charge generation layer. Moreover, the difference in LUMO energy level between the electron transport layer and the N-type charge generation layer causes a rise in operating voltage when the electrons injected into the N-type charge generation layer move to the electron transport layer.

SUMMARY

Accordingly, the present invention is directed to an organic light emitting display device that substantially obviates one or more of the problems due to limitations and disadvantages of the related art.

An object of the present invention is to provide an on organic light emitting display device which is capable of reducing operating voltage and improving efficiency and lifetime characteristics.

Additional features and advantages of the invention will be set forth in the description which follows, and in part will be apparent from the description, or may be learned by practice of the invention. The objectives and other advantages of the invention will be realized and attained by the structures particularly pointed out in the written description and claims whereof as well as the appended drawings.

To achieve these and other advantages and in accordance with the purpose of the present invention, as embodied and broadly described, an organic light emitting display device comprises at least two light emitting parts each having a light emitting layer and an electron transport layers, and at least one charge generation layer between the light emitting parts, wherein at least one among the charge generation layer or the electron transport layer includes a compound having nitrogen atoms and a substituent for enhancing electron mobility.

In another aspect, an organic light emitting display device comprises at least two light emitting parts each having a light emitting layer and an electron transport layer, and at least one charge generation layer between the light emitting parts, wherein at least one among the charge generation layer or the electron transport layer includes a compound including a core having nitrogen-atom and a substituent for adjusting carrier mobility or a substituent having hole characteristics or electron characteristics.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Figure 1:
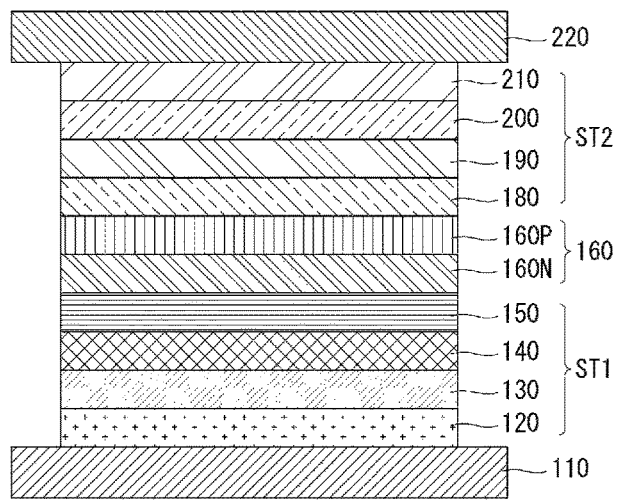
FIG. 1 is a cross-sectional view showing an organic light emitting display device according to first and second example embodiments of the present invention.

The various aspects and features of the present invention and methods of accomplishing the same may be understood more readily by reference to the following detailed descriptions of exemplary embodiments and the accompanying drawings. The present invention may, however, be embodied in many different forms and should not be construed as being limited to the example embodiments set forth herein. Rather, these example embodiments are provided so that this disclosure will be thorough and complete and will fully convey the concept of the present invention to those skilled in the art, and the present invention is defined by the appended claims The shapes, sizes, percentages, angles, numbers, etc shown in the figures to describe the example embodiments of the present invention are merely examples and not limited to those shown in the figures. Like reference numerals denote like elements throughout the specification. In describing the present invention, detailed descriptions of related well-known technologies will be omitted to avoid unnecessary obscuring the present invention.

When the terms 'comprise', 'have', 'consist of' and the like are used, other parts may be added as long as the term 'only' is not used. The singular forms may be interpreted as the plural forms unless explicitly stated.

The elements may be interpreted to include an error margin even if not explicitly stated. When the position relation between two parts is described using the terms 'on', 'over', 'under', 'next to' and the like, one or more parts may be positioned between the two parts as long as the term 'immediately' or 'directly' is not used.

When the temporal relationship between two events is described using the terms 'after', 'following', 'next', 'before' and the like, the two events may not occur in succession as long as the term 'immediately' or 'directly' is not used.

It will be understood that, although the terms first, second, etc., may be used to describe various elements, these elements should not be limited by these terms. These terms are only used to distinguish one element from another element. Thus, a first element discussed below could be termed a second element without departing from the technical spirit of the present invention.

The features of various example embodiments of the present invention may be combined with one another one of partly or wholly, and may technically interact or work together in various ways. The example embodiments may be carried out independently or in combination with one another.

Hereinafter, various exemplary embodiments of the present invention will be described in detail with reference to the accompanying drawings.

FIG. 1 is a cross-sectional view showing an organic light emitting display device according to first and second example embodiments of the present invention.

With reference to FIG. 1, an organic light emitting display device 100 according to the first example embodiment of the present invention comprises light emitting parts ST1 and ST2 between an anode 110 and a cathode 220, and a charge generation layer 160 between the light emitting parts ST1 and ST2.

The anode 110 is a hole injection electrode, and may be formed of one among ITO (indium tin oxide), IZO (indium zinc oxide), or ZnO (zinc oxide) having a high work function. Also, if the anode 110 is a reflective electrode, the anode 110 may further comprise a reflective layer formed of one among aluminum (Al), silver (Ag), or nickel (Ni) under a layer formed of one among ITO, IZO, or ZnO.

The first light emitting part ST1 is a single light emitting diode unit, and comprises a first light emitting layer 140. The first light emitting layer 140 may emit light at least one among red, green, or blue: for example, it may be a blue light emitting layer in this example embodiment. The blue light emitting layer comprises at least one among a blue light emitting layer, a dark blue light emitting layer, or a sky blue light emitting layer. Alternatively, the first light emitting layer 140 may be composed of a blue light emitting layer and a red light emitting layer, or may be composed of a blue light emitting layer and a yellow-green light emitting layer, or may be composed of a blue light emitting layer and a green light emitting layer.

The first light emitting part ST1 comprises a hole injection layer 120 and a first hole transport layer 130 between the anode 110 and the first light emitting layer 140, and a first electron transport layer 150 over the first light emitting layer 140.

The hole injection layer 120 may function to facilitate injection of holes from the anode 110 to the first light emitting layer 140, and may be formed of, but are not limited to, one among CuPc (copper phthalocyanine), PEDOT (poly(3,4)-ethylenedioxythiophene), and PANI (polyaniline). The hole injection layer 120 may be 1 to 150 nm thickness. If the hole injection layer 120 is 1 nm thickness or greater, the hole injection characteristics may be improved, or if the hole injection layer 120 is 150 nm thickness or less, an increase in the thickness of the hole injection layer 120 may be prevented and a rise in operating voltage may be therefore prevented. The hole injection layer 120 may not be included in the composition of the organic light emitting display device, depending on the structure or characteristics of the organic light emitting display device.

The first hole transport layer 130 may function to facilitate transport of holes, and may be formed of, but are not limited to, one among NPD(N,N'-bis(naphthalene-1-yl)-N,N'-bis(phenyl)-2,2'-dimethylbenzidine), TPD(N,N'-bis-(3-methylphenyl)-N,N'-bis(phenyl)-benzidine), spiro-TAD(2,2'7,7'-tetrakis(N,N-diphenylamino)-9,9'-spirofluorene), and MTDATA(4,4',4"-Tris(N-3-methylphenyl-N-phenylamino)-triphenylamine). The first hole transport layer 130 may be 1 to 150 nm thickness. If the first hole transport layer 130 is 1 nm thickness or greater, the hole transport characteristics may be improved, or if the first hole transport layer 130 is 150 nm thickness or less, an increase in the thickness of the first hole transport layer 130 may be prevented and a rise in operating voltage may be therefore prevented.

The first light emitting layer 140 may emit light of red (R), green (G), blue (B), or yellow (Y), and may be formed of a phosphorescent or fluorescent material.

If the first light emitting layer 140 is a red light emitting layer, it may be formed of, but are not limited to, a phosphorescent material having a host material such as CBP(4,4'-bis(carbazole-9-yl)biphenyl) and a dopant having one among PIQIr (acac)(bis(1-phenylisoquinoline)acetylacetonate iridium), PQIr(acac)(bis(1-phenylquinoline)acetylacetonate iridium), PQIr(tris(1-phenylquinoline)iridium), and PtOEP(octaethylporphyrin platinum). Alternatively, the first light emitting layer 140 may be formed of, but are not limited to, a fluorescent material having $PBD:Eu(DBM)_3$ (Phen) or perylene. Also, if the first light emitting layer 140 is a red light emitting layer, the light emission area may be in the range of 600 to 650 nm.

If the first light emitting layer 140 is a green light emitting layer, it may be formed of, but are not limited to, a phosphorescent material having a host material such as CBP(4,4'-bis(carbazole-9-yl)biphenyl) and a dopant material having an iridium-based material. Alternatively, the first light emitting layer 140 may be formed of, but are not limited to, a fluorescent material having $Alq_3$(tris(8-hydroxyquinolinato)aluminum). Also, if the first light emitting layer 140 is a green light emitting layer, the light emission area may be in the range of 510 to 570 nm.

If the first light emitting layer 140 is a blue light emitting layer, it may be formed of, but are not limited to, a phosphorescent material having a host material such as CBP(4,4'-bis(carbazole-9-yl)biphenyl) and a dopant material having an iridium-based material. Alternatively, the first light emitting layer 140 may be formed of, but are not limited to, a fluorescent material having any one among spiro-DPVBi, spiro-CBP, distyrylbenzene (DSB), distyrylarylene (DSA), a PFO polymer, and a PPV polymer. Also, the first light emitting layer 140 may comprise a sky blue light emitting layer or a deep blue light emitting layer, as well as the blue light emitting layer. Accordingly, the light emission area of the first light emitting layer 140 may be in the range of 440 to 480 nm. Alternatively, the first light emitting part ST1 may be composed of two light emitting layers: a blue light emitting layer and a red light emitting layer, in order to improve the red light emission efficiency of the organic light emitting display device. If the first light emitting part ST1 is composed of a blue light emitting layer and a red light emitting layer, the light emission area may be in the range of 440 to 650 nm.

If the first light emitting layer 140 is a yellow light emitting layer, it may have a single layer structure of a yellow-green light emitting layer or a green light emitting layer, or a multilayer structure composed of a yellow-green light emitting layer and a green light emitting layer. As used herein, the yellow light emitting layer comprises a yellow-green light emitting layer, a green light emitting layer, or a multilayer structure composed of a yellow-green light emitting layer and a green light emitting layer. This example embodiment will be described by taking as an example a single layer structure of a yellow light emitting layer that emits yellow-green light. The yellow light emitting layer may include at least one host of CBP 4,4'-bis(carbazol-9-yl)biphenyl) and BAlq(Bis(2-methyl-8-quinolinolate)-4-(phenylphenolato)aluminum) and a phosphorescent yellow-green dopant that emits yellow-green light. The light emission area of the yellow-green light emitting layer may be in the range of 510 to 590 nm. The first light emitting part ST1 may be composed of two light emitting layers: a yellow-green light emitting layer and a red light emitting layer, in order to improve the red light emission efficiency of the organic light emitting display device. If the first light emitting part ST1 is composed of a yellow-green light emitting layer and a red light emitting layer, the light emission area may be in the range of 510 to 650 nm.

The first electron transport layer 150 functions to facilitate transport of electrons, and may be formed of, but are not limited to, $Alq_3$(tris(8-hydroxy-quinolinato)aluminum), PBD(2-(4-biphenyl)-5-(4-tert-butylphenyl)-1,3,4-oxadiazole), TAZ(3-(4-biphenyl)-4-pheynyl-5-tert-butylphenyl-1,2,4-triazole), or BAlq(Bis(2-methyl-8-quinolinolate)-4-(phenylphenolato)aluminum). The first electron transport layer 150 may be 1 to 150 nm thickness. If the first electron transport layer 150 is 1 nm thickness or greater, the electron transport characteristics may be improved, or if the first electron transport layer 150 is 150 nm thickness or less, an increase in the thickness of the first electron transport layer 150 may be prevented and a rise in operating voltage may be therefore prevented.

The first light emitting part ST1 comprises a hole injection layer 120 and a first hole transport layer 130 between the anode 110 and the first light emitting layer 140, and a first electron transport layer 150 over the first light emitting layer 140. Accordingly, the first light emitting part ST1 having the hole injection layer 120, the first hole transport layer 130, the first light emitting layer 140, and the first electron transport layer 150 is over the anode 110. The hole injection layer 120 may not be included in the composition of the first light emitting part ST1, depending on the structure or characteristics of the device.

The charge generation layer (CGL) 160 is between the first light emitting part ST1 and the second light emitting part ST2. The first light emitting part ST1 and the second light emitting part ST2 are connected by the charge generation layer 160. The charge generation layer 160 may be a PN-junction charge generation layer formed by joining an N-type charge generation layer 160N and a P-type charge generation layer 160P. The PN junction charge generation layer 160 generates a charge, or injects the charge, i.e., electrons and holes, separately into the light emitting layers. That is, the N-type charge generation layer 160N transfers electrons to the first electron transport layer 150, and the first electron transport layer 150 supplies the electrons to the first light emitting layer 140 adjacent to the anode. The P-type charge generation layer 160P transfers holes to a second hole transport layer 180, and the second hole transport layer 180 supplies the holes to a second light emitting layer 190 of the second light emitting part ST2. As such, the organic light emitting display device with a plurality of emitting layers may achieve much higher emission efficiency and reduce operating voltage. Accordingly, the charge generation layer 160 has a major effect on the organic light emitting display device's characteristics, i.e., emission efficiency and operating voltage.

Thus, the present inventors conducted several tests or experiments to improve the electron injection characteristics of the N-type charge generation layer. By these tests or experiments, they noticed that, due to the difference in LUMO energy level between the electron transport layer and the N-type charge generation layer, the operating voltage rose when the electrons injected into the N-type charge generation layer moved to the electron transport layer. After performing several tests or experiments to choose materials for the electron transport layer and N-type charge generation layer which can reduce operating voltage and improve efficiency, compounds of the present invention were chosen for the N-type charge generation layer. A compound having a nitrogen-atom according to the present invention makes it easy to transport electrons because it has high electron mobility by having two nitrogen (N) atoms having electron-rich. Moreover, a compound of the present invention includes nitrogen (N) of $sp^2$ hybrid orbital which is relatively electron-rich, and the nitrogen is bound to an alkali metal or alkali earth metal, a dopant for the N-type charge generation layer, thereby forming a gap state. This gap state may facilitate transfer of electrons from the N-type charge generation layer to the electron transport layer. Also, since nitrogen is bound to the alkali metal or alkali earth metal in the N-type charge generation layer, the alkali metal or alkali earth metal is not diffused into the P-type charge generation layer, thus increasing lifetime.

Compounds for the N-type charge generation layer 160N according to an example embodiment of the present invention are represented by the following Chemical Formula 1:

[Chemical Formula 1]

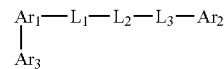

where $Ar_1$ is phenanthrolinyl or phenanthrolinylene, and $Ar_2$ and $Ar_3$ are independently one among hydrogen, a substituted or unsubstituted aryl group having 6 to 60 carbon atoms, a substituted or unsubstituted hetero aryl group having 3 to 60 carbon atoms, and an alkyl group having 1 to 20 carbon atoms. $L_1$ and $L_3$ are independently one among a single bond, a substituted or unsubstituted aryl group having 6 to 60 carbon atoms, a substituted or unsubstituted hetero aryl group having 3 to 60 carbon atoms, and an alkyl group having 1 to 20 carbon atoms, and $L_2$ is one among a single bond, a substituted or unsubstituted anthracenylene, and a substituted or unsubstituted pyrenylene.

More specifically, $Ar_2$ and $Ar_3$ are independently one among nitrogen, a substituted or unsubstituted phenyl, alkylphenyl, biphenyl, alkylbiphenyl, halophenyl, alkoxyphenyl, haloalkoxyphenyl, cyanophenyl, silylphenyl, naphthyl, alkylnaphthyl, halonaphthyl, cyanonaphthyl, silylnaphthyl, pyridyl, alkylpyridyl, halopyridhyl, cyanopyridyl, alkoxypyridyl, silylpyridyl, pyrimidyl, halopyrimidyl, cyanopyrimidyl, alkoxylpyrimidyl, quinolinyl, isoquinolinyl, quinoxalinyl, pyrazinyl, quinazolinyl, naphthyridinyl, benzothiophenyl, benzofuranyl, dibenzothiophenyl, arylthiazolyl, dibenzofuranyl, fluorenyl, carbazoyl, imidazolyl, carbolinyl, phenanthrenyl, terphenyl, terpyridinyl, triphenylenyl, fluoranthenyl, and diazafluorenyl.

$L_1$ and $L_3$ are independently one among a single bond, a substituted or unsubstituted phenylene, alkylphenylene, halophenylene, cyanophenylene, naphtylene, alkylnaphthylene, biphenylene, alkylbiphenylene, pyridylene, pyrimidylene, quinolinylene, isoquinolinylene, quinoxalinylene, pyrazinylene, quinazolinylene, naphthyridinylene, thiophenylene, furanylene, benzothiophenylene, benzofuranylene, dibenzothiophenylene, dibenzofuranylene, fluorenylene, carbazoylene, imidazolylene, triphenylenylene, fluoranthenylene, and diazafluorenyl.

The compounds represented by the above Chemical Formula 1 can be illustrated below.

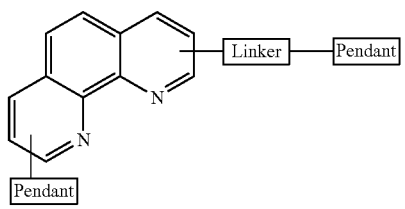 [SMILES: c1cnc2c(c1)ccc1cccnc12]

Phenanthroline, $Ar_1$ of Chemical Formula 1, is the core and exhibits the characteristics of the N-type charge generation layer by being bound to an alkali metal doped on the N-type charge generation layer. More specifically, the phenanthroline core includes nitrogen (N) of $sp^2$ hybrid orbital which is relatively electron-rich, and this nitrogen is bound to an alkali metal or alkali earth metal, a dopant for the N-type charge generation layer, thereby forming a gap state. This gap state may facilitate transfer of electrons from the N-type charge generation layer to the electron transport layer. Also, since nitrogen is bound to the alkali metal or alkali earth metal in the N-type charge generation layer, the alkali metal or alkali earth metal is not diffused into the P-type charge generation layer, thus increasing lifetime.

The linkers, $L_1$ and $L_2$ of Chemical Formula 1, adjust carrier mobility. $L_1$ serves as a path that allows abundant electrons in $L_2$ to reach $Ar_1$ by controlling conjugation, and controls HOMO (highest occupied molecular orbitals) and LUMO (lowest unoccupied molecular orbitals). $L_2$ serves to improve pi($\pi$)-electron density by using aromatic macrocycles and form a main framework of HOMO and LUMO. Accordingly, the carrier mobility of the N-type charge generation layer can be enhanced, thereby facilitating transfer of electrons from the N-type charge generation layer to the electron transport layer.

The pendants, $L_3$-$Ar_2$ and $Ar_3$ of Chemical Formula 1, serve to add up charge characteristics, and control HOMO and LUMO. For example, compounds represented by the following Chemical Formula 2 have hole characteristics, and compounds represented by the following Chemical Formula 3 have electron characteristics. The pendants with electron characteristics can facilitate transfer of electrons from the N-type charge generation layer to the electron transport layer by improving the electron characteristics of the N-type charge generation layer.

[Chemical Formula 2]

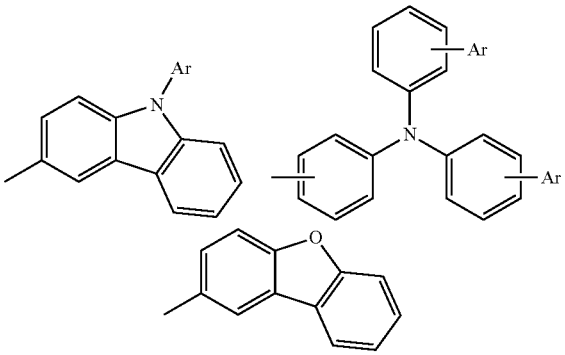

where Ar is aryl.

[Chemical Formula 3]

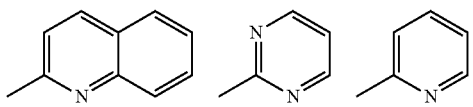

The aforementioned linkers and pendants act as a substituent on the core, and serve to enhance the electron mobility of the compound. Accordingly, the electron mobility of the N-type charge generation layer having the compound can be improved, thereby facilitating transfer of electrons from the N-type charge generation layer to the electron transport layer.

The N-type charge generation layer 160N according to the first example embodiment of the present invention may be formed of compounds represented by the following Chemical Formulas 4 and 5, among the compounds represented by the above Chemical Formula 1:

[Chemical Formula 4]

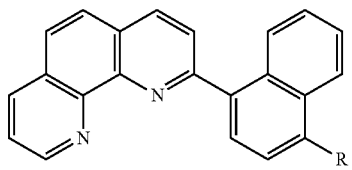

[Chemical Formula 5]

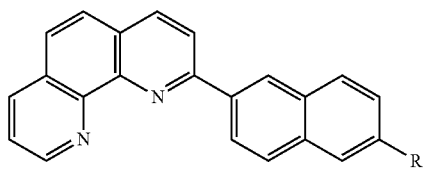

where R is one among hydrogen, a substituted or unsubstituted aryl group having 6 to 60 carbon atoms, a substituted or unsubstituted hetero aryl group having 3 to 60 carbon atoms, or an alkyl group having 1 to 20 carbon atoms.
The compounds represented by Chemical Formulas 4 and 5 may be one among the following compounds:
NC01
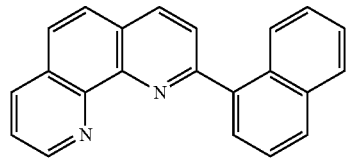
NC02
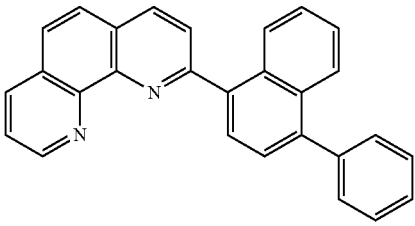
NC03
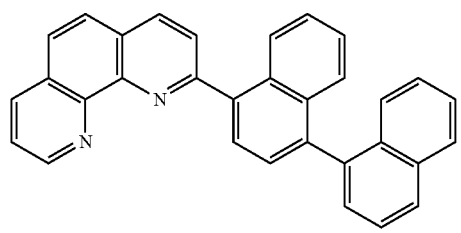
NC04
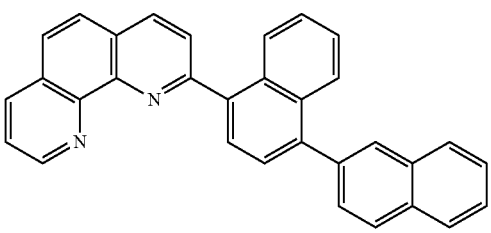
NC05
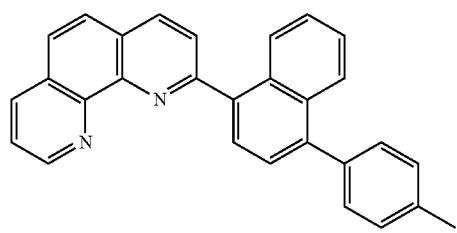
NC06
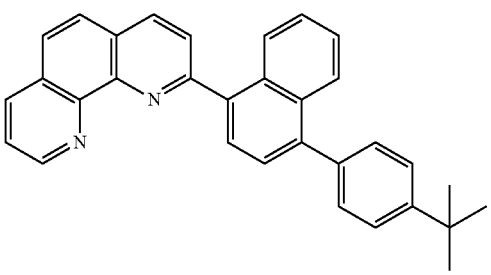
NC07
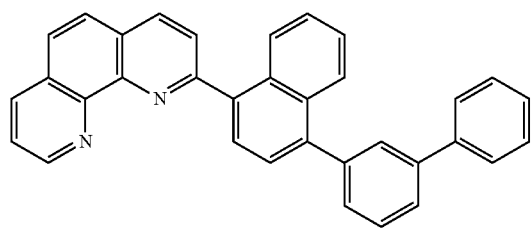
NC08
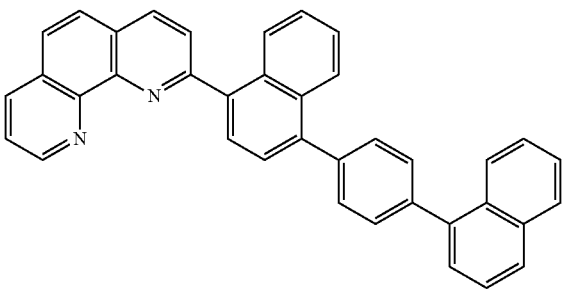
NC09
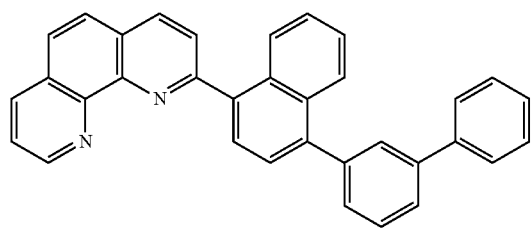
NC10
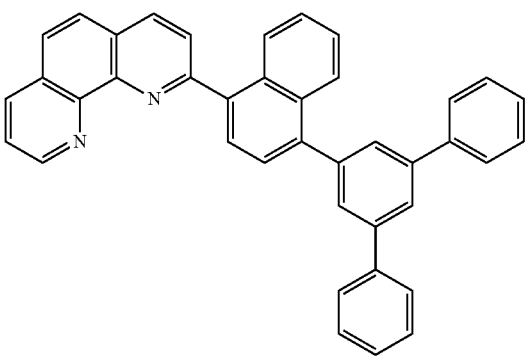

-continued
NC11
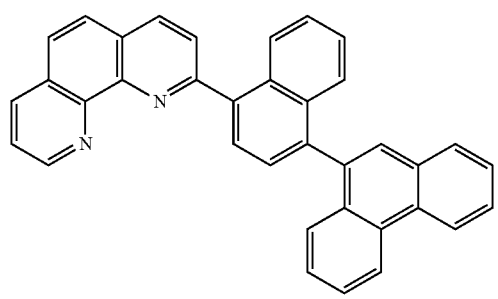
NC12
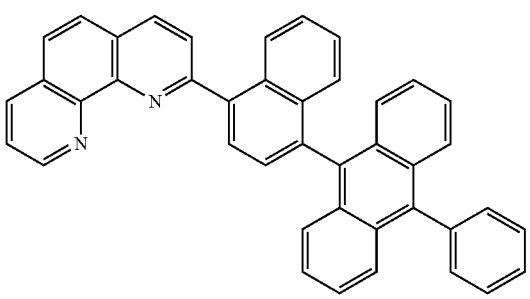
NC13
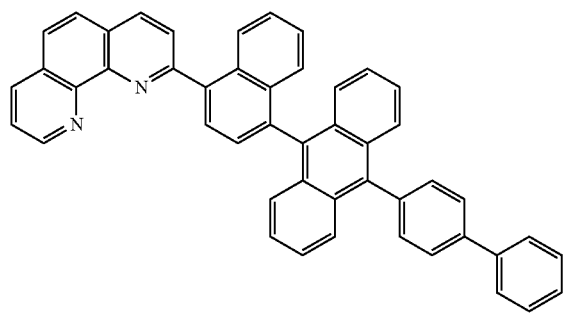
NC14
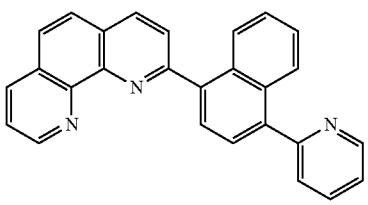
NC15
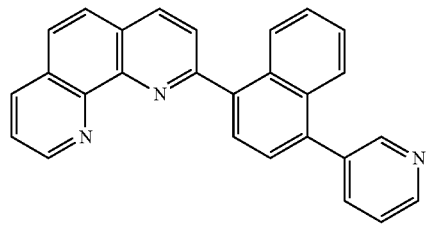
NC16
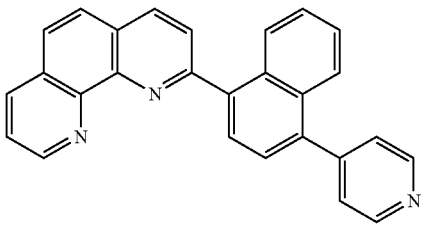
NC17
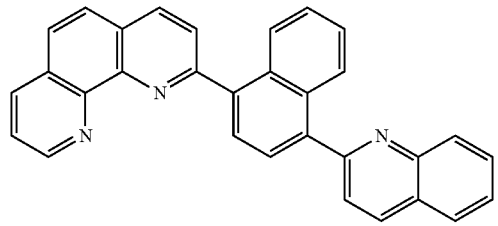
NC18
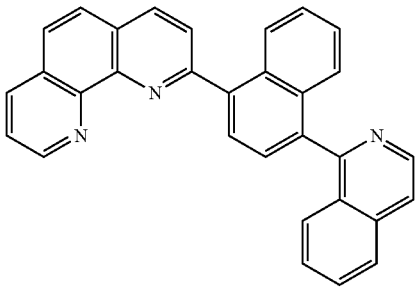
NC19
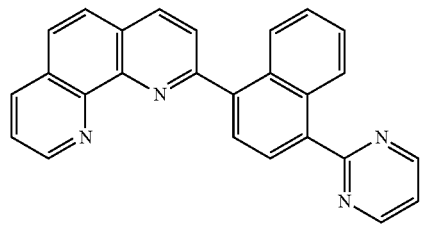
NC20
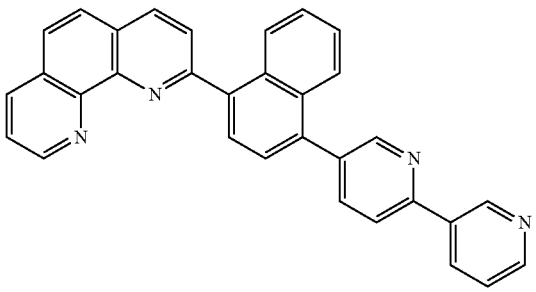

-continued
NC21
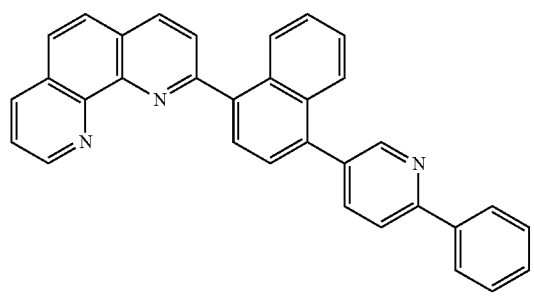
NC22
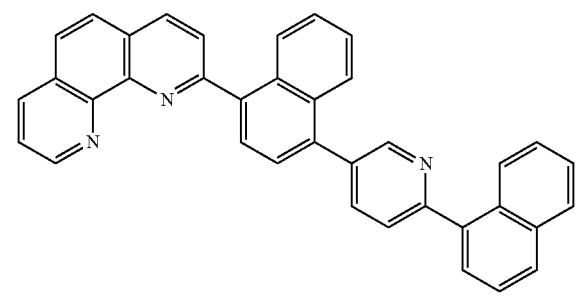
NC23
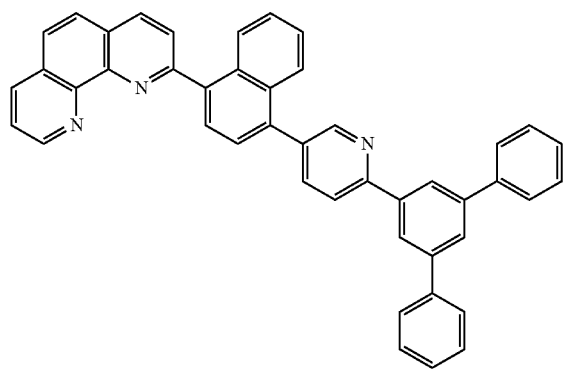
NC24
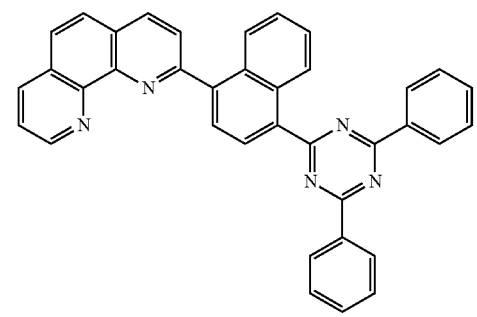
NC25
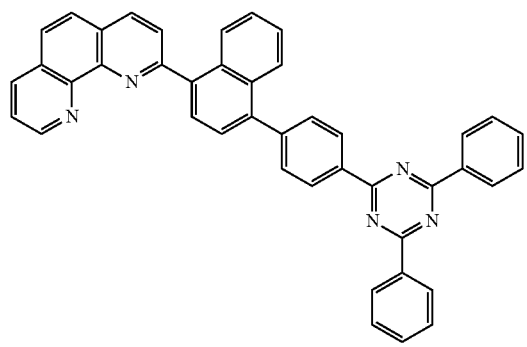
NC26
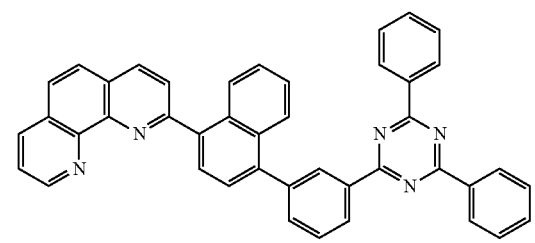
NC27
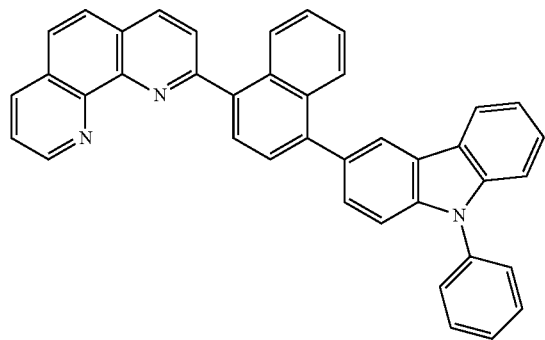
NC28
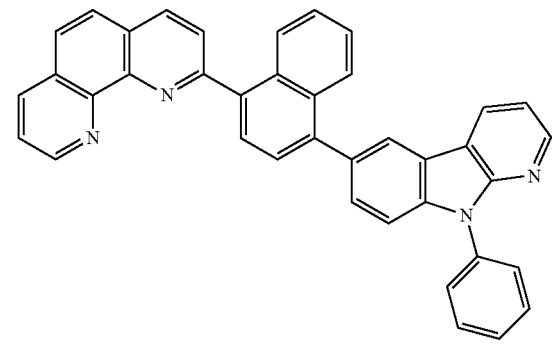

-continued
NC29
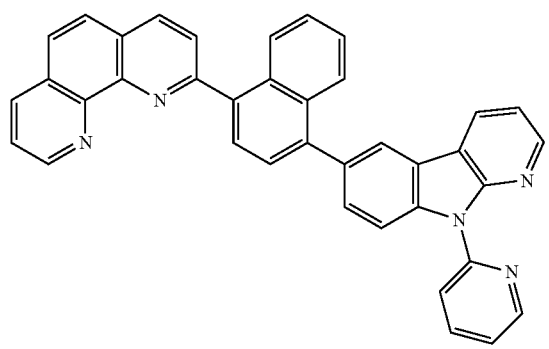
NC30
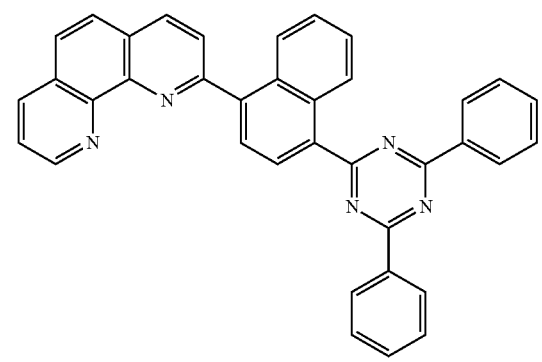
NC31
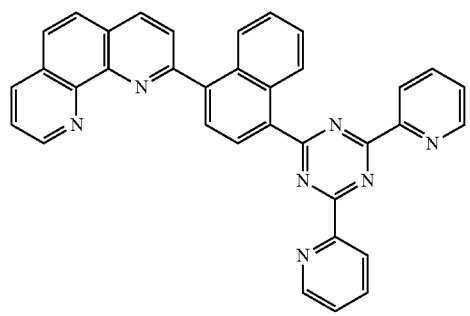
NC32
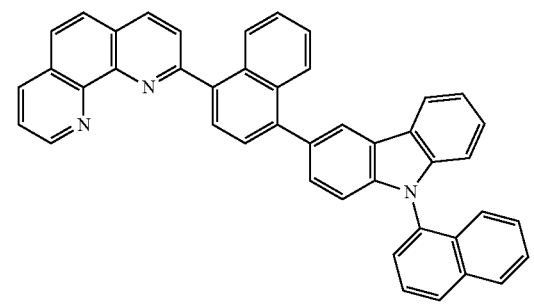
NC33
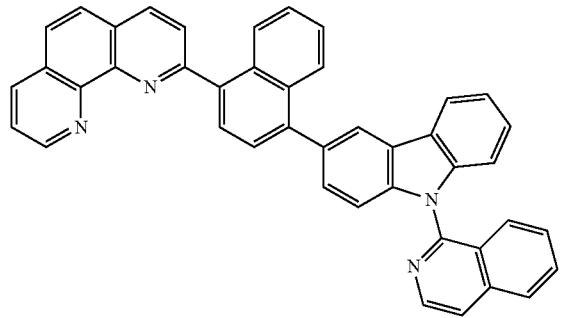
NC34
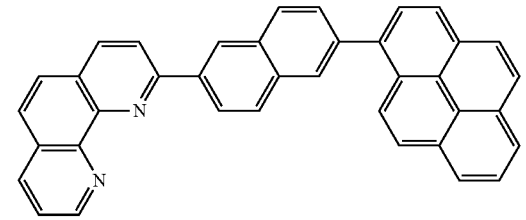
NC35
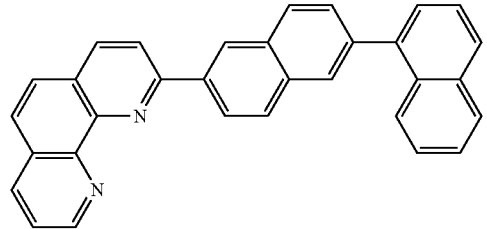
NC36
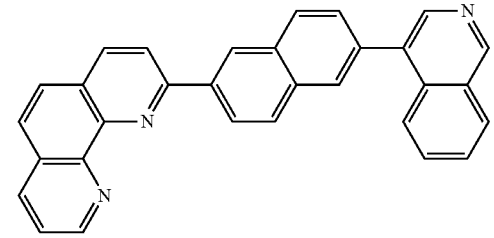
NC37
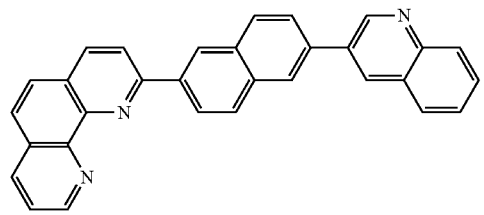
NC38
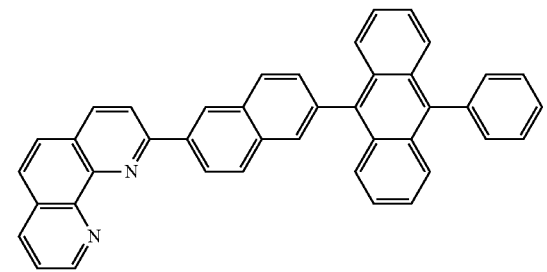

-continued
NC39
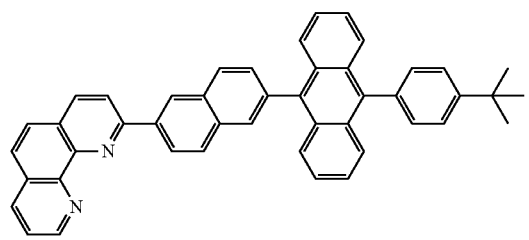
NC40
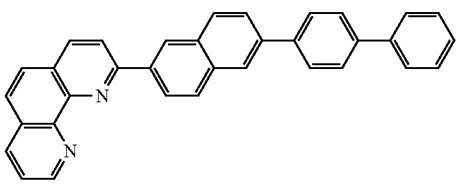
NC41
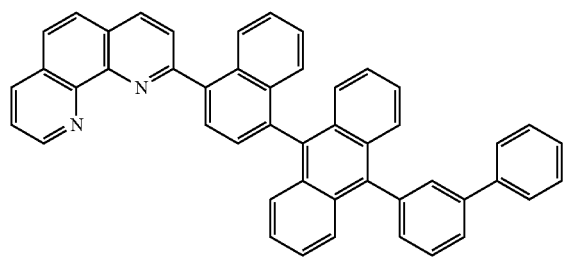
NC42
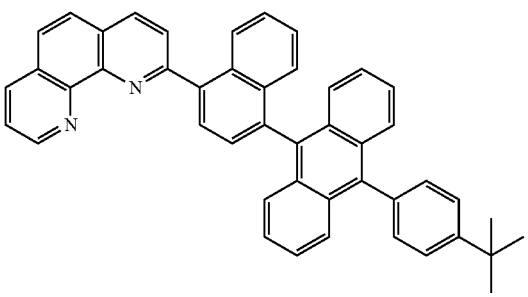
NC43
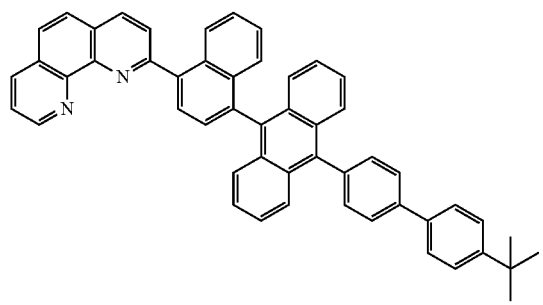
NC44
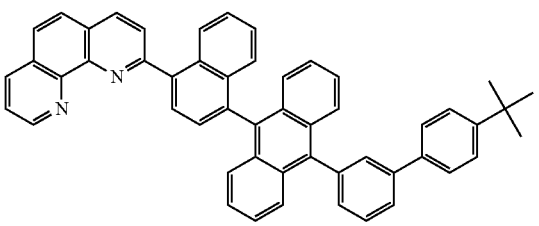
NC45
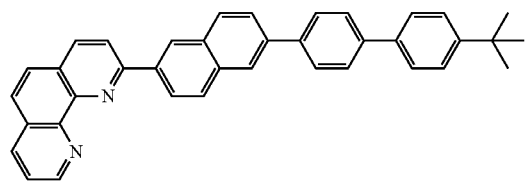
NC46
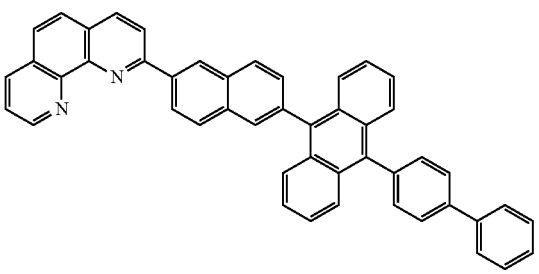
NC47
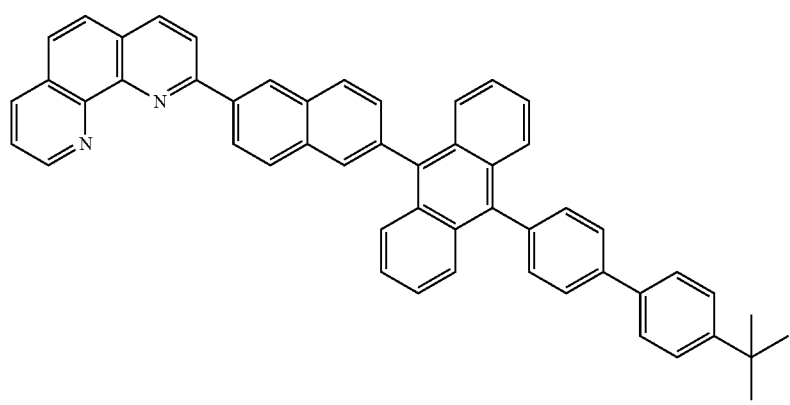

NC48

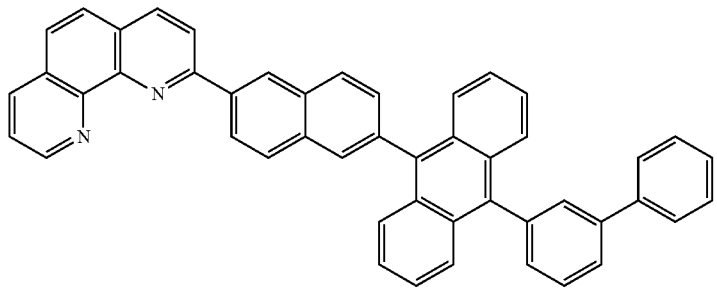

In a compound represented by the above Chemical Formula 4 or 5 according to the present invention, naphthalene is at the 2 position of phenanthroline, and the 1 or 2 position is substituted by naphthalene. As naphthalene is attached to the 2 position of phenanthroline, the difference in energy level between the N-type charge generation layer and the electron transport layer can be reduced, thereby maximizing the tunneling effect of electrons. Accordingly, the present invention can improve electron injection through tunneling effect by using this compound for the N-type charge generation layer.

The P-type charge generation layer 160P may be formed of a metal or a P-doped organic material. The metal may be one or more alloys among Al, Cu, Fe, Pb, Zn, Au, Pt, W, In, Mo, Ni, and Ti. A P-type dopant and host for the P-doped organic material may be commonly-used materials. For example, the P-type dopant may be a material among $F_4$-TCNQ(2,3,5,6-tetrafluoro-7,7,8,8,-tetracyanoquinodemethane), a derivative of tetracyanoquinodemethane, iodine, $FeCl_3$, $FeF_3$, and $SbCl_5$. The host may be a material among NPB(N,N'-bis(naphthalene-1-yl)-N,N'-bis(phenyl)-benzidine), TPD (N,N'-bis-(3-methylphenyl)-N,N'-bis(phenyl)-benzidine), and TNB(N,N,N'N'-tetranaphthalenyl-benzidine).

The second light emitting part ST2 having the second hole transport layer 180, the second light emitting layer 190, a second electron transport layer 200, and an electron injection layer 210 is over the first light emitting part ST1. The second hole transport layer 180 and the second electron transport layer 200 may have the same composition as the first hole transport layer 130 and first electron transport layer 150 of the above-described first light emitting part ST1, respectively, or have a different composition from those of the first hole transport layer 130 and first electron transport layer 150. The electron injection layer 210 may be omitted depending on the structure or characteristic of the device.

The second light emitting layer 190 may emit light of one among red, green, or blue, and it may be a yellow-green light emitting layer in this example embodiment. The yellow-green light emitting layer may have a single-layer structure of a yellow-green light emitting layer or a green light emitting layer, or a multilayer structure composed of a yellow-green light emitting layer and a green light emitting layer. As used herein, the second light emitting layer 190 may comprise a yellow-green light emitting layer, a green light emitting layer, a multilayer structure composed of a yellow-green light emitting layer and a green light emitting layer, a multilayer structure composed of a yellow-green light emitting layer and a red light emitting layer, or a multilayer structure composed of a green light emitting layer and a red light emitting layer. This example embodiment will be described by taking as an example a single layer structure of a second light emitting layer that emits yellow-green light. The second light emitting layer 190 may contain, but are not limited to, at least one host of CBP 4,4'-bis(carbazol-9-yl)biphenyl) and BAlq(Bis(2-methyl-8-quinolinolate)-4-(phenylphenolato)aluminum) and a phosphorescent yellow-green dopant that emits yellow-green light.

The electron injection layer 210 functions to facilitate injection of electrons, and may be formed of, but are not limited to, one or more among $Alq_3$ (tris(8-hydroxyquinolinato)aluminum), PBD(2-4-biphenyl)-5-(4-tert-butylphenyl)-1,3,4-oxadiazole), TAZ(3-(4-biphenyl)-4-pheynyl-5-tert-butylphenyl-1,2,4-triazole), and BAlq(Bis(2-methyl-8-quinolinolate)-4-(phenylphenolato)aluminum). On the other hand, the electron injection layer 210 may be formed of a metal compound, and the metal compound may be, for example, but are not limited to, one or more among LiQ, LiF, NaF, KF, RbF, CsF, FrF, $BeF_2$, $MgF_2$, $CaF_2$, $SrF_2$, $BaF_2$, and $RaF_2$. The electron injection layer 210 may be 1 to 50 nm thickness. If the electron injection layer 210 is 1 nm thickness or greater, the electron injection characteristics may be improved, or if the electron injection layer 210 is 50 nm thickness or less, an increase in the thickness of the electron injection layer 210 may be prevented and a rise in operating voltage may be therefore prevented.

The second light emitting part ST2 comprises the second hole transport layer 180, the second light emitting layer 190, and the second electron transport layer 200 and electron injection layer 210 over the second light emitting layer 190. Accordingly, the second light emitting part ST2 having the second hole transport layer 180, the second light emitting layer 190, the second electron transport layer 200, and the electron injection layer 210 is over the first light emitting part ST1.

The cathode 220 is over the second light emitting part ST2, constituting the organic light emitting display device according to the first example embodiment of the present invention. The cathode 220 is an electron injection electrode, and may be formed of magnesium (Mg), calcium (Ca), aluminum (Al), silver (Ag), or an alloy thereof, having a low work function. If the organic light emitting display device is a top-emission type or a dual-emission type, the cathode 220 may be formed thin enough to pass light therethrough. If the organic light emitting display device is a bottom-emission type, the cathode 220 may be formed thick enough to reflect light.

As discussed above, a compound of the present invention has a structure in which linkers and pendants are combined with a phenanthroline core. Accordingly, the nitrogen in the core of the compound is bound to a dopant to form a gap state, the linkers induce enhancement of electron mobility, and the pendants give electron characteristics. Hence, transfer of electrons from the N-type charge generation layer to the electron transport layer can be facilitated by improving the electron characteristics of the N-type charge generation layer.

In a compound of the present invention, naphthalene is at the 2 position of phenanthroline, and the 1 or 2 position is substituted by naphthalene. As naphthalene is attached to the 2 position of phenanthroline, the difference in energy level between the N-type charge generation layer and the electron transport layer can be reduced, thereby maximizing the tunneling effect of electrons. Accordingly, the present invention can improve electron injection capability through tunneling effect by using this compound for the N-type charge generation layer.

Accordingly, the present invention allows for efficient transfer of electrons from the N-type charge generation layer to the electron transport layer and therefore improves device efficiency and device performance, by using a compound having a nitrogen-atom for the N-type charge generation layer. Also, the facilitated transfer of electrons from the N-type charge generation layer to the electron transport layer helps reduce the low lifetime problem caused by poor electron injection. Moreover, it can also reduce the problem of operating voltage rise caused by the difference in LUMO energy level between the electron transport layer and the N-type charge generation layer when the electrons injected into the N-type charge generation layer move to the electron transport layer.

An organic light emitting display device according to the second example embodiment of the present invention will be described below. The organic light emitting display device according to the second example embodiment of the present invention has the same structure as in FIG. 1, so a description of it will be given with reference to FIG. 1 and redundancies from the first example embodiment will be explained briefly.

With reference to FIG. 1, an organic light emitting display device 100 according to the second example embodiment of the present invention comprises light emitting parts ST1 and ST2 between an anode 110 and a cathode 220, and a charge generation layer 160 between the light emitting parts ST1 and ST2. The first light emitting part ST1 comprises a hole injection layer 120 and a first hole transport layer 130 between the anode 110 and the first light emitting layer 140, and a first electron transport layer 150 over the first light emitting layer 140.

The charge generation layer 160 is over the first light emitting part ST1. The charge generation layer 160 may be a PN-junction charge generation layer formed by joining an N-type charge generation layer 160N and a P-type charge generation layer 160P. The PN junction charge generation layer 160 generates a charge, or injects the charge, i.e., electrons and holes, separately into the light emitting layers.

The N-type charge generation layer 160N of the charge generation layer 160 of the present invention may be formed of the same compound as the N-type charge generation layer of the foregoing first example embodiment. That is, the N-type charge generation layer 160N according to the second example embodiment of the present invention may be formed of compounds represented by Chemical Formulas 4 and 5, among the compounds represented by Chemical Formula 1.

A compound of the present invention has a structure in which linkers and pendants are combined with a phenanthroline core. Accordingly, the nitrogen in the core of the compound is bound to a dopant to form a gap state, the linkers induce enhancement of electron mobility, and pendants give electron characteristics. Hence, transfer of electrons from the N-type charge generation layer to the electron transport layer can be facilitated by improving the electron characteristics of the N-type charge generation layer. In a compound of the present invention, naphthalene is at the 2 position of phenathroline, and the 1 or 2 position is substituted by naphthalene. As naphthalene is attached to the 2 position of phenanthroline, the difference in energy level between the N-type charge generation layer and the electron transport layer can be reduced, thereby maximizing the tunneling effect of electrons. Accordingly, the present invention can improve electron injection through tunneling effect by using this compound for the N-type charge generation layer.

On the other hand, if the N-type charge generation layer 160N of the present invention is not formed of the aforementioned compounds, it may be formed of a metal or an N-doped organic material. The metal may be one among Li, Na, K, Rb, Cs, Mg, Ca, Sr, Ba, La, Ce, Sm, Eu, Tb, Dy, and Yb. An N-type dopant and host for the N-doped organic material may be commonly-used materials. For example, the N-type dopant may be an alkali metal, an alkali metal compound, an alkali earth metal, or an alkali earth metal compound. Specifically, the N-type dopant may be one among Li, Cs, K, Rb, Mg, Na, Ca, Sr, Eu, and Yb. The percentage of the dopant to be mixed is between 1 and 8% relative to 100% for the host. The dopant may have a work function of 2.5 eV or higher. The host material may be an organic material that has a hetero ring having nitrogen atom and includes 20 to 60 carbon atoms, for example, one material of tris(8-hydroxyquinoline)aluminum, triazine, a hydroxyquinoline derivative, a benzazole derivative, and a silole derivative.

The second light emitting part ST2 having a second hole transport layer 180, a second light emitting layer 190, a second electron transport layer 200, and an electron injection layer 210 is over the first light emitting part ST1. The second electron transport layer 200 of the present invention serves to facilitate electron transport. If electron transfer to the second light emitting layer 190 is not smooth, this affects the lifetime or efficiency of the organic light emitting display device. Thus, the present inventors conducted several tests or experiments to improve the electron injection characteristics of the electron transport layer. Through a number of tests which were performed on materials that do not affect the lifetime or efficiency of the organic light emitting display device and cause no rise in operating voltage, a compound having a nitrogen-atom was chosen as an electron transport compound for the electron transport layer. The compound may comprise a phenanthroline compound. A compound of the present invention is rich in electrons by having two nitrogen atoms, which results in high electron mobility, making electron transport easy.

Accordingly, the second electron transport layer 200 includes a compound represented by the above Chemical Formula 1. The compound represented by Chemical Formula 1 may have the following composition. This compound may perform different functions, in part, for the N-type charge generation layer of the first example embodiment of the present invention and the second electron transport layer of the second example embodiment of the present invention.

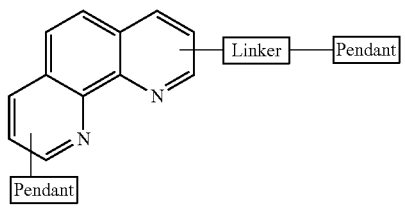

Phenanthroline, $Ar_1$ of Chemical Formula 1, is the core and rich in electrons by having two nitrogen atoms, which results in high electron mobility, making electron transport easy.

The linkers, $L_1$ and $L_2$ of Chemical Formula 1, adjust carrier mobility. $L_1$ serves as a path that allows abundant electrons in $L_2$ to reach $A_{r1}$ by controlling conjugation, and controls HOMO (highest occupied molecular orbitals) and LUMO (lowest unoccupied molecular orbitals). $L_2$ serves to improve pi(π)-electron density by using aromatic macrocycles and form a basis set of HOMO and LUMO. Accordingly, the electron mobility of the first electron transport layer can be enhanced, thereby facilitating transfer of electrons from the first electron transport layer to the first light emitting layer.

The pendants, $L_3$-$Ar_2$ and $Ar_3$ of Chemical Formula 1, serve to give charge characteristics, and control HOMO and LUMO. For example, compounds represented by the following Chemical Formula 2 have hole characteristics, and compounds represented by the following Chemical Formula 3 have electron characteristics. The pendants with electron characteristics can facilitate transfer of electrons from the N-type charge generation layer to the electron transport layer by improving the electron characteristics of the N-type charge generation layer.

[Chemical Formula 2]

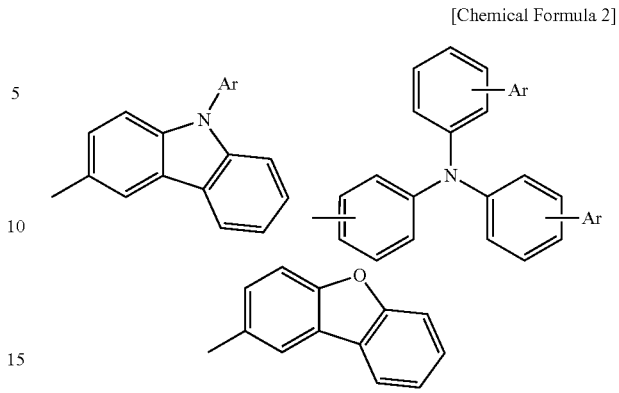

where Ar is aryl.

[Chemical Formula 3]

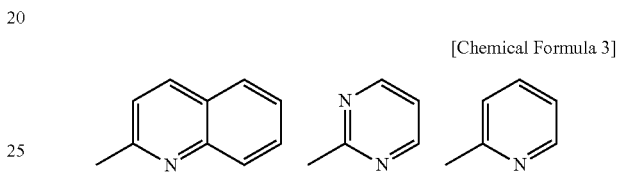

The aforementioned linkers and pendants act as a substituent on the core, and serve to enhance the electron mobility of the compound. Accordingly, the electron mobility of the N-type charge generation layer having the compound can be improved, thereby facilitating transfer of electrons from the N-type charge generation layer to the electron transport layer.

A compound represented by Chemical Formula 1 that can be used for the second electron transport layer 200 of the present invention may be one among the compounds shown in the following Table 1:

TABLE 1
| | Ar₁ | Ar₃ | L₁ | L₂ | L₃ | Ar₂ |
|---|---|---|---|---|---|---|
| NC101 | 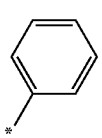 | — | 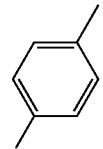 |  | — | 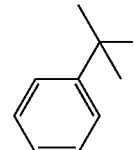 |
| NC102 | 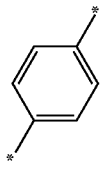 | — | — | 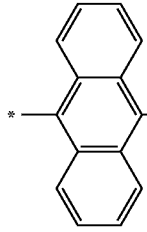 | 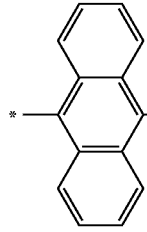 | 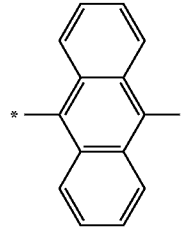 |
| NC103 | 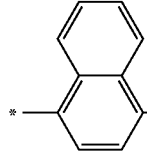 | — | 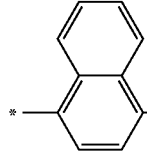 | 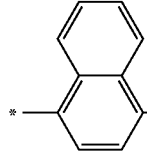 | — | 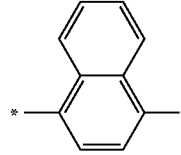 |
| NC104 | 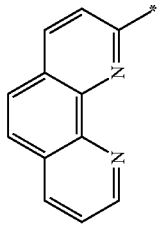 | — | 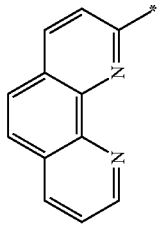 | 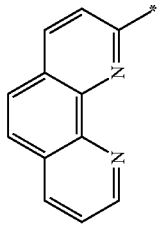 | — | 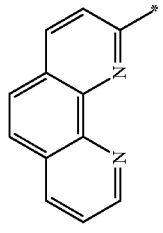 |

TABLE 1-continued
| | Ar₁ | Ar₃ | L₁ | L₂ | L₃ | Ar₂ |
|---|---|---|---|---|---|---|
| NC105 | 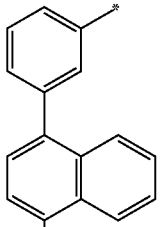 | — | 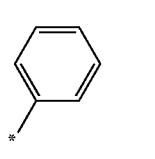 | 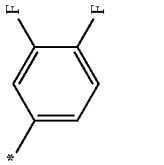 | — | 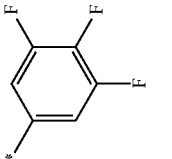 |
| NC106 | 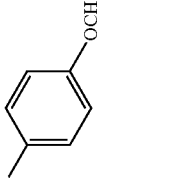 | — |  | 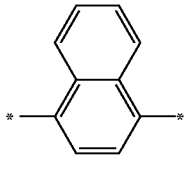 |  |  |
| NC107 | 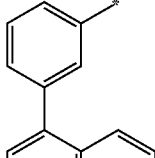 | — | 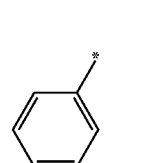 | 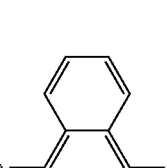 | — |  |
| NC108 | 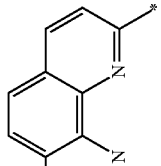 | — | — | 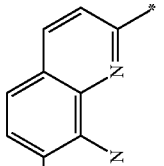 | — | 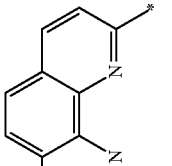 |
| NC109 | 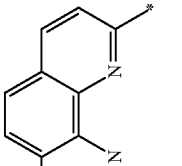 | — | — | | | |

TABLE 1-continued
| | Ar₁ | Ar₃ | L₁ | L₂ | L₃ | Ar₂ |
|---|---|---|---|---|---|---|
| NC110 |  | — |  |  | — |  |
| NC111 |  | — |  |  | — |  |
| NC112 |  | — |  |  |  |  |
| NC113 |  | — | — |  | — |  |
| NC114 |  | — | — |  | — |  |

TABLE 1-continued
| | Ar₁ | Ar₃ | L₁ | L₂ | L₃ | Ar₂ |
|---|---|---|---|---|---|---|
| NC115 | 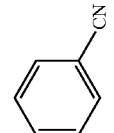 | — | — | 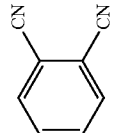 | 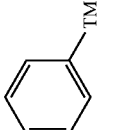 | 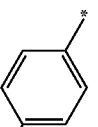 |
| NC116 | 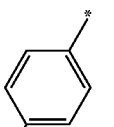 | — | 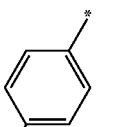 | 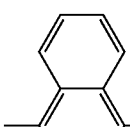 | — | 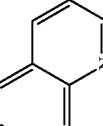 |
| NC117 | 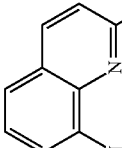 | — | 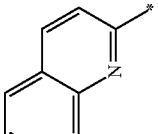 | 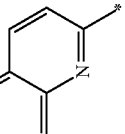 | — |  |
| NC118 |  | — |  |  |  |  |
| NC119 |  | — |  | | — | |

TABLE 1-continued

| | Ar₁ | Ar₃ | L₁ | L₂ | L₃ | Ar₂ |
|---|---|---|---|---|---|---|
| NC120 | | — | | | | |
| NC121 | | — | — | | | |
| NC122 | | — | | | | |
| NC123 | | — | — | | | |
| NC124 | | — | | | — | |

TABLE 1-continued
| | Ar₁ | Ar₃ | L₁ | L₂ | L₃ | Ar₂ |
|---|---|---|---|---|---|---|
| NC125 | 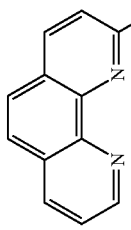 | — | 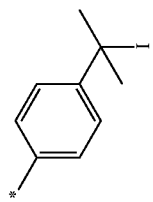 | 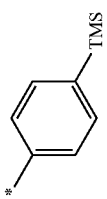 | — | 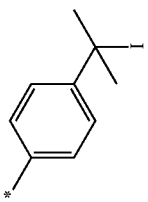 |
| NC126 | 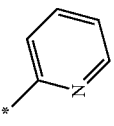 | — | 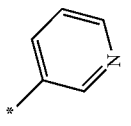 | 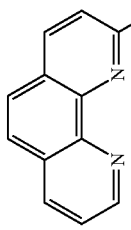 | — | 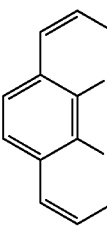 |
| NC127 | 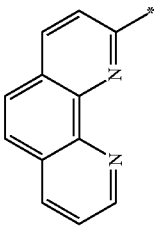 | — | 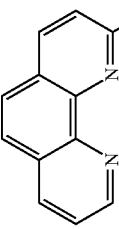 | 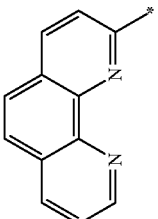 | 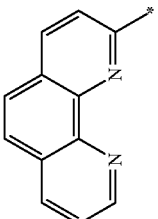 | 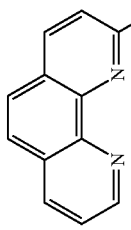 |
| NC128 | 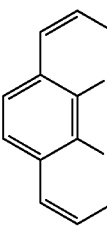 | — | 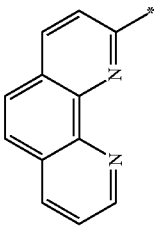 | 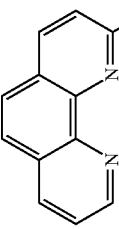 | 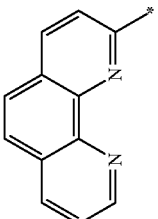 | 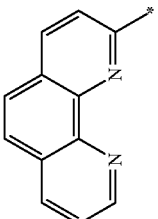 |
| NC129 | 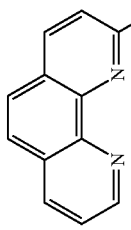 | — | 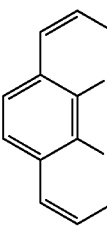 | 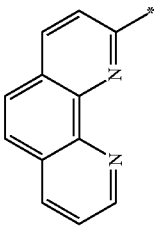 | — | 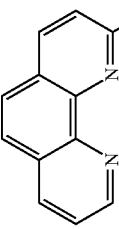 |

TABLE 1-continued
| | Ar₁ | Ar₃ | L₁ | L₂ | L₃ | Ar₂ |
|---|---|---|---|---|---|---|
| NC130 | 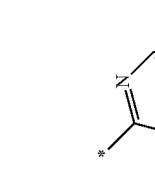 | — | — | 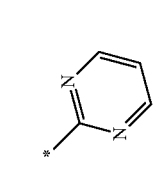 | 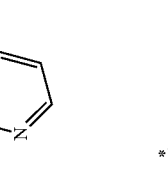 | 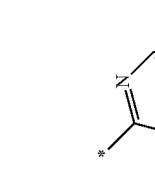 |
| NC131 | 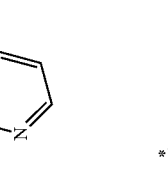 | — | 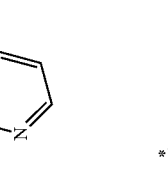 | 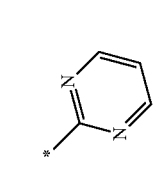 | 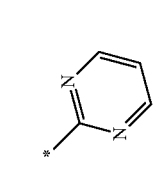 | 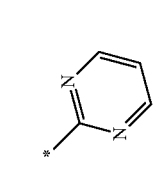 |
| NC132 | 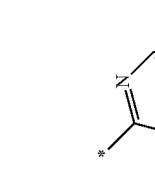 | — | 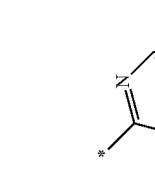 | 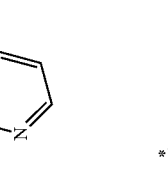 | 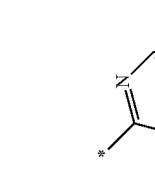 | 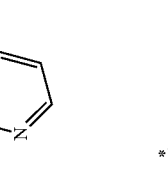 |
| NC133 | | — | 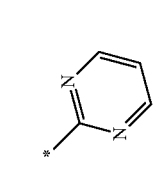 | | | |
| NC134 | | — | — | | | |

TABLE 1-continued
| | Ar₁ | Ar₃ | L₁ | L₂ | L₃ | Ar₂ |
|---|---|---|---|---|---|---|
| NC135 | 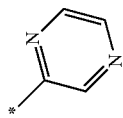 | — | 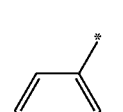 | 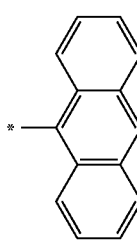 | 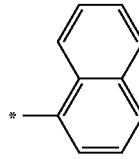 | 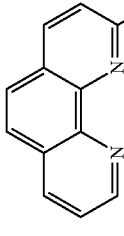 |
| NC136 | 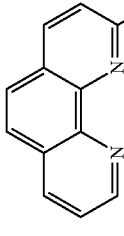 | — | 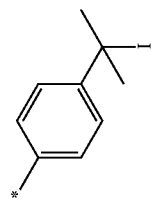 | 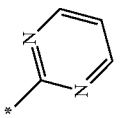 | 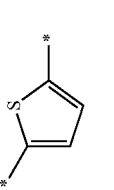 | 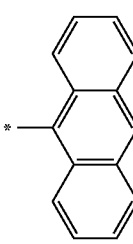 |
| NC137 | 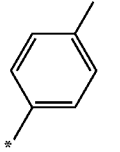 | — | 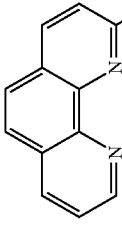 | 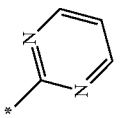 | 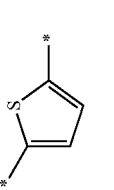 | 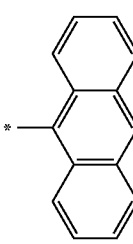 |
| NC138 | 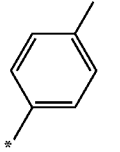 | — | — | 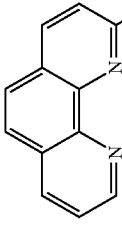 |  | 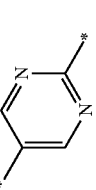 |
| NC139 | 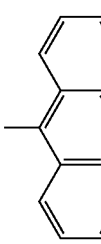 | — |  | 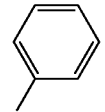 | 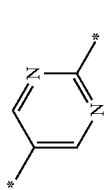 | 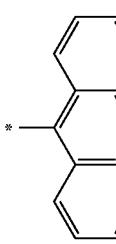 |

TABLE 1-continued

| | Ar₁ | Ar₃ | L₁ | L₂ | L₃ | Ar₂ |
|---|---|---|---|---|---|---|
| NC140 | 2-substituted benzo[h]quinoline | — | — | 9,10-anthracenediyl | — | 6-cyanopyridin-3-yl |
| NC141 | 2-substituted 1,10-phenanthroline | — | 2,5-thiophenediyl | 9,10-anthracenediyl | 1,4-phenylene | pyrimidin-2-yl |
| NC142 | 5-substituted 1,10-phenanthroline | phenyl | 1,4-naphthalenediyl | 9,10-anthracenediyl | 1,4-phenylene | pyrimidin-2-yl |
| NC143 | 2-substituted 1,10-phenanthroline | — | 2,5-thiophenediyl | 9,10-anthracenediyl | 1,5-naphthyridine-diyl | phenyl |
| NC144 | 2-substituted 1,10-phenanthroline | — | 4-(naphthalen-1-yl)phenyl | 9,10-anthracenediyl | — | 2-fluoropyrimidin-5-yl |

TABLE 1-continued
| | $Ar_1$ | $Ar_3$ | $L_1$ | $L_2$ | $L_3$ | $Ar_2$ |
|---|---|---|---|---|---|---|
| NC145 | 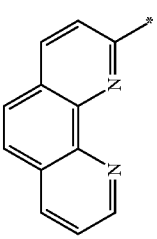 | — | — | 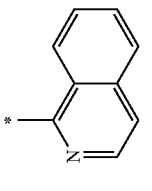 | — | 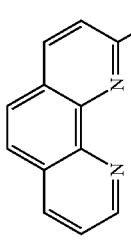 |
| NC146 | 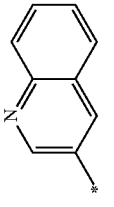 | — | — | 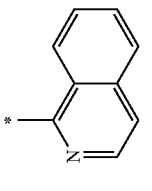 | — | 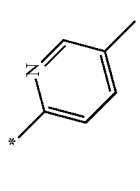 |
| NC147 | 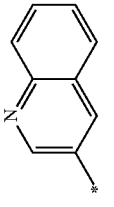 | — | — | 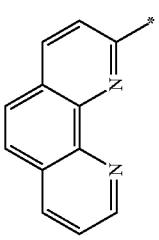 | — | 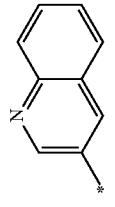 |
| NC148 | 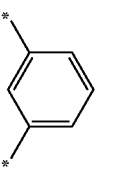 | — | 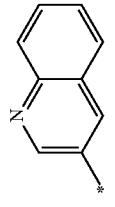 | 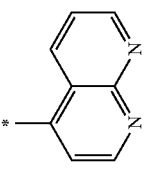 | 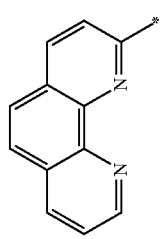 | 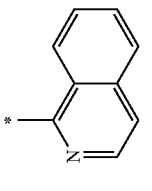 |
| NC149 | 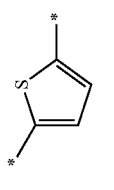 | — | 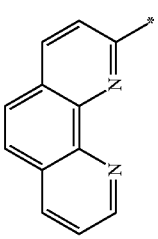 | 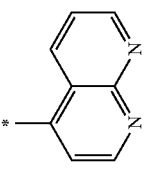 | 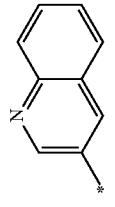 | 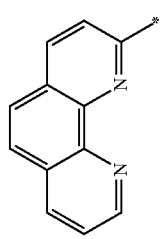 |

TABLE 1-continued

| | Ar₁ | Ar₃ | L₁ | L₂ | L₃ | Ar₂ |
|---|---|---|---|---|---|---|
| NC150 | | — | | | — | |
| NC151 | | — | | | — | |
| NC152 | | — | | | | |
| NC153 | | — | | | — | |
| NC154 | | — | | | — | |

TABLE 1-continued

| | Ar₁ | Ar₃ | L₁ | L₂ | L₃ | Ar₂ |
|---|---|---|---|---|---|---|
| NC155 | phenanthroline | — | phenylene | anthracene | dibenzothiophene | pyrimidine |
| NC156 | phenanthroline | — | — | anthracene | dibenzothiophene | phenyl |
| NC157 | phenanthroline | — | — | anthracene | 9,9-dimethylfluorene | phenyl |
| NC158 | phenanthroline | — | — | anthracene | 9,9-dimethylfluorene | pyrimidine |
| NC159 | phenanthroline | — | dibenzofuran | anthracene | — | pyrimidine |

TABLE 1-continued
| | Ar₁ | Ar₃ | L₁ | L₂ | L₃ | Ar₂ |
|---|---|---|---|---|---|---|
| NC160 | 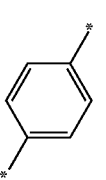 | 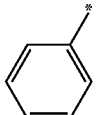 |  |  |  |  |
| NC161 | 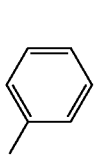 | — | — |  | — |  |
| NC162 | 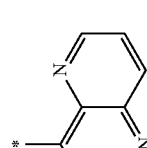 | — |  |  | — |  |
| NC163 | 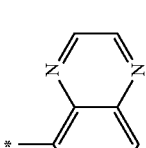 | — | — |  | — |  |
| NC164 | 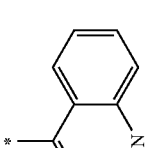 | — |  |  |  |  |

TABLE 1-continued
| | Ar₁ | Ar₃ | L₁ | L₂ | L₃ | Ar₂ |
|---|---|---|---|---|---|---|
| NC165 |  | — | 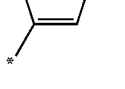 | 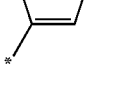 |  |  |
| NC166 |  | 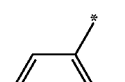 | — | 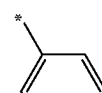 |  | 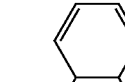 |
| NC167 | 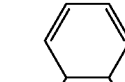 | — |  | 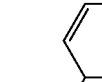 | — |  |
| NC168 | 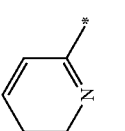 | — | 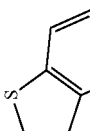 | 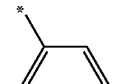 | — | 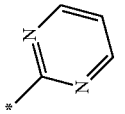 |
| NC169 | 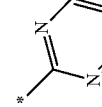 | 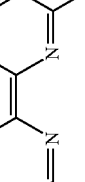 | 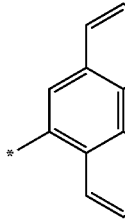 | 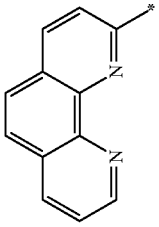 | 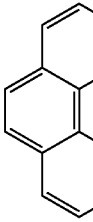 | 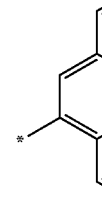 |

TABLE 1-continued
| | Ar₁ | Ar₃ | L₁ | L₂ | L₃ | Ar₂ |
|---|---|---|---|---|---|---|
| NC170 | 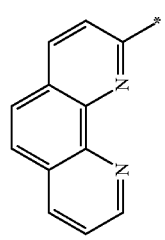 | — | 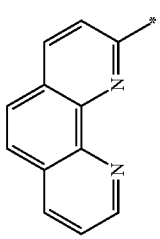 | 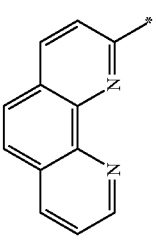 | — | 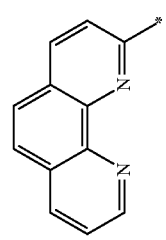 |
| NC171 | 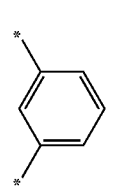 | — | — | 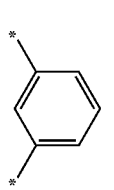 | — | 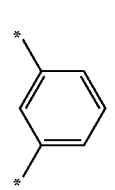 |
| NC172 | 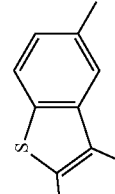 | — |  | 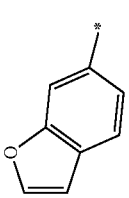 | 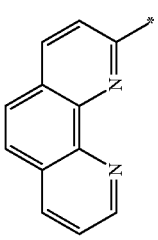 | 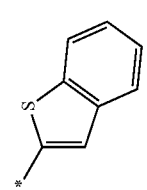 |
| NC173 | 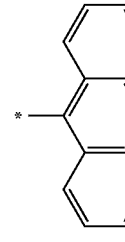 | — | — | 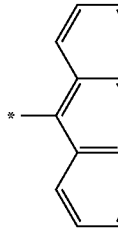 | — | 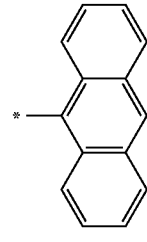 |
| NC174 | 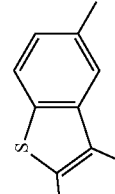 | — | 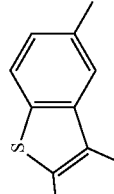 | 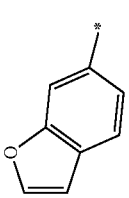 | 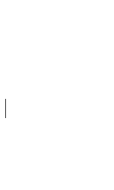 | 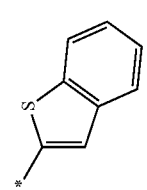 |

TABLE 1-continued

| | Ar₁ | Ar₃ | L₁ | L₂ | L₃ | Ar₂ |
|---|---|---|---|---|---|---|
| NC175 | benzo[h]quinoline-2-yl | — | 1,4-naphthylene | 9,10-anthrylene | — | dibenzofuran-2-yl |
| NC176 | benzo[h]quinoline-2-yl | — | — | 9,10-anthrylene | — | dibenzofuran-4-yl |
| NC177 | benzo[h]quinoline-2-yl | — | 1,8-naphthyridine-2,6-diyl | 9,10-anthrylene | — | 9,9-dimethylfluoren-2-yl |
| NC178 | benzo[h]quinoline-2-yl | — | — | 9,10-anthrylene | 1,3-phenylene | 9,9-dimethylfluoren-2-yl |

TABLE 1-continued
| | Ar₁ | Ar₃ | L₁ | L₂ | L₃ | Ar₂ |
|---|---|---|---|---|---|---|
| NC179 | 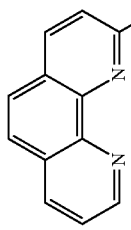 | — | 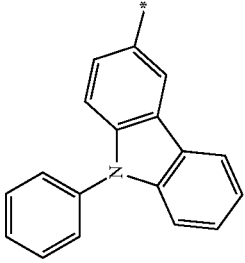 | 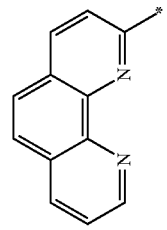 | — | 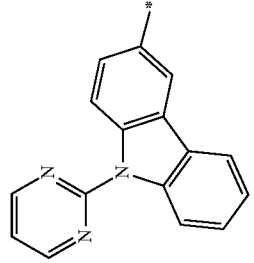 |
| NC180 | 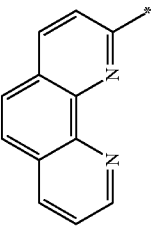 | — | — | 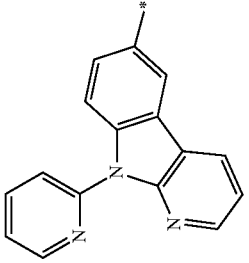 | 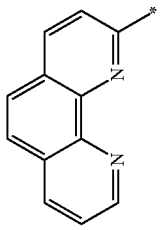 | 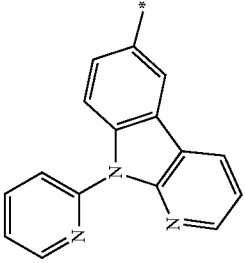 |
| NC181 | 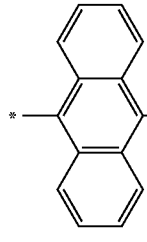 | — | 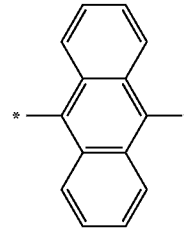 | 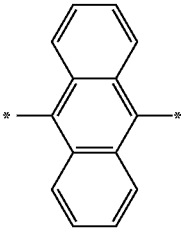 | — | 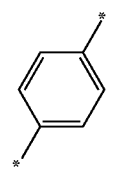 |
| NC182 |  | — |  |  | — |  |

TABLE 1-continued
| | Ar₁ | Ar₃ | L₁ | L₂ | L₃ | Ar₂ |
|---|---|---|---|---|---|---|
| NC183 | 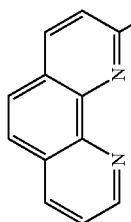 | — | 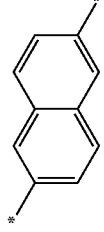 | 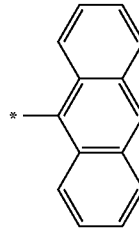 | — | 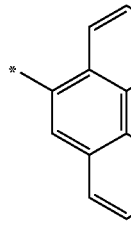 |
| NC184 | 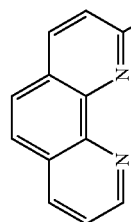 | — | 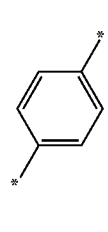 | 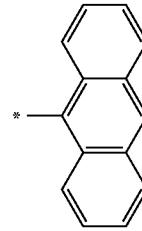 | 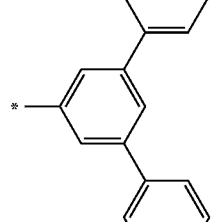 | 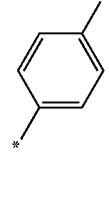 |
| NC185 | 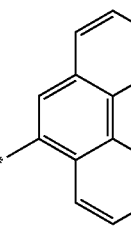 | 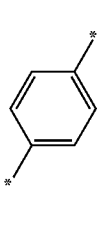 | 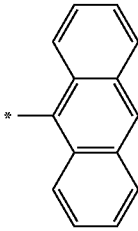 | 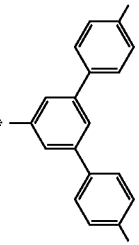 | — | 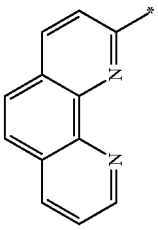 |
| NC186 | 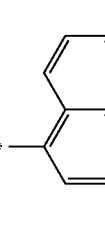 | — | 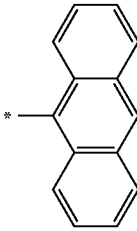 | 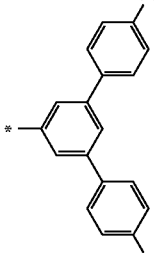 | — | 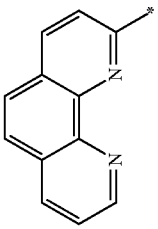 |
| NC187 | 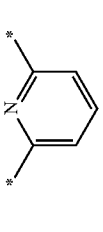 | — | 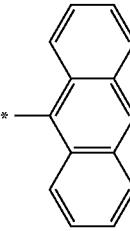 | 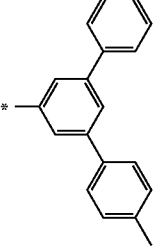 | — |  |

TABLE 1-continued

| | Ar₁ | Ar₃ | L₁ | L₂ | L₃ | Ar₂ |
|---|---|---|---|---|---|---|
| NC188 | phenanthroline-2-yl | — | pyridine-2,6-diyl | anthracene-9,10-diyl | 1,4-phenylene | 3,5-bis(4-tert-butylphenyl)phenyl |
| NC189 | phenanthroline-2-yl | — | 1,4-phenylene | anthracene-9,10-diyl | — | 3,5-di(pyridin-2-yl)phenyl |
| NC190 | phenanthroline-2-yl | — | 1,4-phenylene | anthracene-9,10-diyl | 1,4-phenylene | 2,6-di(pyridin-2-yl)pyridin-4-yl |
| NC191 | phenanthroline-2-yl | — | — | anthracene-9,10-diyl | 1,4-phenylene | 2,6-di(pyridin-2-yl)pyridin-4-yl |

TABLE 1-continued
| | Ar₁ | Ar₃ | L₁ | L₂ | L₃ | Ar₂ |
|---|---|---|---|---|---|---|
| NC192 | 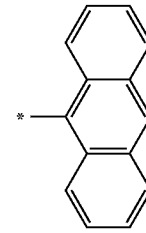 | — | — | 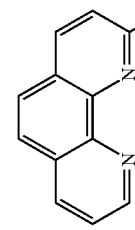 | 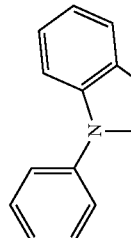 | 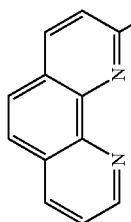 |
| NC193 | 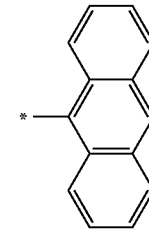 | — |  | 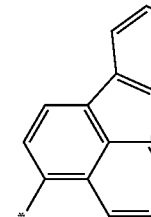 | — | 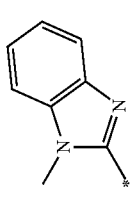 |
| NC194 | 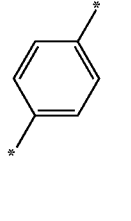 | — | 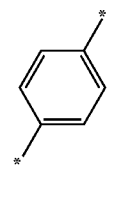 | 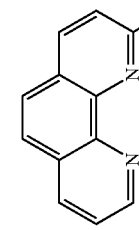 | — | 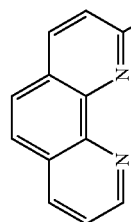 |
| NC195 | 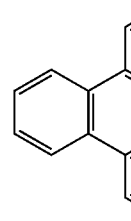 | — | — | 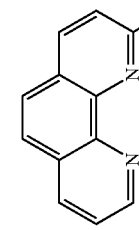 | — | 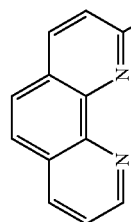 |
| NC196 | 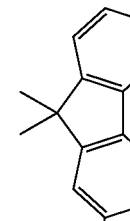 | — | 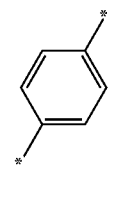 | 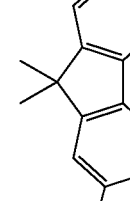 | — | 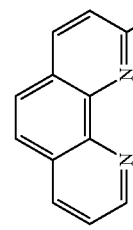 |

TABLE 1-continued
| | $Ar_1$ | $Ar_3$ | $L_1$ | $L_2$ | $L_3$ | $Ar_2$ |
|---|---|---|---|---|---|---|
| NC197 | 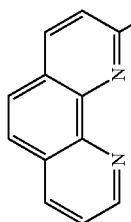 | — | 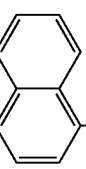 | 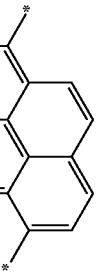 | — | 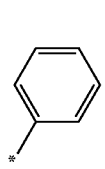 |
| NC198 | 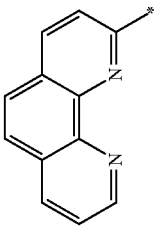 | — | — |  | — | 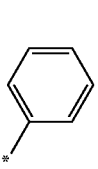 |
| NC199 | 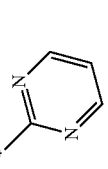 | — | — | 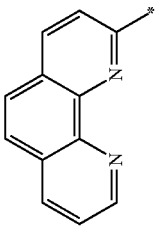 |  | 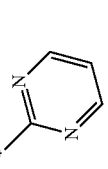 |
| NC200 | 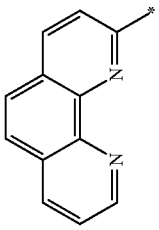 | — | — |  | 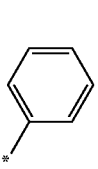 | 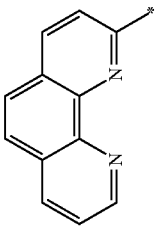 |
| NC201 | 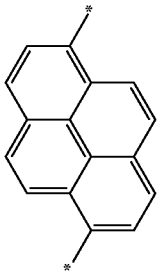 | — | 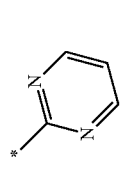 | | — | |

TABLE 1-continued
| | Ar₁ | Ar₃ | L₁ | L₂ | L₃ | Ar₂ |
|---|---|---|---|---|---|---|
| NC202 | 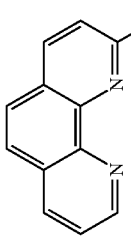 | — | 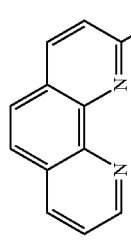 | 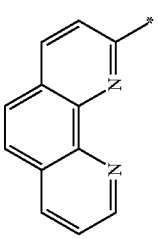 | — | 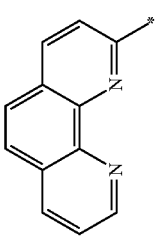 |
| NC203 | 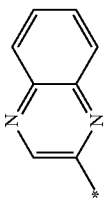 | — | 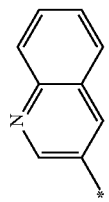 | 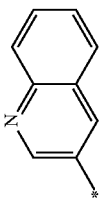 | 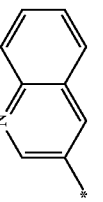 | 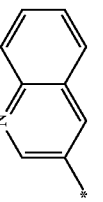 |
| NC204 | 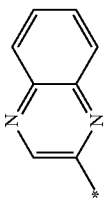 | — | 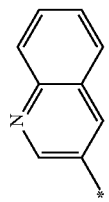 | 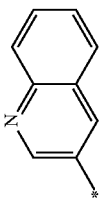 | 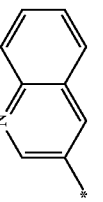 | 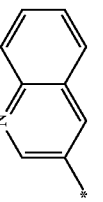 |
| NC205 | 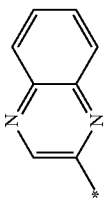 | — | 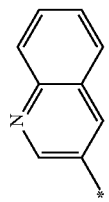 | 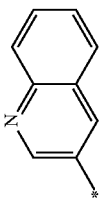 | 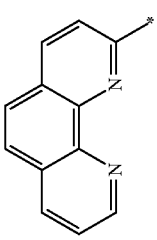 | 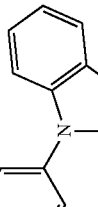 |
| NC206 | 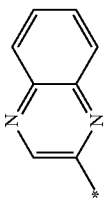 | — | 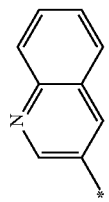 | 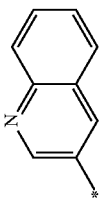 | 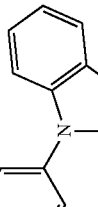 | 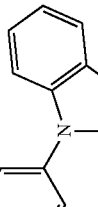 |

TABLE 1-continued
| | Ar₁ | Ar₃ | L₁ | L₂ | L₃ | Ar₂ |
|---|---|---|---|---|---|---|
| NC207 | 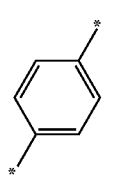 | — | 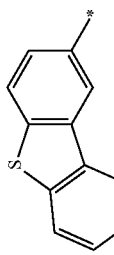 | 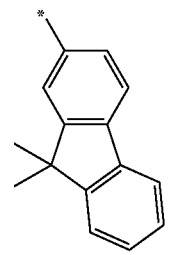 | — | 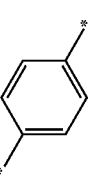 |
| NC208 | 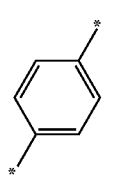 | — | 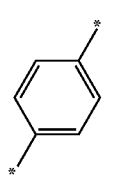 | 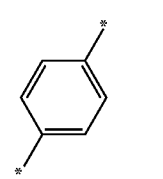 | — | 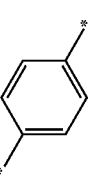 |
| NC209 | 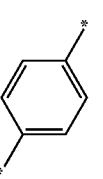 | 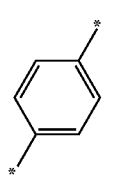 | 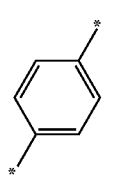 | 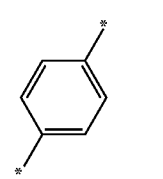 | — | — |
| NC210 | 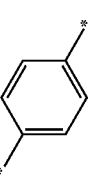 | 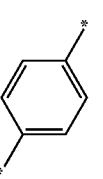 | 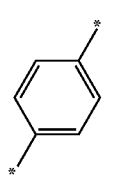 | 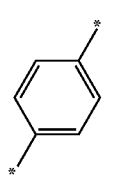 | — | — |
| NC211 | 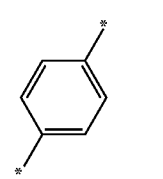 | 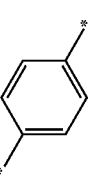 | 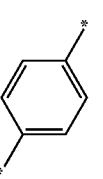 | 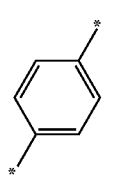 | — | — |

TABLE 1-continued
| | Ar₁ | Ar₃ | L₁ | L₂ | L₃ | Ar₂ |
|---|---|---|---|---|---|---|
| NC212 | 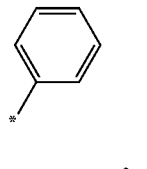 | 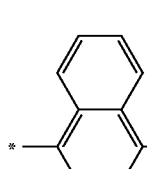 | 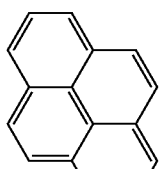 | 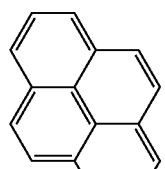 | — | — |
| NC213 | 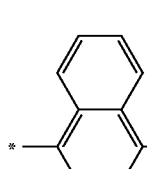 | — | 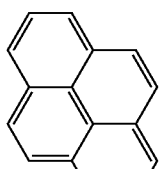 | 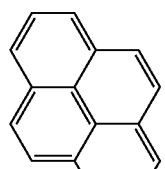 | — | — |
| NC214 | 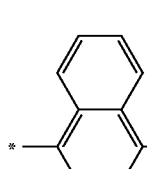 | — | 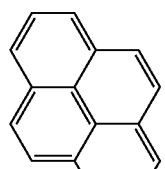 | 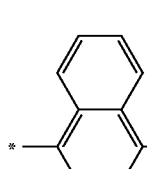 | — | — |
| NC215 | 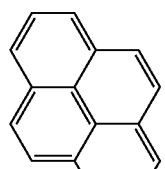 | — | 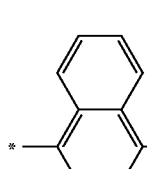 | 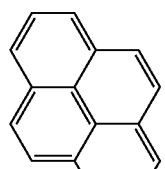 | — | — |
| NC216 |  | — |  |  | — | — |

TABLE 1-continued

| | Ar₁ | Ar₃ | L₁ | L₂ | L₃ | Ar₂ |
|---|---|---|---|---|---|---|
| NC217 | phenanthroline | — | thiophene | pyrene | — | — |
| NC218 | phenanthroline | — | thiophene | pyrene | thiophene | phenyl |
| NC219 | phenanthroline | — | naphthalene | pyrene | thiophene | phenyl |
| NC220 | phenanthroline | — | — | pyrene | thiophene | phenyl |

TABLE 1-continued
| | Ar₁ | Ar₃ | L₁ | L₂ | L₃ | Ar₂ |
|---|---|---|---|---|---|---|
| NC221 | 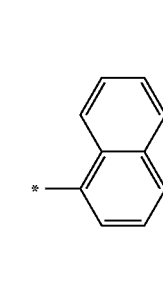 | — | 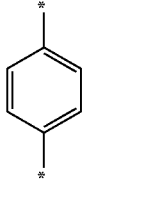 | — | 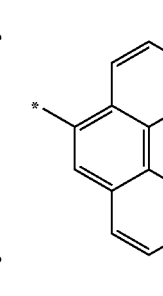 | 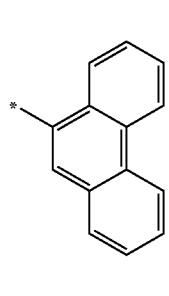 |
| NC222 | 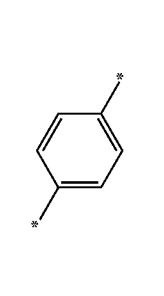 | — | 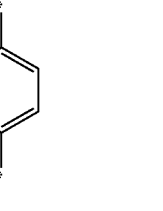 | — | 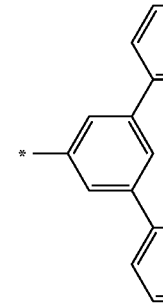 | 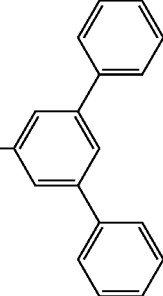 |
| NC223 | 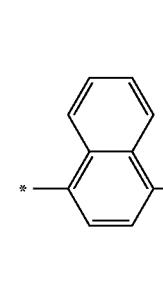 | — | 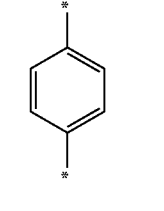 | — | — | 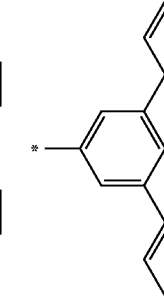 |
| NC224 |  | — |  | — | — | 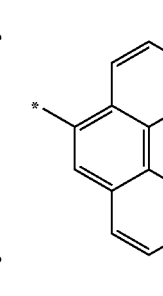 |

TABLE 1-continued
| | Ar₁ | Ar₃ | L₁ | L₂ | L₃ | Ar₂ |
|---|---|---|---|---|---|---|
| NC225 | 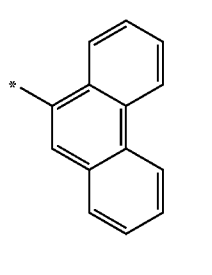 | — | 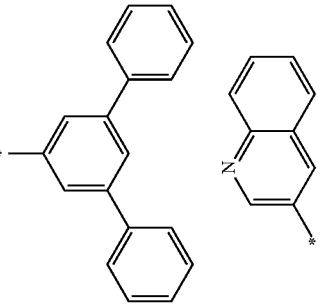 | — | 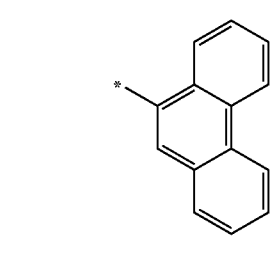 |  |
| NC226 |  | — | 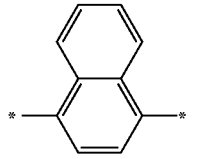 | — | 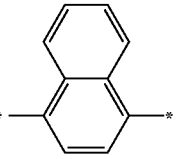 | 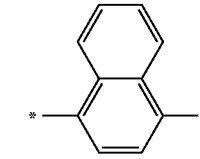 |
| NC227 | 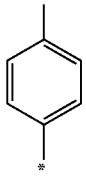 | — | 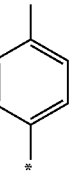 | — | 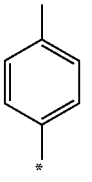 | |
| NC228 | | | | | | |

TABLE 1-continued
| | Ar₁ | Ar₃ | L₁ | L₂ | L₃ | Ar₂ |
|---|---|---|---|---|---|---|
| NC229 | 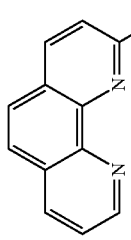 | — | 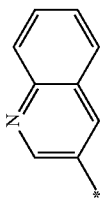 | — | 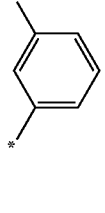 | 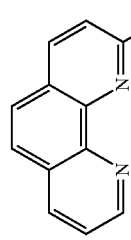 |
| NC230 | 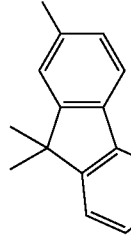 | — |  | — | — | 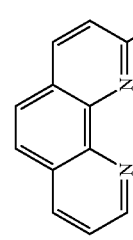 |
| NC231 | 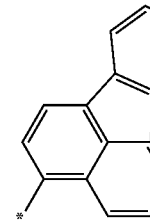 | — | 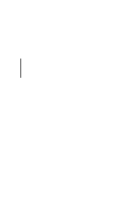 | — | — | 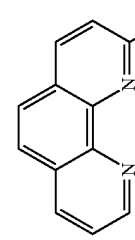 |
| NC232 | 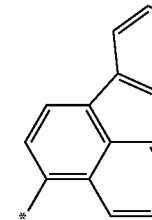 | — | 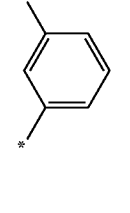 | — | — |  |

The aforementioned compound of the present invention is included in the second light emitting part ST2 having a yellow-green light emitting layer. The yellow-green light emitting layer is a phosphorescent light emitting layer, and requires an organic layer with high electron mobility. The compound of the present invention is suitable for the phosphorescent light emitting layer because it has high electron mobility and low triplet energy. Accordingly, if the compound of the present invention is included in the second light emitting part ST2, the electron mobility of the second light emitting part ST2 is increased. Thus, the compound of the present invention is preferably positioned in the second light emitting part ST2 that emits phosphorescent yellow-green light. On the other hand, if the phosphorescent light emitting layer is positioned in the first light emitting part ST1 or a third light emitting part ST3, the compound of the present invention may be positioned in the first light emitting part ST1 or the third light emitting part ST3.

The second electron transport layer 200 according to the second example embodiment of the present invention makes it easy to transport electrons because it has high electron mobility by the compound of the present invention, and facilitates transport of electrons from the electron transport layer to the light emitting layer. Accordingly, the organic light emitting display device according to the second example embodiment of the present invention comprises the first light emitting part ST1, charge generation layer 160, and second light emitting part ST2 between the anode 110 and the cathode 220.

Although the second example embodiment of the present invention has been described with an example where the N-type charge generation layer 160N of the charge generation layer 160 and the second electron transport layer 200 are formed of a compound of the present invention, the present invention is not limited to this example and at least one among the following—the first electron transport layer 150, the second electron transport layer 200, and the N-type charge generation layer 160N of the charge generation layer 160—may be formed of the compound of the present invention.

As discussed above, a compound having a nitrogen-atom of the present invention is rich in electrons by having two nitrogen atoms, which results in high electron mobility, making electron transport easy. Accordingly, the organic light emitting display device of the present invention allows for efficient transfer of electrons from the N-type charge generation layer to the light emitting layer, by using this compound for at least one among the electron transport layers in the light emitting parts.

Moreover, the compound having the nitrogen-atom of the present invention includes nitrogen (N) of sp2 hybrid orbital which is relatively electron-rich, and the nitrogen is bound to an alkali metal or alkali earth metal, a dopant for the N-type charge generation layer, thereby forming a gap state. This gap state may facilitate transfer of electrons from the N-type charge generation layer to the electron transport layer. Accordingly, the organic light emitting display device of the present invention facilitates transfer of electrons from the N-type charge generation layer to the electron transport layer, by using this compound of the present invention for the N-type charge generation layer. Also, since the compound having a nitrogen-atom is bound to the alkali metal or alkali earth metal in the N-type charge generation layer, the alkali metal or alkali earth metal is not diffused into the P-type charge generation layer, thus increasing lifetime.

Accordingly, the organic light emitting display device of the present invention allows for efficient transfer of electrons from the N-type charge generation layer to the light emitting layer and therefore improves device efficiency and device performance, by using the compound having the nitrogen-atom for at least one among the following—the electron transport layers and N-type charge generation layers in the light emitting parts. Also, the facilitated transfer of electrons from the N-type charge generation layer to the electron transport layer helps reduce the low lifetime problem caused by poor electron injection. Moreover, it can also reduce the problem of operating voltage rise caused by the difference in LUMO energy level between the electron transport layer and the N-type charge generation layer when the electrons injected into the N-type charge generation layer move to the electron transport layer.

Figure 2:
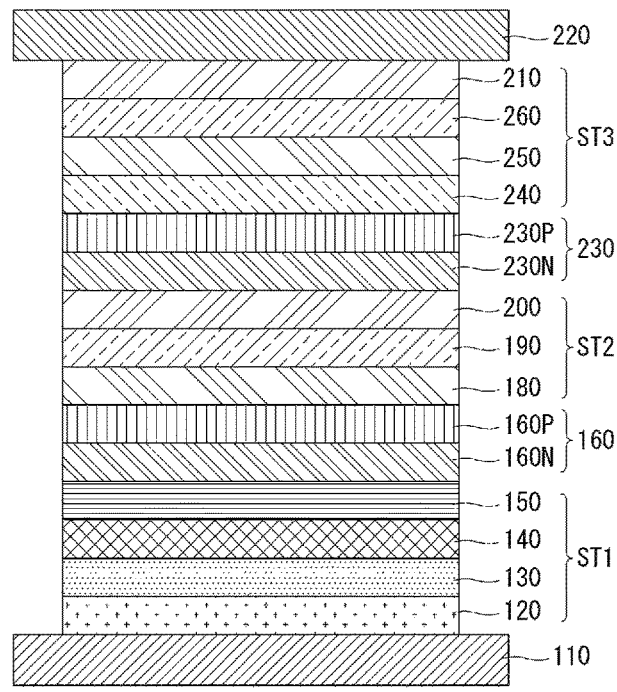
FIG. 2 is a cross-sectional view showing an organic light emitting display device according to third and fourth example embodiments of the present invention.

FIG. 2 is a view showing an organic light emitting display device according to third and fourth example embodiments of the present invention. The same elements as the first and second example embodiments are denoted by the same reference numerals, so descriptions of these elements will be omitted.

With reference to FIG. 2, an organic light emitting display device 100 of the present invention comprises a plurality of light emitting parts ST1, ST2, and ST3 between an anode 110 and a cathode 220, and a first charge generation layer 160 and a second charge generation layer 230 between the light emitting parts ST1, ST2, and ST3. Although this example embodiment has been illustrated and described with an example where three light emitting parts are between the anode 110 and the cathode 220, the present invention is not limited to this example and four or more light emitting parts may be between the anode 110 and the cathode 220.

More specifically, the first light emitting part ST1 is a single light emitting diode unit, and comprises a first light emitting layer 140. The first light emitting layer 140 may emit light of one among red, green, or blue: for example, it may be a blue light emitting layer in this example embodiment. The blue light emitting layer comprises one among a blue light emitting layer, a dark blue light emitting layer, or a sky blue light emitting layer. In this case, the light emission area of the blue light emitting layer, dark blue light emitting layer, or sky blue light emitting layer may be in the range of 440 to 480 nm. Alternatively, the first light emitting layer 140 may be composed of a blue light emitting layer and a red light emitting layer, or may be composed of a blue light emitting layer and a yellow-green light emitting layer, or may be composed of a blue light emitting layer and a green light emitting layer. The light emission area of the blue light emitting layer and the red light emitting layer may be in the range of 440 to 650 nm. The light emission area of the blue light emitting layer and the yellow-green light emitting layer may be in the range of 440 to 590 nm. The light emission area of the blue light emitting layer and the green light emitting layer may be in the range of 440 to 570 nm.

The first light emitting part ST1 comprises a hole injection layer 120 and a first hole transport layer 130 between the anode 110 and the first light emitting layer 140, and a first electron transport layer 150 over the first light emitting layer 140. Accordingly, the first light emitting part ST1 having the hole injection layer 120, the first hole transport layer 130, the first light emitting layer 140, and the first electron transport layer 150 is formed over the anode 110. The hole injection layer 120 may not be included in the composition of the first light emitting part ST1, depending on the structure or characteristics of the device.

The first charge generation layer 160 is between the first light emitting part ST1 and the second light emitting part ST2. The first charge generation layer 160 is a PN-junction charge generation layer formed by joining an N-type charge generation layer 160N and a P-type charge generation layer 160P. The PN junction charge generation layer 160 generates a charge, or injects the charge, i.e., electrons and holes, separately into the light emitting layers.

The N-type charge generation layer 160N of the first charge generation layer 160 of the present invention may include the same compound as the N-type charge generation layer of the first example embodiment and the N-type charge generation layer of the second example embodiment. That is, the N-type charge generation layer 160N according to the third example embodiment of the present invention may be formed of compounds represented by Chemical Formulas 4 and 5, among the compounds represented by Chemical Formula 1.

As discussed above, a compound of the present invention has a structure in which linkers and pendants are combined with a phenanthroline core. Accordingly, the nitrogen in the core of the compound is bound to a dopant to form a gap state, the linkers induce enhancement of electron mobility, and the pendants give electron characteristics. Hence, transfer of electrons from the N-type charge generation layer to the electron transport layer can be facilitated by improving the electron characteristics of the N-type charge generation layer. In a compound of the present invention, naphthalene is at the 2 position of phenathroline, and the 1 or 2 position is substituted by naphthalene. As naphthalene is attached to the 2 position of phenanthroline, the difference in energy level between the N-type charge generation layer and the electron transport layer can be reduced, thereby maximizing the tunneling effect of electrons. Accordingly, the present invention can improve electron injection through tunneling effect by using this compound for the N-type charge generation layer.

The second light emitting part ST2 having a second light emitting layer 190 is over the first charge generation layer 160. The second light emitting layer 190 may emit light of one among red, green, or blue, and it may be a yellow-green light emitting layer, for example, in this example embodiment. The yellow-green light emitting layer may comprise a yellow light emitting layer, a green light emitting layer, a multilayer structure composed of a yellow-green light emitting layer and a green light emitting layer, a multilayer structure composed of a yellow light emitting layer and a red light emitting layer, a multilayer structure composed of a green light emitting layer and a red light emitting layer, or a multilayer structure composed of a yellow-green light emitting layer and a red light emitting layer. The light emission area of the yellow-green light emitting layer may be in the range of 510 to 590 nm. If the second light emitting layer 190 is composed of two light emitting layers: a yellow-green light emitting layer and a red light emitting layer, in order to improve red light emission efficiency, the light emission area of the yellow-green light emitting layer and the red light emitting layer may be in the range of 510 to 650 nm.

The second light emitting part ST2 comprises a second hole transport layer 180, the second light emitting layer 190, and a second electron transport layer 200 over the second light emitting layer 190. Accordingly, the second light emitting part ST2 having the second hole transport layer 180, the second light emitting layer 190, and the second electron transport layer 200 is over the first charge generation layer 160.

The second charge generation layer 230 is between the second light emitting part ST2 and the third light emitting part ST3. The second charge generation layer 230 is a PN-junction charge generation layer formed by joining an N-type charge generation layer 230N and a P-type charge generation layer 230P. The PN junction charge generation layer 230 generates a charge, or injects the charge, i.e., electrons and holes, separately into the light emitting layers. The N-type charge generation layer 230N of the second charge generation layer 230 of the present invention is also formed of a compound represented by Chemical Formula 1, like the N-type charge generation layer 160N of the first charge generation layer 160.

The third light emitting part ST3 having a third light emitting layer 250 is over the second light emitting part ST3. The third light emitting layer 250 may emit light of one among red, green, or blue: for example, it may be a blue light emitting layer in this example embodiment. The blue light emitting layer comprises one among a blue light emitting layer, a dark blue light emitting layer, or a sky blue light emitting layer. In this case, the light emission area of the blue light emitting layer, dark blue light emitting layer, or sky blue light emitting layer may be in the range of 440 to 480 nm. Alternatively, the third light emitting layer 250 may be composed of a blue light emitting layer and a red light emitting layer, or a blue light emitting layer and a yellow-green light emitting layer, or a blue light emitting layer and a green light emitting layer. The light emission area of the blue light emitting layer and the red light emitting layer may be in the range of 440 to 650 nm. The light emission area of the blue light emitting layer and the yellow-green light emitting layer may be in the range of 440 to 590 nm. The light emission area of the blue light emitting layer and the green light emitting layer may be in the range of 440 to 570 nm.

The third light emitting part ST3 comprises a third hole transport layer 240, the third light emitting layer 250, and a third electron transport layer 260 and a hole injection layer 210 that are over the third light emitting layer 250. Accordingly, the third light emitting part ST3 having the third hole transport layer 240, the third light emitting layer 250, the third electron transport layer 260, and the electron injection layer 210 is over the second charge generation layer 230. A cathode 220 is over the third light emitting part ST3 to constitute the organic light emitting display device according to the third example embodiment of the present invention.

Although the third example embodiment of the present invention has been described with an example where the N-type charge generation layer 160N of the first charge generation layer 160 and the N-type charge generation layer 230N of the second charge generation layer 230 include a compound of the present invention, the present invention is not limited to this example and at least one among the following—the N-type charge generation layer 160N of the first charge generation layer 160 and the N-type charge generation layer 230N of the second charge generation layer 230—may include the compound of the present invention.

As discussed above, a compound of the present invention has a structure in which linkers and pendants are attached to a phenanthroline core. Accordingly, the nitrogen in the core of the compound is bound to a dopant to form a gap state, the linkers induce enhancement of electron mobility, and the pendants give electron characteristics. Hence, transfer of electrons from the N-type charge generation layer to the electron transport layer can be facilitated by improving the electron characteristics of the N-type charge generation layer.

In a compound of the present invention, naphthalene is at the 2 position of phenanthroline, and the 1 or 2 position is substituted by naphthalene. As naphthalene is attached to the 2 position of phenanthroline, the difference in energy level between the N-type charge generation layer and the electron transport layer can be reduced, thereby maximizing the tunneling effect of electrons. Accordingly, the present invention can improve electron injection through tunneling effect by using this compound for the N-type charge generation layer.

Accordingly, the present invention allows for efficient transfer of electrons from the N-type charge generation layer to the electron transport layer and therefore improves device efficiency and device performance, by using a compound having a nitrogen-atom for the N-type charge generation layer. Also, the facilitated transfer of electrons from the N-type charge generation layer to the electron transport layer helps reduce the low lifetime problem caused by poor electron injection. Moreover, it can also reduce the problem of operating voltage rise caused by the difference in LUMO energy level between the electron transport layer and the N-type charge generation layer when the electrons injected into the N-type charge generation layer move to the electron transport layer.

An organic light emitting display device according to the fourth example embodiment of the present invention will be described below. The organic light emitting display device according to the fourth example embodiment of the present invention has the same structure as in FIG. 2, so a description of it will be given with reference to FIG. 2 and redundancies from the first to third example embodiments will be explained briefly.

With reference to FIG. 2, an organic light emitting display device 100 according to the fourth example embodiment of the present invention comprises a plurality of light emitting parts ST1, ST2, and ST3 between an anode 110 and a cathode 220, and a first charge generation layer 160 and a second charge generation layer 230 between the light emitting parts ST1, ST2, and ST3. Although this example embodiment has been illustrated and described with an example where three light emitting parts are between the anode 110 and the cathode 220, the present invention is not limited to this example and four or more light emitting parts may be between the anode 110 and the cathode 220.

More specifically, the first light emitting part ST1 is a single light emitting diode unit, and comprises a first light emitting layer 140. The first light emitting layer 140 may emit light of one among red, green, or blue: for example, it may be a blue light emitting layer in this example embodiment. The blue light emitting layer comprises one among a blue light emitting layer, a dark blue light emitting layer, or a sky blue light emitting layer. In this case, the light emission area of the blue light emitting layer, dark blue light emitting layer, or sky blue light emitting layer may be in the range of 440 to 480 nm. Alternatively, the first light emitting layer 140 may be composed of a blue light emitting layer and a red light emitting layer, or may be composed of a blue light emitting layer and a yellow-green light emitting layer, or may be composed of a blue light emitting layer and a green light emitting layer. The light emission area of the blue light emitting layer and the red light emitting layer may be in the range of 440 to 650 nm. The light emission area of the blue light emitting layer and the yellow-green light emitting layer may be in the range of 440 to 590 nm. The light emission area of the blue light emitting layer and the green light emitting layer may be in the range of 440 to 570 nm.

The first light emitting part ST1 comprises a hole injection layer 120 and a first hole transport layer 130 between the anode 110 and the first light emitting layer 140, and a first electron transport layer 150 over the first light emitting layer 140. Accordingly, the first light emitting part ST1 having the hole injection layer 120, the first hole transport layer 130, the first light emitting layer 140, and the first electron transport layer 150 is over the anode 110. The hole injection layer 120 may not be included in the composition of the first light emitting part ST1, depending on the structure or characteristics of the device.

The first charge generation layer 160 is between the first light emitting part ST1 and the second light emitting part ST2. The first charge generation layer 160 is a PN-junction charge generation layer formed by joining an N-type charge generation layer 160N and a P-type charge generation layer 160P. The PN junction charge generation layer 160 generates a charge, or injects the charge, i.e., electrons and holes, separately into the light emitting layers.

The N-type charge generation layer 160N of the first charge generation layer 160 of the present invention includes a compound represented by Chemical Formula 1, like the first to third example embodiments. The compound represented by Chemical Formula 1 according to the present invention has a structure in which linkers and pendants are attached to a phenanthroline core. Accordingly, the nitrogen in the core of the compound is bound to an alkali metal or alkali earth metal in the N-type charge generation layer to form a gap state, the linkers induce enhancement of electron mobility, and the pendants give electron characteristics. Hence, transfer of electrons from the N-type charge generation layer to the electron transport layer can be facilitated by improving the electron characteristics of the N-type charge generation layer. Also, since nitrogen is bound to the alkali metal or alkali earth metal in the N-type charge generation layer, the alkali metal or alkali earth metal is not diffused into the P-type charge generation layer, thus increasing lifetime.

The second light emitting part ST2 having a second light emitting layer 190 is over the first charge generation layer 160. The second light emitting layer 190 may emit light of one among red, green, or blue, and it may be a yellow-green light emitting layer, for example, in this example embodiment. The yellow-green light emitting layer may comprise a yellow-green light emitting layer, a green light emitting layer, a multilayer structure composed of a yellow-green light emitting layer and a green light emitting layer, a multilayer structure composed of a yellow light emitting layer and a red light emitting layer, a multilayer structure composed of a green light emitting layer and a red light emitting layer, or a multilayer structure composed of a yellow-green light emitting layer and a red light emitting layer. The light emission area of the yellow-green light emitting layer may be in the range of 510 to 590 nm. If the second light emitting layer 190 is composed of two light emitting layers: a yellow-green light emitting layer and a red light emitting layer, in order to improve red light emission efficiency, the light emission area of the yellow-green light emitting layer and the red light emitting layer may be in the range of 510 to 650 nm.

The second light emitting part ST2 further comprises a second hole transport layer 180, and a second electron transport layer 200 over the second light emitting layer 190. Accordingly, the second light emitting part ST2 having the second hole transport layer 180, the second light emitting layer 190, and the second electron transport layer 200 is over the first light emitting part ST1.

The second electron transport layer 200 of the present invention includes a compound represented by Chemical Formula 1, like the second example embodiment. The compound represented by Chemical Formula 1 according to the present invention has a structure in which linkers and pendants are attached to a phenanthroline core. Accordingly, the second electron transport layer 200 according to the fourth example embodiment of the present invention has high electron mobility, making electron transport easy.

The second charge generation layer 230 is between the second light emitting part ST2 and the third light emitting part ST3. The second charge generation layer 230 is a PN-junction charge generation layer formed by joining an N-type charge generation layer 230N and a P-type charge generation layer 230P. The PN junction charge generation layer 230 generates a charge, or injects the charge, i.e., electrons and holes, separately into the light emitting layers.

The N-type charge generation layer 230N of the second charge generation layer 230 of the present invention includes a compound represented by Chemical Formula 1, like the N-type charge generation layer 160N of the first charge generation layer 160. The compound represented by Chemical Formula 1 according to the present invention has a structure in which linkers and pendants are attached to a phenanthroline core. Accordingly, the nitrogen in the core of the compound is bound to a dopant to form a gap state, the linkers induce enhancement of electron mobility, and the pendants give electron characteristics. Hence, transfer of electrons from the N-type charge generation layer to the electron transport layer can be facilitated by improving the electron characteristics of the N-type charge generation layer.

The third light emitting part ST3 having a third light emitting layer 250 is over the second light emitting part ST2. The third light emitting layer 250 may emit light of one among red, green, or blue: for example, it may be a blue light emitting layer in this example embodiment. The blue light emitting layer comprises one among a blue light emitting layer, a dark blue light emitting layer, or a sky blue light emitting layer. Alternatively, the third light emitting layer 250 may be composed of a blue light emitting layer and a red light emitting layer, or may be composed of a blue light emitting layer and a yellow-green light emitting layer, or may be composed of a blue light emitting layer and a green light emitting layer.

The third light emitting part ST3 comprises a third hole transport layer 240, and a third electron transport layer 260 and a hole injection layer 210 that are over the third light emitting layer 250. Accordingly, the third light emitting part ST3 having the third hole transport layer 240, the third light emitting layer 250, the third electron transport layer 260, and the electron injection layer 210 is over the second light emitting part ST2. A cathode 220 is over the third light emitting part ST3 to constitute the organic light emitting display device according to the fourth example embodiment of the present invention.

Although the fourth example embodiment of the present invention has been described with an example where the N-type charge generation layer 160N of the first charge generation layer 160 and the N-type charge generation layer 230N of the second charge generation layer 230 are formed of a compound of the present invention, the present invention is not limited to this example and at least one among the following—the first electron transport layer 150, the N-type charge generation layer 160N of the first charge generation layer 160, the N-type charge generation layer 230N of the second charge generation layer 230, and the third electron transport layer 260—may include the compound of the present invention.

As discussed above, a compound having a nitrogen atom of the present invention is rich in electrons by having two nitrogen atoms, which results in high electron mobility, making electron transport easy. Accordingly, the organic light emitting display device of the present invention allows for efficient transfer of electrons from the N-type charge generation layer to the light emitting layer, by using this compound for at least one among the electron transport layers in the light emitting parts.

Moreover, the compound having the nitrogen-atom of the present invention includes nitrogen (N) of $sp^2$ hybrid orbital which is relatively electron-rich, and the nitrogen is bound to an alkali metal or alkali earth metal, a dopant for the N-type charge generation layer, thereby forming a gap state. This gap state may facilitate transfer of electrons from the N-type charge generation layer to the electron transport layer. Accordingly, the organic light emitting display device of the present invention facilitates transfer of electrons from the N-type charge generation layer to the electron transport layer, by using this compound of the present invention for the N-type charge generation layer. Also, since nitrogen is bound to the alkali metal or alkali earth metal in the N-type charge generation layer, the alkali metal or alkali earth metal is not diffused into the P-type charge generation layer, thus increasing lifetime.

Accordingly, the organic light emitting display device of the present invention allows for efficient transfer of electrons from the N-type charge generation layer to the light emitting layer and therefore improves device efficiency and device performance, by using the compound having the nitrogen-atom for at least one among the following—the electron transport layers and N-type charge generation layers in the light emitting parts. Also, the facilitated transfer of electrons from the N-type charge generation layer to the electron transport layer helps reduce the low lifetime problem caused by poor electron injection. Moreover, it can also reduce the problem of operating voltage rise caused by the difference in LUMO energy level between the electron transport layer and the N-type charge generation layer when the electrons injected into the N-type charge generation layer move to the electron transport layer.

Figure 3:
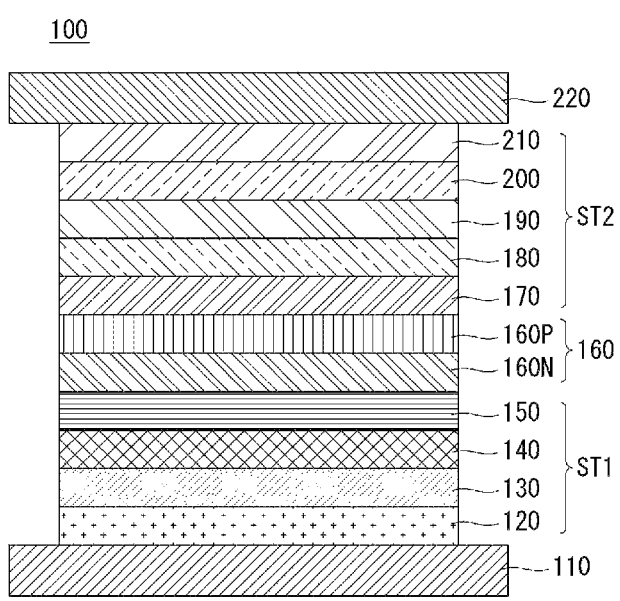
FIG. 3 is a view showing an organic light emitting display device according to a fifth example embodiment of the present invention.

FIG. 3 is a view showing an organic light emitting display device according to a fifth example embodiment of the present invention. The same elements as the first to fourth example embodiments are denoted by the same reference numerals, so descriptions of these elements will be given briefly.

With reference to FIG. 3, an organic light emitting display device 100 of the present invention comprises light emitting parts ST1 and ST2 between an anode 110 and a cathode 220, and a charge generation layer 160 between the light emitting parts ST1 and ST2.

The first light emitting part ST1 comprises a first hole injection layer 120, a first hole transport layer 130, a blue light emitting layer, and a first electron transport layer 150.

The first electron transport layer 200 serves to facilitate electron transport, and may affect the lifetime or efficiency of the organic light emitting display device. Thus, the present inventors conducted several tests or experiments to improve the electron injection characteristics of the electron transport layer. Through a number of tests using a combination of the electron transport layer and the charge generation layer which were performed on materials that do not affect the lifetime, efficiency, or operating voltage of the organic light emitting device, a phenanthroline compound was chosen for the electron transport layer. The phenanthroline compound comprises a p-terphenyl derivative. The phenanthroline compound makes charge transport easy through an aromatic ring in the molecule. Especially, the phenanthroline compound has a phenanthroline ring having electron-rich nitrogen (N), which facilitates transport of electrons to the light emitting layers. Also, a triphenyl derivative is linked to a phenanthroline derivative, facilitating the movement of electrons from an adjacent N-type charge generation layer to the light emitting layer.

Accordingly, the first electron transport layer 150 includes a compound represented by Chemical Formula 1. The compound represented by Chemical Formula 1 is an electron transport compound represented by any one among the following Chemical Formulas 6 to 13. The electron transport compound includes a phenanthroline derivative and a triphenyl derivative.

[Chemical Formula 6]

[Chemical Formula 7]

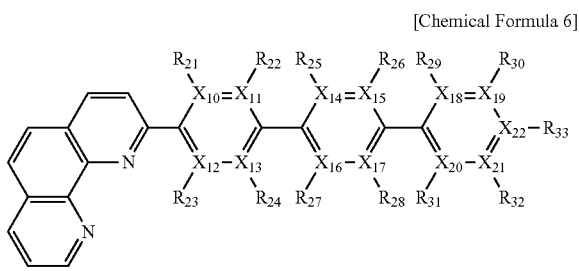

[Chemical Formula 8]

[Chemical Formula 9]

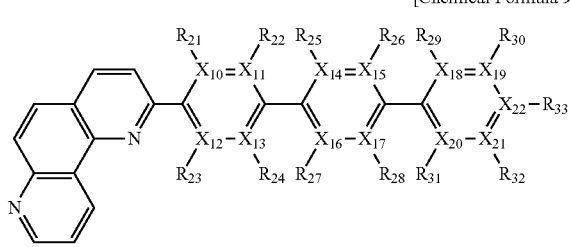

where $R_{21}$ and $R_{33}$ are independently one among hydrogen, a substituted or unsubstituted aryl group having 6 to 60 carbon atoms, a substituted or unsubstituted hetero aryl group having 4 to 60 carbon atoms, an alkyl group having 1 to 10 carbon atoms, or an alkoxy group having 1 to 10 carbon atoms, at least one among the pairs $R_{21}$ and $R_{22}$, $R_{23}$ and $R_{24}$, $R_{25}$ and $R_{26}$, $R_{27}$ and $R_{28}$, $R_{29}$ and $R_{30}$, and $R_{31}$ and $R_{32}$ may bond together to form a ring, and $X_{10}$ to $X_{22}$ are independently C or N.

[Chemical Formula 10]

[Chemical Formula 11]

[Chemical Formula 12]

[Chemical Formula 13]

where $R_{21}$ and $R_{33}$ are independently one among hydrogen, a substituted or unsubstituted aryl group having 6 to 60 carbon atoms, a substituted or unsubstituted hetero aryl group having 4 to 60 carbon atoms, an alkyl group having 1 to 10 carbon atoms, or an alkoxy group having 1 to 10 carbon atoms, at least one among the pairs $R_{21}$ and $R_{22}$, $R_{23}$ and $R_{24}$, $R_{25}$ and $R_{26}$, $R_{28}$ and $R_{29}$, $R_{27}$ and $R_{31}$, $R_{29}$ and $R_{30}$, $R_{31}$ and $R_{32}$, $R_{32}$ and $R_{33}$, and $R_{30}$ and $R_{33}$ may bond together to form a ring, and $X_{10}$ to $X_{22}$ are independently C or N.

More specifically, electron transport compounds represented by Chemical Formulas 6 to 9 have a molecular weight of 400 or greater, and may be one among the compounds represented by the following Chemical Formulas 16 to 19:

[Chemical Formula 16]

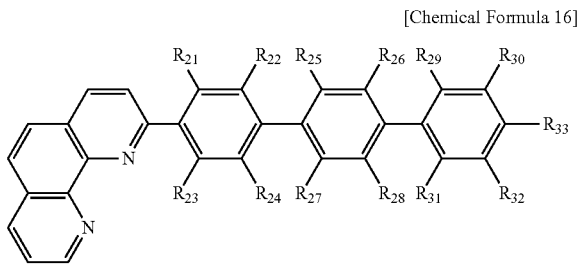

[Chemical Formula 17]

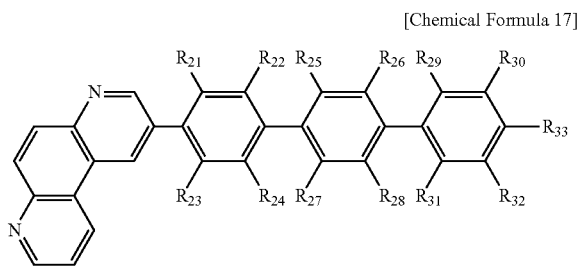

[Chemical Formula 18]

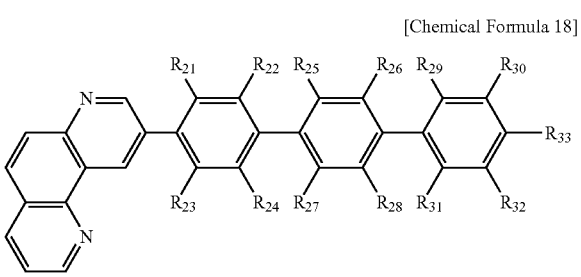

[Chemical Formula 19]

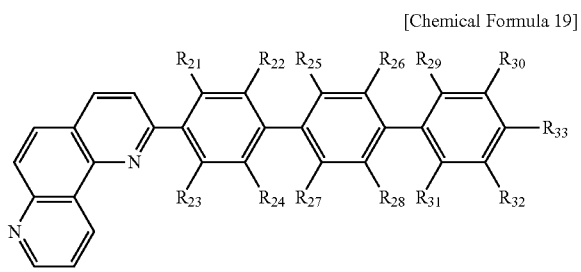

where $R_{21}$ and $R_{33}$ are independently one among hydrogen, a substituted or unsubstituted aryl group having 6 to 60 carbon atoms, a substituted or unsubstituted hetero aryl group having 4 to 60 carbon atoms, an alkyl group having 1 to 10 carbon atoms, or an alkoxy group having 1 to 10 carbon atoms, and at least one among the pairs $R_{21}$ and $R_{22}$, $R_{23}$ and $R_{24}$, $R_{25}$ and $R_{26}$, $R_{27}$ and $R_{28}$, $R_{29}$ and $R_{30}$, and $R_{31}$ and $R_{32}$ may bond together to form a ring.

Also, electron transport compounds represented by Chemical Formulas 10 to 13 may be one among the compounds represented by the following Chemical Formulas 20 to 23:

[Chemical Formula 20]

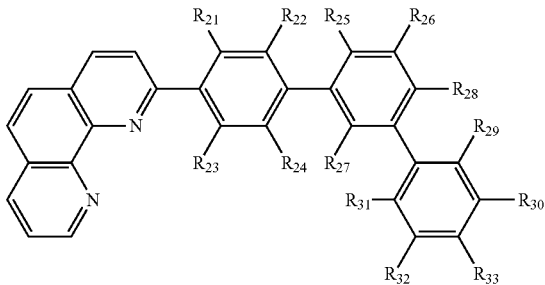

[Chemical Formula 21]

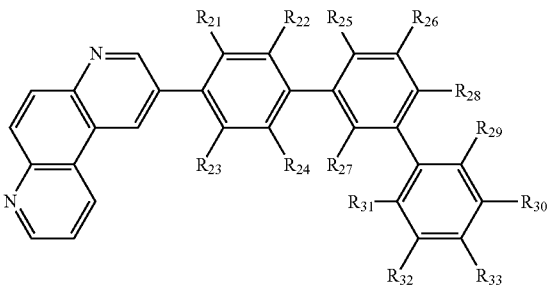

[Chemical Formula 22]

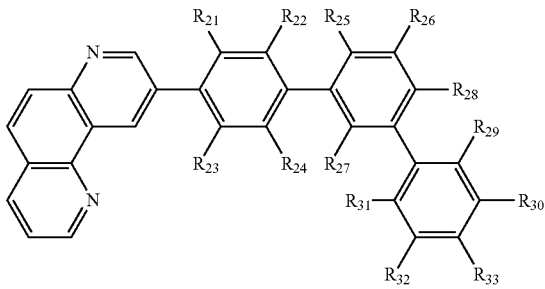

[Chemical Formula 23]

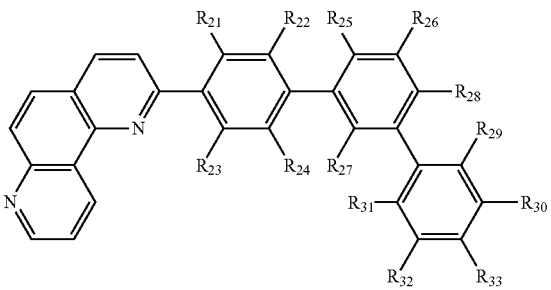

where $R_{21}$ and $R_{33}$ are independently one among hydrogen, a substituted or unsubstituted aryl group having 6 to 60 carbon atoms, a substituted or unsubstituted hetero aryl group having 4 to 60 carbon atoms, an alkyl group having 1 to 10 carbon atoms, or an alkoxy group having 1 to 10 carbon atoms, and at least one among the pairs $R_{21}$ and $R_{22}$, $R_{23}$ and $R_{24}$, $R_{25}$ and $R_{26}$, $R_{28}$ and $R_{29}$, $R_{27}$ and $R_{31}$, $R_{29}$ and $R_{30}$, $R_{31}$ and $R_{32}$, $R_{32}$ and $R_{33}$, and $R_{30}$ and $R_{33}$ may bond together to form a ring.

The above electron transport compounds may be one among the following compounds:

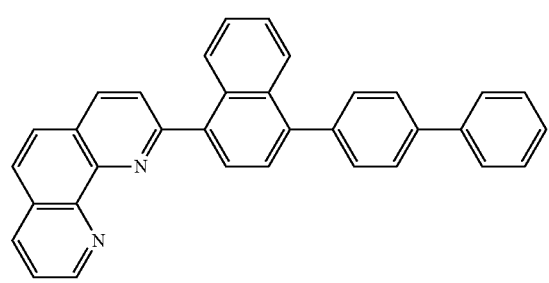
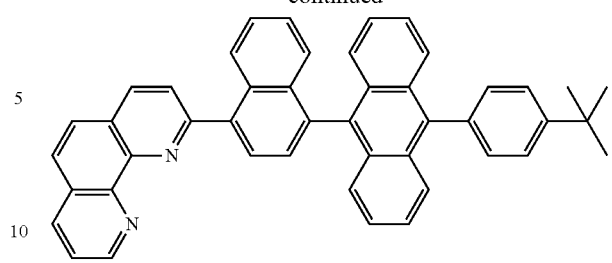
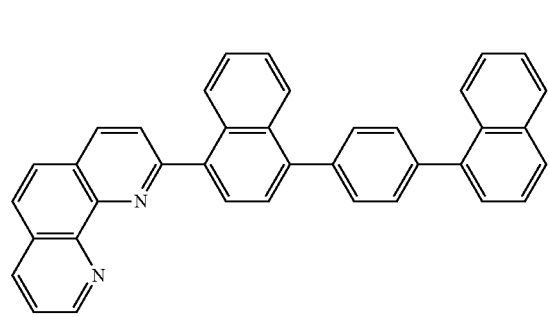
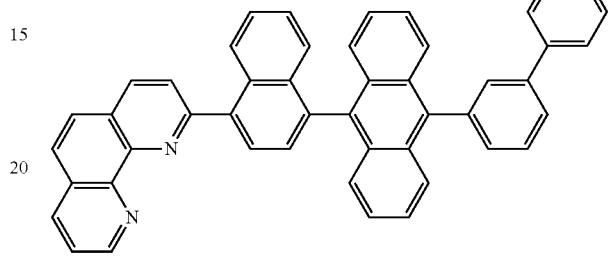
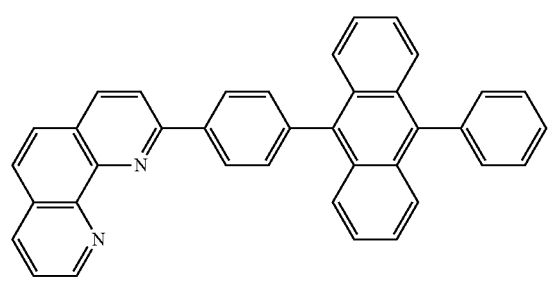
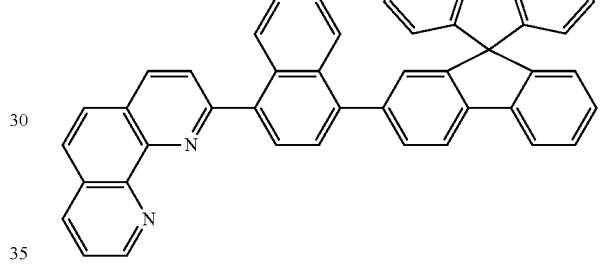
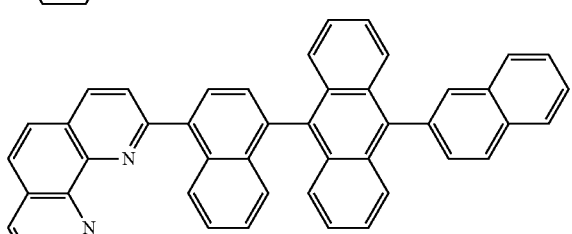
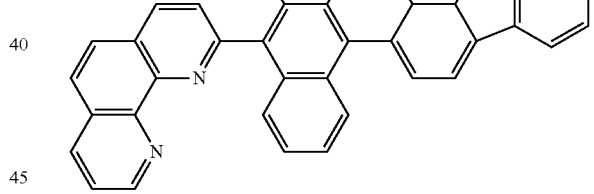
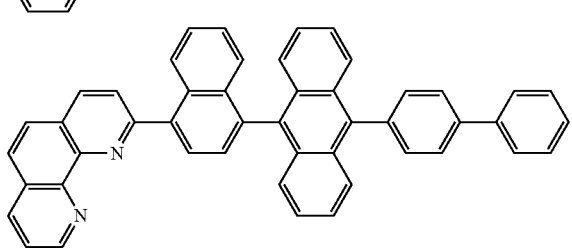
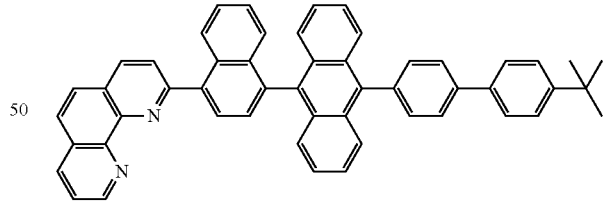
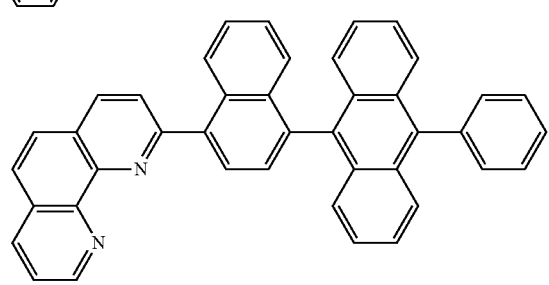
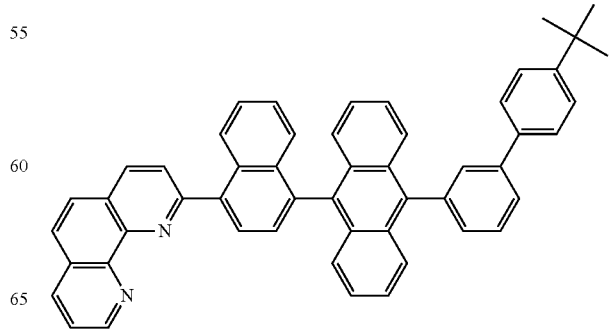

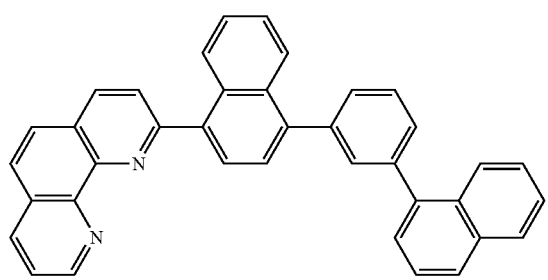
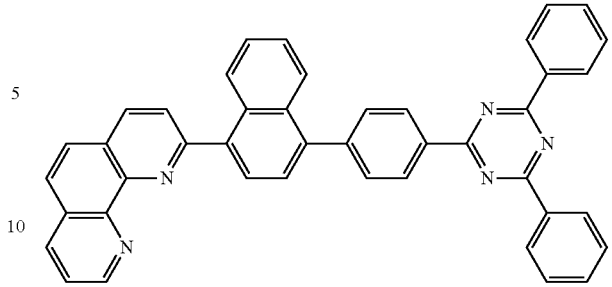
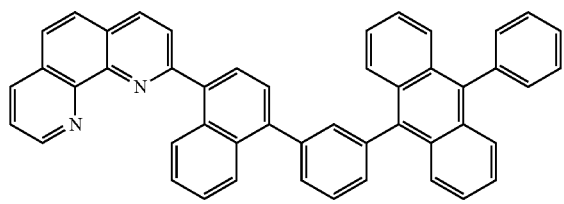
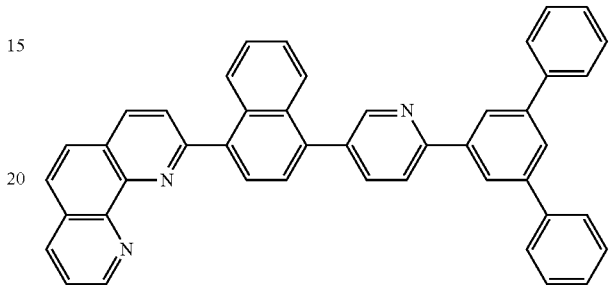
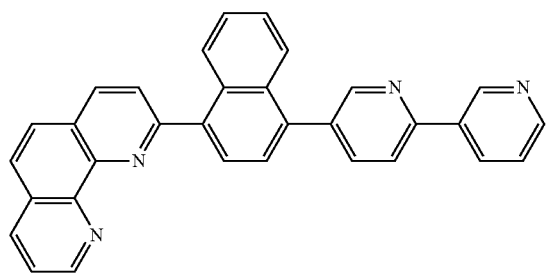

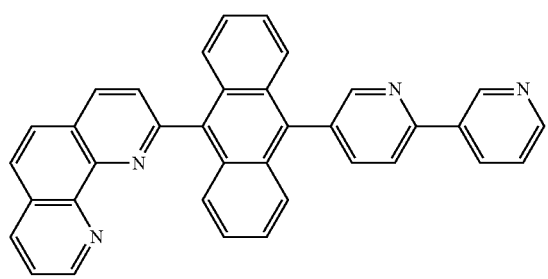

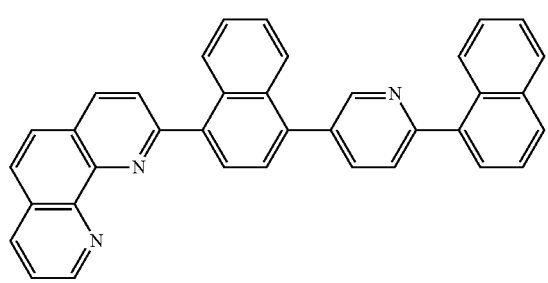

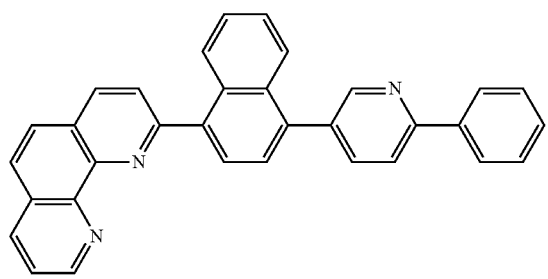

The charge generation layer (CGL) 160 is over the first light emitting part ST1. The first light emitting part ST1 and the second light emitting part ST2 are connected by the charge generation layer 160. The charge generation layer 160 may be a PN-junction charge generation layer formed by joining an N-type charge generation layer 160N and a P-type charge generation layer 160P. The PN junction charge generation layer 160 generates a charge, or injects the charge, i.e., electrons and holes, separately into the light emitting layers. That is, the N-type charge generation layer 160N supplies electrons to the first electron transport layer 150 adjacent to the anode, and the P-type charge generation layer 160P supplies holes to the light emitting layer of the second light emitting part ST2. As such, the organic light emitting display device with a plurality of emitting layers may achieve much higher emission efficiency and reduce operating voltage. Accordingly, the charge generation layer 160 has a major effect on the organic light emitting display device's characteristics, i.e., emission efficiency and operating voltage.

Thus, the present inventors conducted several tests to improve the electron injection characteristics of the charge generation layer. Through a number of tests, an anthracene compound and a pyrene compound were chosen as a host in the charge generation layer. The anthracene compound and the pyrene compound each comprises a carboline derivative. The pyrene compound and the anthracene compound includes nitrogen (N) of $sp^2$ hybrid orbital in the carboline derivative which is relatively electron-rich, and the nitrogen is bound to an alkali metal or alkali earth metal, a dopant for the N-type charge generation layer, thereby forming a gap state. This gap state may facilitate transfer of electrons from the P-type charge generation layer to the N-type charge generation layer.

Accordingly, the N-type charge generation layer 160N includes a host and a dopant, and the host may be formed of charge generation compounds represented by the following Chemical Formulas 14 and 15:

[Chemical Formula 14]

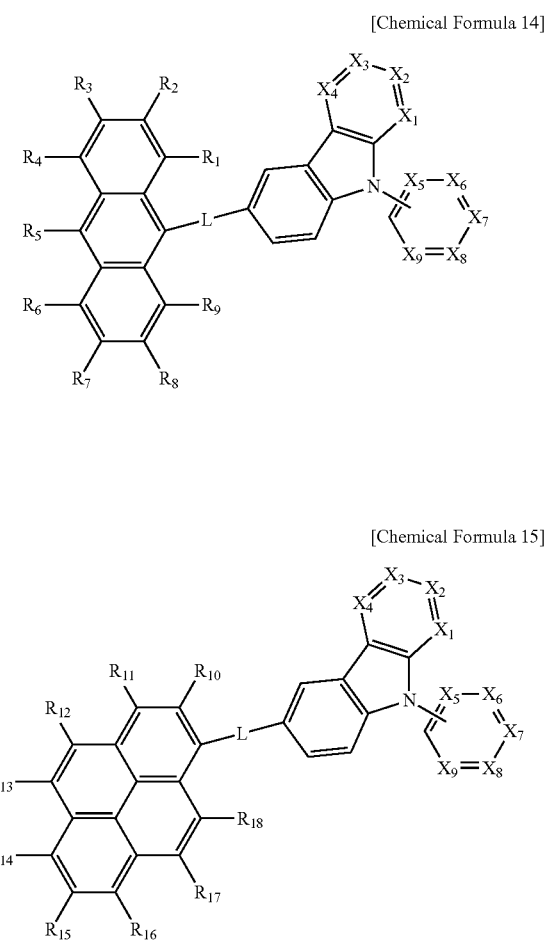

[Chemical Formula 15]

[Chemical Formula 24]

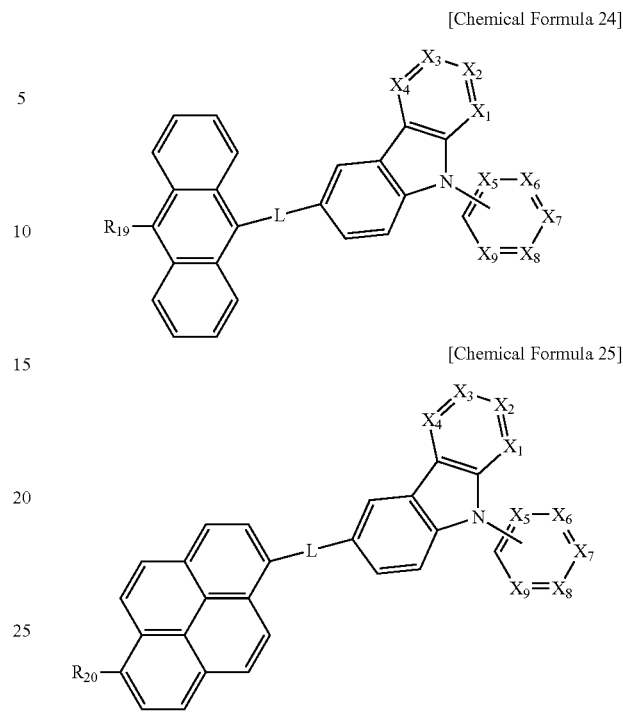

[Chemical Formula 25]

where at least one among $X_1$ to $X_4$ and at least one among $X_5$ to $X_9$ comprises at least one among S, O, N, and Si, L is one among a single bond, a substituted or unsubstituted arylene group having 6 to 20 carbon atoms, and a substituted or unsubstituted hetero arylene group having 4 to 20 carbon atoms. $R_{19}$ in Chemical Formula 24 is independently one among hydrogen, a substituted or unsubstituted aryl group having 6 to 60 carbon atoms, a substituted or unsubstituted hetero aryl group having 4 to 60 carbon atoms, an alkyl group having 1 to 10 carbon atoms, or an alkoxy group having 1 to 10 carbon atoms, and $R_{20}$ in Chemical Formula 25 is independently one among hydrogen, a substituted or unsubstituted aryl group including 6 to 60 carbon atoms, a substituted or unsubstituted hetero aryl group including 4 to 60 carbon atoms, an alkyl group including 1 to 10 carbon atoms, or an alkoxy group including 1 to 10 carbon atoms.

A charge generation compound for the N-type charge generation layer 160N may be one among the following compounds.

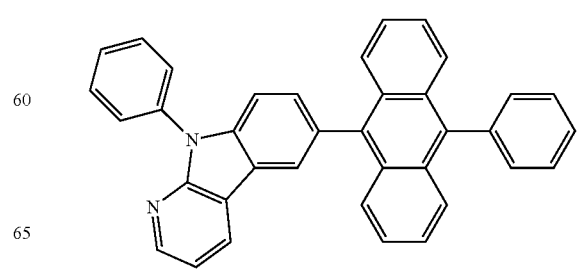

where at least one among $X_1$ to $X_4$ and at least one among $X_5$ to $X_9$ comprises at least one among S, O, N, and Si, L is one among a single bond, a substituted or unsubstituted arylene group having 6 to 20 carbon atoms, and a substituted or unsubstituted hetero arylene group having 4 to 20 carbon atoms. $R_2$ to $R_9$ in Chemical Formula 14 are independently one among hydrogen, a substituted or unsubstituted aryl group having 6 to 60 carbon atoms, a substituted or unsubstituted hetero aryl group having 6 to 60 carbon atoms, an alkyl group having 1 to 10 carbon atoms, or an alkoxy group having 1 to 10 carbon atoms, and $R_{10}$ to $R_{18}$ in Chemical Formula 15 are independently one among hydrogen, a substituted or unsubstituted aryl group having 6 to 60 carbon atoms, a substituted or unsubstituted hetero aryl group having 6 to 60 carbon atoms, an alkyl group having 1 to 10 carbon atoms, or an alkoxy group having 1 to 10 carbon atoms.

The charge generation compounds represented by Chemical Formulas 14 and 15 may be represented by the following Chemical Formulas 24 and 25.

101
-continued
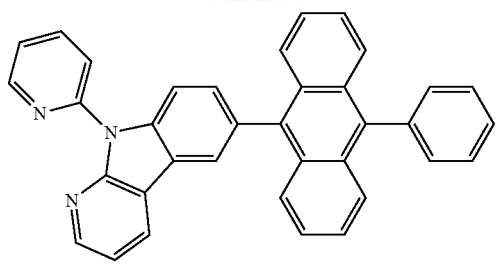
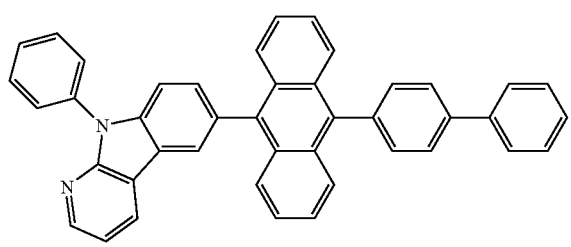
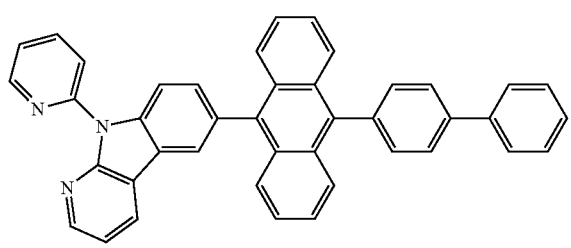
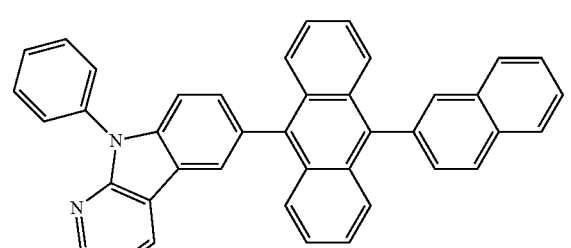
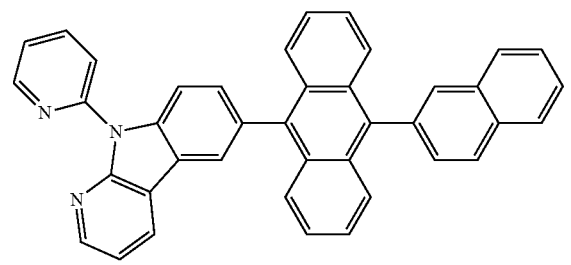
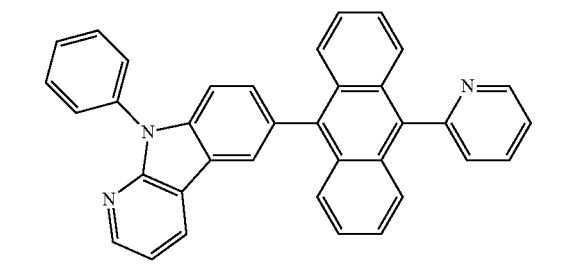
102
-continued
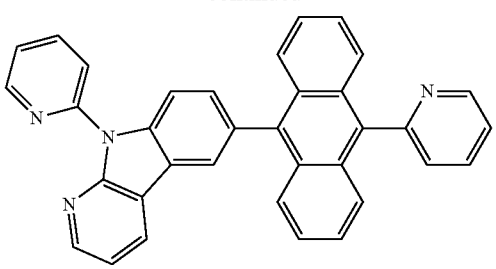
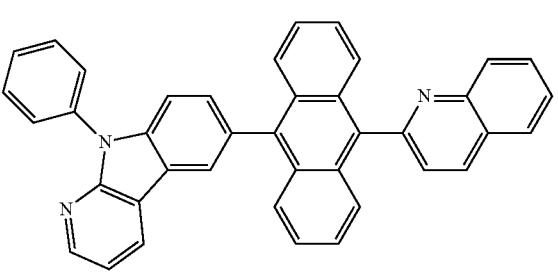
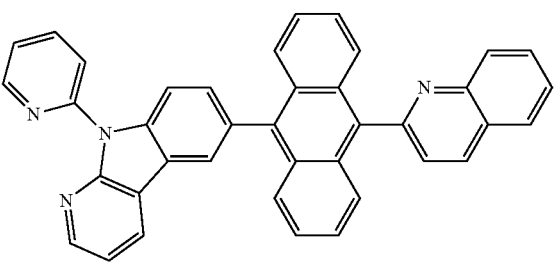
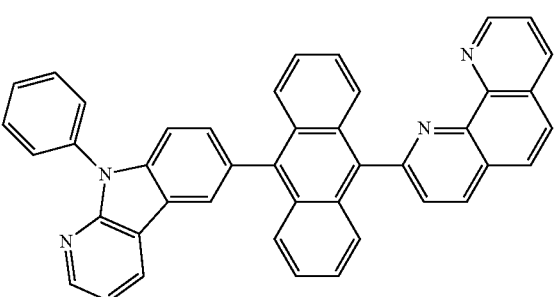
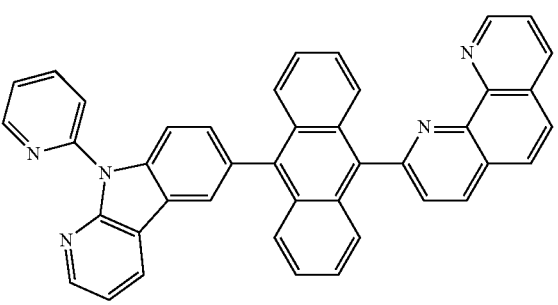
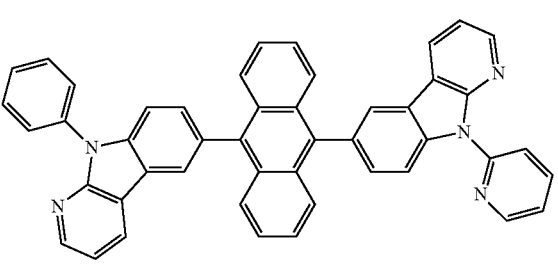

103
-continued
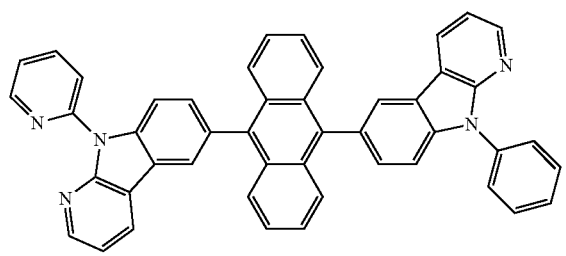
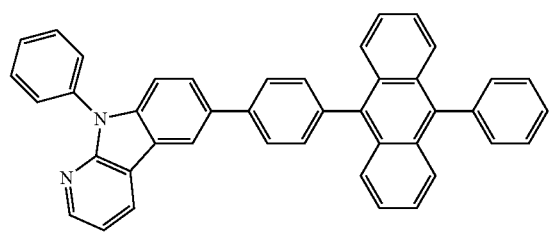
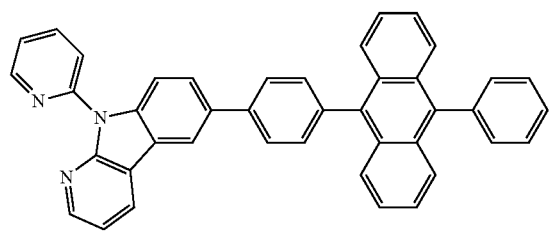
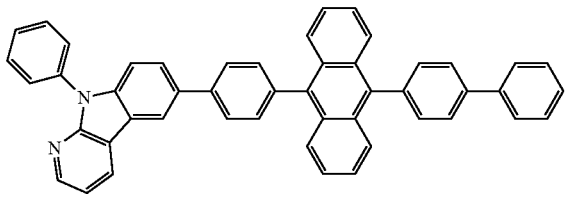
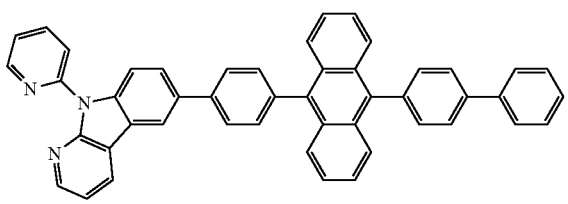
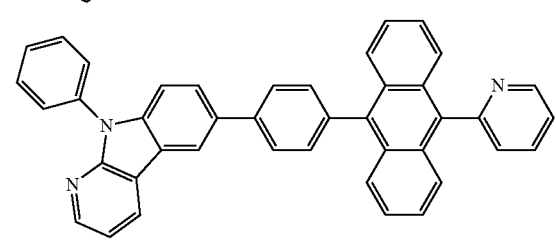
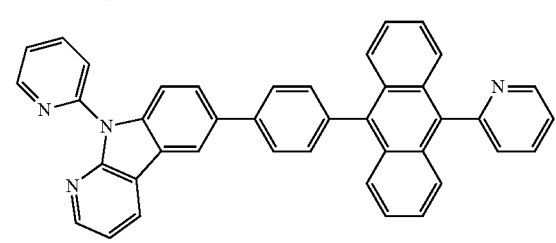
104
-continued
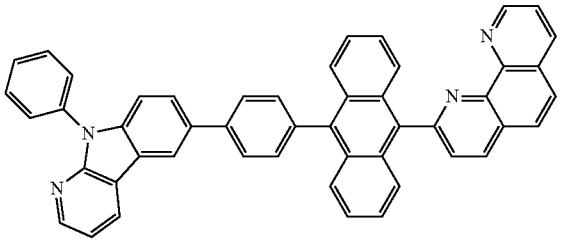
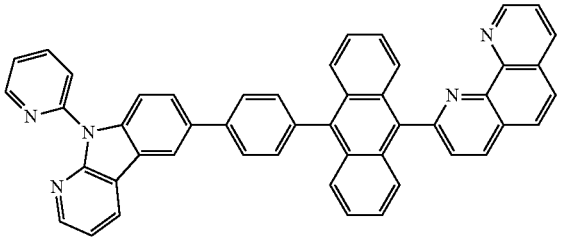
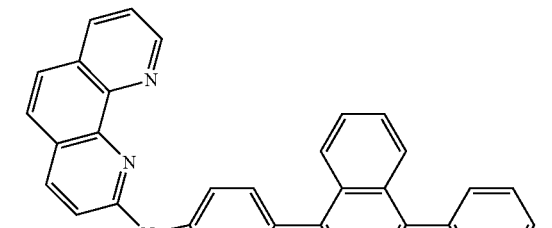
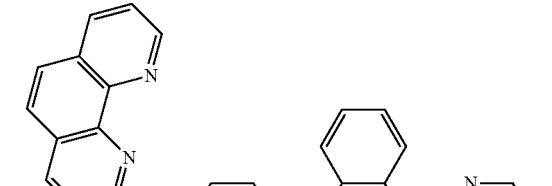
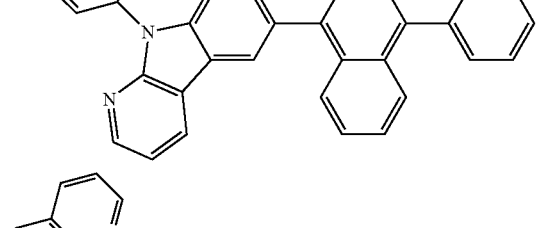
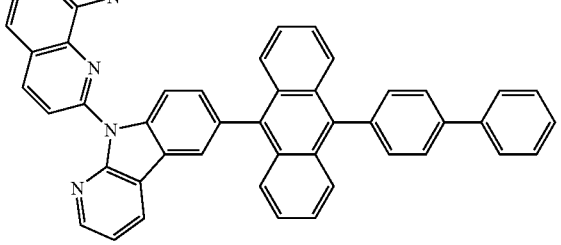

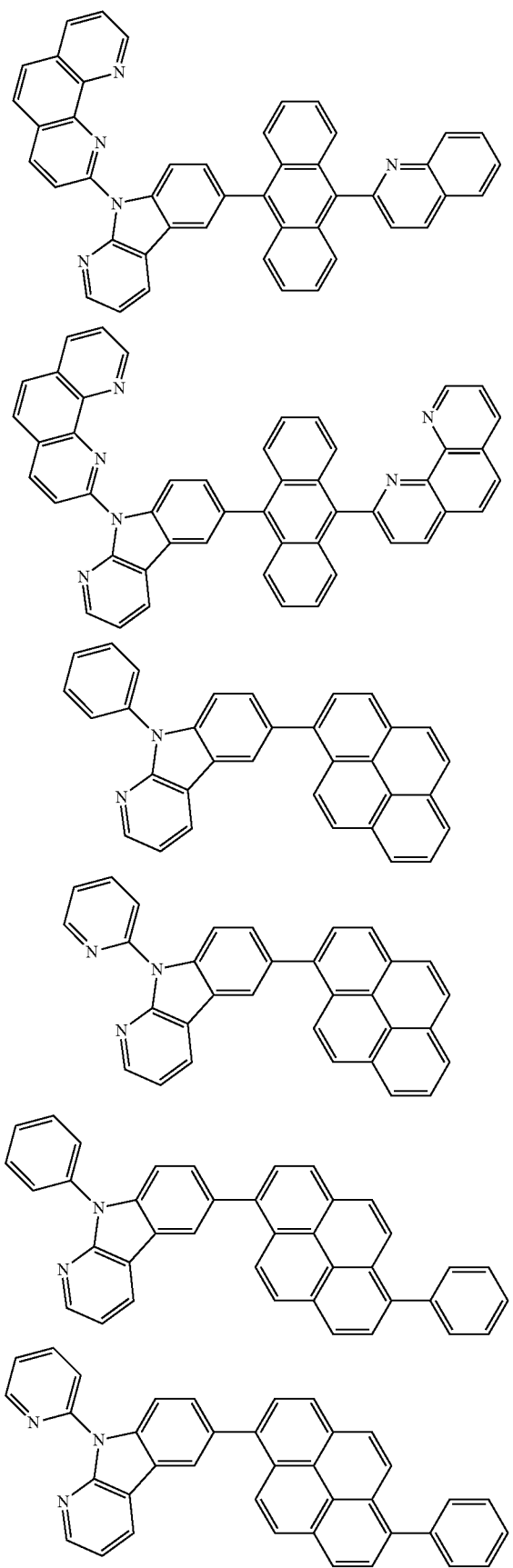
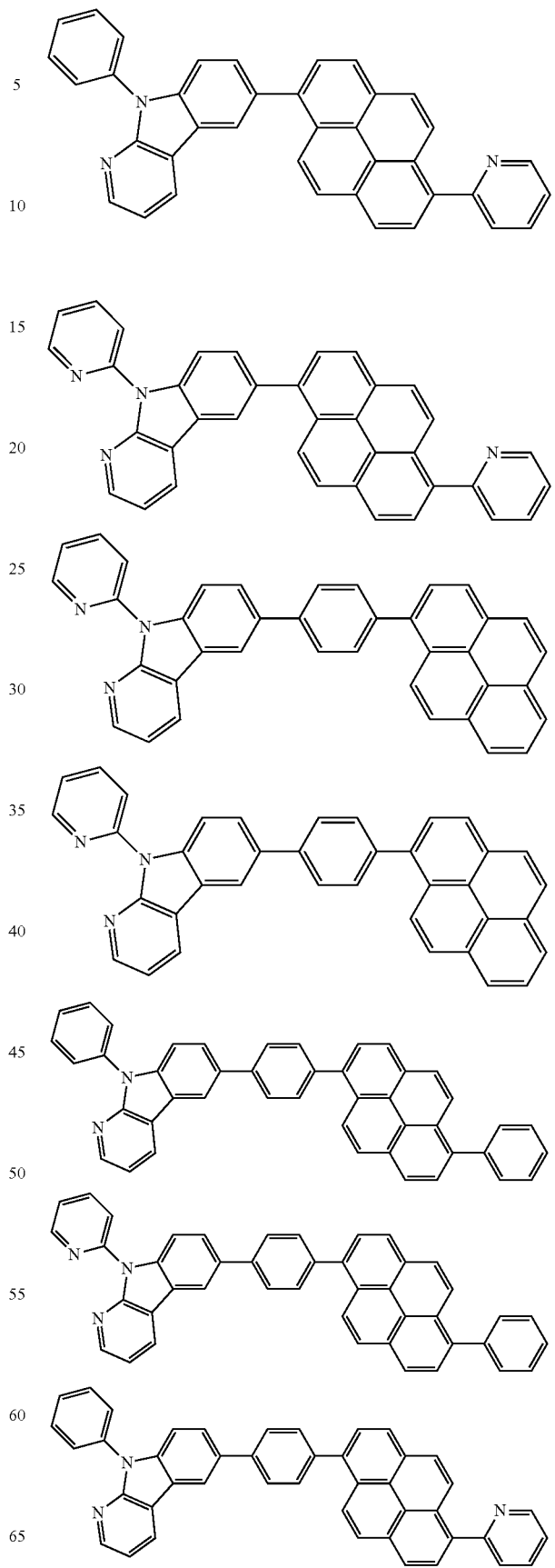

-continued

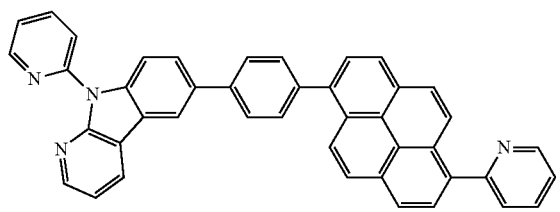
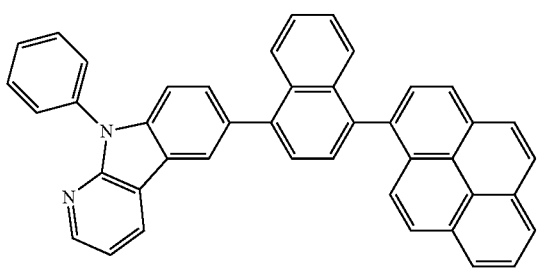
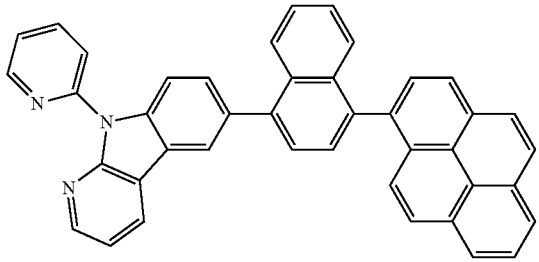
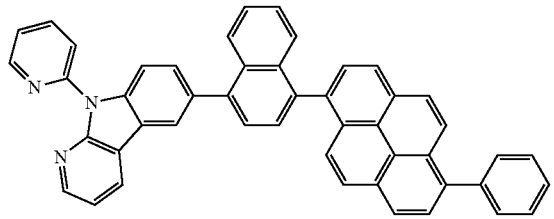
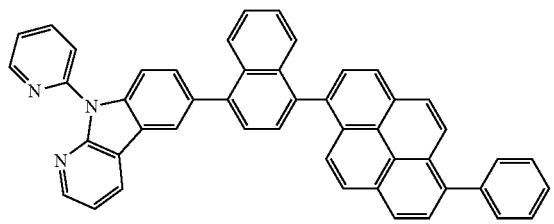
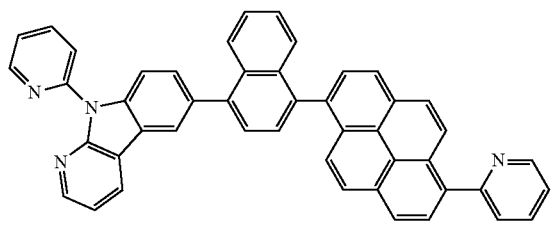
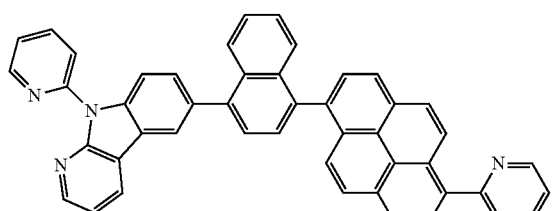

-continued

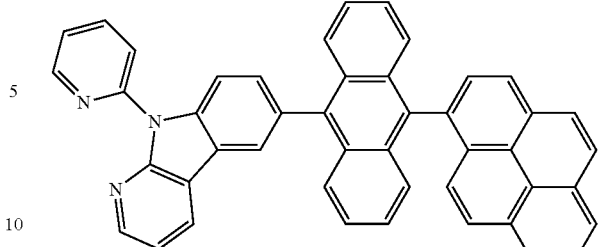
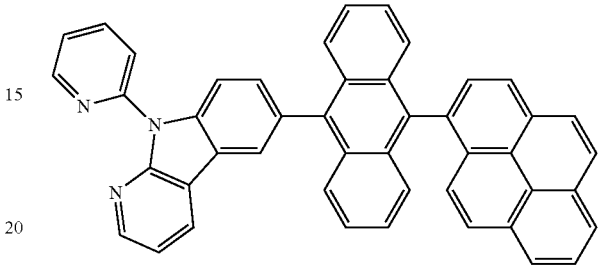
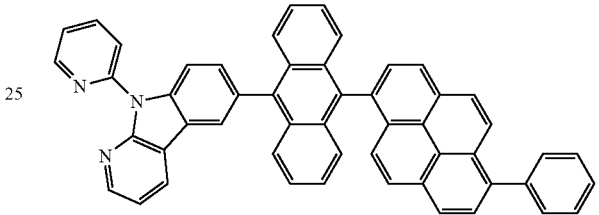
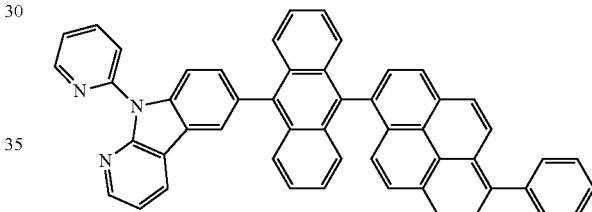
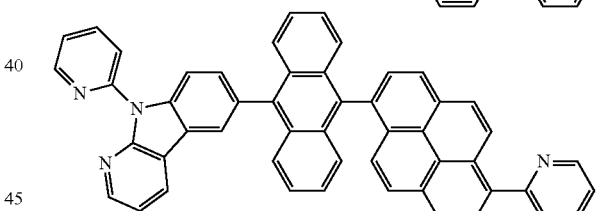
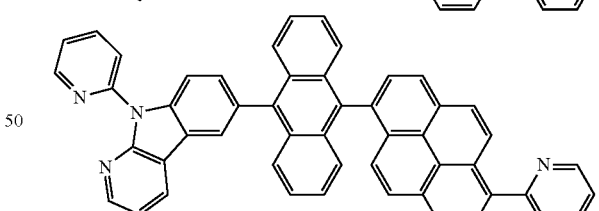

The N-type charge generation layer 160N includes a dopant. The dopant may be an alkali metal, an alkali metal compound, an alkali earth metal, or an alkali earth metal compound. Specifically, the N-type dopant may be one or more among Li, Cs, K, Rb, Mg, Na, Ca, Sr, Eu, and Yb. The percentage of the dopant to be mixed is between 1 and 8% relative to 100% for the host. The dopant may have a work function of 2.5 eV or higher.

The second light emitting part ST2 having the second hole injection layer 170, the second hole transport layer 180, the yellow light emitting layer 190, the second electron transport layer 200, and the electron injection layer 210 over the charge generation layer 160. The second hole injection layer 170, the second hole transport layer 180, and the second electron transport layer 200 may have the same composition as the first hole injection layer 120, first hole transport layer 130, and first electron transport layer 150 of the first light emitting part ST1, respectively, or have a different composition from those of the first hole injection layer 120, first hole transport layer 130, and first electron transport layer 150.

The second electron transport layer 200 may have the same composition as the first electron transport layer 150 or have a different composition from that of the first electron transport layer 150. If the second electron transport layer 200 has a different composition from that of the first electron transport layer 150, the second electron transport layer 200 may be formed of, but are not limited to, one or more among Alq$_3$(tris(8-hydroxyquinolinato)aluminum), PBD(2-(4-biphenyl)-5-(4-tert-butylphenyl)-1,3,4-oxadiazole), TAZ(3-(4-biphenyl)-4-pheynyl-5-tert-butylphenyl-1,2,4-triazole), and BAlq(Bis(2-methyl-8-quinolinolate)-4-(phenylphenolato)aluminum). The second electron transport layer 200 may be 1 to 150 nm thickness. If the second electron transport layer 200 is 1 nm thickness or greater, the electron transport characteristics may be improved, or if the first electron transport layer 200 is 150 nm thickness or less, an increase in the thickness of the first electron transport layer 200 may be prevented and a rise in operating voltage may be therefore prevented.

As discussed above, the present invention facilitates transfer of electrons from the N-type charge generation layer to the electron transport layer and the light emitting layer by using a phenanthroline compound for at least one among the electron transport layers included in the light emitting parts and an anthracene or pyrene compound for the N-type charge generation layer.

Moreover, the electron transport layer includes a phenanthroline compound, and the phenanthroline compound has a phenanthroline ring having nitrogen, which facilitates transport of electrons to the light emitting layers. Also, a triphenyl derivative is linked to a phenanthroline derivative, facilitating the movement of electrons from the N-type charge generation layer to the light emitting layer.

In addition, by using a pyrene compound or anthracene compound having a carboline derivative for the N-type charge generation layer, nitrogen (N) of sp$^2$ hybrid orbital in the carboline derivative which is relatively electron-rich is bound to an alkali metal or alkali earth metal in the N-type charge generation layer, thereby forming a gap state. This gap state may facilitate transfer of electrons from the P-type charge generation layer to the N-type charge generation layer.

Figure 4:
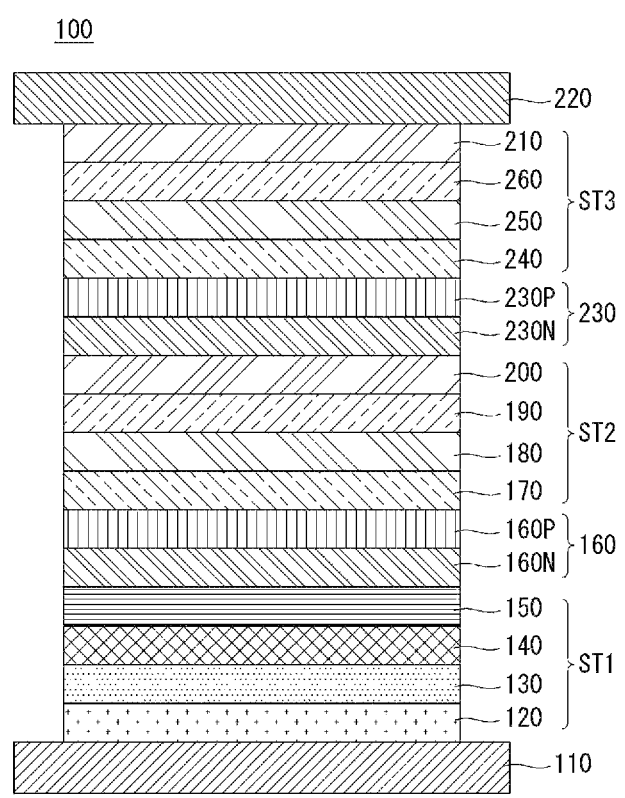
FIG. 4 is a view showing an organic light emitting display device according to a sixth example embodiment of the present invention.

FIG. 4 is a view showing organic light emitting display devices according to a sixth example embodiment of the present invention. The same elements as the first to fifth example embodiments are denoted by the same reference numerals, so descriptions of these elements will be omitted.

With reference to FIG. 4, an organic light emitting display device 100 of the present invention comprises a plurality of light emitting parts ST1, ST2, and ST3 between an anode 110 and a cathode 220, and a first charge generation layer 160 and a second charge generation layer 230 between the light emitting parts ST1, ST2, and ST3. Although this example embodiment has been illustrated and described with an example where three light emitting parts are between the anode 110 and the cathode 220, the present invention is not limited to this example and four or more light emitting parts may be between the anode 110 and the cathode 220.

More specifically, the first light emitting part ST1 comprises a first hole injection layer 120, a first hole transport layer 130, a first light emitting layer 140, and a first electron transport layer 150. The first light emitting layer 140 may be a blue light emitting layer. The first hole injection layer 120 and the first hole transport layer 130 may not be included in the composition of the first light emitting part ST1, depending on the structure or characteristics of the device.

The first electron transport layer 150 includes a phenanthroline compound, like in the fifth example embodiment, and the phenanthroline compound makes charge transport easy through an aromatic ring in the molecule. Especially, the phenanthroline compound has a phenanthroline ring having electron-rich nitrogen (N), which facilitates transport of electrons to the light emitting layers. Also, a triphenyl derivative is linked to a phenanthroline derivative, facilitating the movement of electrons from the N-type charge generation layer to the light emitting layer.

The first charge generation layer 160 having an N-type charge generation layer 160N and a P-type charge generation layer 160P is over the first light emitting part ST1. The N-type charge generation layer 160N includes a pyrene compound or an anthracene compound. By using a pyrene compound or anthracene compound having a carboline derivative for the N-type charge generation layer 160N, nitrogen (N) of sp$^2$ hybrid orbital in the carboline derivative which is relatively electron-rich is bound to an alkali metal or alkali earth metal in the N-type charge generation layer, thereby forming a gap state. This gap state may facilitate transfer of electrons from the P-type charge generation layer to the N-type charge generation layer. Accordingly, electrons can be moved fast to the first light emitting layer 140, thus improving electron injection and reducing operating voltage. The P-type charge generation layer 160P has the same composition as the fifth example embodiment.

The second light emitting part ST2 having the second light emitting part 190 is over the first charge generation layer 160. The second light emitting part ST2 comprises a second hole injection layer 170, a second hole transport layer 180, a second light emitting layer 190, and a second electron transport layer 200. The second electron transport layer 200 has the same composition as the first electron transport layer 150, so its description will be omitted.

The second charge generation layer 230 having an N-type charge generation layer 230N and a P-type charge generation layer 230P is over the second light emitting part ST2. The N-type charge generation layer 230N has the same composition as the N-type charge generation layer 160N of the first charge generation layer 160, so its description will be omitted. Also, the P-type charge generation layer 230P has the same composition as the P-type charge generation layer 160P of the first charge generation layer 160.

The third light emitting part ST3 having a third light emitting layer 250 is over the second charge generation layer 230. The third light emitting part ST3 comprises a third hole transport layer 240, a third light emitting layer 250, a third electron transport layer 260, and an electron injection layer 210. The third electron transport layer 260 has the same composition as the first electron transport layer 150 and the second electron transport layer 200, so its description will be omitted. The cathode 220 is formed over the third light emitting part ST3 to constitute the organic light emitting display device according to the sixth example embodiment of the present invention.

Although the sixth example embodiment of the present invention has been described with an example where the first electron transport layer 150, the second electron transport layer 200, and the third electron transport layer 260 all have the same composition, the present invention is not limited to this example and at least one among the first, second, and third electron transport layer 150, 200, and 260 includes a phenanthroline compound. The phenanthroline compound makes charge transport easy through an aromatic ring in the molecule. Especially, the phenanthroline compound has a phenanthroline ring having electron-rich nitrogen (N), which facilitates transport of electrons to the light emitting layers. Also, a triphenyl derivative is linked to a phenanthroline derivative, facilitating the movement of electrons from an adjacent N-type charge generation layer to the light emitting layer.

Although the sixth example embodiment of the present invention has been described with an example where the N-type charge generation layer 160N of the first charge generation layer 160 and the N-type charge generation layer 230N of the second charge generation layer 230 both have the same composition, the present invention is not limited to this example and at least one among the N-type charge generation layer 160N of the first charge generation layer 160 or the N-type charge generation layer 230N of the second charge generation layer 230 includes an anthracene compound or pyrene compound having a carboline derivative. The pyrene compound and the anthracene compound includes nitrogen (N) of sp² hybrid orbital in the carboline derivative which is relatively electron-rich, and the nitrogen is bound to an alkali metal or alkali earth metal, a dopant for the N-type charge generation layer, thereby forming a gap state. This gap state may facilitate transfer of electrons from the P-type charge generation layer to the N-type charge generation layer.

Figure 5:
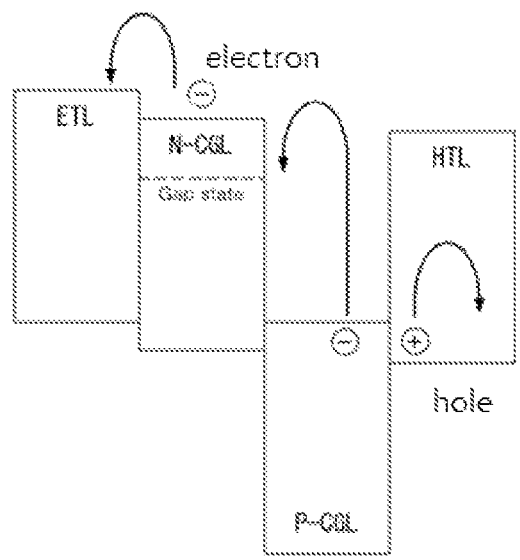
FIG. 5 is an energy band diagram of organic light emitting display devices according to the present invention.

FIG. 5 is an energy band diagram of the organic light emitting display devices according to the fifth and sixth example embodiments of the present invention.

With reference to FIG. 5, an organic light emitting display device of the present invention comprises a hole transport layer HTL, a P-type charge generation layer P-CGL, an N-type charge generation layer N-CGL, and an electron transport layer ETL. The N-type charge generation layer N-CGL supplies electrons to the electron transport layer ETL adjacent to it, and the P-type charge generation layer P-CGL supplies holes to the hole transport layer HTL adjacent to it. The N-type charge generation layer N-CGL includes nitrogen (N) of sp² hybrid orbital in the carboline derivative which is relatively electron-rich, and the nitrogen is bound to an alkali metal or alkali earth metal, a dopant for the N-type charge generation layer, thereby forming a gap state. This gap state may facilitate transfer of electrons from the P-type charge generation layer P-CGL to the N-type charge generation layer N-CGL. Also, the electron transport layer ETL comprises a phenanthroline compound that makes charge transport easy through an aromatic ring in the molecule. Especially, the phenanthroline compound has a phenanthroline ring having electron-rich nitrogen (N), which facilitates transport of electrons to the light emitting layers. Also, a triphenyl derivative is linked to a phenanthroline derivative, facilitating the movement of electrons from the N-type charge generation layer to the electron transport layer. Accordingly, the electron injection capability of the device is improved, thereby reducing the operating voltage of the device and improving emission efficiency.

Hereinafter, synthesis examples of compounds of the present invention will be described in detail. However, it should be noted that the following synthesis examples are only for illustration, and the present invention is not limited thereto.

<Test 1>

SYNTHESIS EXAMPLE

1) Synthesis of Intermediate A

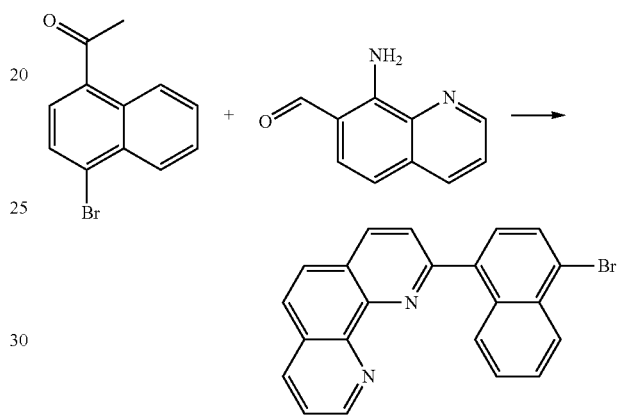

1-(1-bromonaphthalene-4-yl)ethanone (14.5 g, 0.058 mol), 8-aminoquinoline-7-carbaldehyde (10 g, 0.058 mol), 800 ml of ABS ethanol (absolute EtOH), and 13 g of KOH were put into a round-bottom flask. The mixture was refluxed at an elevated temperature and stirred for 15 hours. The reaction solution was cooled at room temperature, and an organic layer was collected by extracting with dichloromethane (CH₂Cl₂, MC)/water. The organic layer was vacuum-concentrated, and then dichloromethane was developed with aluminum oxide (Al₂O₃) for column separation, thereby yielding 10.5 g of intermediate A.

2) Synthesis of Compound NC09 (2-4, biphenyl-3-yl-naphthalene-1-yl-1,10-phenanthroline)

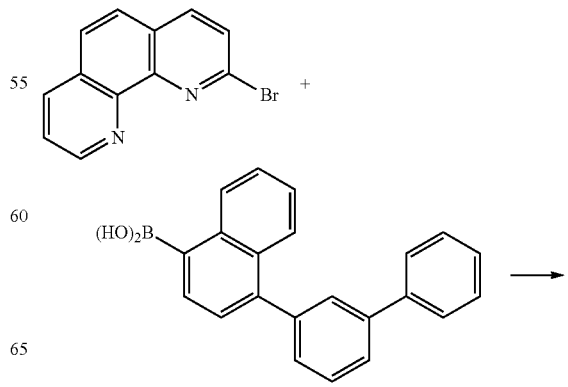

-continued

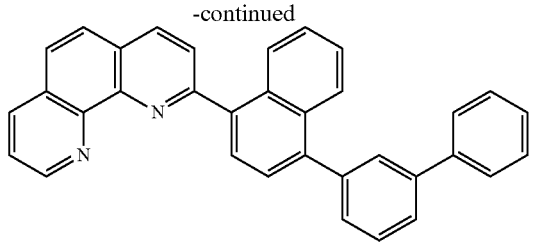

2-bromo-1,10-phenanthroline (3 g, 0.012 mol), 4-biphenyl-3-yl-naphthalene-1-boronic acid (4.5 g, 0.014 mol), Tetrakis(triphenylphosphine) palladium(0) (0.5 g, 0.5 mmol), 60 ml of toluene, 15 ml of ethanol, and 12 ml of 2M potassium carbonate ($K_2CO_3$) were put into a round-bottom flask. The mixture was refluxed and stirred for 12 hours. After completion of the reaction, an organic layer was collected by extraction and vacuum-concentrated to remove the solvent, and then silica gel column separation (MC->MC:Acetone=10:1) was performed. By vacuum concentration, 3.2 g of compound NC09 was obtained.

3) Synthesis of Compound NC12 (2-(1-(10-phenylanthracene-9-yl)naphthalen-4-yl)-1,10-phenanthroline)

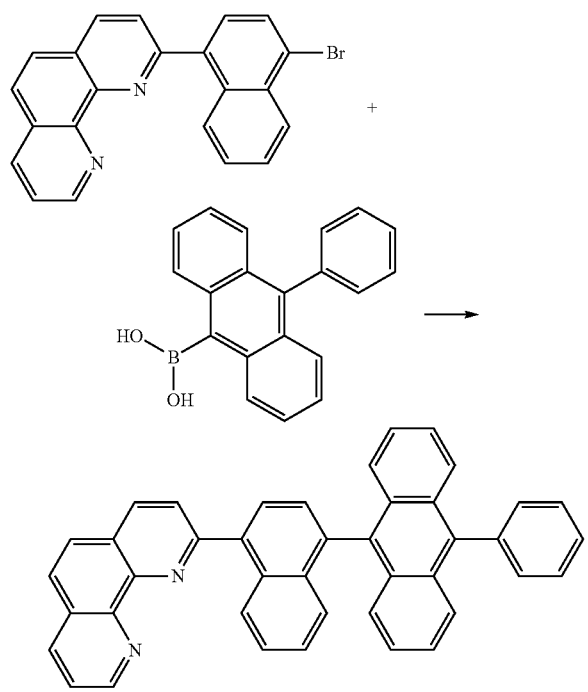

Intermediate A (3 g, 8 mmol), 9-phenylanthracene-10-boronic acid) (2.8 g, 9 mmol), Tetrakis(triphenylphosphine) palladium(0) (0.4 g, 0.3 mmol), 60 ml of toluene, 15 ml of ethanol, and 8 ml of 2M potassium carbonate were put into a round-bottom flask, and refluxed and stirred for 12 hours. After completion of the reaction, the reaction solution was filtered to obtain a crude product. The filtered crude product was dissolved in chloroform ($CHCl_3$) by heating, vacuum-filtered through aluminum oxide ($Al_2O_3$), and then concentrated and recrystallized to yield 2 g of compound NC12.

4) Synthesis of Compound NC17 (2-(1-(quinolin-2-yl)naphthalene-4-yl)-1,10-phenanthroline)

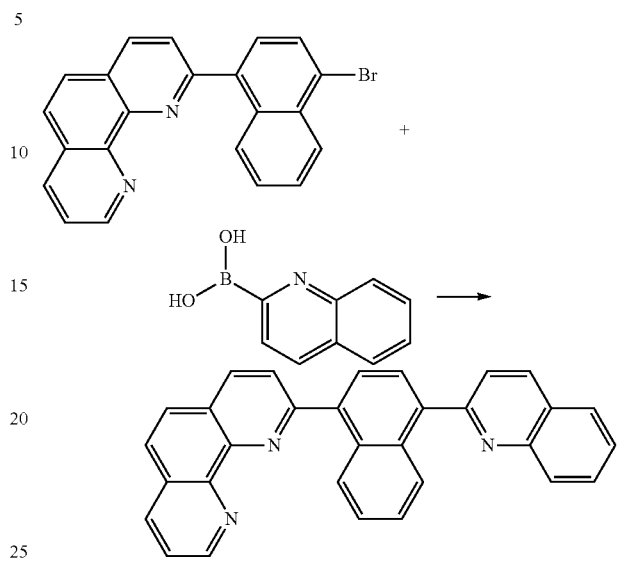

Intermediate A (3 g, 8 mmol), 9-phenylanthracene-10-boronic acid) (1.6 g, 9 mmol), Tetrakis(triphenylphosphine) palladium(0) (0.4 g, 0.3 mmol), 60 ml of toluene, 15 ml of ethanol, and 8 ml of 2M potassium carbonate ($K_2CO_3$) were put into a round-bottom flask, and refluxed and stirred for 12 hours. After completion of the reaction, an organic layer was collected by extraction and vacuum-concentrated to remove the solvent, and then silica gel column separation (MC->MC:Acetone=10:1) was performed using aluminum oxide ($Al_2O_3$). By vacuum concentration, 2.4 g of compound NC17 was obtained.

5) Synthesis of Intermediate B (2-(2-bromonaphthalene-6-yl)-1,10-phenanthroline)

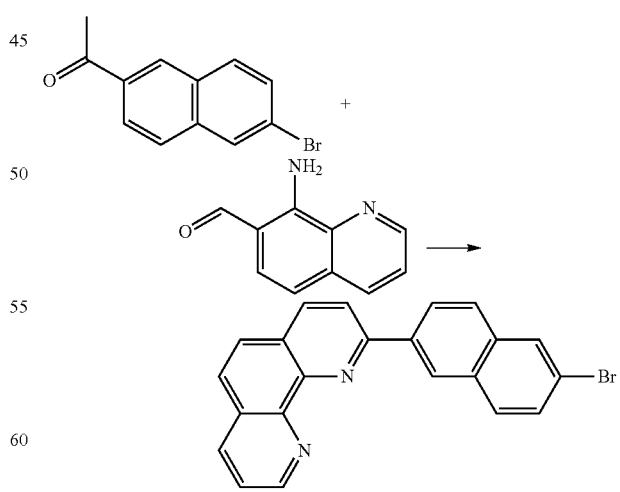

1-(2-bromonaphthalene-4-yl)ethanone (7.3 g, 0.029 mol), 8-aminoquinoline-7-carbaldehyde (5 g, 0.029 mol), 400 ml of ABS, and 6.5 g of KOH were put into a round-bottom flask. The mixture was refluxed at an elevated temperature and stirred for 15 hours. The reaction solution was cooled at room temperature, and an organic layer was collected by extracting with dichloromethane/water. The organic layer was vacuum-concentrated, and then dichloromethane was developed with aluminum oxide (Al$_2$O$_3$) for column separation, thereby yielding 4.6 g of intermediate B.

6) Synthesis of Compound NC34 (2-(2-(pyren-1-yl)naphthalene-6-yl)-1,10-phenanthroline)

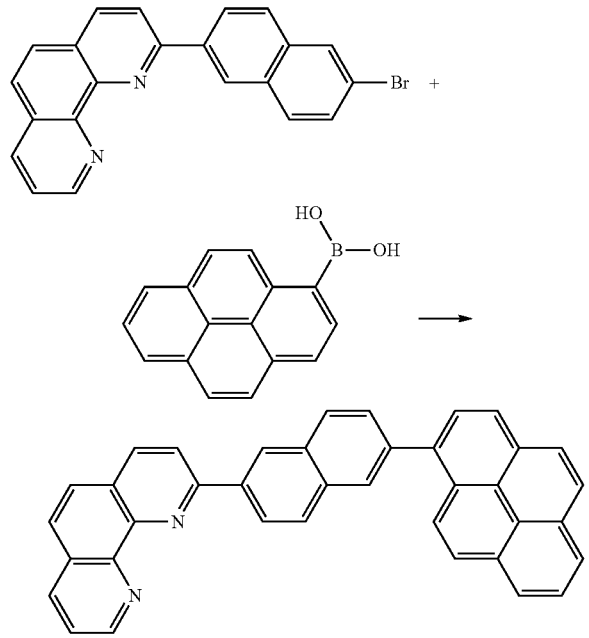

Intermediate B (3 g, 8 mmol), pyrene-1-boronic acid (2.3 g, 9 mmol), Tetrakis(triphenylphosphine) palladium(0) (0.4 g, 0.3 mmol), 60 ml of toluene, 15 ml of ethanol, 8 ml of 2M potassium carbonate (K$_2$CO$_3$) were put into a round-bottom flask and refluxed and stirred for 12 hours. After completion of the reaction, the reaction solution was filtered to obtain a crude product. The filtered crude product was dissolved in chloroform (CHCl$_3$) by heating, vacuum-filtered through aluminum oxide (Al$_2$O$_3$), and then concentrated and recrystallized to yield 1.6 g of compound NC34.

7) Synthesis of Compound NC42 (2-(1-(10-(4-tert-butylphenyl)anthracene-9-yl)naphthalen-4-yl)-1,10-phenanthroline)

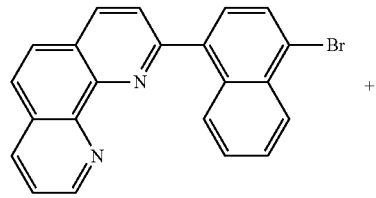

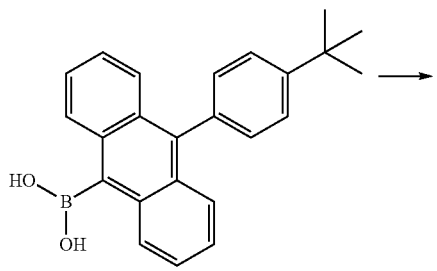

Intermediate A (3 g, 8 mmol), 9-(4-tert-butylphenyl)anthracene-10-yl-10-boronic acid (3.3 g, 9 mmol), Tetrakis(triphenylphosphine) palladium(0) (0.4 g, 0.3 mmol), 60 ml of toluene, 15 ml of ethanol, 8 ml of 2M potassium carbonate (K$_2$CO$_3$) were put into a round-bottom flask and refluxed and stirred for 12 hours. After completion of the reaction, the reaction solution was filtered to obtain a crude product. The filtered crude product was dissolved in chloroform (CHCl$_3$) by heating, vacuum-filtered through aluminum oxide (Al$_2$O$_3$), and then concentrated and recrystallized to yield 2.4 g of compound NC42.

8) Synthesis of NC43 (2-(1-(3-(10-(4-tert-butylphenyl)anthracene-9-yl)phenyl)naphthalene-4-yl)-1,10-phenanthroline)

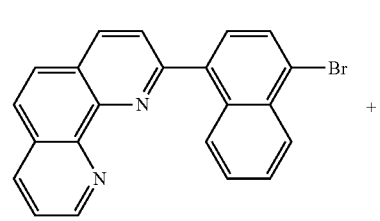

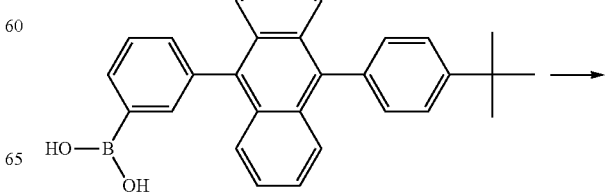

-continued

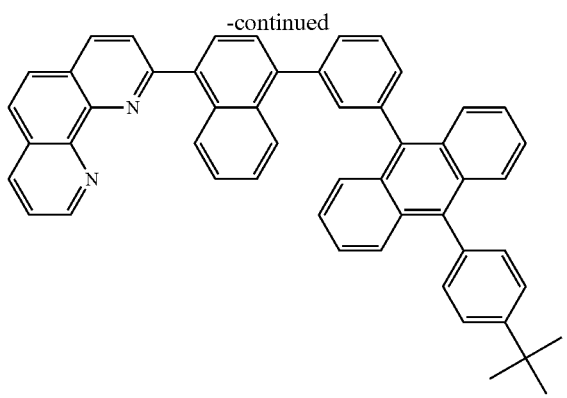

Intermediate A (3 g, 8 mmol), 9-phenylanthracene-10-boronic acid (4 g, 9 mmol), Tetrakis(triphenylphosphine)palladium(0) (0.4 g, 0.3 mmol), 60 ml of toluene, 15 ml of ethanol, 8 ml of 2M potassium carbonate ($K_2CO_3$) were put into a round-bottom flask and refluxed and stirred for 12 hours. After completion of the reaction, an organic layer was collected by extraction and vacuum-concentrated to remove the solvent, and then silica gel column separation (MC->MC:Acetone=10:1) was performed using aluminum oxide ($Al_2O_3$). By vacuum concentration, 2.4 g of compound NC43 was obtained.

Figure 7:
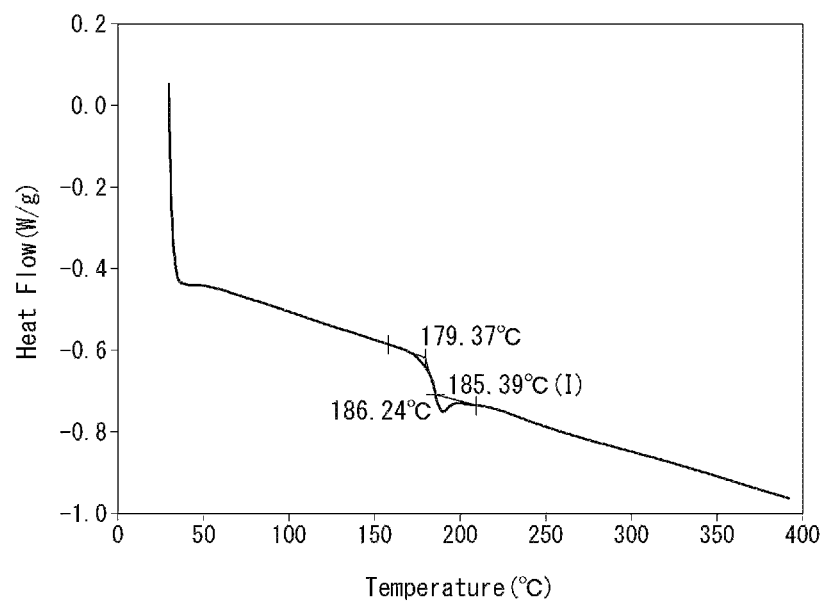
FIG. 7 is a graph showing the glass transition temperature of compound NC12.
Figure 8:
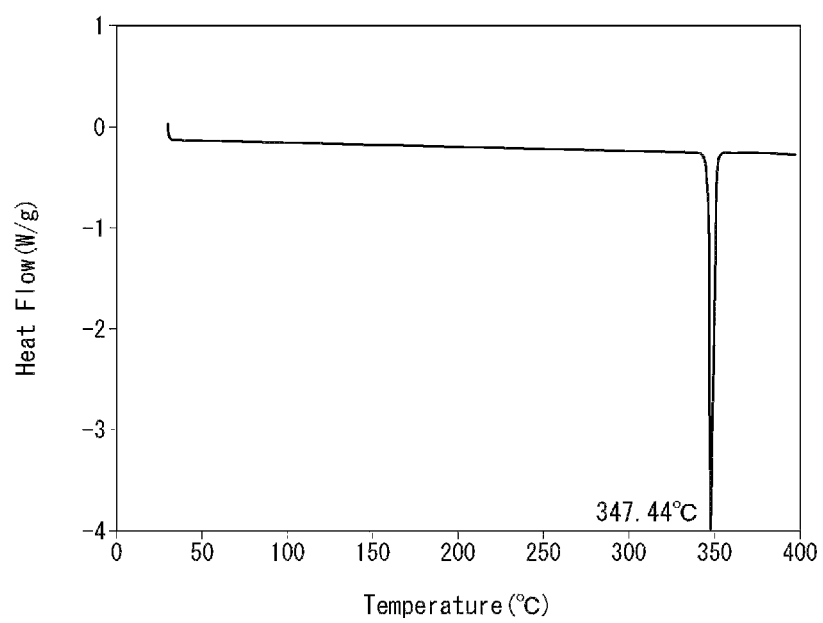
FIG. 8 is a graph showing the melting point of compound NC12.
Figure 9:
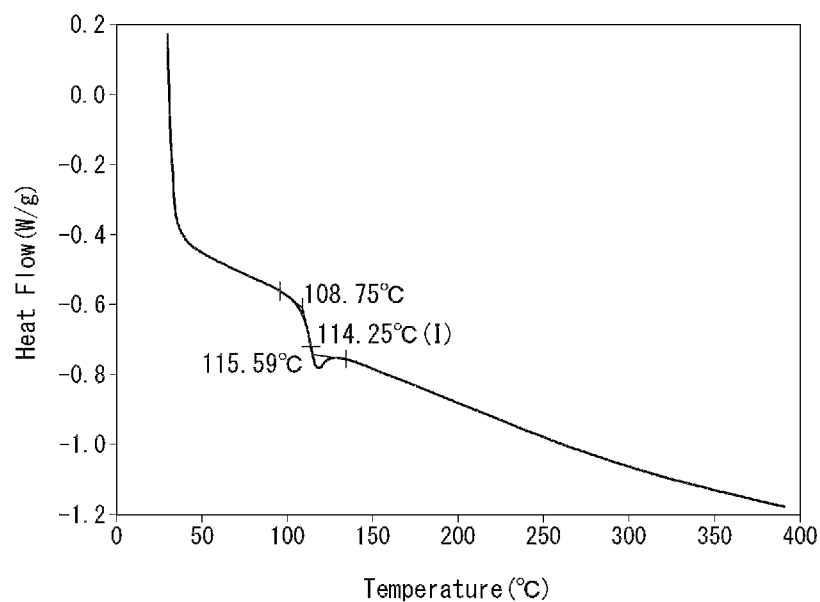
FIG. 9 is a graph showing the glass transition temperature of compound NC17.
Figure 10:
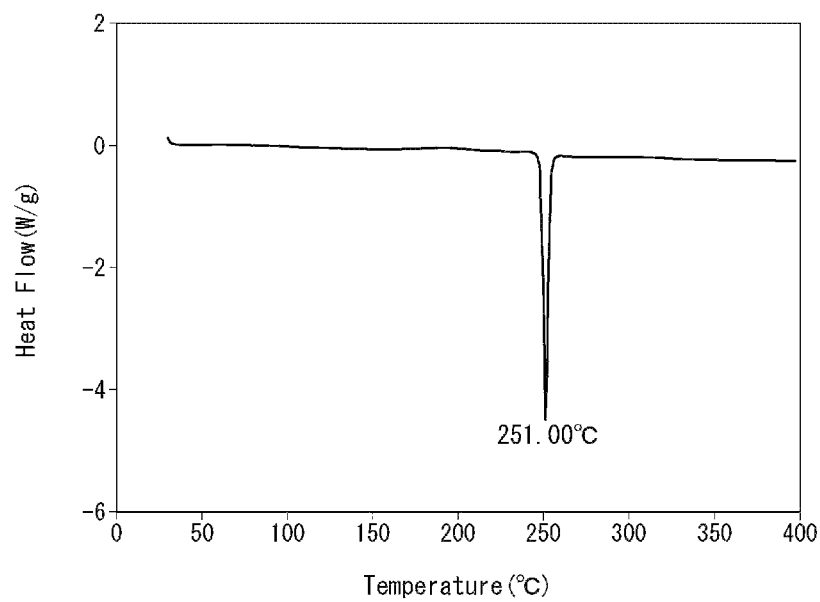
FIG. 10 is a graph showing the melting point of compound NC17.
Figure 11:
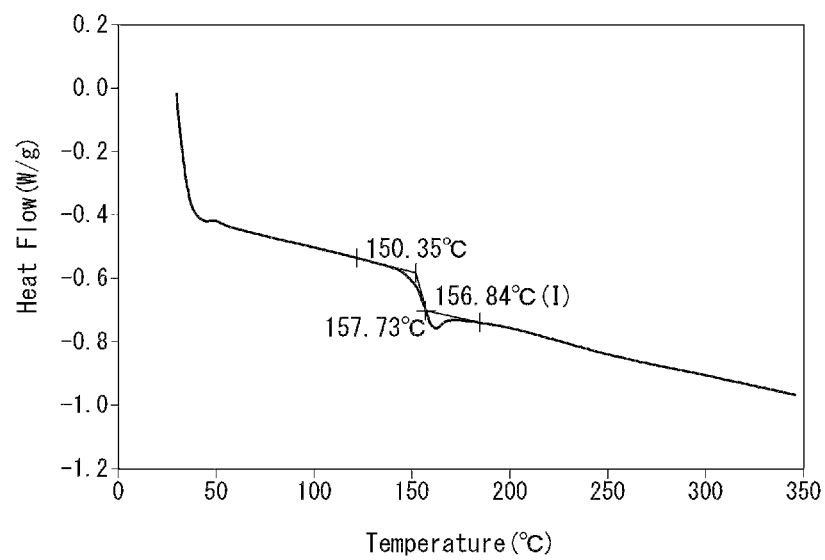
FIG. 11 is a graph showing the glass transition temperature of compound NC34.
Figure 12:
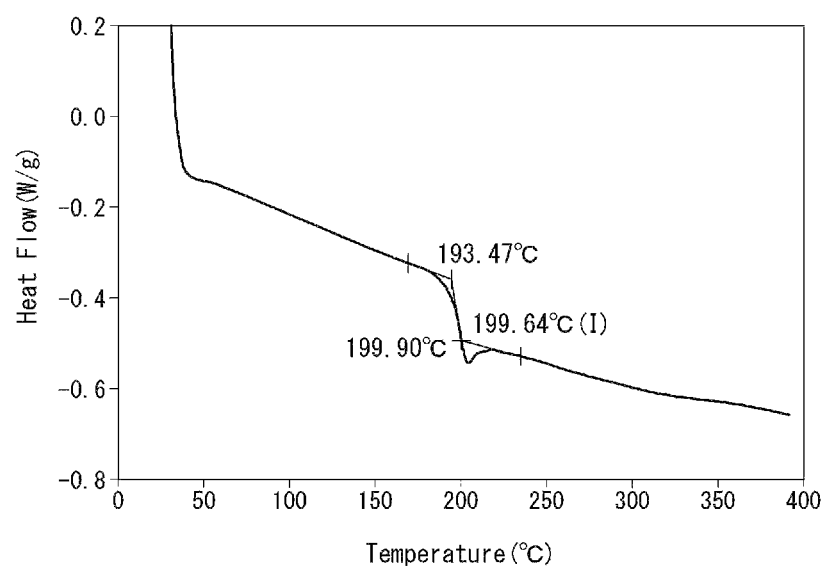
FIG. 12 is a graph showing the glass transition temperature of compound NC42.
Figure 13:
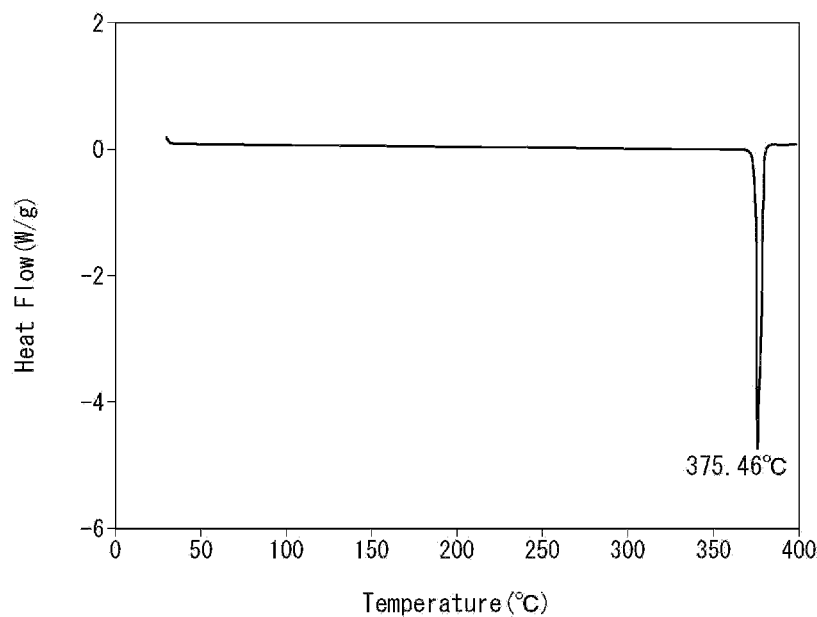
FIG. 13 is a graph showing the melting point of compound NC42.
Figure 14:
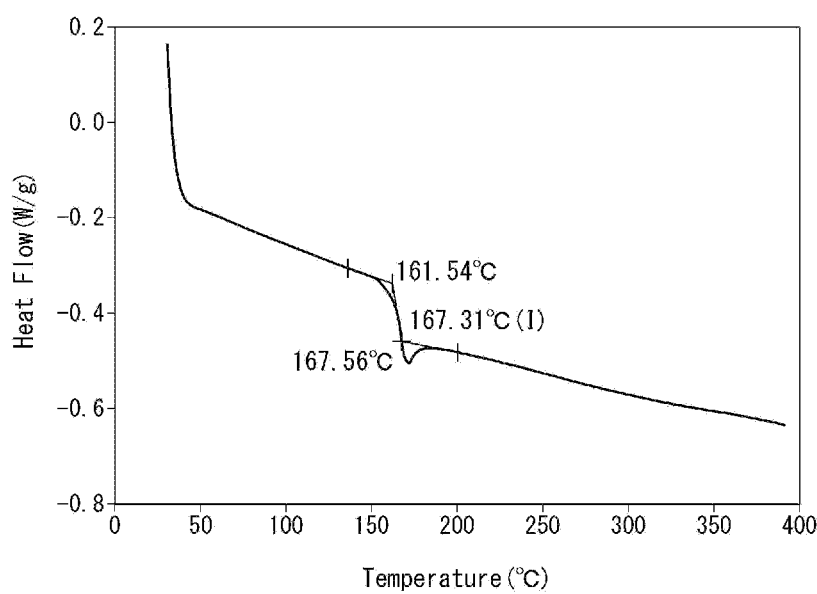
FIG. 14 is a graph showing the glass transition temperature of compound NC43.
Figure 15:
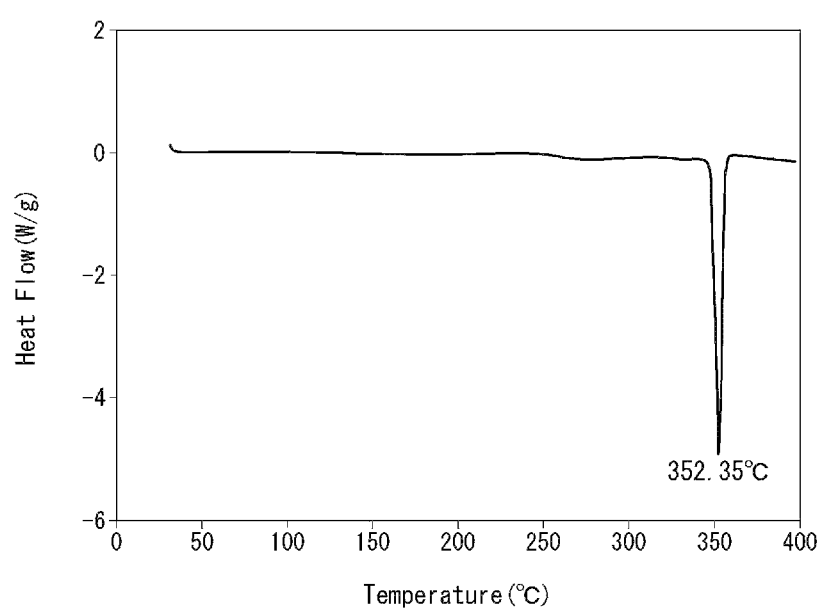
FIG. 15 is a graph showing the melting point of compound NC43.

To investigate the thermal stability of the above prepared compounds, the glass transition temperatures Tg and melting points Tm of compounds NC09, NC12, NC17, NC34, NC42, and NC43 were measured and shown in FIGS. 6 to 15, and listed in the following Table 2. The glass transition temperature Tg and melting point Tm were measured by DSC (differential scanning calorimetry). DSC measures thermal energy changes with temperature and is used for examining polymeric materials. FIG. 7 is a graph showing the glass transition temperature of compound NC12. FIG. 8 is a graph showing the melting point of compound NC12. FIG. 9 is a graph showing the glass transition temperature of compound NC17. FIG. 10 is a graph showing the melting point of compound NC17. FIG. 11 is a graph showing the glass transition temperature of compound NC34. FIG. 12 is a graph showing the glass transition temperature of compound NC42. FIG. 13 is a graph showing the melting point of compound NC42. FIG. 14 is a graph showing the glass transition temperature of compound NC43. FIG. 15 is a graph showing the melting point of compound NC43. (For reference, the melting points of NC09 and NC34 were not measured). In FIGS. 6 to 15, the horizontal axis indicates temperature, and the vertical axis indicates heat flow.

TABLE 2

| Compound | Glass transition temperature (Tg, ° C.) | Melting point (Tm, ° C.) |
|---|---|---|
| NC09 | 101.05 | — |
| NC12 | 185.39 | 347.44 |
| NC17 | 114.25 | 251.00 |
| NC34 | 156.84 | — |
| NC42 | 199.64 | 375.46 |
| NC43 | 167.31 | 352.35 |

Figure 6:
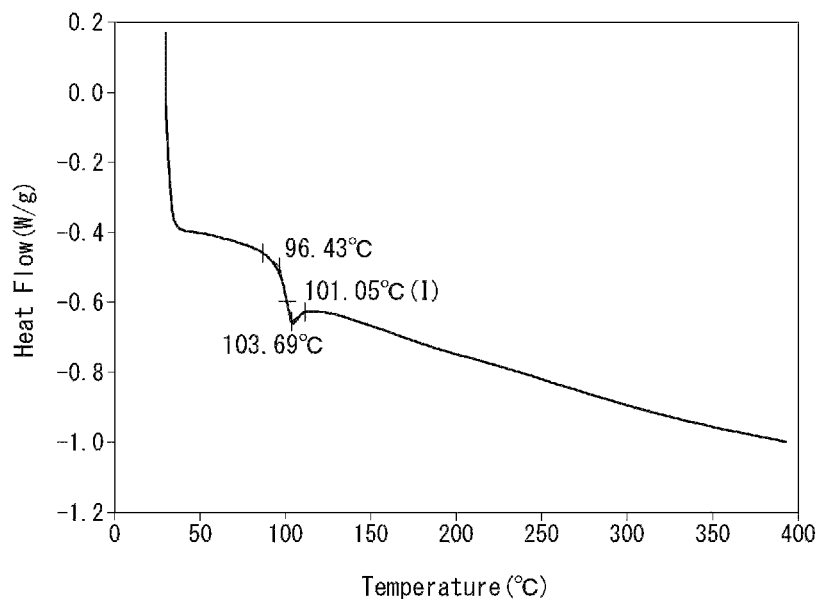
FIG. 6 is a graph showing the glass transition temperature of compound NC09.

FIG. 6 is a graph showing the glass transition temperature of compound NC09. As shown in FIG. 6, the heat flow along the vertical axis undergoes a change at a certain temperature. The glass transition temperature is determined by the middle value between a temperature at which the heat flow starts to change and a temperature at which the heat flow stops changing. Accordingly, it can be concluded that the glass transition temperature Tg of NC09 is 101.05° C. The melting point of NC09 was not measured.

FIG. 7 is a graph showing the melting point of compound NC12. The melting point Tm refers to an endothermic peak temperature that is observed after a glass transition temperature when the temperature is raised to a certain temperature. Accordingly, it can be concluded that the melting point Tm of NC12 is 347.44° C.

With reference to FIGS. 6 to 15 and Table 2, the compounds of the present invention prepared in the synthesis examples showed a glass transition temperature of about 100° C. or higher and a melting point of 250° C. or higher. Thus, it can be concluded that the compounds of the present invention have thermal stability when applied to an organic light emitting display device.

Hereinafter, embodiments for manufacturing an organic light emitting display device using the aforementioned compounds as an N-type charge generation layer will be disclosed. It should be noted that the thicknesses or formation conditions of the following organic layers do not limit the scope of the present invention.

COMPARATIVE EXAMPLE 1

A substrate was patterned to have a light emission area of 2 mm×2 mm and then cleaned in UV ozone. The substrate was mounted on a vacuum chamber and set to a base pressure of 5 to $7 \times 10^{-8}$ torr, and then the following layers were deposited in the following order by evaporation from heated boats.

(1) NPD as a hole injection layer was doped with 10% F4-TCNQ to a thickness of 100 Å.
(2) NPD as a hole transport layer was formed to a thickness of 1200 Å.
(3) An anthracene host as a blue light emitting layer was doped with a 4% pyrene dopant to a thickness of 200 Å.
(4) TmPyPB as a first electron transport layer was formed to a thickness of 100 Å.
(5) BPhen as an N-type charge generation layer was doped with 2% Li to a thickness of 100 Å.
(6) NPD as a P-type charge generation layer was doped with 10% F4-TCNQ to a thickness of 200 Å.
(7) NPD as a hole transport layer was formed to a thickness of 200 Å.
(8) A CBP host as a yellow light emitting layer was doped with a 10% Ir compound to a thickness of 200 Å.
(9) $Alq_a$ as a second electron transport layer was formed to a thickness of 100 Å.
(10) LiF as an electron injection layer was formed to a thickness of 5 Å.
(11) Al as a cathode was formed to a thickness of 2,000 Å.

After depositing these layers, they were transferred from the vacuum chamber to a dry box for forming film, followed by encapsulation using UV hardening epoxy resin and a moisture getter, thereby manufacturing an organic light emitting display device.

Embodiment 1
The N-type charge generation layer had the same composition as Comparative Example 1, and was formed of compound NC09.

Embodiment 2
The N-type charge generation layer had the same composition as Comparative Example 1, and was formed of compound NC12.

Embodiment 3

The N-type charge generation layer had the same composition as Comparative Example 1, and was formed of compound NC17.

Embodiment 4

The N-type charge generation layer had the same composition as Comparative Example 1, and was formed of compound NC34.

Embodiment 5

The N-type charge generation layer had the same composition as Comparative Example 1, and was formed of compound NC42.

Embodiment 6

The N-type charge generation layer had the same composition as Comparative Example 1, and was formed of compound NC43.

The materials of the N-type charge generation layer used in the above comparative example 1 and embodiments do not limit the scope of the present invention.

The operating voltage, current efficiency, and lifetime of the organic light emitting display devices according to Comparative Example 1 and Embodiments 1 to 6 were measured and shown in the following Table 3. Also, the current density vs operating voltage was measured and shown in FIG. 16, the emission spectrum were measured and shown in FIG. 17, and the ratio of decrease in luminance over time was measured and shown in FIG. 18. The following Table 3 shows the percentages of results of Embodiments relative to 100% for results of Comparative Example 1. Also, the lifetime T95 describes the time it takes to reach 95% of the initial luminance of Comparative Example 1.

TABLE 3

|  | Operating voltage (%) | Current efficiency (%) | Lifetime (T95) (%) |
| --- | --- | --- | --- |
| Comparative Example 1 | 100 | 100 | 100 |
| Embodiment 1 | 94 | 104 | 119 |
| Embodiment 2 | 103 | 105 | 124 |
| Embodiment 3 | 94 | 101 | 85 |
| Embodiment 4 | 93 | 102 | 128 |
| Embodiment 5 | 91 | 102 | 108 |
| Embodiment 6 | 105 | 102 | 243 |

Figure 16:
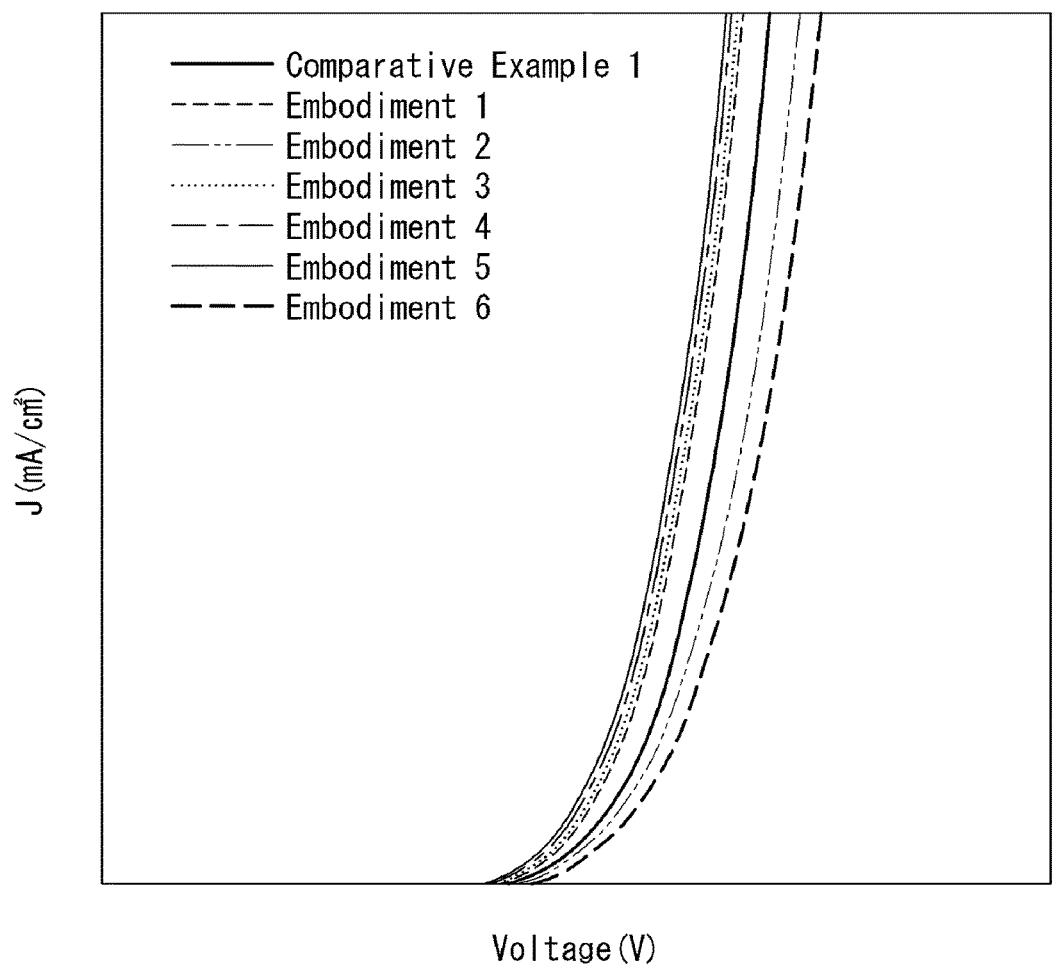
FIG. 16 is a graph of the current density vs. operating voltage of organic light emitting display devices manufactured according to Comparative Example and Embodiments 1 to 6 of the present invention.
Figure 17:
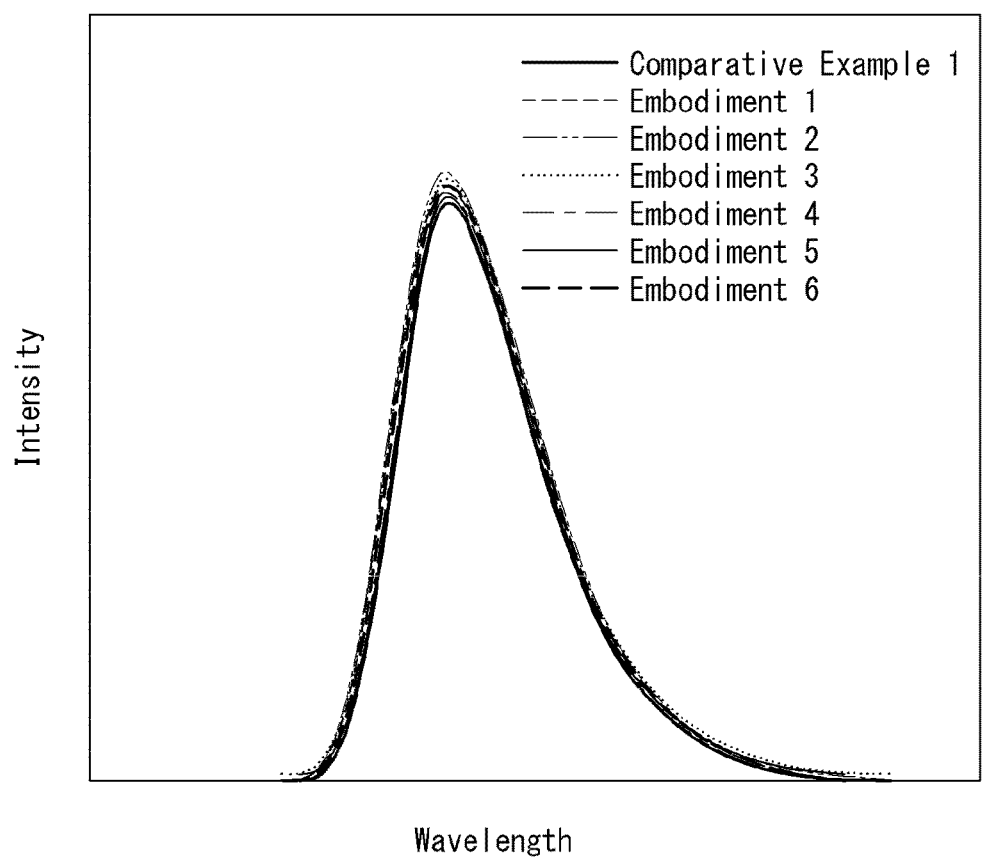
FIG. 17 is a graph of the emission spectrum of organic light emitting display devices according to Comparative Example and Embodiments 1 to 6 of the present invention.
Figure 18:
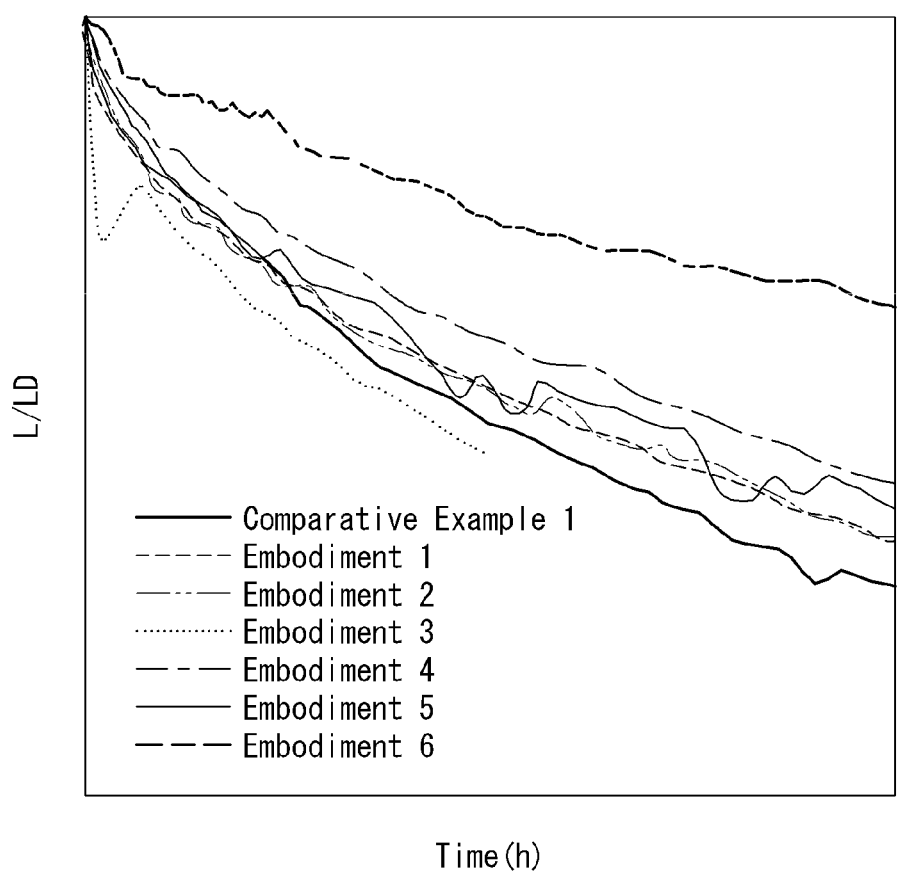
FIG. 18 is a graph of the ratio of decrease in luminance over time of organic light emitting display devices according to Comparative Example and Embodiments 1 to 6 of the present invention.

With reference to FIGS. 16 to 18 and Table 3, Embodiment 1 using compound NC09 as the N-type charge generation layer showed a 6% decrease in operating voltage, a 4% increase in current efficiency, and a 19% increase in lifetime, compared to Comparative Example 1 using BPhen as the N-type charge generation layer in a stack structure. Also, Embodiment 2 using compound NC12 as the N-type charge generation layer showed a 3% increase in operating voltage, a 5% increase in current efficiency, and a 24% increase in lifetime, compared to Comparative Example 1. Also, Embodiment 3 using compound NC17 as the N-type charge generation layer showed a 6% decrease in operating voltage, a 1% increase in current efficiency, and a 15% increase in lifetime, compared to Comparative Example 1. Also, Embodiment 4 using compound NC34 as the N-type charge generation layer showed a 7% decrease in operating voltage, a 2% increase in current efficiency, and a 28% increase in lifetime, compared to Comparative Example 1. Also, Embodiment 5 using compound NC42 as the N-type charge generation layer showed a 9% decrease in operating voltage, a 2% increase in current efficiency, and an 8% increase in lifetime, compared to Comparative Example 1. Also, Embodiment 6 using compound NC43 as the N-type charge generation layer showed a 5% increase in operating voltage, a 2% increase in current efficiency, and a 143% increase in lifetime, compared to Comparative Example 1, which means a remarkable improvement in lifetime.

<Test 2>

SYNTHESIS EXAMPLE

1) Synthesis of Intermediate C (2-(1-bromonaphthalene-4-yl)-1,10-phenanthroline)

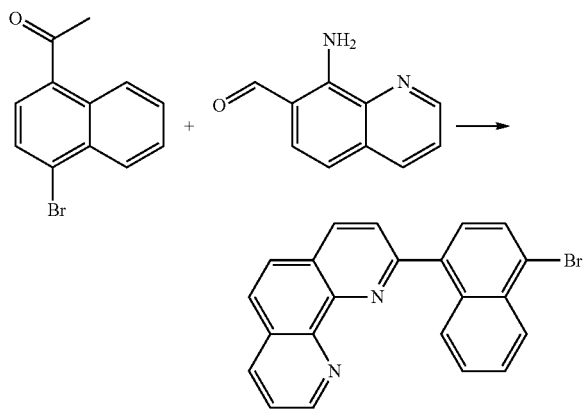

1-(1-bromonaphthalene-4-yl)ethanone (14.5 g, 0.058 mol), 8-aminoquinoline-7-carbaldehyde (10 g, 0.058 mol), 800 ml of ABS ethanol, and 13 g of KOH were put into a round-bottom flask. The mixture was refluxed at an elevated temperature and stirred for 15 hours. The reaction solution was cooled at room temperature, and an organic layer was collected by extracting with dichloromethane/water. The organic layer was vacuum concentrated, and then dichloromethane was developed with aluminum oxide ($Al_2O_3$) for column separation, thereby yielding 10.5 g of intermediate C.

2) Synthesis of Intermediate D (2-(3-bromophenyl)-1,10-phenanthroline)

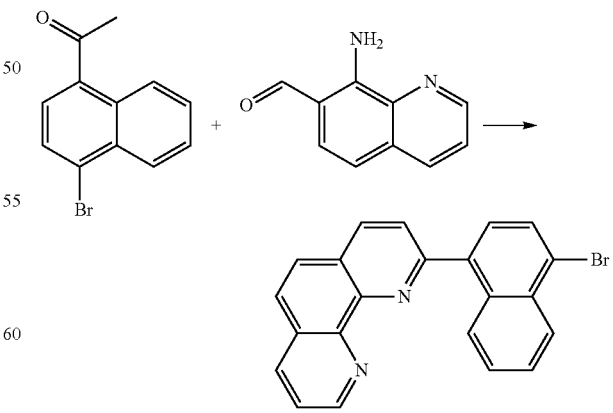

1-(3-bromophenyl)ethanone (15 g, 0.075 mol), 8-aminoquinoline-7-carbaldehyde (13 g, 0.075 mol), 800 ml of ABS ethanol, and 15 g of KOH were put into a round-bottom 7) Synthesis of NC119 (2-(1-(10-(naphthalene-2-yl)anthracene-9-yl)naphthalen-4-yl)-1,10-phenanthroline)

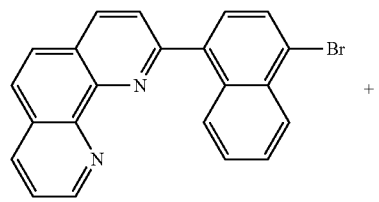

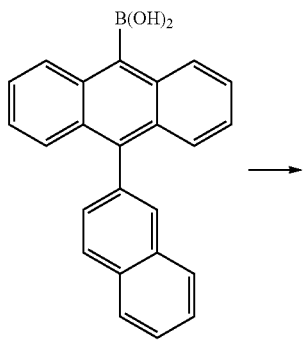

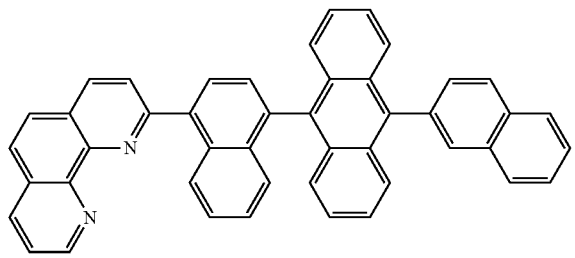

Intermediate C (5 g, 0.013 mol), 9-(naphthalen-2-yl)anthracene-10-boronic acid (5.4 g, 0.016 mol), Tetrakis(triphenylphosphine) palladium(0) (0.6 g, 0.5 mmol), 100 ml of toluene, 10 ml of ethanol, and 8 ml of 2M potassium carbonate were put into a round-bottom flask and refluxed and stirred for 12 hours. After completion of the reaction, the reaction solution was filtered to obtain a crude product. The filtered crude product was dissolved in chloroform ($CHCl_3$) by heating, vacuum-filtered through silica gel, and then concentrated and recrystallized to yield 4.2 g of compound NC119.

4) Synthesis of NC124 (2-(3-(10-phenylanthracene-9-yl)phenyl)-1,10-phenanthroline)

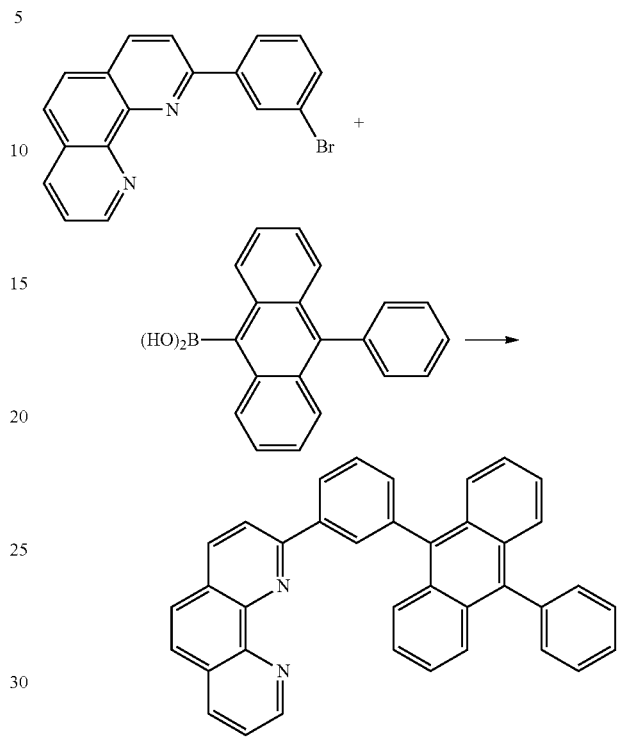

Intermediate 2 (5 g, 0.015 mol), 9-phenylanthracene-10-boronic acid (5.3 g, 0.018 mol), Tetrakis(triphenylphosphine) palladium(0) (0.7 g, 0.6 mmol), 100 ml of toluene, 10 ml of ethanol, and 8 ml of 2M potassium carbonate were put into a round-bottom flask and refluxed and stirred for 12 hours. After completion of the reaction, the reaction solution was filtered to obtain a crude product. The filtered crude product was dissolved in chloroform ($CHCl_3$) by heating, vacuum-filtered through silica gel, and then concentrated and recrystallized to yield 3.6 g of compound NC124.

5) Synthesis of NC126 (2-(1-(10-(4-(trimethylsilyl)phenyl)anthracene-9-yl)naphthalen-4-yl)-1,10-phenanthroline)

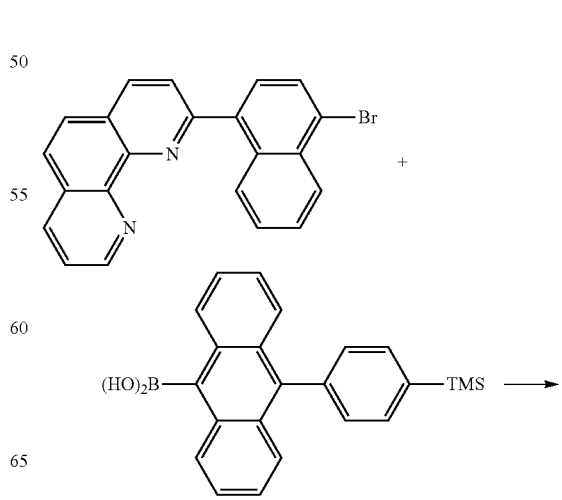

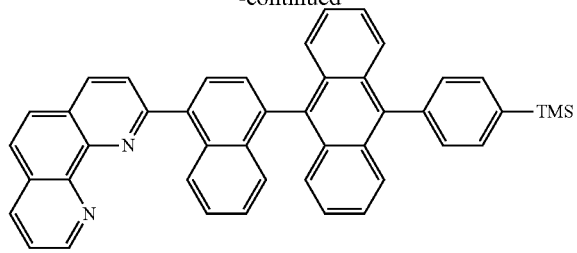

Intermediate C (5 g, 0.013 mol), 9-(4-(trimethylsilyl)phenyl)anthracene-10-yl-10-boronic acid (5.8 g, 0.016 mol), Tetrakis(triphenylphosphine) palladium(0) (0.6 g, 0.5 mmol), 100 ml of toluene, 10 ml of ethanol, and 8 ml of 2M potassium carbonate were put into a round-bottom flask and refluxed and stirred for 12 hours. After completion of the reaction, the reaction solution was filtered to obtain a crude product. The filtered crude product was dissolved in chloroform (CHCl$_3$) by heating, vacuum-filtered through silica gel, and then concentrated and recrystallized to yield 3.7 g of compound NC126.

6) Synthesis of NC132 (2-(1-(10-(4-(pyrimidin-2-yl)phenyl)anthracene-9-yl)naphthalen-4-yl)-1,10-phenanthroline)

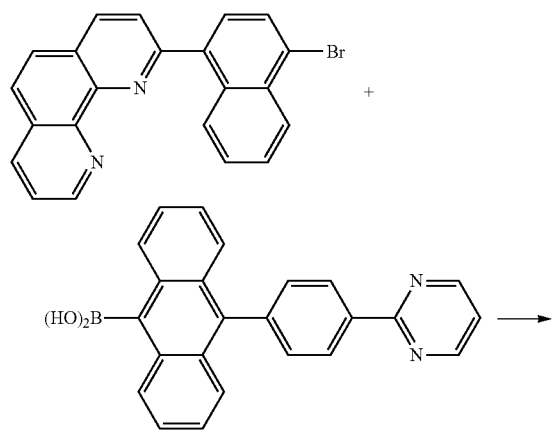

Intermediate C (5 g, 0.013 mol), 9-(4-(pyrimidin-2-yl)phenyl)anthracene-10-yl-10-boronic acid (5.9 g, 0.016 mol), Tetrakis(triphenylphosphine) palladium(0) (0.6 g, 0.5 mmol), 100 ml of toluene, 10 ml of ethanol, and 8 ml of 2M potassium carbonate were put into a round-bottom flask and refluxed and stirred for 12 hours. After completion of the reaction, the reaction solution was filtered to obtain a crude product. The filtered crude product dissolved in chloroform (CHCl$_3$) by heating, vacuum-filtered through silica gel, and then concentrated and recrystallized to yield 3 g of compound NC132.

7) Synthesis of NC175 (2-(1-(10-(dibenzofuran-2-yl)anthracene-9-yl)naphthalen-4-yl)-1,10-phenanthroline)

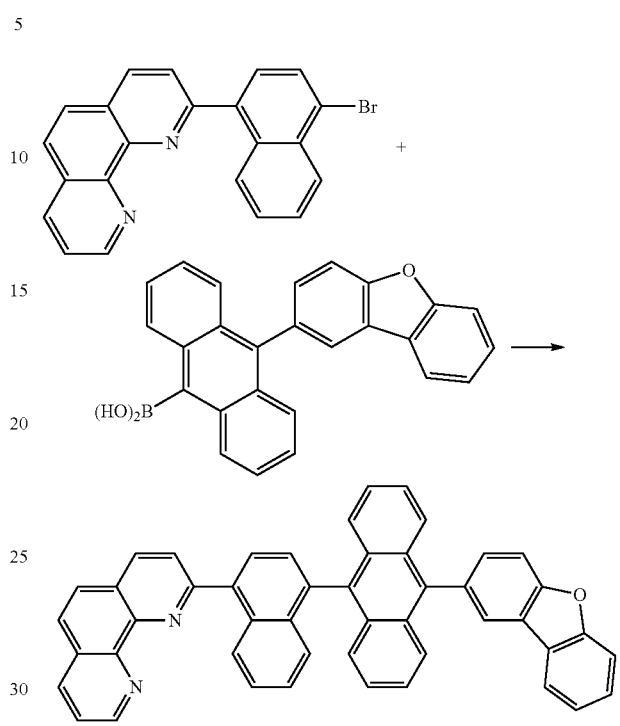

Intermediate C (5 g, 0.013 mol), 9-(dibenzofuran-2-yl)anthracene-10-boronic acid (6 g, 0.016 mol), Tetrakis(triphenylphosphine) palladium(0) (0.6 g, 0.5 mmol), 100 ml of toluene, 10 ml of ethanol, and 8 ml of 2M potassium carbonate were put into a round-bottom flask and refluxed and stirred for 12 hours. After completion of the reaction, the reaction solution was filtered to obtain a crude product. The filtered crude product was dissolved in chloroform (CHCl$_3$) by heating, vacuum-filtered through silica gel, and then concentrated and recrystallized to yield 4 g of compound NC175.

8) Synthesis of Intermediate E (9-(4-bromodibenzothiophene-6-yl)-10-phenylanthracene)

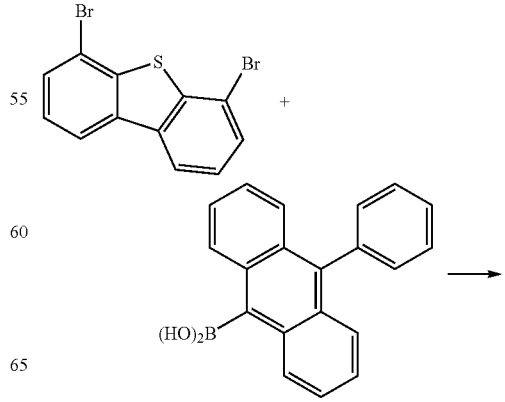

-continued

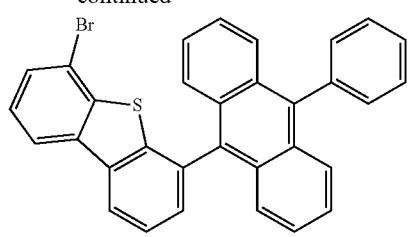

4,6-dibromodibenzothiophene (10 g, 0.029 mol), 9-phenylanthracene-10-boronic acid (8.7 g, 0.029 mol), Tetrakis (triphenylphosphine) palladium(0) (1.4 g, 1.2 mmol), 250 ml of toluene, 30 ml of ethanol, and 15 ml of 2M potassium carbonate were put into a round-bottom flask and refluxed and stirred for 24 hours at 60° C. After completion of the reaction, the reaction solution was filtered to obtain a crude product. The filtered crude product was dissolved in chloroform (CHCl₃) by heating, vacuum-filtered through silica gel, and then concentrated and recrystallized to yield 8.2 g of intermediate E.

9) Synthesis of Intermediate F (4,4,5,5-tetramethyl-2-(6-(10-phenylanthracene-9-yl)-(dibenzothiophene-4-yl))-1,3,2-dioxaborolane)

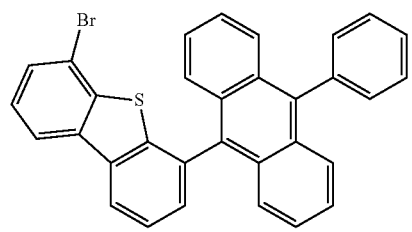

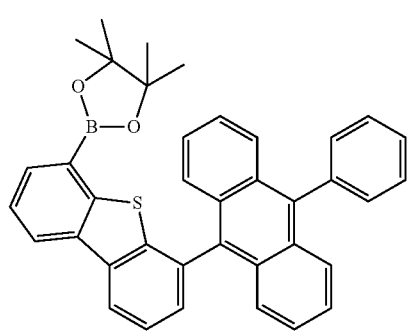

Intermediate E (8 g, 0.016 mol), bis(pinacolato)diboron) (5.9 g, 0.023 mol), 1,1-Bis(diphenylphosphino)ferrocene dichloropalladium( ) (0.5 g, 0.6 mmol), 150 ml of 1,4-dioxane, and potassium acetate (6.1 g, 0.062 mol) were put into a round-bottom flask and refluxed and stirred for 24 hours. After completion of the reaction, the reaction solution was filtered to obtain a crude product. The filtered crude product was dissolved in chloroform (CHCl₃) by heating, vacuum-filtered through silica gel, and then concentrated and recrystallized to yield 7.8 g of intermediate F.

10) Synthesis of NC151 (2-(4-(10-phenylanthracene-9-yl)dibenzothiophene-6-yl)-1,10-phenanthroline)

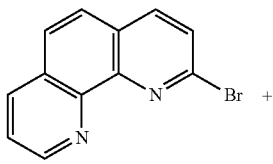

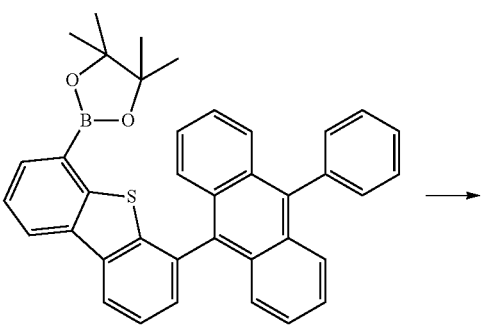

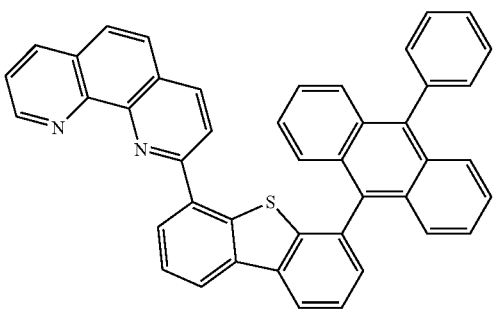

2-bromo-1,10-phenanthroline (3 g, 0.012 mol), intermediate F (7.8 g, 0.014 mol), Tetrakis(triphenylphosphine) palladium(0) (0.5 g, 0.5 mmol), 200 ml of toluene, 10 ml of ethanol, 50 ml of tetrahydrofuran (THF), and 8 ml of 2M potassium carbonate were put into a round-bottom flask and refluxed and stirred for 12 hours. After completion of the reaction, the reaction solution was filtered to obtain a crude product. The filtered crude product was dissolved in chloroform (CHCl₃) by heating, vacuum-filtered through silica gel, and then concentrated and recrystallized to yield 3.3 g of compound NC151.

11) Synthesis of NC195 (2-(10-(fluoranthen-3-yl)anthracene-9-yl)-1,10-phenanthroline)

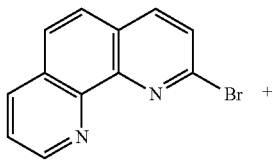

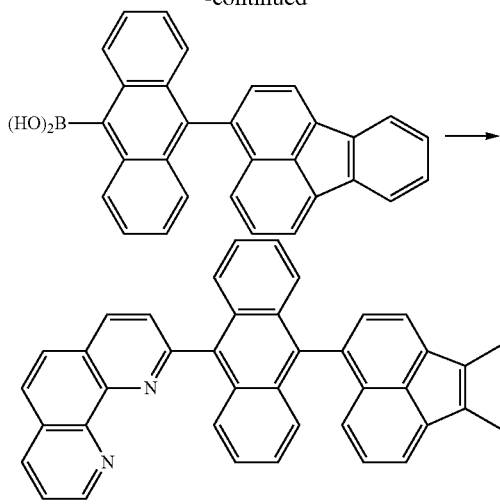

2-bromo-1,10-phenanthroline (5 g, 0.019 mol), 9-(fluoranthen-3-yl)anthracene-10-yl-10-boronic acid (9.8 g, 0.023 mol), Tetrakis(triphenylphosphine) palladium(0) (0.9 g, 0.8 mmol), 100 ml of toluene, 10 ml of ethanol, and 10 ml of 2M potassium carbonate were put into a round-bottom flask and refluxed and stirred for 12 hours. After completion of the reaction, the reaction solution was filtered to obtain a crude product. The filtered crude product was dissolved in chloroform ($CHCl_3$) by heating, vacuum-filtered through silica gel, and then concentrated and recrystallized to yield 7.2 g of compound NC195.

12) Synthesis of NC197 (2-(1-(1-phenylpyrene-6-yl)naphthalen-4-yl)-1,10-phenanthroline)

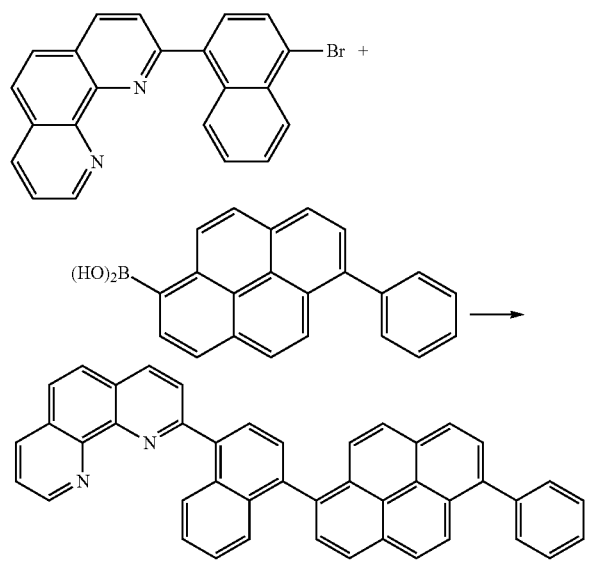

Intermediate C (5 g, 0.013 mol), 6-phenylpyrene-1-yl-1-boronic acid (5 g, 0.016 mol), Tetrakis(triphenylphosphine) palladium(0) (0.6 g, 0.5 mmol), 100 ml of toluene, 10 ml of ethanol, and 8 ml of 2M potassium carbonate were put into a round-bottom flask and refluxed and stirred for 12 hours. After completion of the reaction, the reaction solution was filtered to obtain a crude product. The filtered crude product was dissolved in chloroform ($CHCl_3$) by heating, vacuum-filtered through silica gel, and then concentrated and recrystallized to yield 4.1 g of compound NC197.

13) Synthesis of Intermediate G
(8-amino-5-phenylquinoline-7-carbaldehyde)

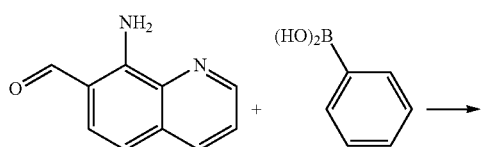

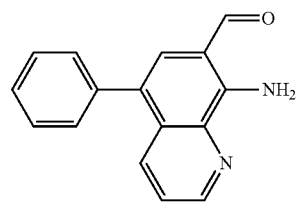

8-amino-5-bromoquinoline-7-carbaldehyde (15 g, 0.06 mol), phenylboronic acid (7.3 g, 0.06 mol), Tetrakis(triphenylphosphine) palladium(0) (2.8 g, 2 mmol), 300 ml of toluene, 30 ml of ethanol, 30 ml of 2M potassium carbonate were put into a round-bottom flask and refluxed and stirred for 12 hours. After completion of the reaction, the reaction solution was filtered through silica gel, and the silica gel was washed with dichloromethane. The filtrate was vacuum-concentrated, and the product was dissolved in dichloromethane and then Hexane was added to it to obtain a powder by precipitation. The powder was washed, yielding 12 g of intermediate G.

14) Synthesis of NC209 (6-phenyl-2-(4-(pyren-8-yl)phenyl)-1,10-phenanthroline)

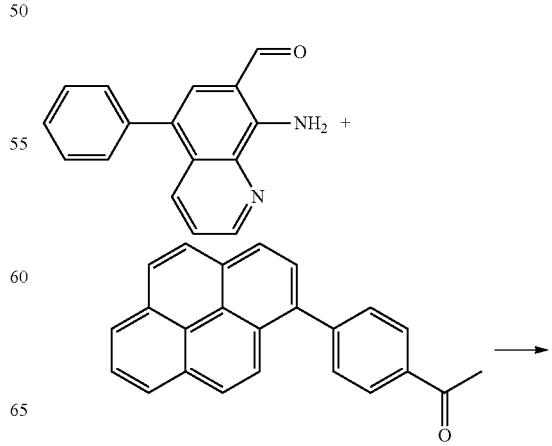

129

-continued

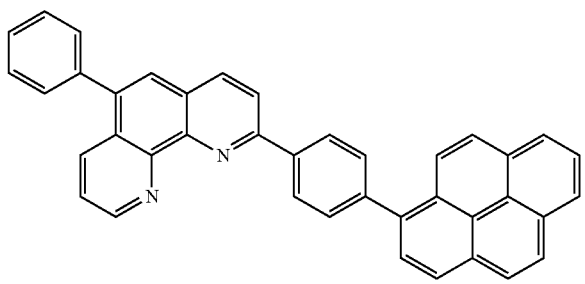

Intermediate G (5 g, 0.028 mol), 1-(4-(pyren-3-yl)phenyl) ethanone) (6.4 g, 0.028 mol), 600 ml of ABS ethanol, and 8 g of KOH were put into a round-bottom flask and refluxed and stirred for 15 hours. The reaction solution was cooled at room temperature and then filtered. The filtrate was washed with water and then dichloromethane, thereby yielding 6.5 g of compound NC209.

15) Synthesis of NC223 (2-(1-(phenanthren-9-yl)naphthalen-4-yl)-1,10-phenanthroline)

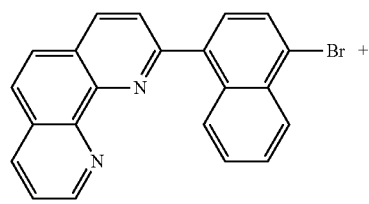

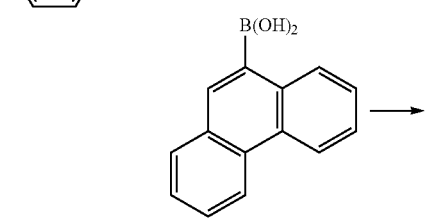

Intermediate C (5 g, 0.013 mol), phenanthrene-9-boronic acid (3.5 g, 0.016 mol), Tetrakis(triphenylphosphine) palladium(0) (0.6 g, 0.5 mmol), 100 ml of toluene, 10 ml of ethanol, and 8 ml of 2M potassium carbonate were put into a round-bottom flask and refluxed and stirred for 12 hours. After completion of the reaction, the reaction solution was filtered to obtain a crude product. The filtered crude product was dissolved in chloroform (CHCl$_3$) by heating, vacuum-filtered through silica gel, and then concentrated and recrystallized to yield 4.8 g of compound NC223.

130

16) Synthesis of C231 (2-(1-(fluoranthen-3-yl)naphthalen-4-yl)-1,10-phenanthroline)

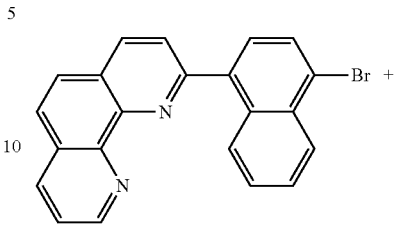

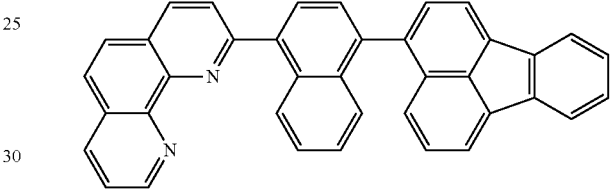

Intermediate C (5 g, 0.013 mol), fluoranthene-3-boronic acid (3.8 g, 0.016 mol), Tetrakis(triphenylphosphine) palladium(0) (0.6 g, 0.5 mmol), 100 ml of toluene, 10 ml of ethanol, and 8 ml of 2M potassium carbonate were put into a round-bottom flask and refluxed and stirred for 12 hours. After completion of the reaction, the reaction solution was filtered to obtain a crude product. The filtered crude product was dissolved in chloroform (CHCl$_3$) by heating, vacuum-filtered through silica gel, and then concentrated and recrystallized to yield 4.5 g of compound NC231.

17) Synthesis of NC232 (2-(1-(3-(fluoranthen-3-yl)phenyl)naphthalen-4-yl)-1,10-phenanthroline)

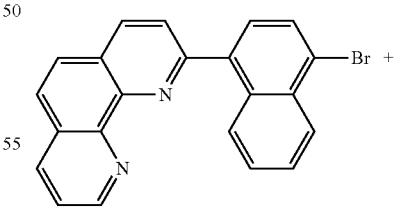

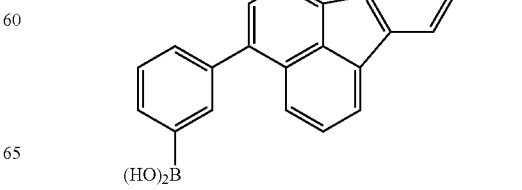

-continued

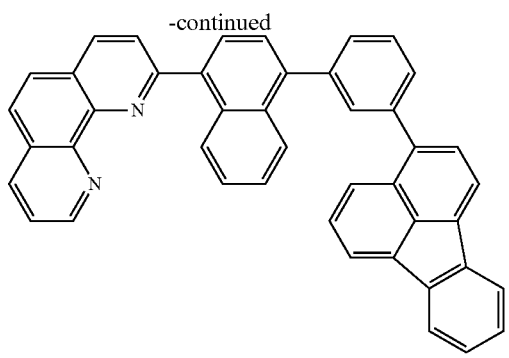

Intermediate C (5 g, 0.013 mol), 3-(fluoranthen-3-yl)phenylboronic acid (5 g, 0.016 mol), Tetrakis(triphenylphosphine) palladium(0) (0.6 g, 0.5 mmol), 100 ml of toluene, 10 ml of ethanol, and 8 ml of 2M potassium carbonate were put into a round-bottom flask and refluxed and stirred for 12 hours. After completion of the reaction, the reaction solution was filtered to obtain a crude product. The filtered crude product was dissolved in chloroform ($CHCl_3$) by heating, vacuum-filtered through silica gel, and then concentrated and recrystallized to yield 5.1 g of compound NC232.

Hereinafter, embodiments for manufacturing an organic light emitting display device using the compounds prepared according to the above-described synthesis examples as an N-type charge generation layer will be disclosed. It should be noted that the thicknesses or formation conditions of the following organic layers do not limit the scope of the present invention.

Embodiment 7

The N-type charge generation layer has the same composition as Comparative Example 1 of Test 1, and was formed of compound NC119.

Embodiment 8

The N-type charge generation layer has the same composition as Comparative Example 1 of Test 1, and was formed of compound NC124.

Embodiment 9

The N-type charge generation layer has the same composition as Comparative Example 1 of Test 1, and was formed of compound NC126.

Embodiment 10

The N-type charge generation layer has the same composition as Comparative Example 1 of Test 1, and was formed of compound NC132.

Embodiment 11

The N-type charge generation layer has the same composition as Comparative Example 1 of Test 1, and was formed of compound NC151.

Embodiment 12

The N-type charge generation layer has the same composition as Comparative Example 1 of Test 1, and was formed of compound NC175.

Embodiment 13

The N-type charge generation layer had the same composition as Comparative Example 1 of Test 1, and was formed of compound NC195.

Embodiment 14

The N-type charge generation layer had the same composition as Comparative Example 1 of Test 1, and was formed of compound NC197.

Embodiment 15

The N-type charge generation layer had the same composition as Comparative Example 1 of Test 1, and was formed of compound NC223.

Embodiment 16

The N-type charge generation layer had the same composition as Comparative Example 1 of Test 1, and was formed of compound NC231.

Embodiment 17

The organic light emitting display device had the same composition as Comparative Example 1 of the foregoing Test 1, and the N-type charge generation layer includes compound NC232.

The operating voltage, current efficiency, and lifetime of the organic light emitting display devices according to Comparative Example 1 and Embodiments 7 to 17 were measured and shown in the following Table 4. Also, the following Table 4 shows the percentages of results of Embodiments relative to 100% for results of Comparative Example 1. Also, the lifetime T95 describes the time it takes to reach 95% of the initial luminance of Comparative Example 1.

Figure 19:
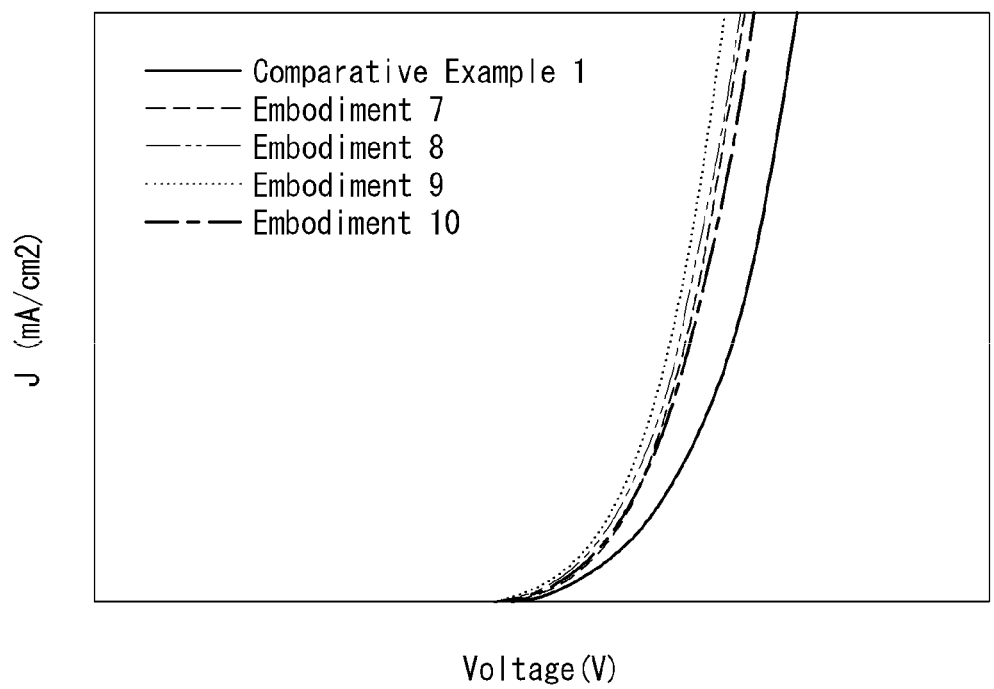
FIG. 19 is a graph of the current density vs. operating voltage of organic light emitting display devices according to Comparative Example and Embodiments 7 to 10 of the present invention.
Figure 20:
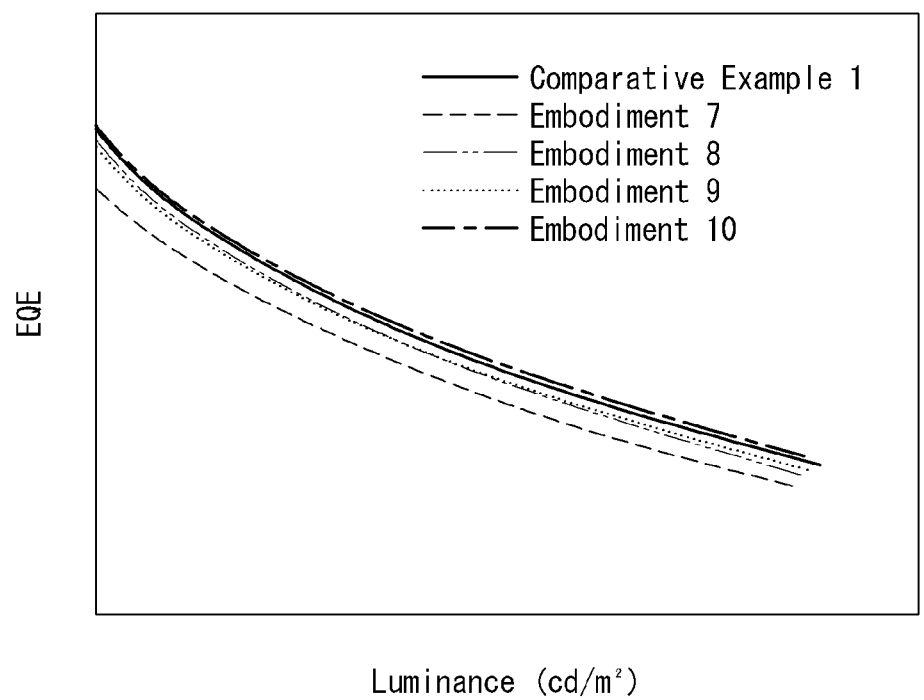
FIG. 20 is a graph of the emission spectrum of organic light emitting display devices according to Comparative Example and Embodiments 7 to 10 of the present invention.
Figure 21:
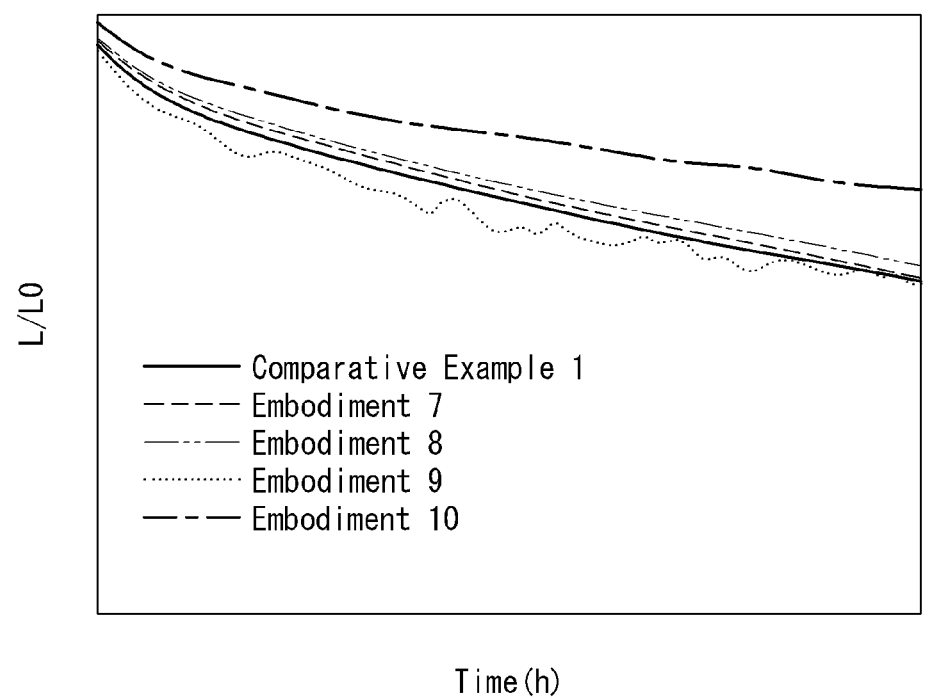
FIG. 21 is a graph of the ratio of decrease in luminance over time of organic light emitting display devices according to Comparative Example and Embodiments 7 to 10 of the present invention.
Figure 22:
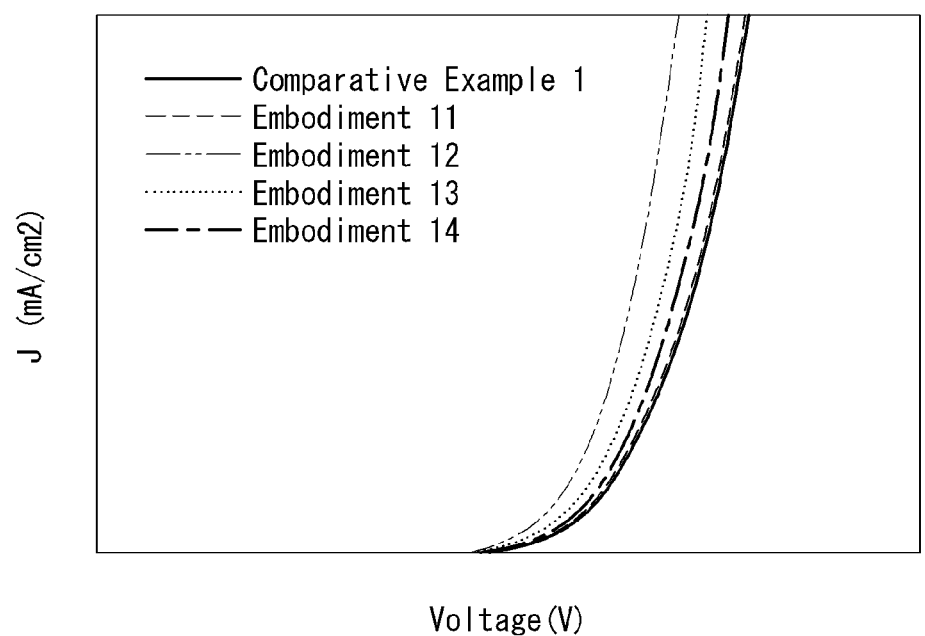
FIG. 22 is a graph of the current density vs. operating voltage of organic light emitting display devices according to Comparative Example and Embodiments 11 to 14 of the present invention.
Figure 23:
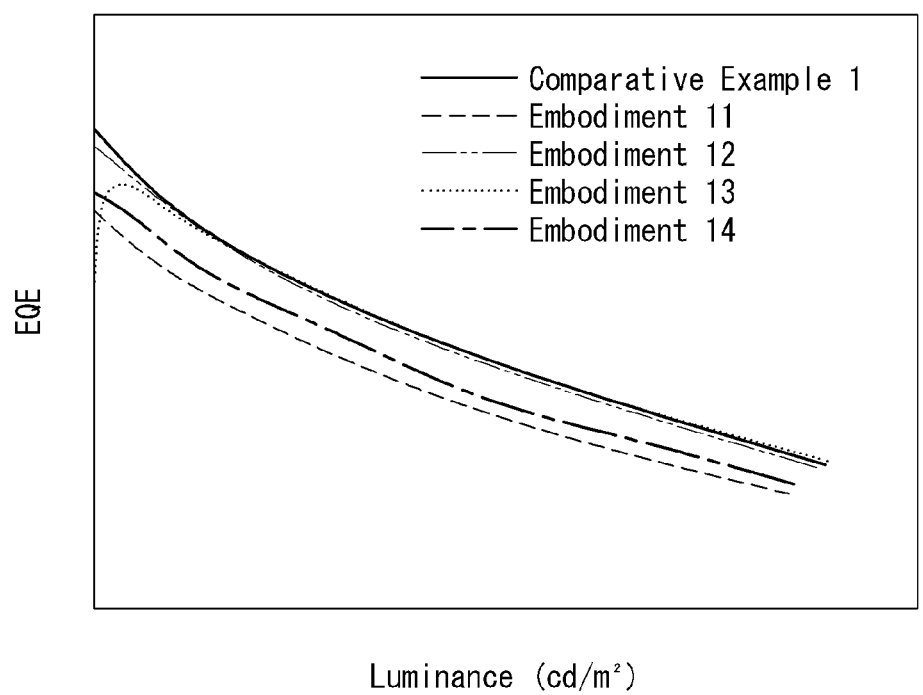
FIG. 23 is a graph of the emission spectrum of organic light emitting display devices according to Comparative Example and Embodiments 11 to 14 of the present invention.
Figure 24:
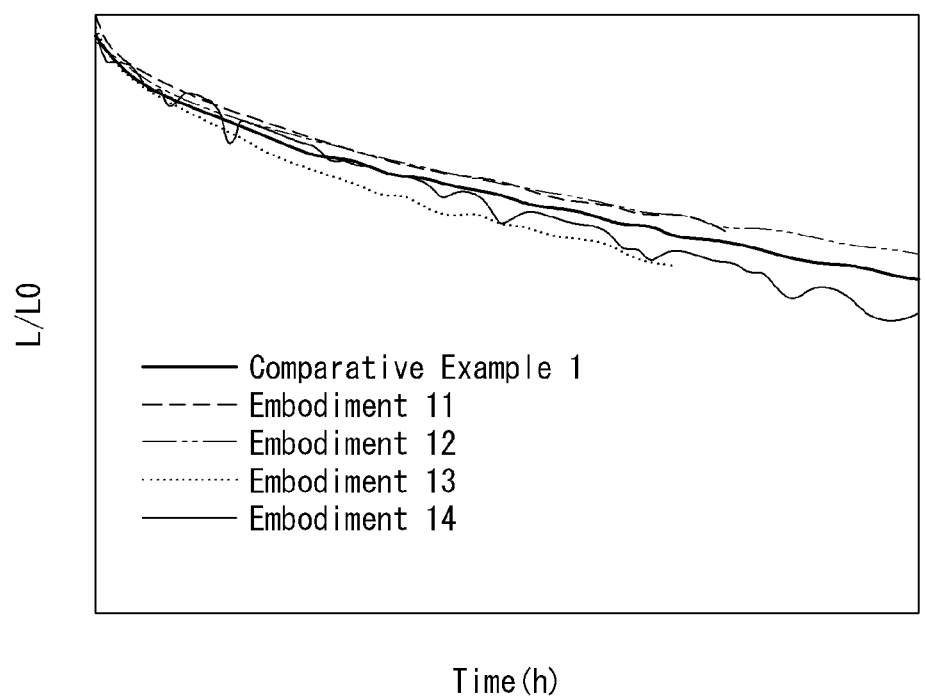
FIG. 24 is a graph of the ratio of decrease in luminance over time of organic light emitting display devices according to Comparative Example and Embodiments 11 to 14 of the present invention.
Figure 25:
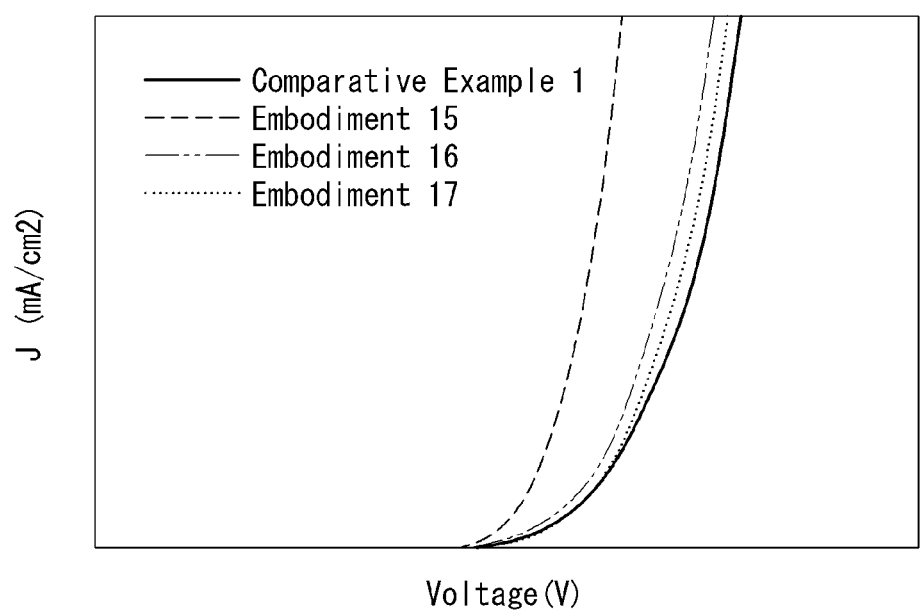
FIG. 25 is a graph of the current density vs. operating voltage of organic light emitting display devices according to Comparative Example and Embodiments 15 to 17 of the present invention.
Figure 26:
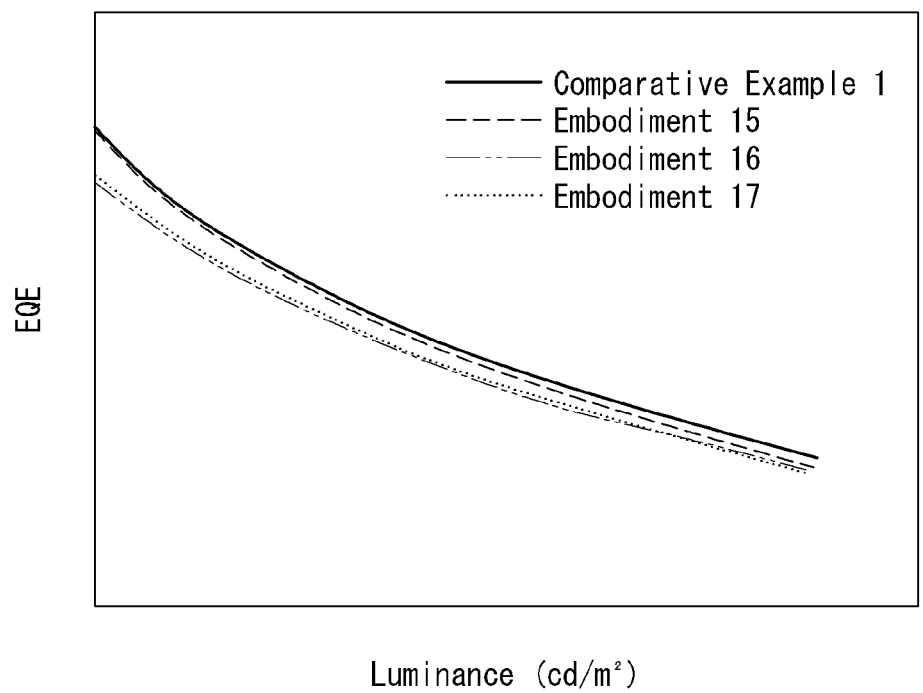
FIG. 26 is a graph of the emission spectrum of organic light emitting display devices according to Comparative Example and Embodiments 15 to 17 of the present invention.
Figure 27:
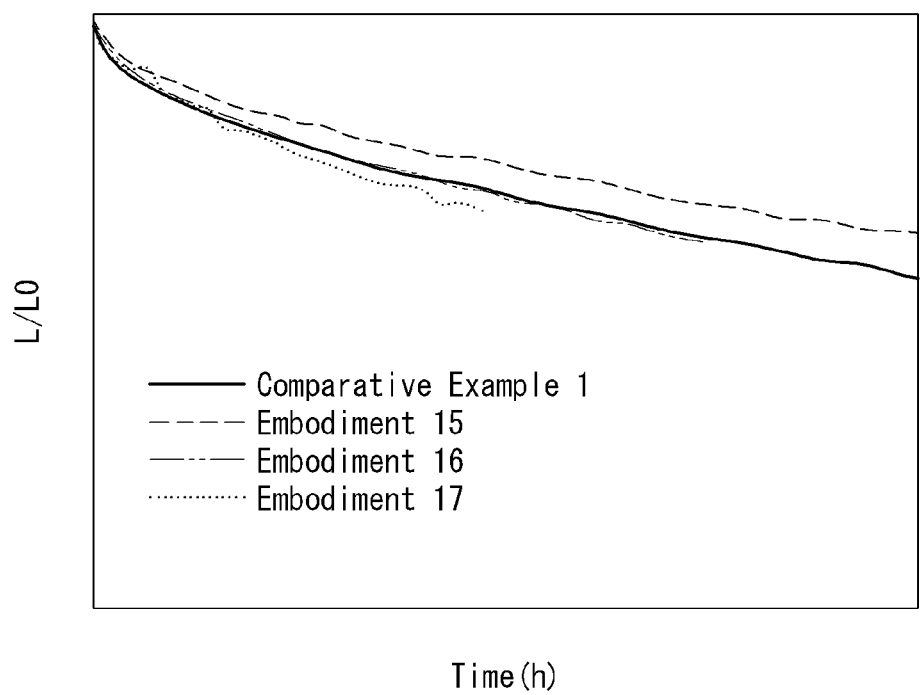
FIG. 27 is a graph of the ratio of decrease in luminance over time of organic light emitting display devices according to Comparative Example and Embodiments 15 to 17 of the present invention.

The current density vs operating voltage of the organic light emitting display devices manufactured according to Comparative Example 1 and Embodiments 7 to 10 was measured and shown in FIG. 19, the quantum efficiency vs luminance was measured and shown in FIG. 20, and the decrease in luminance over time was measured and shown in FIG. 21. Also, the current density vs operating voltage of the organic light emitting display devices manufactured according to Comparative Example 1 and Embodiments 11 to 14 was measured and shown in FIG. 22, the quantum efficiency vs luminance was measured and shown in FIG. 23, and the ratio of decrease in luminance over time was measured and shown in FIG. 24. Also, the current density vs operating voltage of the organic light emitting display devices manufactured according to Comparative Example 1 and Embodiments 15 to 17 was measured and shown in FIG. 25, the quantum efficiency vs luminance was measured and shown in FIG. 26, and the ratio of decrease in luminance over time was measured and shown in FIG. 27.

TABLE 4

| | Operating voltage (%) | Current efficiency (%) | Quantum efficiency (%) | Lilfetime (%) |
|---|---|---|---|---|
| Comparative Example 1 | 100.0 | 100.0 | 100.0 | 100.0 |
| Embodiment 7 | 94.4 | 96.1 | 95.9 | 105.0 |
| Embodiment 8 | 92.7 | 99.0 | 99.5 | 114.0 |
| Embodiment 9 | 91.4 | 98.6 | 99.4 | 68.6 |
| Embodiment 10 | 94.3 | 101.3 | 100.4 | 209.0 |
| Embodiment 11 | 100.0 | 93.5 | 93.2 | 110.6 |
| Embodiment 12 | 91.9 | 99.3 | 99.7 | 116.1 |
| Embodiment 13 | 95.9 | 99.9 | 99.3 | 78.8 |
| Embodiment 14 | 98.5 | 95.4 | 95.6 | 91.2 |
| Embodiment 15 | 85.8 | 100.6 | 99.5 | 134.9 |
| Embodiment 16 | 97.0 | 96.5 | 96.1 | 96.5 |
| Embodiment 17 | 99.1 | 96.9 | 96.6 | 79.7 |

With reference to FIGS. 19 to 27 and Table 4, Embodiment 7 using compound NC119 as the N-type charge generation layer showed a 3.9% decrease in current efficiency, a 4.1% decrease in quantum efficiency, a 5.6% decrease in operating voltage, and a 5% increase in lifetime, compared to Comparative Example 1 using BPhen as the N-type charge generation layer in a stack structure. Also, Embodiment 8 using compound NC124 as the N-type charge generation layer showed a 1% decrease in current efficiency, a 0.5% decrease in quantum efficiency, a 7.3% decrease in operating voltage, and a 5% increase in lifetime, compared to Comparative Example 1. Also, Embodiment 9 using compound NC126 as the N-type charge generation layer showed a 1.4% decrease in current efficiency, a 0.6% decrease in quantum efficiency, an 8.6% decrease in operating voltage, and a 31.4% decrease in lifetime, compared to Comparative Example 1. Also, Embodiment 10 using compound NC132 as the N-type charge generation layer showed a 1.3% increase in current efficiency, a 0.4% increase in quantum efficiency, a 5.7% decrease in operating voltage, and a 109% increase in lifetime, compared to Comparative Example 1. Also, Embodiment 11 using compound NC151 as the N-type charge generation layer showed a 6.5% decrease in current efficiency, a 6.8% decrease in quantum efficiency, no change in operating voltage, and a 10.6% increase in lifetime, compared to Comparative Example 1. Also, Embodiment 12 using compound NC175 as the N-type charge generation layer showed a 0.7% decrease in current efficiency, a 0.3% decrease in quantum efficiency, an 8.1% decrease in operating voltage, and a 16.1% increase in lifetime, compared to Comparative Example 1. Also, Embodiment 13 using compound NC195 as the N-type charge generation layer showed a 0.1% decrease in current efficiency, a 0.7% decrease in quantum efficiency, a 4.1% decrease in operating voltage, and a 21.2% decrease in lifetime, compared to Comparative Example 1. Also, Embodiment 14 using compound NC197 as the N-type charge generation layer showed a 4.6% decrease in current efficiency, a 4.4% decrease in quantum efficiency, a 1.5% decrease in operating voltage, and an 8.8% decrease in lifetime, compared to Comparative Example 1. Also, Embodiment 15 using compound NC223 as the N-type charge generation layer showed a 0.6% increase in current efficiency, a 0.5% decrease in quantum efficiency, a 14.2% decrease in operating voltage, and a 34.9% increase in lifetime, compared to Comparative Example 1. Also, Embodiment 16 using compound NC231 as the N-type charge generation layer showed a 3.5% decrease in current efficiency, a 3.9% decrease in quantum efficiency, a 3% decrease in operating voltage, and a 3.5% decrease in lifetime, compared to Comparative Example 1. Also, Embodiment 17 using compound NC232 as the N-type charge generation layer showed a 3.1% decrease in current efficiency, a 3.4% decrease in quantum efficiency, a 0.9% decrease in operating voltage, and a 20.3% decrease in lifetime, compared to Comparative Example 1.

From these results, it can be found out that an N-type charge generation layer having a compound of the present invention brings about a decrease in the operating voltage of the device and an overall increase in lifetime.

Hereinafter, embodiments for manufacturing an organic light emitting display device using the compounds prepared according to the above-described synthesis examples as an electron transport layer will be disclosed.

Embodiment 18

The second electron transport layer had the same composition as Comparative Example 1 of Test 1, and was formed of compound NC119.

Embodiment 19

The second electron transport layer had the same composition as Comparative Example 1 of Test 1, and was formed of compound NC124.

Embodiment 20

The second electron transport layer had the same composition as Comparative Example 1 of Test 1, and was formed of compound NC197.

Embodiment 21

The second electron transport layer had the same composition as Comparative Example 1 of Test 1, and was formed of compound NC209.

Figure 28:
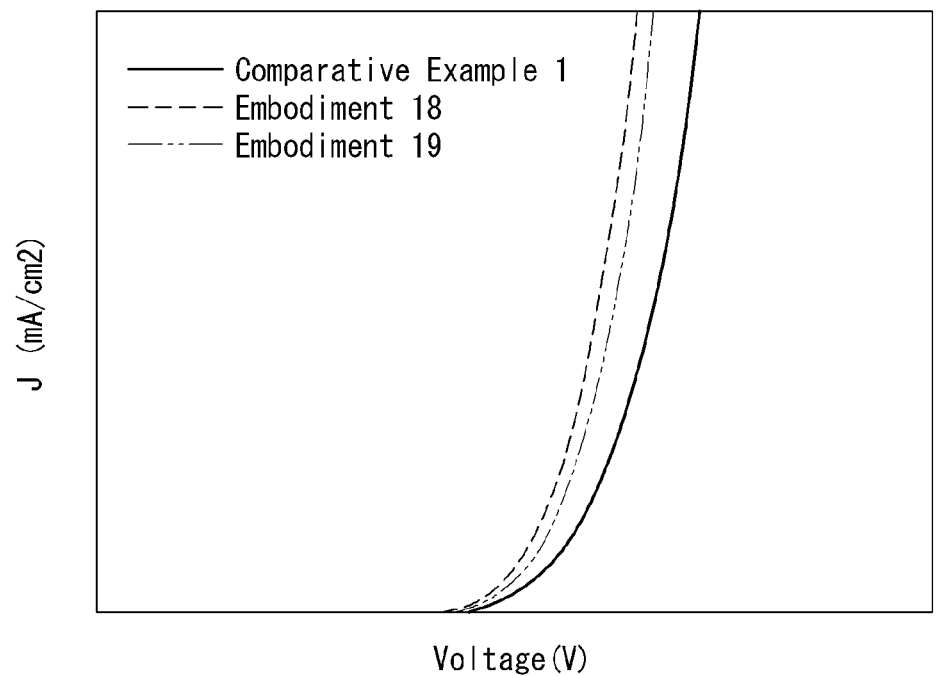
FIG. 28 is a graph of the current density vs. operating voltage of organic light emitting display devices according to Comparative Example and Embodiments 18 and 19 of the present invention.
Figure 29:
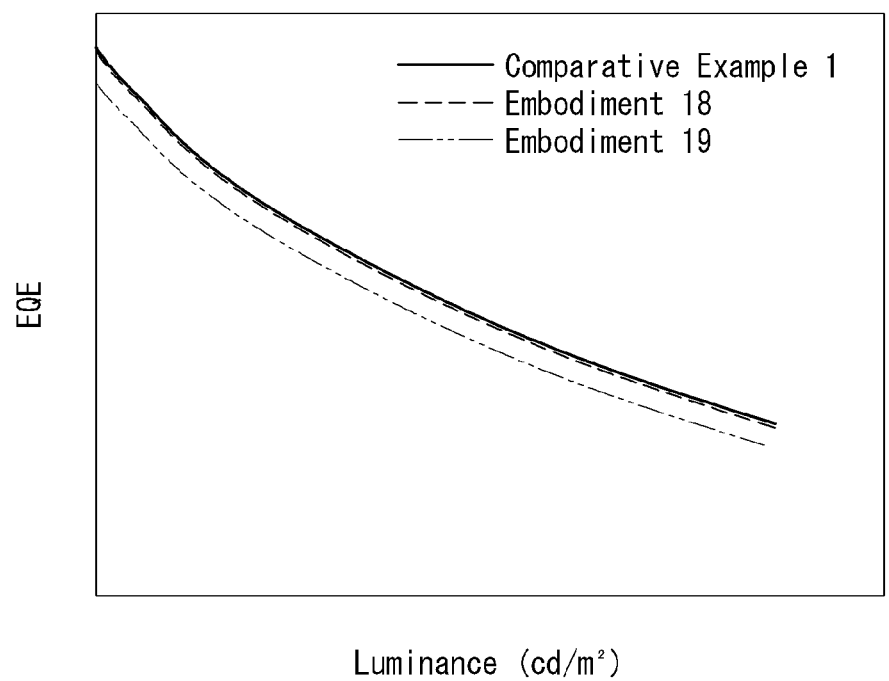
FIG. 29 is a graph of the emission spectrum of organic light emitting display devices according to Comparative Example and Embodiments 18 and 19 of the present invention.
Figure 30:
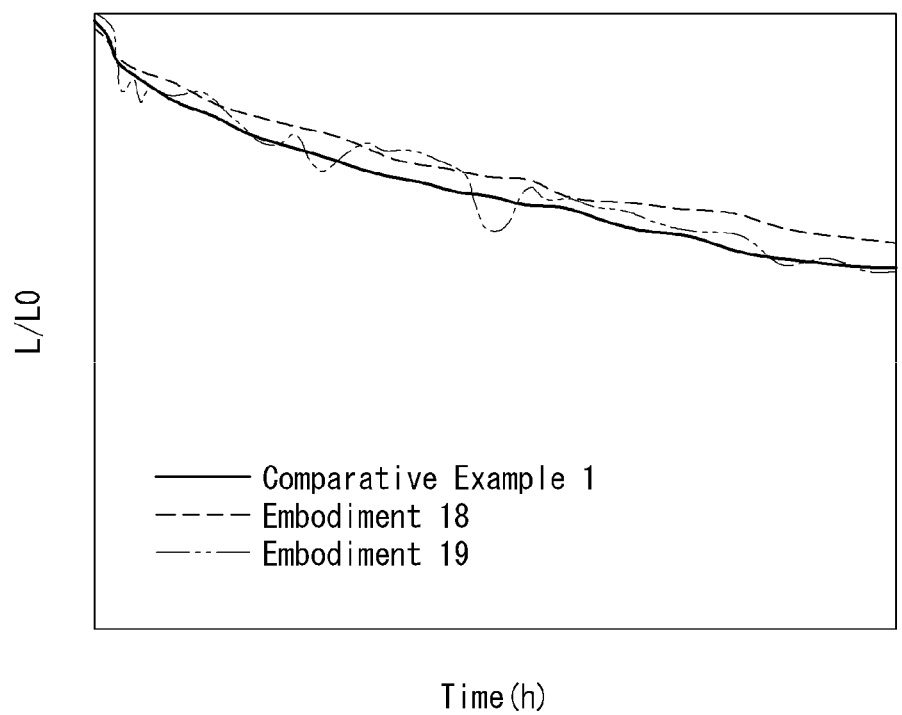
FIG. 30 is a graph of the ratio of decrease in luminance over time of organic light emitting display devices according to Comparative Example and Embodiments 18 and 19 of the present invention.
Figure 31:
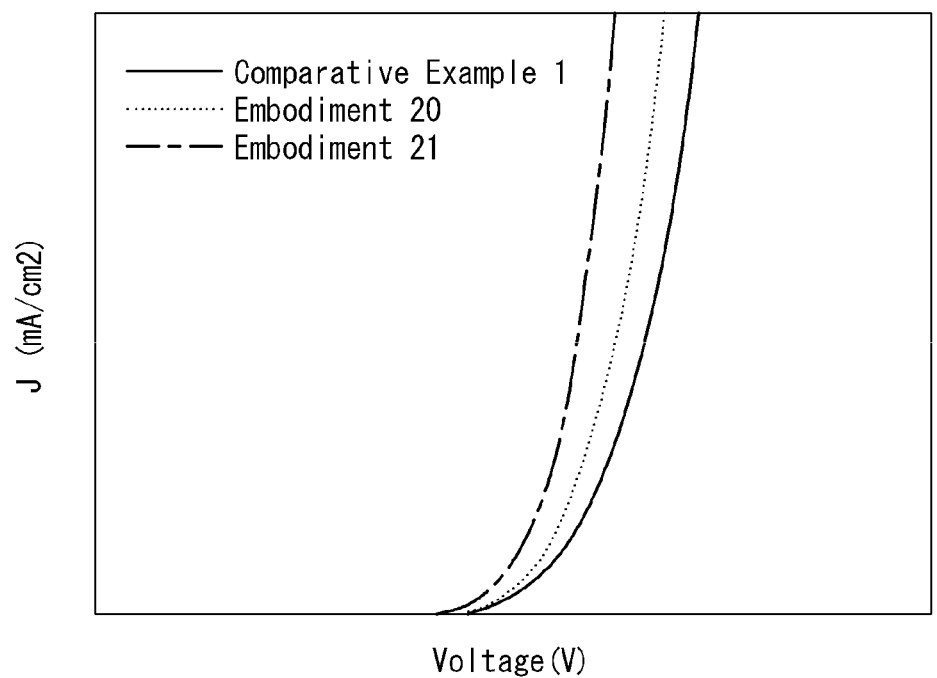
FIG. 31 is a graph of the current density vs. operating voltage of organic light emitting display devices according to Comparative Example and Embodiments 20 and 21 of the present invention.
Figure 32:
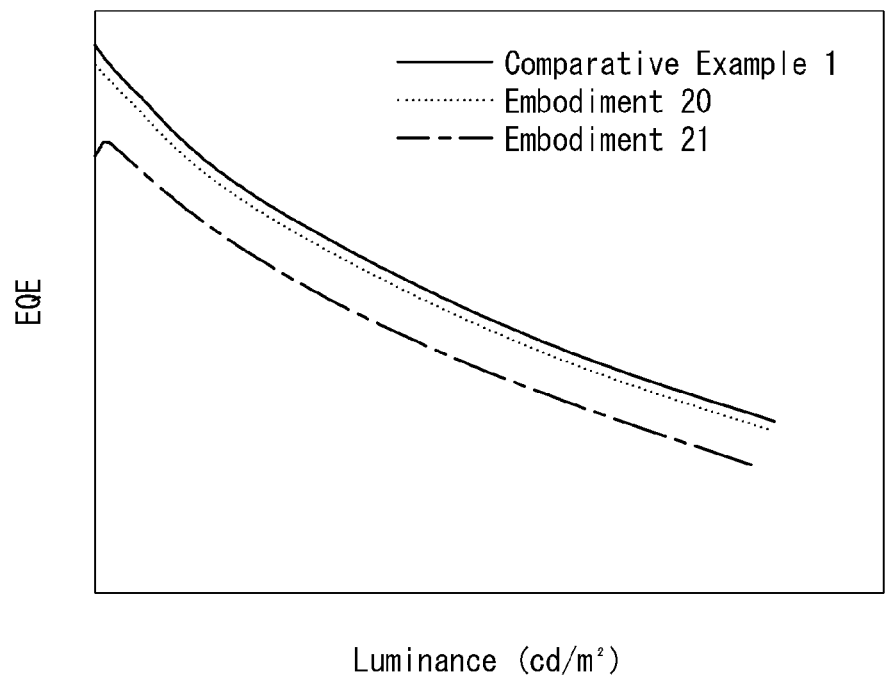
FIG. 32 is a graph of the emission spectrum of organic light emitting display devices according to Comparative Example and Embodiments 20 and 21 of the present invention.
Figure 33:
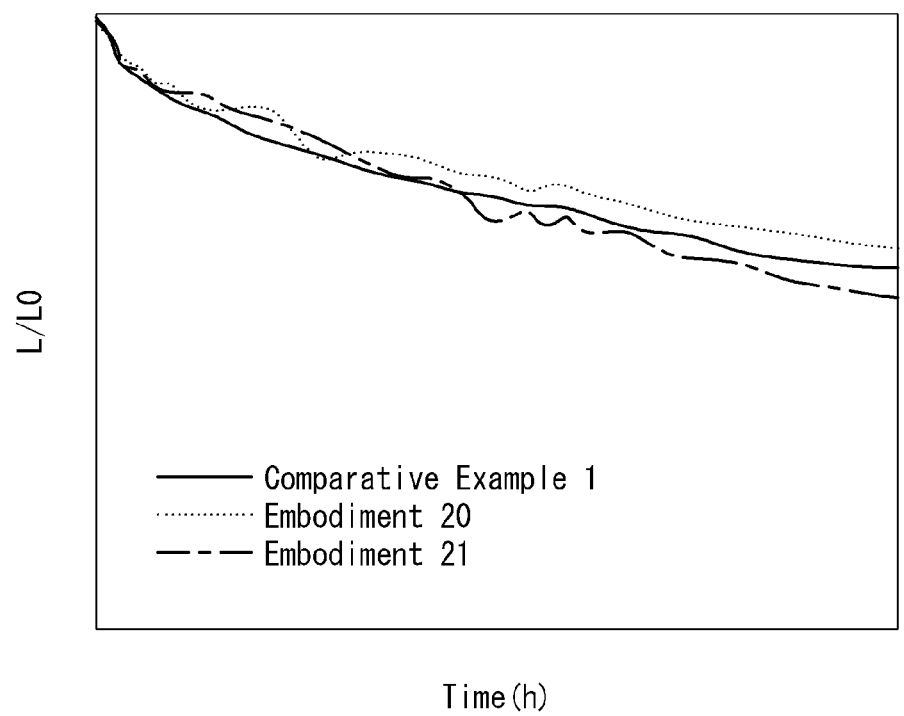
FIG. 33 is a graph of the ratio of decrease in luminance over time of organic light emitting display devices according to Comparative Example and Embodiments 20 and 21 of the present invention.

The operating voltage, current efficiency, and lifetime of the organic light emitting display devices according to Comparative Example 1 and Embodiments 18 to 21 were measured and shown in the following Table 5. The current density vs operating voltage of the organic light emitting display devices manufactured according to Comparative Example 1 and Embodiments 18 and 19 was shown in FIG. 28, the emission spectra of the organic light emitting display devices manufactured according to Comparative Example 1 and Embodiments 18 and 19 were shown in FIG. 29, and the decrease in luminance over time of the organic light emitting display devices manufactured according to Comparative Example 1 and Embodiments 18 and 19 was shown in FIG. 30. Also, the current density vs operating voltage of the organic light emitting display devices manufactured according to Comparative Example 1 and Embodiments 20 and 21 was shown in FIG. 31, the emission spectra of the organic light emitting display devices manufactured according to Comparative Example 1 and Embodiments 20 and 21 were shown in FIG. 32, and the decrease in luminance over time of the organic light emitting display devices manufactured according to Comparative Example 1 and Embodiments 20 and 21 was shown in FIG. 33.

TABLE 5

|  | Operating voltage (%) | Current efficiency (%) | Quantum efficiency (%) | Lifetime (%) |
| --- | --- | --- | --- | --- |
| Comparative Example 1 | 100.0 | 100.0 | 100.0 | 100.0 |
| Embodiment 18 | 91.9 | 99.3 | 99.7 | 114.0 |
| Embodiment 19 | 94.5 | 97.2 | 97.2 | 91.2 |
| Embodiment 20 | 95.6 | 98.4 | 98.5 | 110.6 |
| Embodiment 21 | 90.0 | 94.1 | 94.0 | 79.7 |

With reference to FIGS. 28 to 33 and Table 5, Embodiment 18 using compound NC119 as the electron transport layer showed a 0.7% decrease in current efficiency, a 0.3% decrease in quantum efficiency, an 8.1% decrease in operating voltage, and a 14% increase in lifetime, compared to Comparative Example 1 using Alq3 as the electron transport layer in a stack structure. Also, Embodiment 19 using compound NC124 as the electron transport layer showed a 2.8% decrease in current efficiency, a 2.8% decrease in quantum efficiency, a 5.5% decrease in operating voltage, and a 2.8% decrease in lifetime, compared to Comparative Example 1. Also, Embodiment 20 using compound NC197 as the electron transport layer showed a 1.6% decrease in current efficiency, a 1.5% decrease in quantum efficiency, a 4.4% decrease in operating voltage, and 10.6% increase in lifetime, compared to Comparative Example 1. Also, Embodiment 21 using compound NC209 as the electron transport layer showed a 5.9% decrease in current efficiency, a 6% decrease in quantum efficiency, a 10% decrease in operating voltage, and a 20.3% decrease in lifetime, compared to Comparative Example 1.

From these results, it can be found out that an electron transport layer having a compound of the present invention brings about a decrease in the operating voltage of the device and an increase in lifetime.

<Test 3>

COMPARATIVE EXAMPLE 2

An organic light emitting display device was manufactured by forming, on a substrate, a first light emitting part having a blue light emitting layer and a first electron transport layer, a second light emitting part having an N-type charge generation layer, a P-type charge generation layer, a yellow light emitting layer, and a second electron transport layer, and a cathode. The first electron transport layer was formed of the following compound ETL_R1, and the N-type charge generation layer was formed of the following compound NCGL_R.

ETL_R1

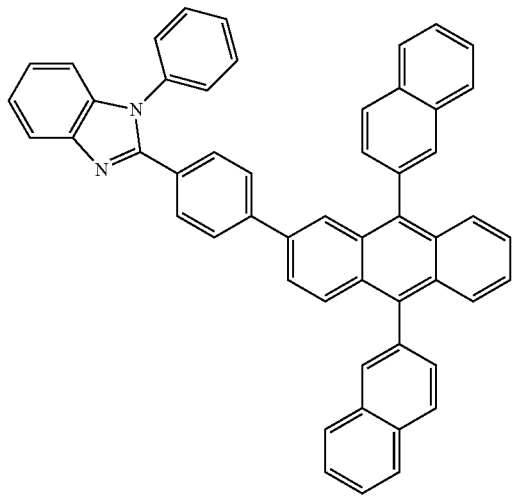

NCGL_R

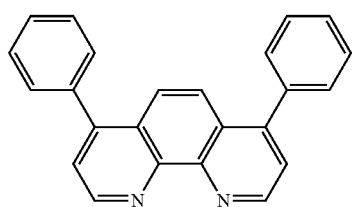

COMPARATIVE EXAMPLE 3

An organic light emitting display device was manufactured by comprising a first electron transport layer having the same composition as Comparative Example 2 and formed of compound ETL_A and an N-type charge generation layer having the same composition as Comparative Example and formed of compound NCGL_R.

ETL_A

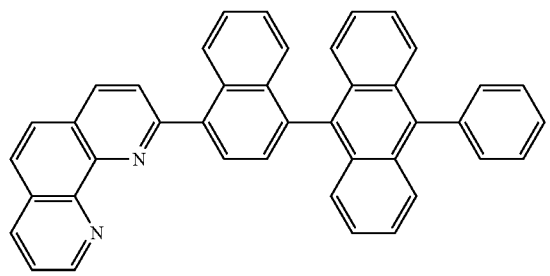

COMPARATIVE EXAMPLE 4

An organic light emitting display device was manufactured by comprising a first electron transport layer having the same composition as Comparative Example 2 and formed of compound ETL_R1 and an N-type charge generation layer having the same composition as Comparative Example 2 and formed of compound NCGL_B.

NCGL_B

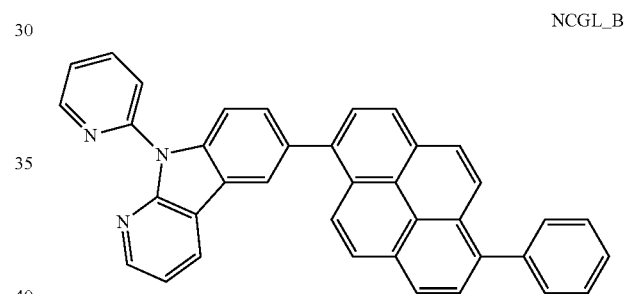

COMPARATIVE EXAMPLE 5

An organic light emitting display device was manufactured by comprising a first electron transport layer having the same composition as Comparative Example 2 and formed of compound ETL_R2 and an N-type charge generation layer having the same composition as Comparative Example 2 and formed of compound NCGL_C.

ETL_R2

NCGL_C

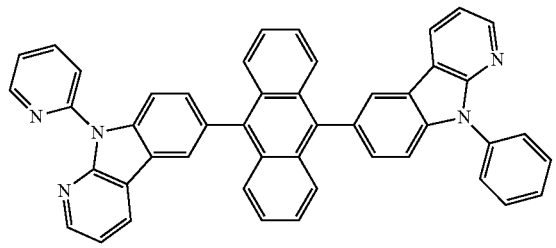

ETL_C

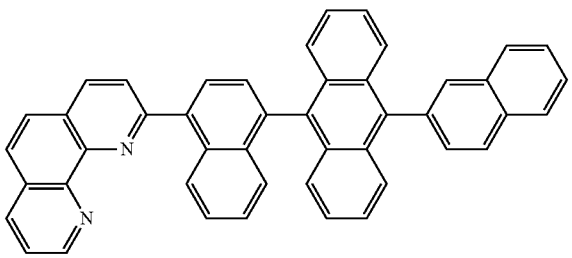

NCGL_C

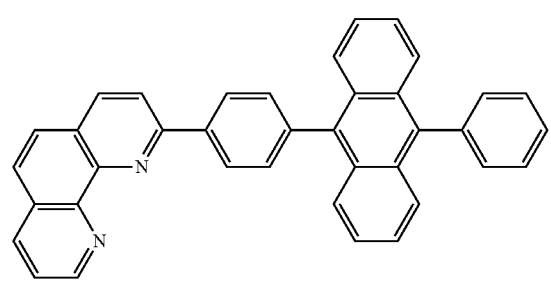

Embodiment 22

An organic light emitting display device was manufactured by comprising a first electron transport layer having the same composition as Comparative Example 2 and formed of compound ETL_A and an N-type charge generation layer having the same composition as Comparative Example 2 and formed of compound NCGL_B.

Embodiment 23

An organic light emitting display device was manufactured by comprising a first electron transport layer having the same composition as Comparative Example 2 and formed of compound ETL B and an N-type charge generation layer having the same composition as Comparative Example 2 and formed of compound NCGL_A.

ETL_B

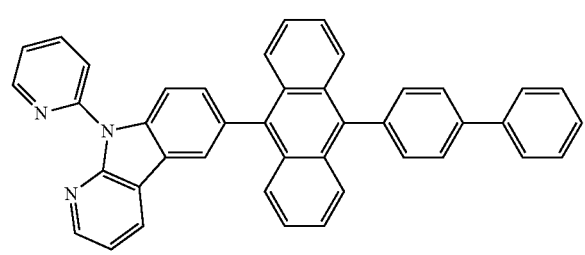

NCGL_A

Embodiment 24

An organic light emitting display device was manufactured by comprising a first electron transport layer having the same composition as Comparative Example 2 and formed of compound ETL_C and an N-type charge generation layer having the same composition as Comparative Example 2 and formed of compound NCGL_C.

The materials of the first electron transport layer and the N-type charge generation layer or the compositions of the light emitting layers used in the above comparative examples and embodiments do not limit the scope of the present invention.

The operating voltage and current efficiency of the organic light emitting display devices according to Comparative Examples 2 to 5 and Embodiments 22 to 24 were measured and shown in the following Table 6. The following Table 6 shows the percentages of results of Comparative Examples 3 to 5 and Embodiments 22 to 24 relative to 100% for results of Comparative Example 2 where the device was driven at a current density of 10 mA/cm$^2$.

TABLE 6

| | Current density (10 mA/cm$^2$) | |
|---|---|---|
| | Operating voltage (V) | Emission efficiency (Cd/A) |
| Comparative Example 2 | 100% | 100% |
| Comparative Example 3 | 97% | 103% |
| Comparative Example 4 | 98% | 104% |
| Comparative Example 5 | 102% | 93% |
| Embodiment 22 | 86% | 117% |
| Embodiment 23 | 88% | 112% |
| Embodiment 24 | 90% | 114% |

In Comparative Example 2, the electron transport layer was formed of ETL_R1, and the N-type charge generation layer was formed of NCGL_R. ETL_R1 is a benzoimidazole-substituted anthracene compound, and NCGL_R is a phenanthroline compound (Bphen).

In Comparative Example 3, the electron transport layer was formed of ETL_A, and the N-type charge generation layer was formed of NCGL_R. ETL_A is a phenanthroline-substituted anthracene compound.

In Comparative Example 4, the electron transport layer was formed of ETL_R1, and the N-type charge generation layer was formed of NCGL_B. NCGL_B is a carboline-substituted pyrene compound.

In Comparative Example 5, the electron transport layer was formed of ETL_R2, and the N-type charge generation layer was formed of NCGL_C. ETL_R2 is a pyridine-substituted fluorine compound, and NCGL_C is a carboline-substituted anthracene compound.

In Embodiment 22, the electron transport layer was formed of ETL_A, and the N-type charge generation layer was formed of NCGL_B. ETL_A is a phenanthroline-substituted anthracene compound, and NCGL_B is a carboline-substituted pyrene compound.

In Embodiment 23, the electron transport layer was formed of ETL B, and the N-type charge generation layer was formed of NCGL_A. ETL B is a phenanthroline-substituted anthracene compound, and NCGL_A is a carboline-substituted anthracene compound.

In Embodiment 24, the electron transport layer was formed of ETL_C, and the N-type charge generation layer was formed of NCGL_C. ETL_C is a phenanthroline-substituted anthracene compound, and NCGL_C is a carboline-substituted anthracene compound.

With reference to Table 6, it can be found out that Embodiment 22 using a phenanthroline derivative for the electron transport layer and a carboline derivative for the N-type charge generation layer achieved a 12 to 16% decrease in operating voltage and a 13 to 24% increase in emission efficiency, compared to Comparative Examples 2 to 5 using a phenanthroline derivative or carboline derivative for one among the electron transport layer or the N-type charge generation layer.

It can be found out that Embodiment 23 using a phenanthroline derivative for the electron transport layer and a carboline derivative for the N-type charge generation layer achieved a 10 to 14% decrease in operating voltage and an 8 to 19% increase in emission efficiency, compared to Comparative Examples 2 to 5 using a phenanthroline derivative or carboline derivative for one among the electron transport layer or the N-type charge generation layer.

It can be found out that Embodiment 24 using a phenanthroline derivative for the electron transport layer and a carboline derivative for the N-type charge generation layer achieved an 8 to 12% decrease in operating voltage and a 10 to 21% increase in emission efficiency, compared to Comparative Examples 2 to 5 using a phenanthroline derivative or carboline derivative for one among the electron transport layer or the N-type charge generation layer.

As discussed above, the organic light emitting display devices according to the first to fourth example embodiments and seventh to twenty-first example embodiments of the present invention have the following advantages.

A compound having nitrogen atom of the present invention is rich in electrons by two nitrogen atoms, which results in high electron mobility, making electron transport easy. Accordingly, the organic light emitting display device of the present invention allows for efficient transfer of electrons from the N-type charge generation layer to the light emitting layer, by using this compound for at least one among the electron transport layers in the light emitting parts.

Moreover, the compound having the nitrogen atom of the present invention includes nitrogen (N) of $sp^2$ hybrid orbital which is relatively electron-rich, and the nitrogen is bound to an alkali metal or alkali earth metal, a dopant for the N-type charge generation layer, thereby forming a gap state. This gap state may facilitate transfer of electrons from the N-type charge generation layer to the electron transport layer. Accordingly, the organic light emitting display device of the present invention facilitates transfer of electrons from the N-type charge generation layer to the electron transport layer, by using this compound of the present invention for the N-type charge generation layer. Also, since the compound having the nitrogen atom is bound to the alkali metal or alkali earth metal in the N-type charge generation layer, the alkali metal or alkali earth metal is not diffused into the P-type charge generation layer, thus increasing lifetime.

Accordingly, the organic light emitting display device of the present invention allows for efficient transfer of electrons from the N-type charge generation layer to the light emitting layer and therefore improves device efficiency and device performance, by using the compound having the nitrogen-atom for at least one among the following—the electron transport layers and N-type charge generation layers in the light emitting parts. Also, the facilitated transfer of electrons from the N-type charge generation layer to the electron transport layer helps reduce the low lifetime problem caused by poor electron injection. Moreover, it can also reduce the problem of operating voltage rise caused by the difference in LUMO energy level between the electron transport layer and the N-type charge generation layer when the electrons injected into the N-type charge generation layer move to the electron transport layer.

Also, the organic light emitting display devices according to the fifth, sixth, twenty-second, twenty-third, and twenty-fourth example embodiments of the present invention have the following advantages.

The present invention facilitates transfer of electrons from the N-type charge generation layer to the electron transport layer or the light emitting layer by using a phenanthroline derivative for at least one among the electron transport layers in the light emitting parts and an anthracene compound or pyrene compound having a carboline derivative for the N-type charge generation layer.

Moreover, the electron transport layer includes a phenanthroline compound and the phenanthroline ring having a nitrogen, which facilitates transport of electrons to the light emitting layers. Also, a triphenyl derivative is linked to the phenanthroline derivative, facilitating the movement of electrons from the N-type charge generation layer to the light emitting layer.

In addition, by using a pyrene compound or anthracene compound having a carboline derivative for the N-type charge generation layer, nitrogen (N) of $sp^2$ hybrid orbital in the carboline derivative which is relatively electron-rich is bound to an alkali metal or alkali earth metal in the N-type charge generation layer, thereby forming a gap state. This gap state may facilitate transfer of electrons from the P-type charge generation layer to the N-type charge generation layer.

It will be apparent to those skilled in the art that various modifications and variations can be made in the organic light emitting display device of the present invention without departing from the spirit or scope of the invention. Thus, it is intended that the present invention cover the modifications and variations of the present invention provided they come within the scope of the appended claims and their equivalents.

What is claimed is:
1. An organic light emitting display device, comprising:
at least two light emitting parts, each having a light emitting layer, a hole transport layer and an electron transport layer, where the light emitting layers may be the same or different, the hole transport layers may be the same or different and the electron transport layers may be the same or different; and a charge generation layer between the light emitting parts, where the charge generation layer comprises a N-type charge generation layer and a P-type charge generation layer, wherein at least one among the charge generation layer and the electron transport layer includes a compound of Formula 1

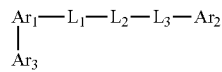

where $Ar_1$ is

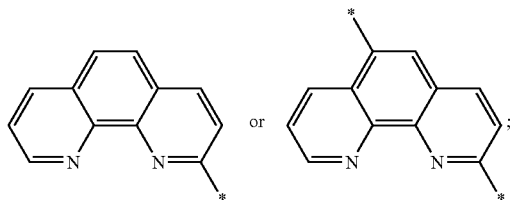 [SMILES: *c1ccc2ccc3cccnc3c2n1 ; *c1ccc2cc(*)c3cccnc3c2n1]

$Ar_3$ is

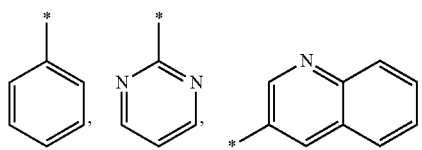

or a bond;
$L_1$ is

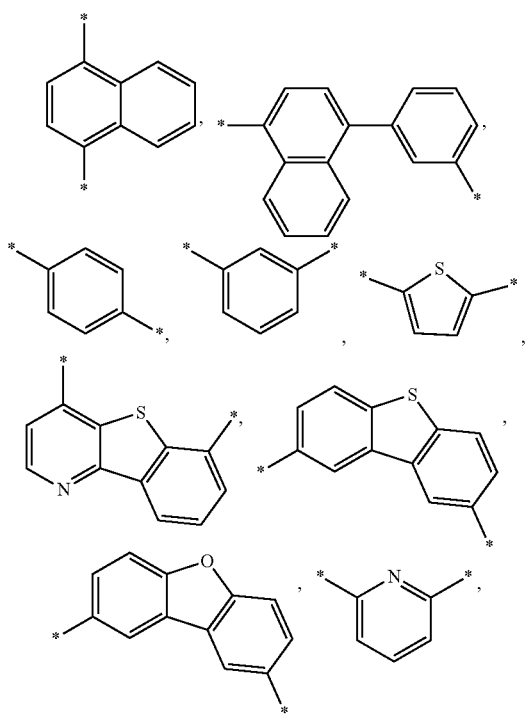

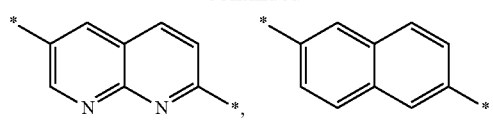

or a bond;
$L_2$ is

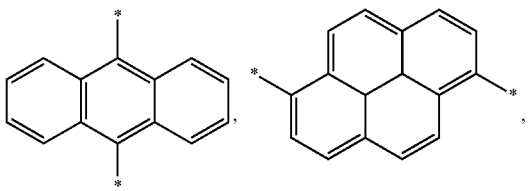

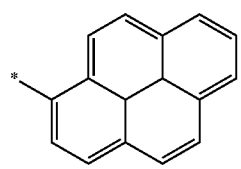

or a bond;
$L_3$ is

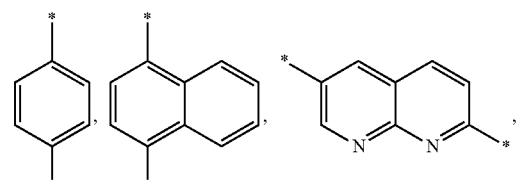

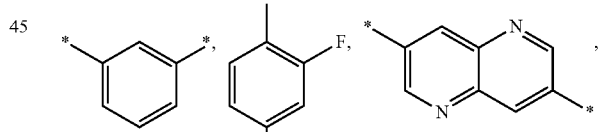

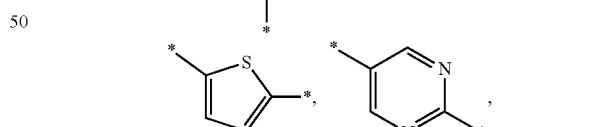

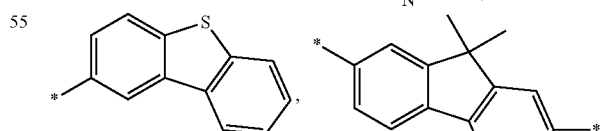

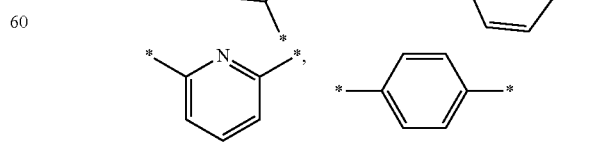

or a bond;

and Ar₂ is
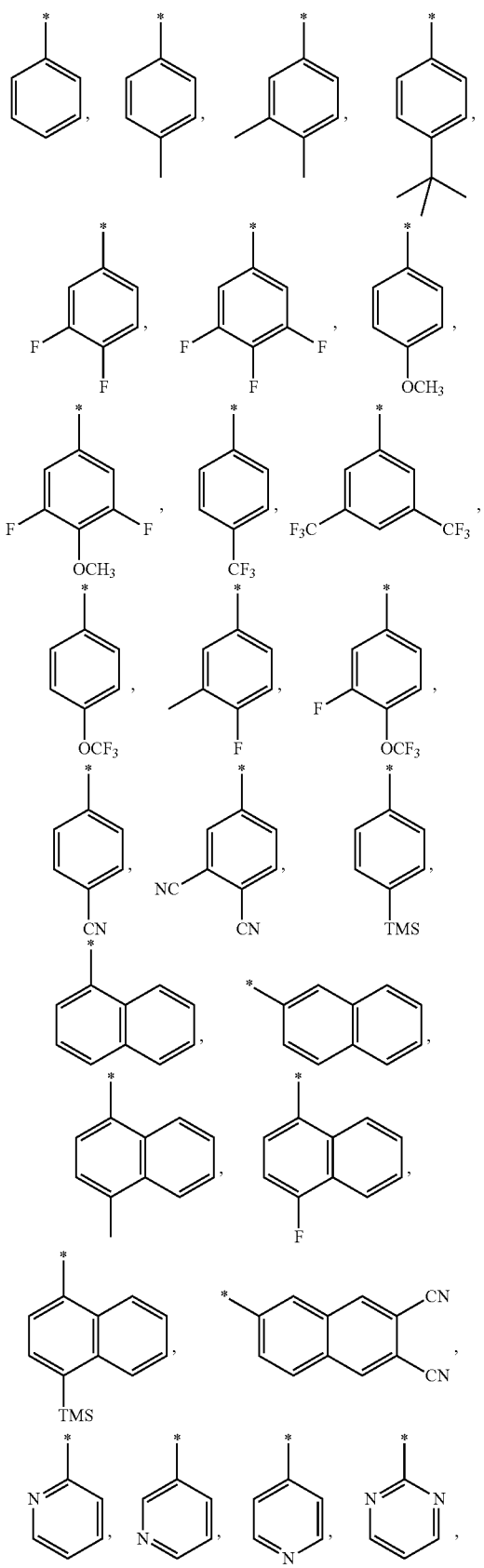
-continued
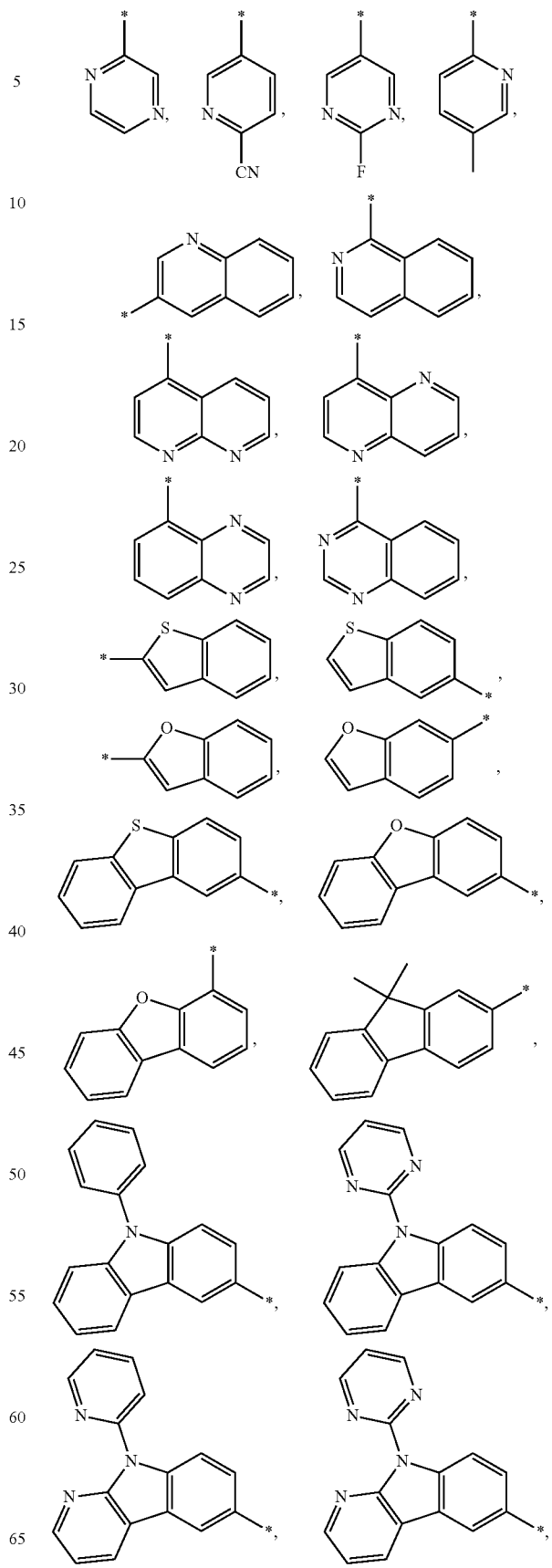

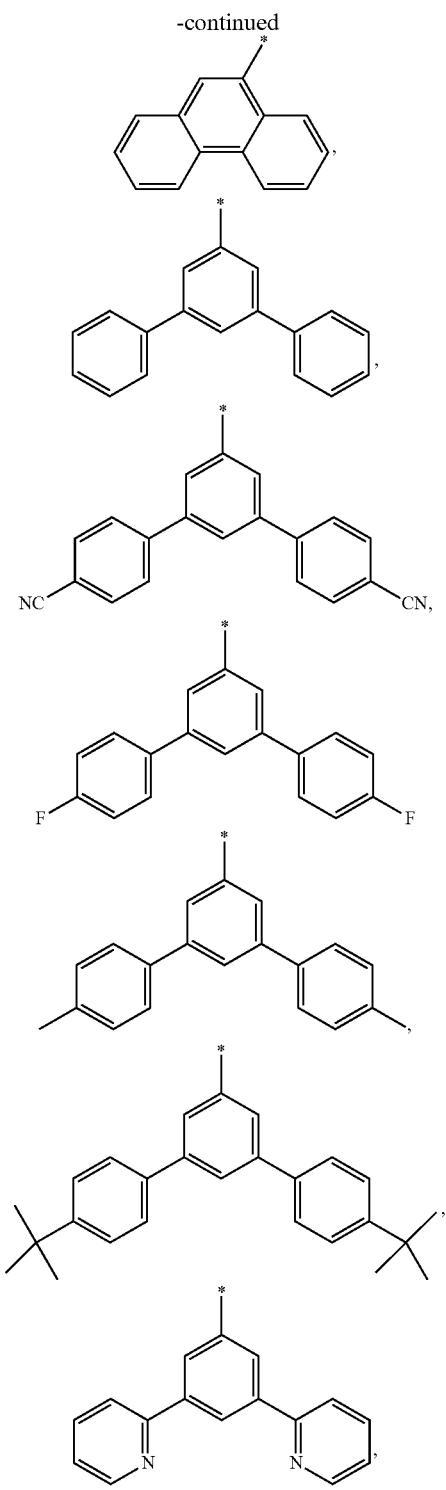

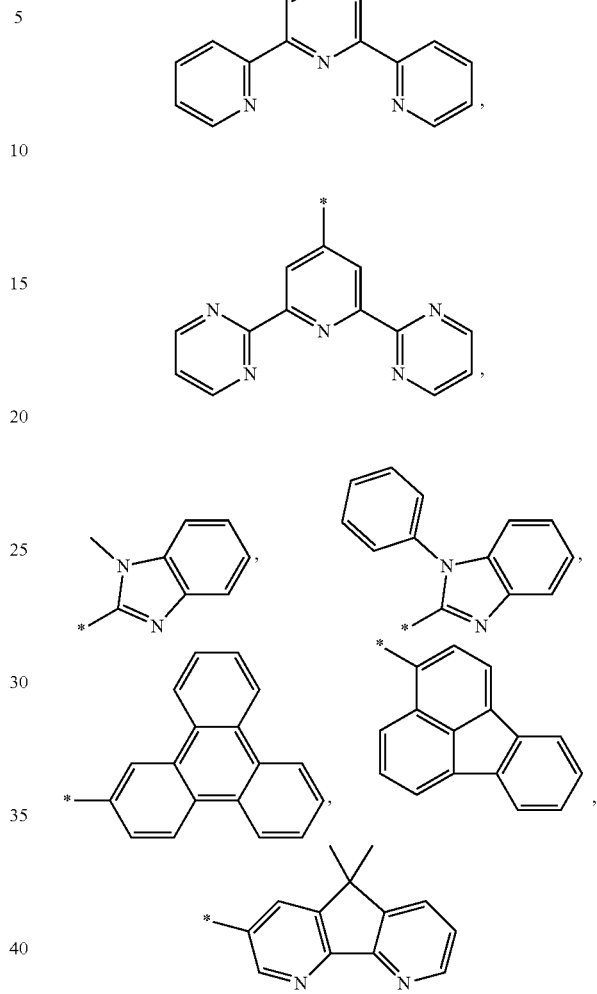

or a bond, wherein at least two of $Ar_2$, $Ar_3$, $L_1$, $L_2$ and $L_3$ are not a bond.

2. The organic light emitting display device of claim 1, wherein one of the at least two light emitting parts includes a blue light emitting part, and the other includes a yellow-green light emitting part.

3. The organic light emitting display device of claim 2, wherein the yellow-green light emitting part includes the electron transport layer.

4. The organic light emitting display device of claim 1, wherein the compound represented by Formula 1 includes any one of the compounds shown in the following table:

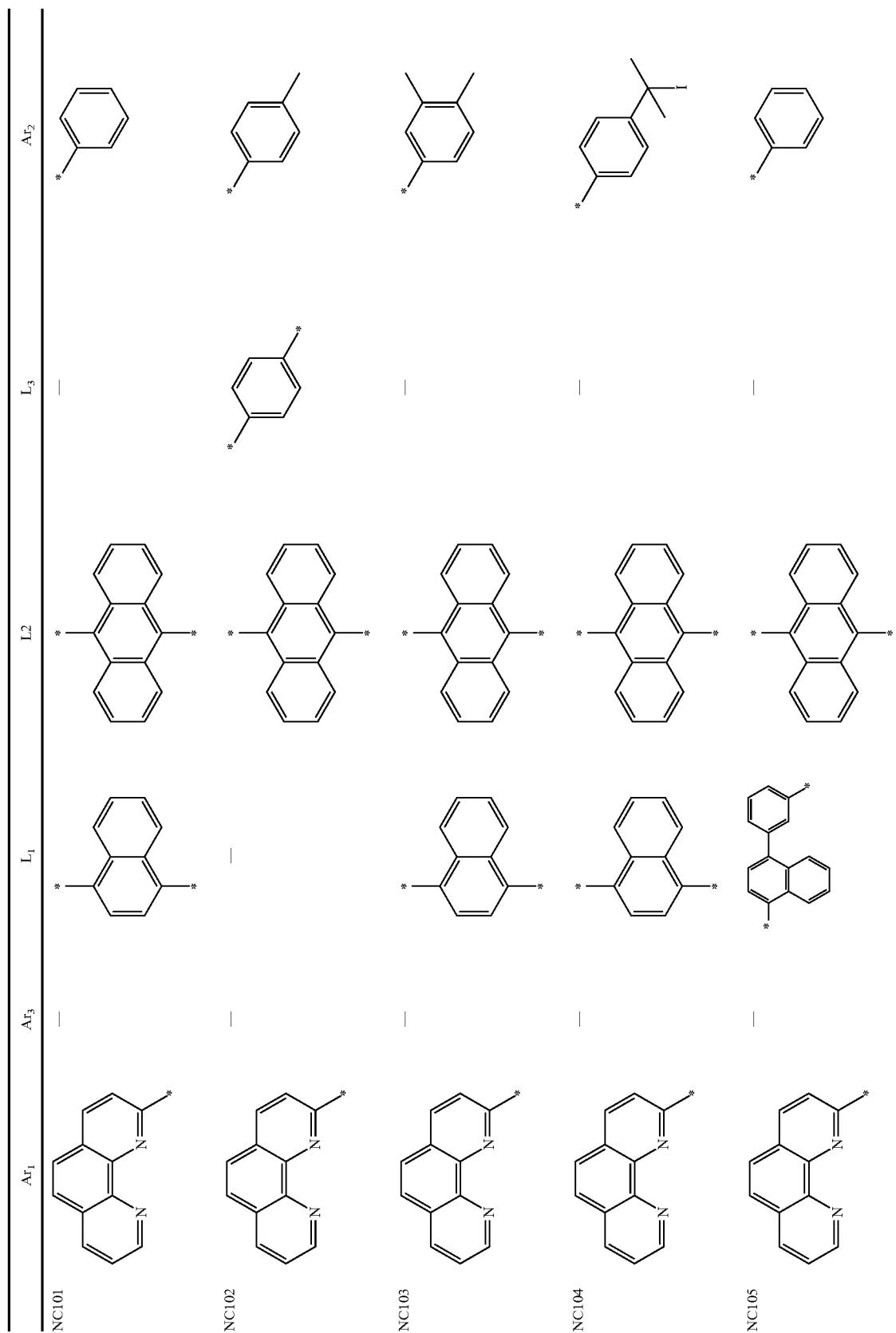

-continued

| | Ar₁ | Ar₃ | L₁ | L₂ | L₃ | Ar₂ |
|---|---|---|---|---|---|---|
| NC106 | phenanthroline-2-yl | — | 1,4-phenylene | 9,10-anthracenylene | 1,4-naphthylene | 3,4-difluorophenyl |
| NC107 | phenanthroline-2-yl | — | 1,4-naphthylene | 9,10-anthracenylene | — | 3,4,5-trifluorophenyl |
| NC108 | phenanthroline-2-yl | — | — | 9,10-anthracenylene | — | 4-methoxyphenyl |
| NC109 | phenanthroline-2-yl | — | — | 9,10-anthracenylene | 1,5-naphthyridinylene | 4-methoxy-3,5-difluorophenyl |
| NC110 | phenanthroline-2-yl | — | 1,4-phenylene | 9,10-anthracenylene | — | 4-trifluoromethylphenyl |

-continued
| | Ar₁ | Ar₃ | L₁ | L₂ | L₃ | Ar₂ |
|---|---|---|---|---|---|---|
| NC111 | 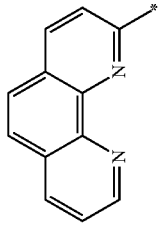 | — |  | 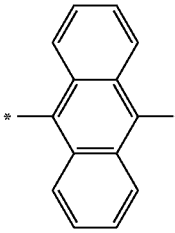 | — | 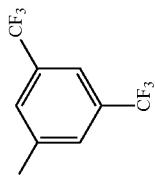 |
| NC112 | 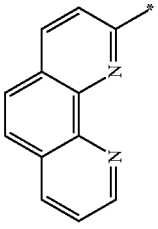 | — | 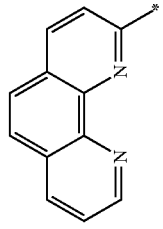 | 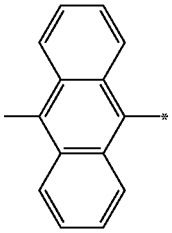 | 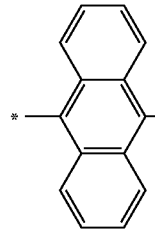 | 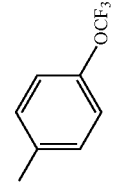 |
| NC113 | 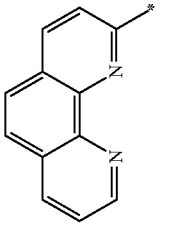 | — | — | 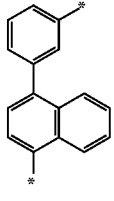 | — |  |
| NC114 | 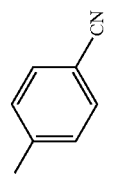 | — | — | 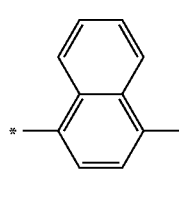 | — | 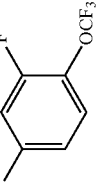 |
| NC115 | 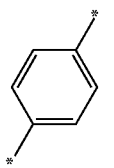 | — | — |  | 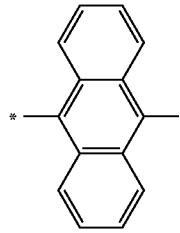 | 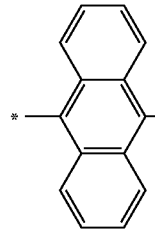 |

| | Ar$_1$ | Ar$_3$ | L$_1$ | L$_2$ | L$_3$ | Ar$_2$ |
|---|---|---|---|---|---|---|
| NC116 | 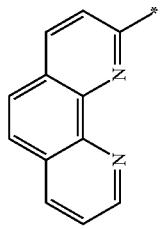 | — | 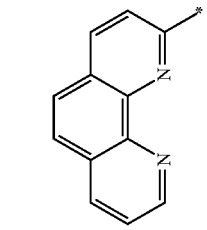 | 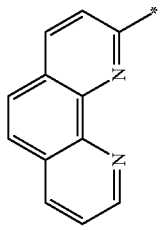 | — | 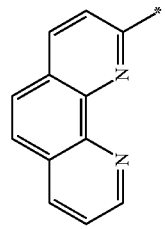 |
| NC117 | 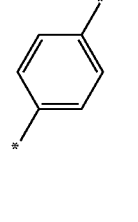 | — | 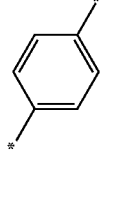 | 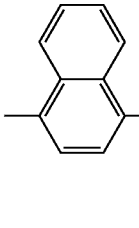 | — | 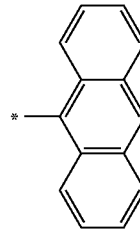 |
| NC118 | 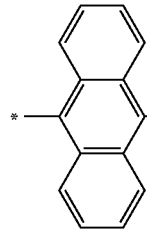 | — | 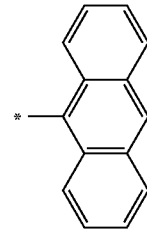 | 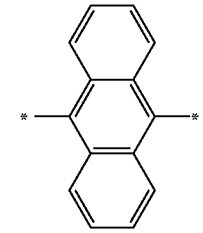 | 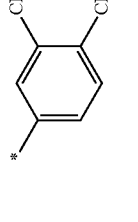 | 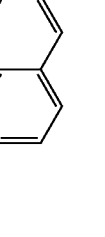 |
| NC119 |  | — |  |  | — |  |
| NC120 |  | — |  |  |  |  |

-continued
| | Ar$_1$ | Ar$_3$ | L$_1$ | L$_2$ | L$_3$ | Ar$_2$ |
|---|---|---|---|---|---|---|
| NC121 | 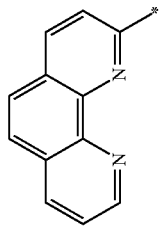 | — | — | 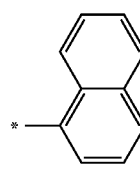 | 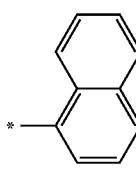 | 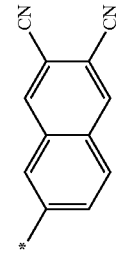 |
| NC122 |  | — | 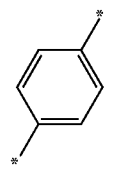 |  | 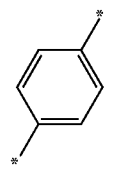 | 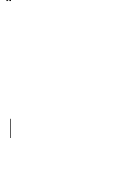 |
| NC123 |  | — | — |  | — | 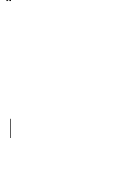 |
| NC124 |  | — | (meta-phenylene) | (anthracene) | — | (phenyl) |
| NC125 |  | — | (para-phenylene) | (anthracene) | — | (isopropylphenyl) |

| | Ar₁ | Ar₃ | L₁ | L₂ | Ar₂ | L₃ | Ar₂ |
|---|---|---|---|---|---|---|---|
| NC126 | | — | | | | — | |
| NC127 | | — | | | | | |
| NC128 | | — | | | | | |
| NC129 | | — | | | | — | |
| NC130 | | — | — | | | | |

-continued
| | Ar₁ | Ar₃ | L₁ | L2 | L₃ | Ar₂ |
|---|---|---|---|---|---|---|
| NC131 | 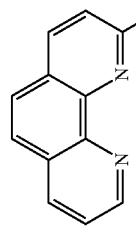 | — | 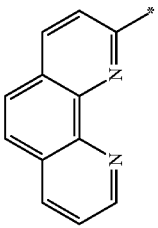 | 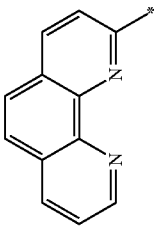 | 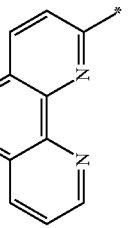 | 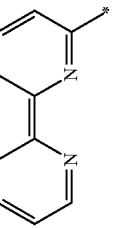 |
| NC132 | 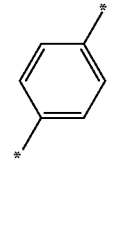 | — | 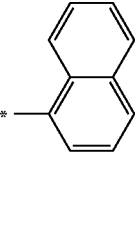 | 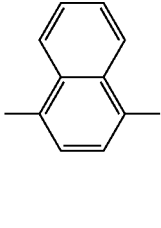 | 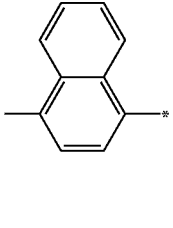 | 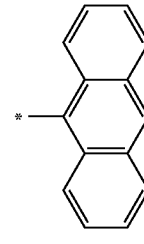 |
| NC133 | 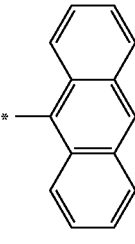 | — | 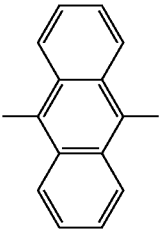 | 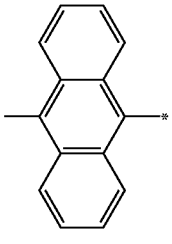 | 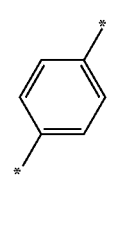 | 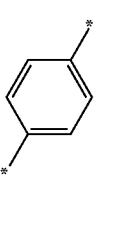 |
| NC134 | 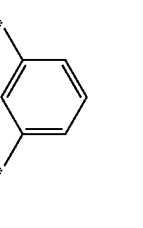 | — | — | 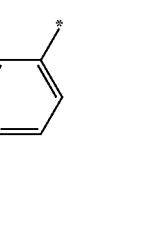 | 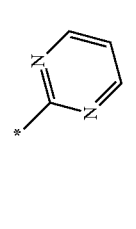 | 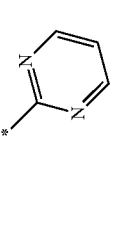 |
| NC135 | 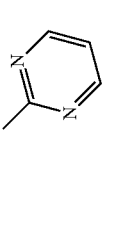 | — |  | | | |

-continued
| | Ar₁ | Ar₃ | L₁ | L₂ | L₃ | Ar₂ |
|---|---|---|---|---|---|---|
| NC136 | 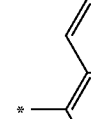 | — |  |  | 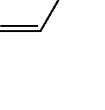 | 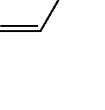 |
| NC137 | 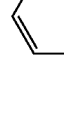 | — |  | 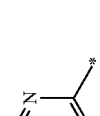 |  |  |
| NC138 | 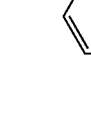 | — | — | 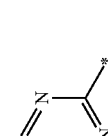 |  |  |
| NC139 | 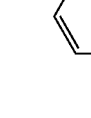 | — | 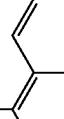 | 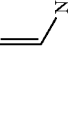 |  |  |
| NC140 | 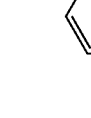 | — | — | 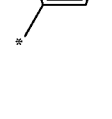 | — | 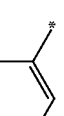 |

-continued

| | Ar₁ | Ar₃ | L₁ | L2 | L₃ | Ar₂ |
|---|---|---|---|---|---|---|
| NC141 | | — | | | | |
| NC142 | | | | | | |
| NC143 | | — | | | | |
| NC144 | | — | | | — | |
| NC145 | | — | — | | — | |

-continued

| | Ar₁ | Ar₃ | L₁ | L2 | L₃ | Ar₂ |
|---|---|---|---|---|---|---|
| NC146 | phenanthroline | — | — | anthracene | — | quinoline |
| NC147 | phenanthroline | — | — | anthracene | — | isoquinoline |
| NC148 | phenanthroline | — | phenylene | anthracene | phenylene | naphthyridine |
| NC149 | phenanthroline | — | phenylene | anthracene | thiophene | quinoline |
| NC150 | phenanthroline | — | naphthylene | anthracene | — | quinoline |

| | Ar₁ | Ar₃ | L₁ | L2 | L₃ | Ar₂ |
|---|---|---|---|---|---|---|
| NC151 | 2-(1,10-phenanthrolinyl) | — | dibenzothiophene | anthracene-9,10-diyl | — | phenyl |
| NC152 | 2-(1,10-phenanthrolinyl) | — | 1,4-phenylene | anthracene-9,10-diyl | 1,4-phenylene | 3-quinolinyl |
| NC153 | 2-(1,10-phenanthrolinyl) | — | dibenzothiophene | anthracene-9,10-diyl | — | 2-fluoropyrimidin-5-yl |
| NC154 | 2-(1,10-phenanthrolinyl) | — | dibenzothiophene | anthracene-9,10-diyl | — | 2-pyrimidinyl |
| NC155 | 2-(1,10-phenanthrolinyl) | — | 1,4-phenylene | anthracene-9,10-diyl | dibenzothiophene | 2-pyrimidinyl |

| | Ar$_1$ | Ar$_3$ | L$_1$ | L$_2$ | L$_3$ | Ar$_2$ |
|---|---|---|---|---|---|---|
| NC156 | | — | — | | | |
| NC157 | | — | — | | | |
| NC158 | | — | — | | | |
| NC159 | | — | | | — | |
| NC160 | | | | | | |

-continued
| | Ar₁ | Ar₃ | L₁ | L₂ | L₃ | Ar₂ |
|---|---|---|---|---|---|---|
| NC161 | 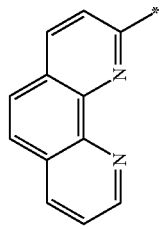 | — | — | 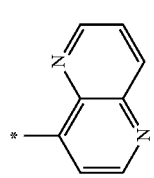 | — | 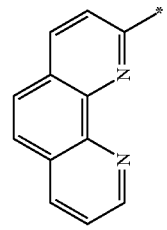 |
| NC162 | 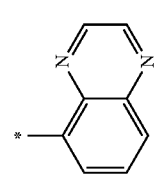 | — | 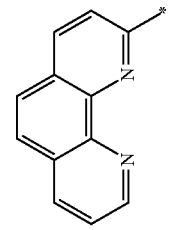 | 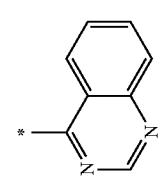 | — | 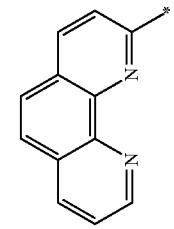 |
| NC163 | 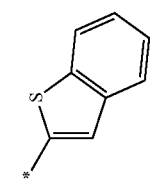 | — | — | 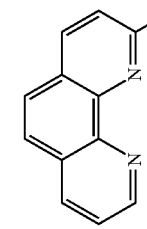 | — | 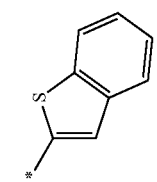 |
| NC164 | | — | | | | |
| NC165 | | — | | | | |

-continued
| | Ar₁ | Ar₃ | L₁ | L2 | L₃ | Ar₂ |
|---|---|---|---|---|---|---|
| NC166 | 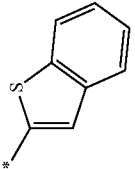 | 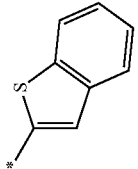 | — | 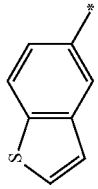 | 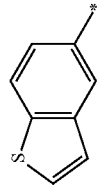 | 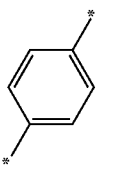 |
| NC167 |  | — | 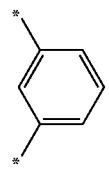 | 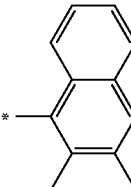 | — | 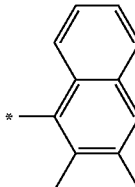 |
| NC168 | 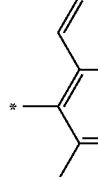 | — | 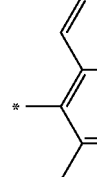 | 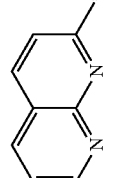 | — | 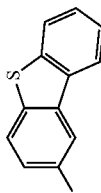 |
| NC169 | 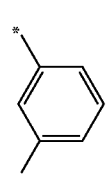 | | | | | |

| | Ar₁ | Ar₃ | L₁ | L2 | L₃ | Ar₂ |
|---|---|---|---|---|---|---|
| NC170 |  | — | 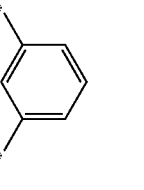 | 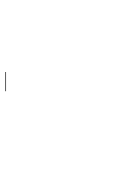 | — | 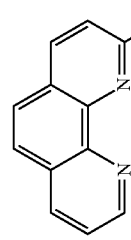 |
| NC171 | 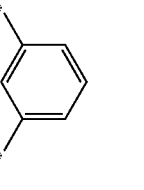 | — | — | 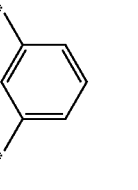 | — | 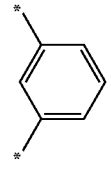 |
| NC172 | 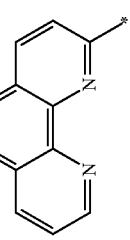 | — | 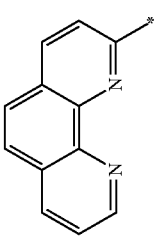 | 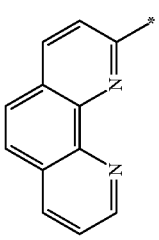 |  | — |
| NC173 | 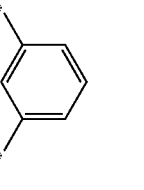 | — | — | 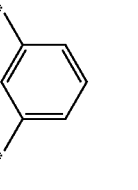 | — |  |
| NC174 |  | — | 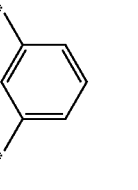 | 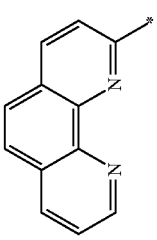 | — | — |

| | Ar₁ | Ar₃ | L₁ | L₂ | L₃ | Ar₂ |
|---|---|---|---|---|---|---|
| NC175 | 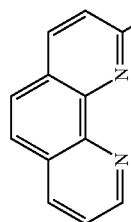 | — | 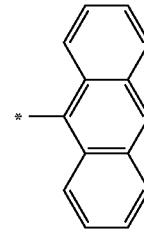 | 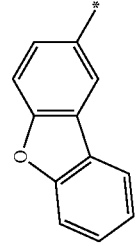 | — | 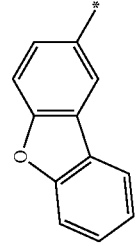 |
| NC176 | 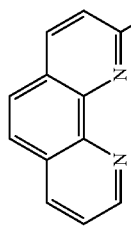 | — | — | 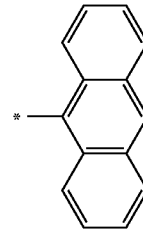 | — | 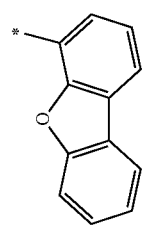 |
| NC177 | 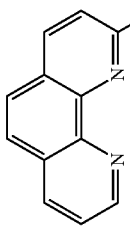 | — | 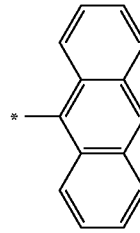 | 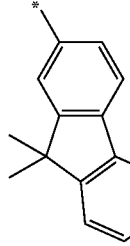 | — | 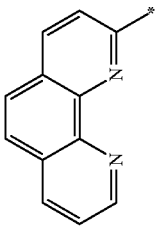 |
| NC178 | 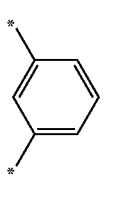 | — | — |  |  |  |

-continued

| | Ar₁ | Ar₃ | L₁ | L₂ | L₃ | Ar₂ |
|---|---|---|---|---|---|---|
| NC179 | 2-phenanthrolinyl | — | 1,4-phenylene | 9,10-anthracenyl | — | 9-phenyl-carbazol-3-yl |
| NC180 | 2-phenanthrolinyl | — | — | 9,10-anthracenyl | 1,4-phenylene | 9-(pyrimidin-2-yl)-carbazol-3-yl |
| NC181 | 2-phenanthrolinyl | — | 1,3-phenylene | 9,10-anthracenyl | — | 9-(pyridin-2-yl)-β-carbolin-3-yl |
| NC182 | 2-phenanthrolinyl | — | 1,4-phenylene | 9,10-anthracenyl | — | 9-(pyrimidin-2-yl)-β-carbolin-3-yl |

-continued
| | Ar₁ | Ar₃ | L₁ | L2 | L₃ | Ar₂ |
|---|---|---|---|---|---|---|
| NC183 | 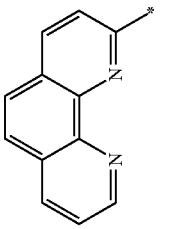 | — | 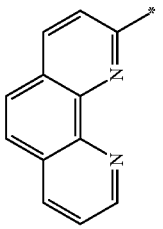 | 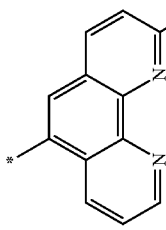 | — | 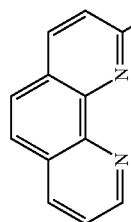 |
| NC184 | 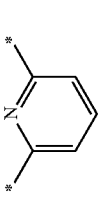 | — | 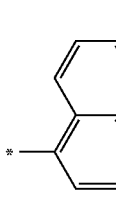 | 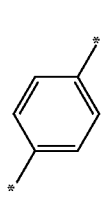 | 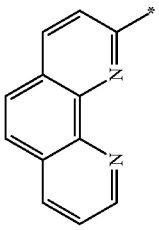 | 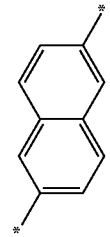 |
| NC185 | 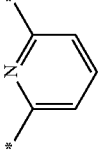 | 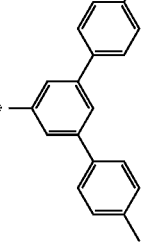 | 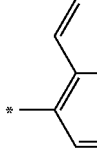 | 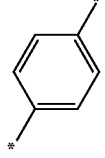 | — | 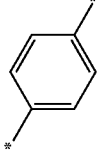 |
| NC186 | 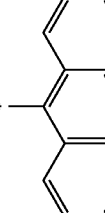 | — | 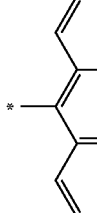 | 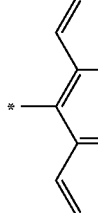 | — | 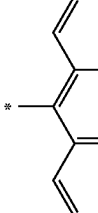 |
| NC187 | 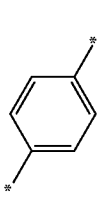 | — | 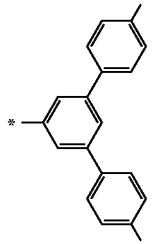 | 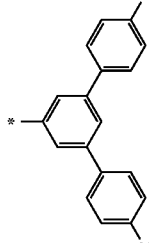 | — | 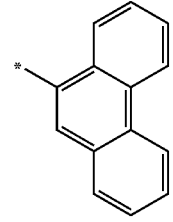 |

| | Ar₁ | Ar₃ | L₁ | L2 | L₃ | Ar₂ |
|---|---|---|---|---|---|---|
| NC188 | | — | | | | |
| NC189 | | — | | | — | |
| NC190 | | — | | | | |
| NC191 | | — | — | | | |

-continued

| | Ar₁ | Ar₃ | L₁ | L2 | L₃ | Ar₂ |
|---|---|---|---|---|---|---|
| NC192 | | — | — | | | |
| NC193 | | — | | | — | |
| NC194 | | — | | | — | |
| NC195 | | — | — | | — | |
| NC196 | | — | | | — | |

-continued
| | Ar₁ | Ar₃ | L₁ | L2 | L₃ | Ar₂ |
|---|---|---|---|---|---|---|
| NC197 |  | — | 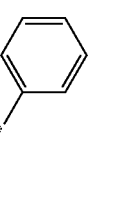 | 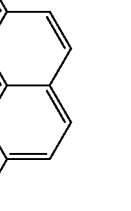 | — | 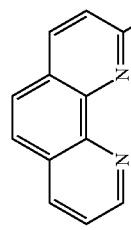 |
| NC198 | 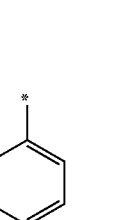 | — | — | 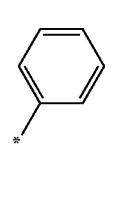 | — | 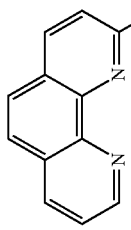 |
| NC199 | 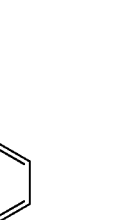 | — | — |  | 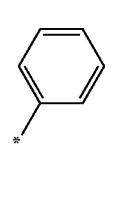 | 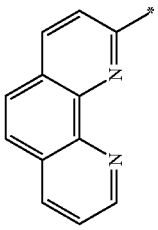 |
| NC200 |  | — | — |  | 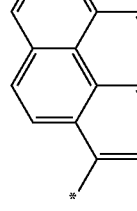 | 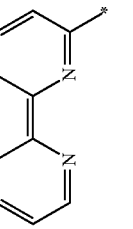 |
| NC201 | 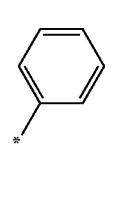 | — | 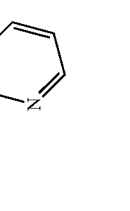 | 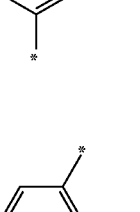 | — | 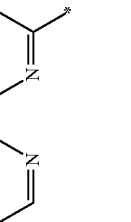 |

| | Ar₁ | Ar₃ | L₁ | L₂ | L₃ | Ar₂ |
|---|---|---|---|---|---|---|
| NC202 | 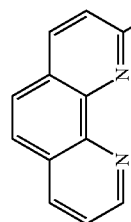 | — | 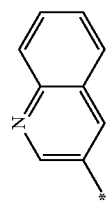 | 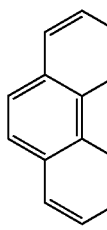 | — | 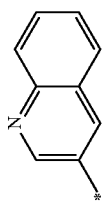 |
| NC203 | 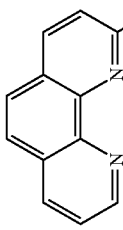 | — | 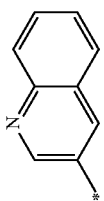 | 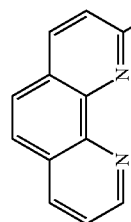 | 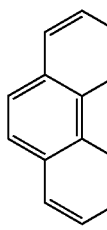 | 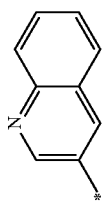 |
| NC204 | 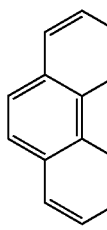 | — | 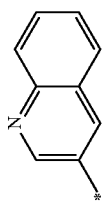 | 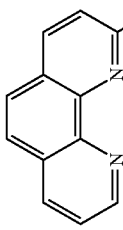 | 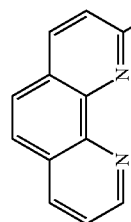 | 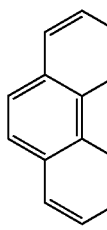 |
| NC205 | 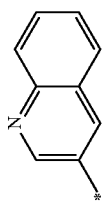 | — | 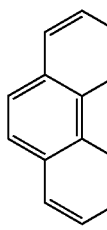 | 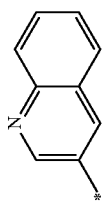 | 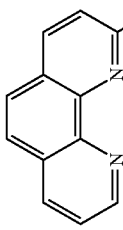 | 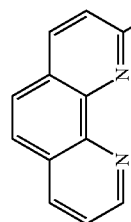 |
| NC206 | 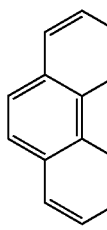 | — | 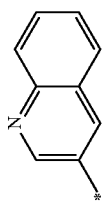 | 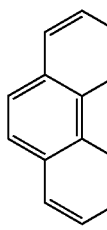 | 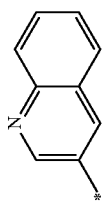 | 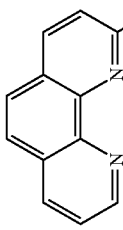 |

| | Ar₁ | Ar₃ | L₁ | L2 | L₃ | Ar₂ |
|---|---|---|---|---|---|---|
| NC207 | 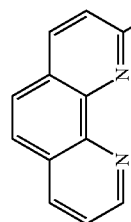 | — | 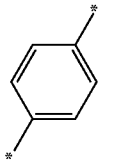 |  | — | 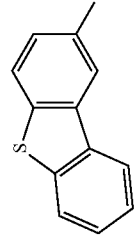 |
| NC208 | 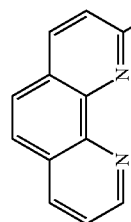 | — | 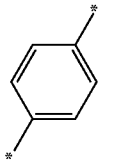 |  | — | 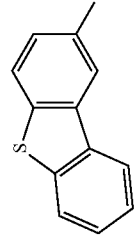 |
| NC209 | 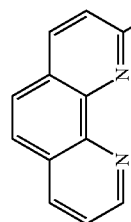 | 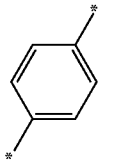 |  | 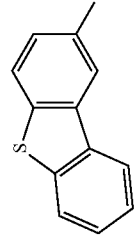 | — | — |
| NC210 | 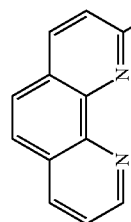 | 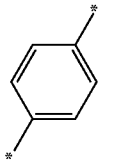 |  | 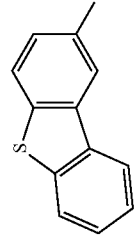 | — | — |
| NC211 | 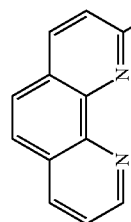 | 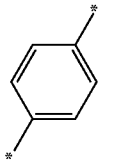 |  | 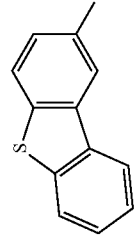 | — | — |

-continued

| | Ar₁ | Ar₃ | L₁ | L₂ | L₃ | Ar₂ |
|---|---|---|---|---|---|---|
| NC212 | phenanthroline | phenyl | naphthalene | pyrene | — | — |
| NC213 | phenanthroline | — | naphthyridine | pyrene | — | — |
| NC214 | phenanthroline | — | naphthalene | pyrene | — | — |
| NC215 | phenanthroline | — | dibenzothiophene | pyrene | — | — |
| NC216 | phenanthroline | — | phenylene | pyrene | — | — |

-continued
| | Ar$_1$ | Ar$_3$ | L$_1$ | L$_2$ | L$_3$ | Ar$_2$ |
|---|---|---|---|---|---|---|
| NC217 | 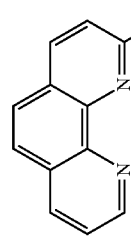 | — | 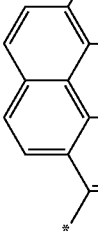 | 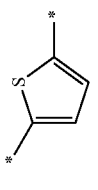 | — | — |
| NC218 | 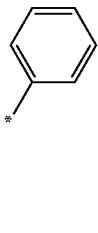 | — | 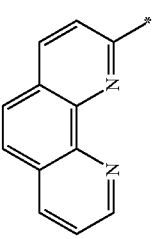 | 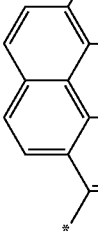 | 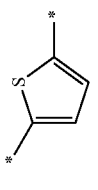 | 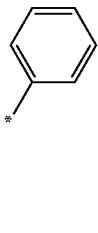 |
| NC219 | 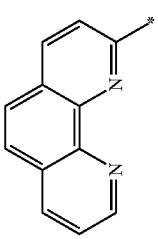 | — | 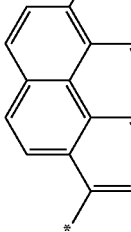 | 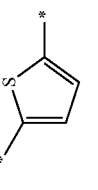 | 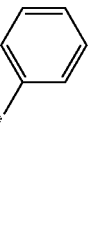 | 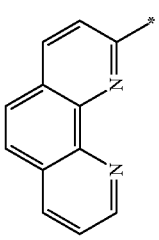 |
| NC220 | 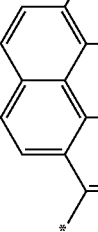 | — | — | 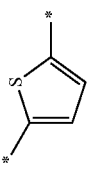 | 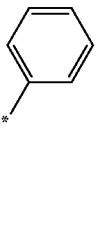 | — |

-continued
| | Ar₁ | Ar₃ | L₁ | L2 | L₃ | Ar₂ |
|---|---|---|---|---|---|---|
| NC221 | 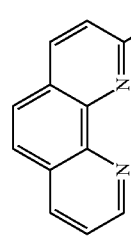 | — | 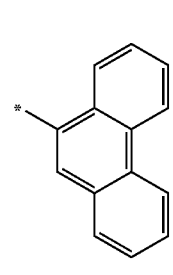 | — | 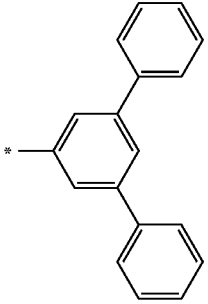 | 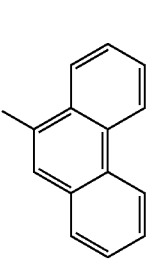 |
| NC222 | 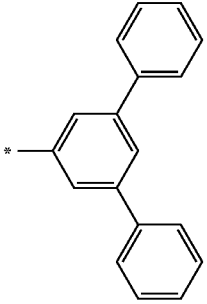 | — | 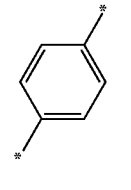 | — | 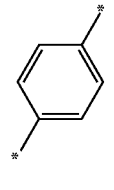 | 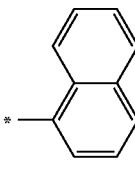 |
| NC223 | 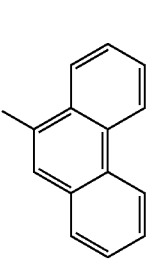 | — | 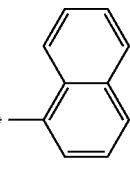 | — | — | 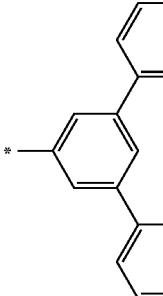 |
| NC224 | | — | | — | — | |

-continued
| | Ar₁ | Ar₃ | L₁ | L2 | L₃ | Ar₂ |
|---|---|---|---|---|---|---|
| NC225 | 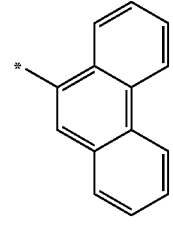 | — | 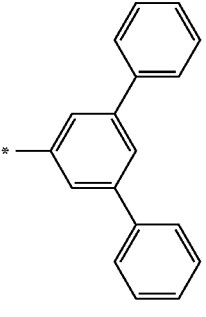 | — | 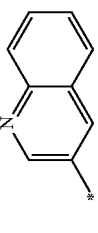 | 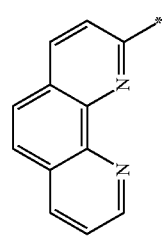 |
| NC226 | 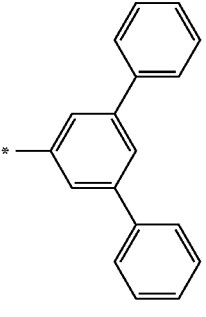 | — | 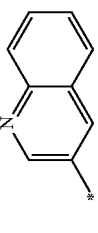 | — | 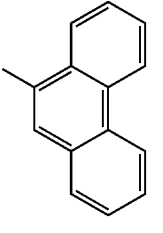 | 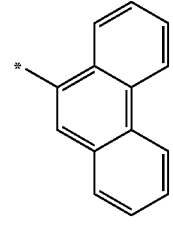 |
| NC227 | 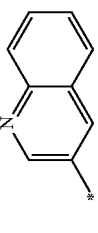 | — | 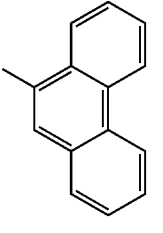 | — | 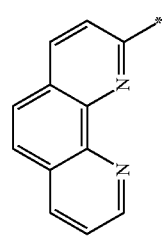 | 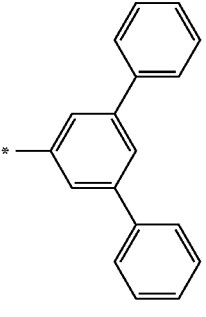 |
| NC228 | 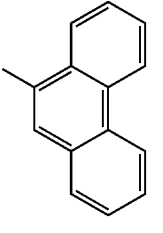 | — | 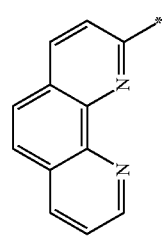 | — | 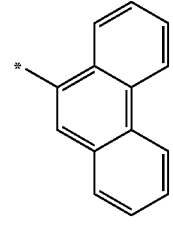 | 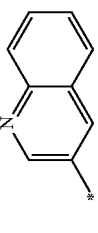 |

| | $Ar_1$ | $Ar_3$ | $L_1$ | L2 | $L_3$ | $Ar_2$ |
|---|---|---|---|---|---|---|
| NC229 | 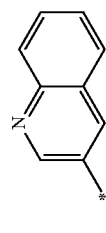 | — | 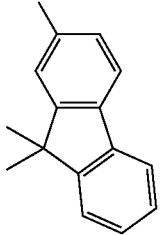 | — | 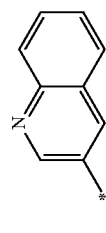 | 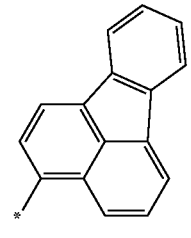 |
| NC230 | 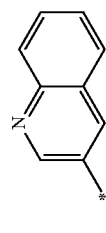 | — | 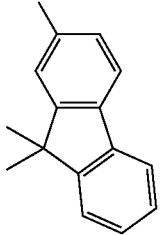 | — | — | 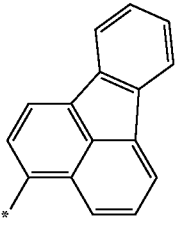 |
| NC231 | 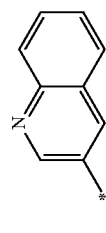 | — | 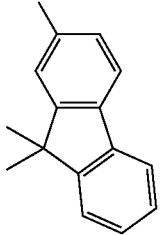 | — | — | 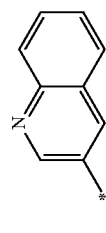 |
| NC232 | 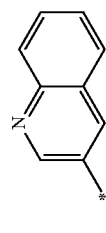 | — | 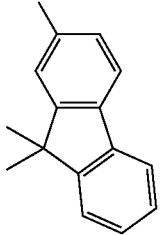 | — | 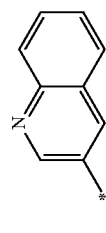 | 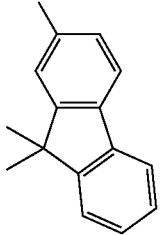 |

5. The organic light emitting display device of claim 1, wherein the compound represented by Formula 1 is one of the following compounds:
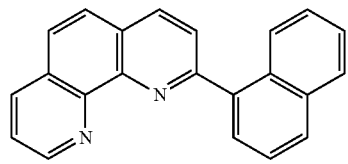 NC01
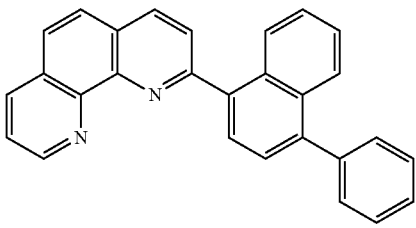 NC02
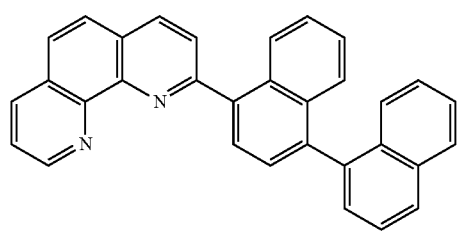 NC03
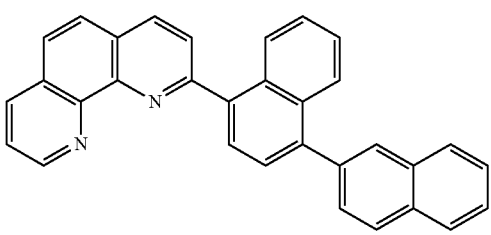 NC04
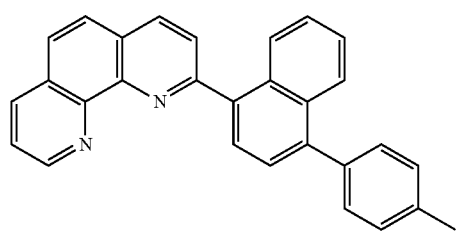 NC05
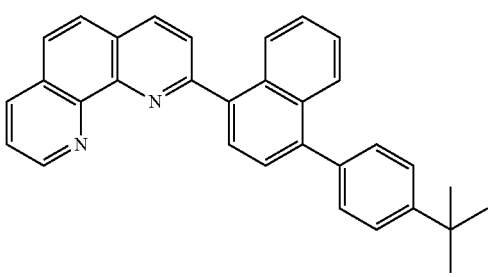 NC06
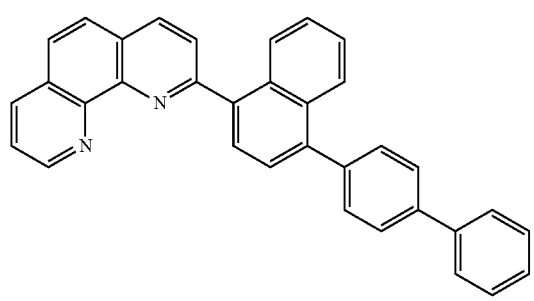 NC07
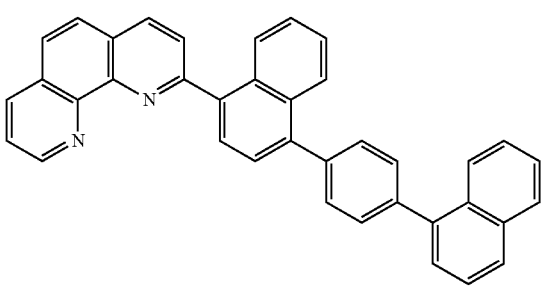 NC08
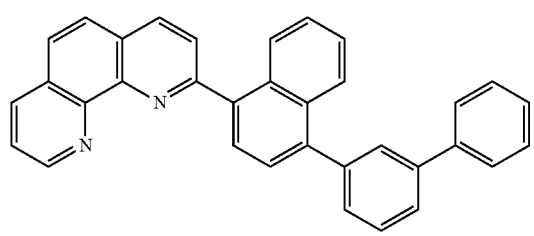 NC09
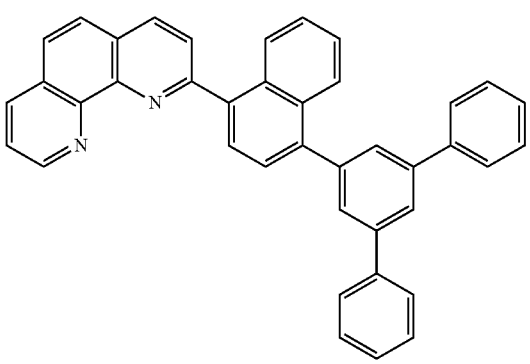 NC10

-continued
NC11
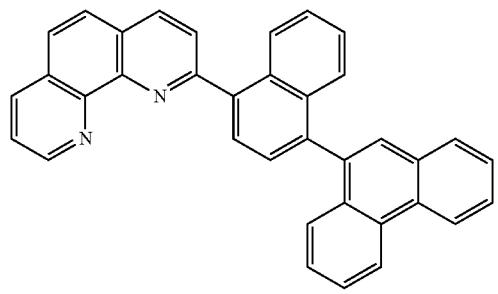
NC12
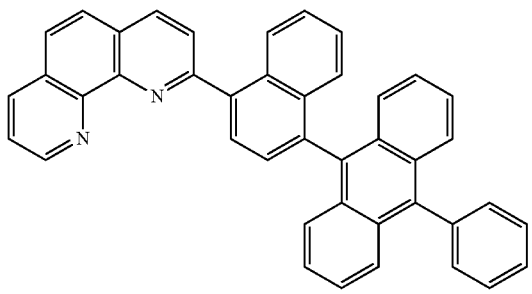
NC13
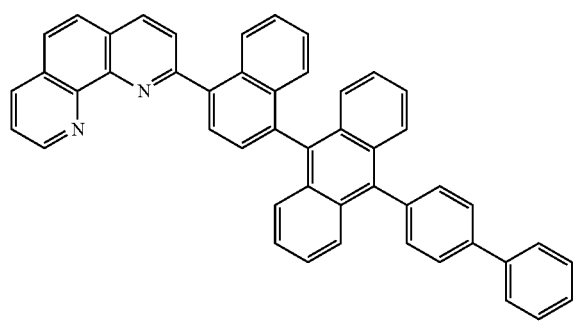
NC14
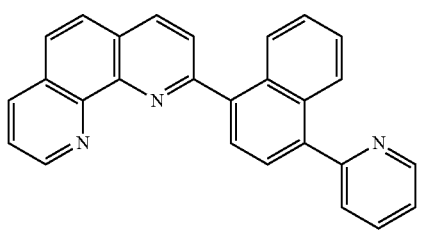
NC15
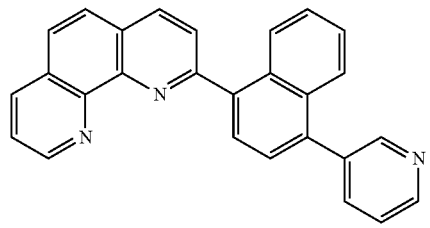
NC16
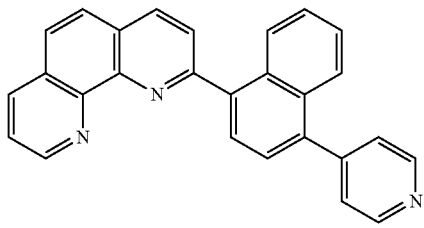
NC19
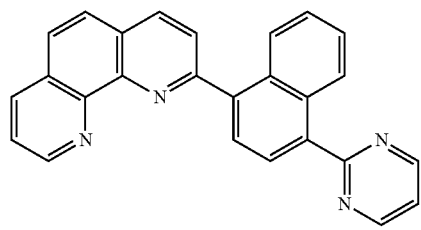
NC20
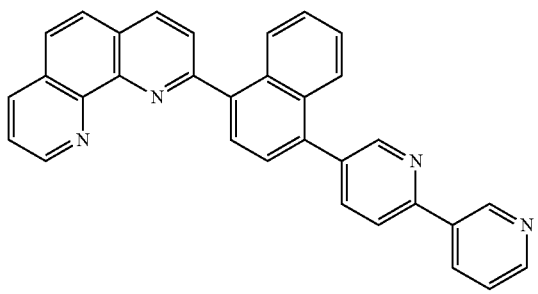
NC21
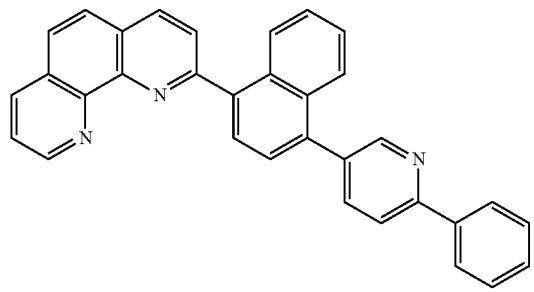
NC22
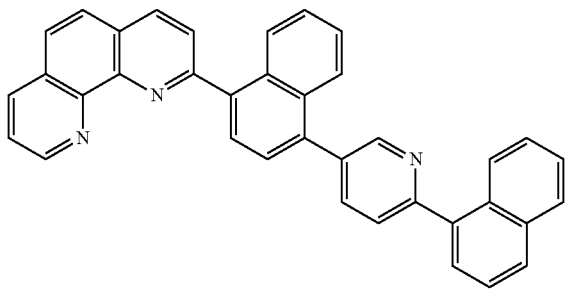

-continued
NC23
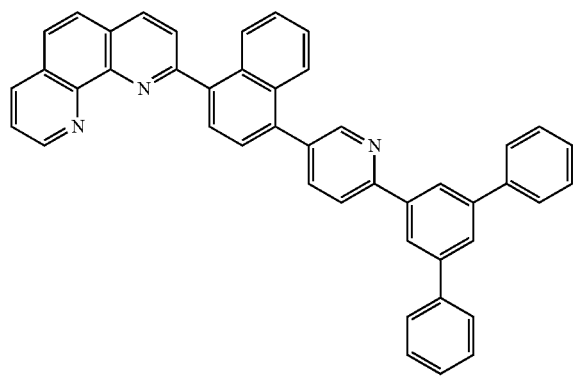
NC24
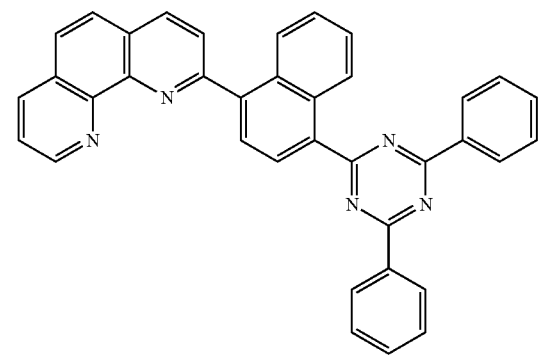
NC25
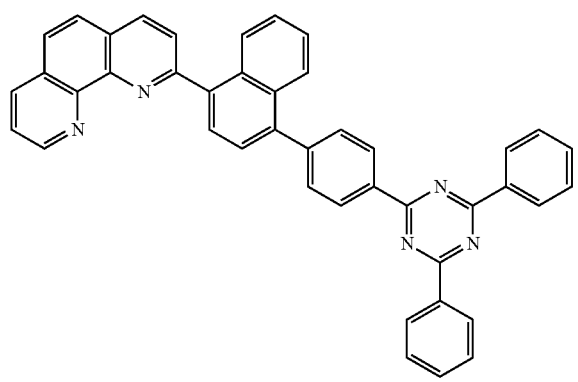
NC26
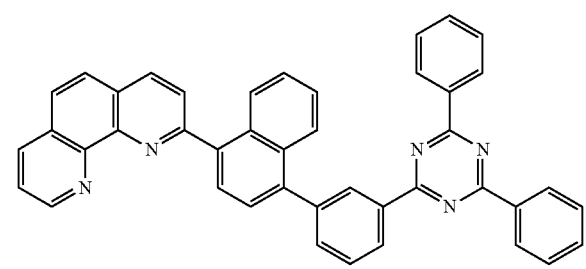
NC27
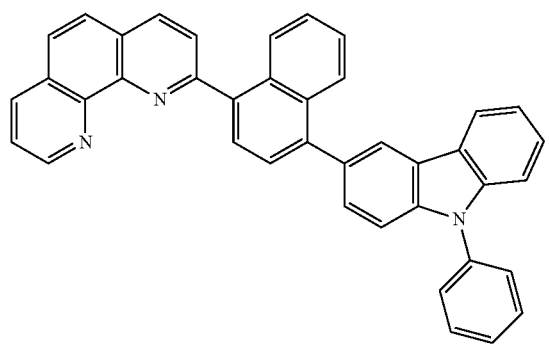
NC28
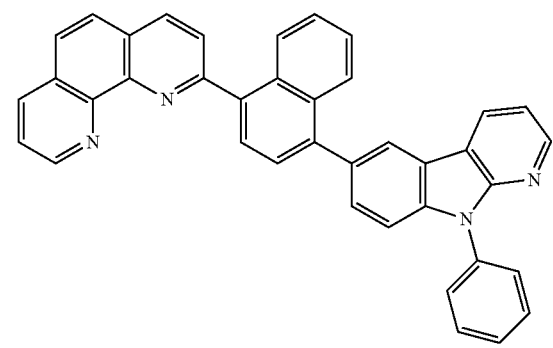
NC29
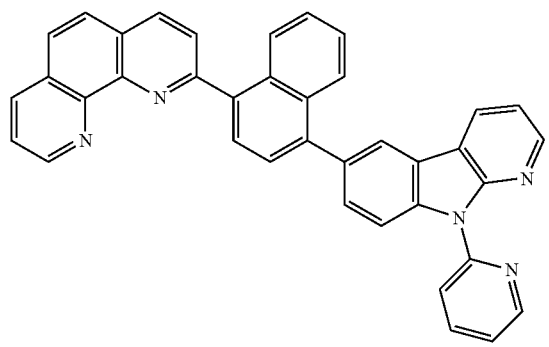
NC30
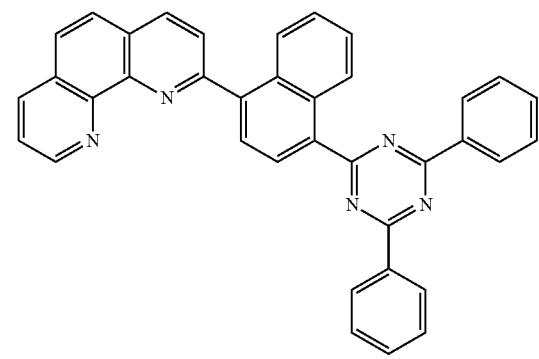

-continued
NC31
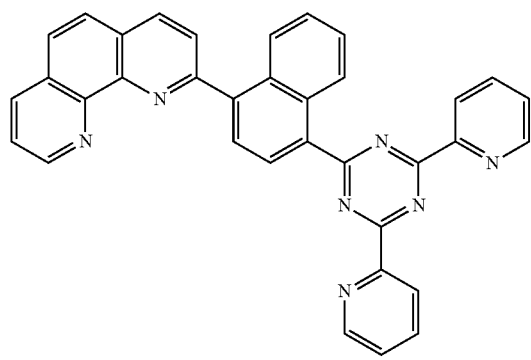
NC32
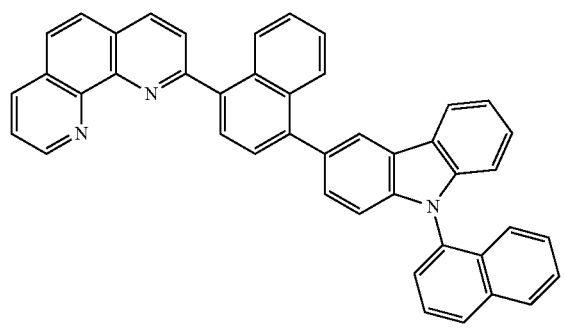
NC33
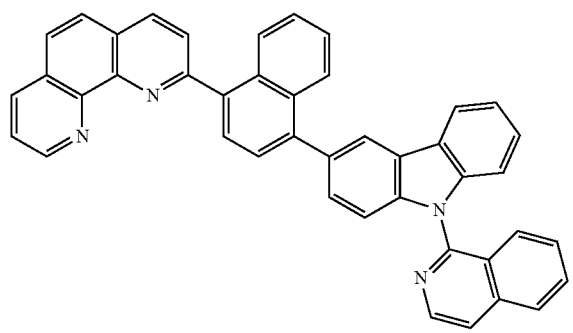
NC34
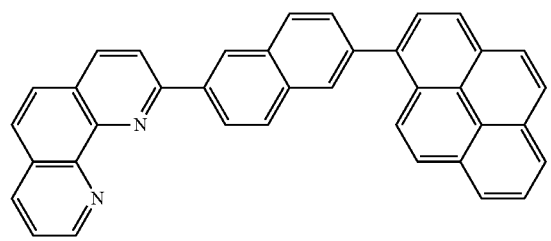
NC35
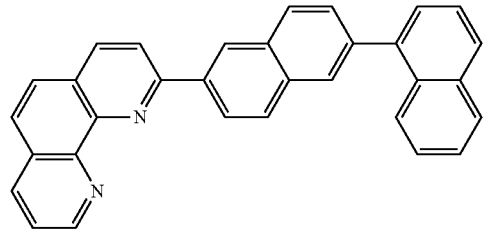
NC36
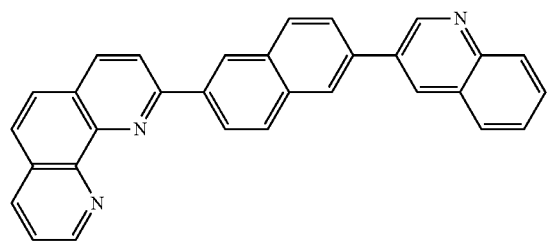
NC37
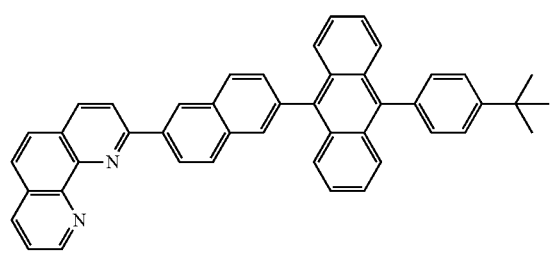
NC38
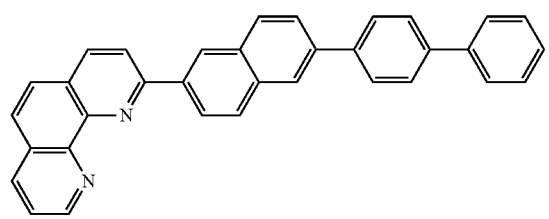
NC39
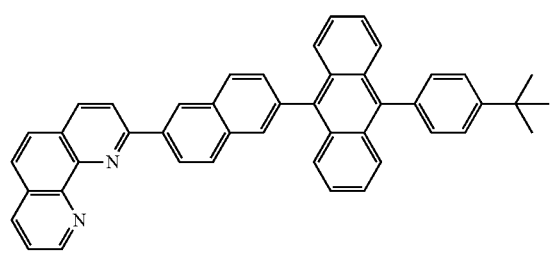
NC40
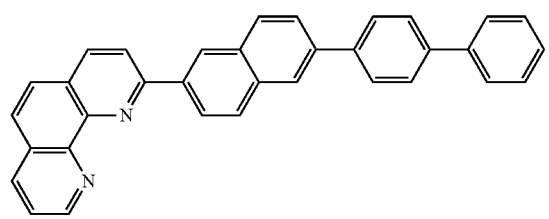

-continued
NC41
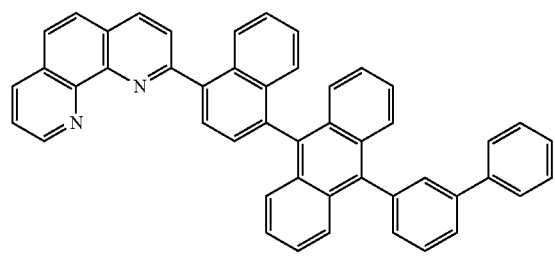
NC42
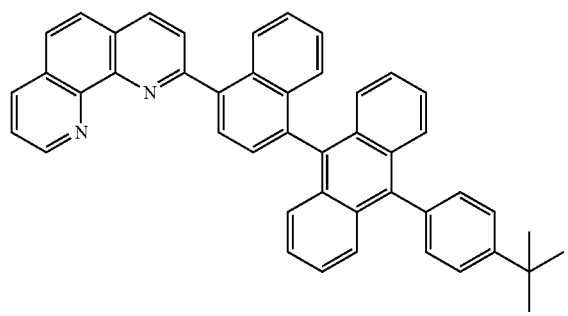
NC43
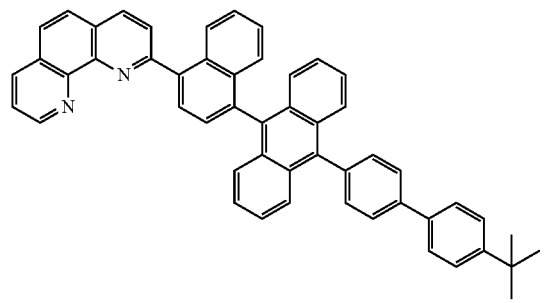
NC44
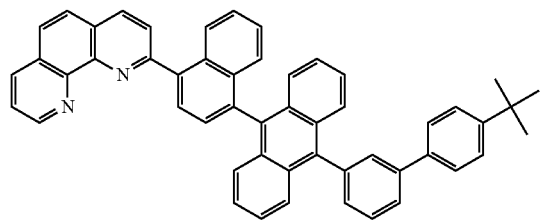
NC45
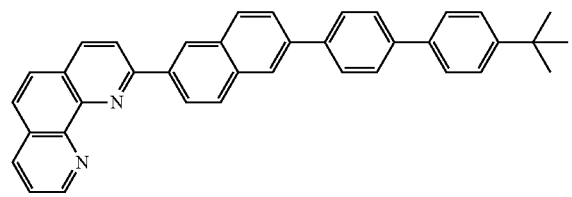
NC46
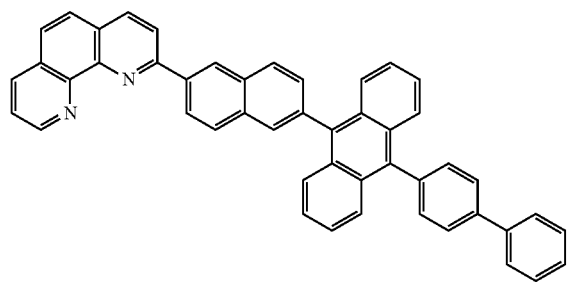
NC47
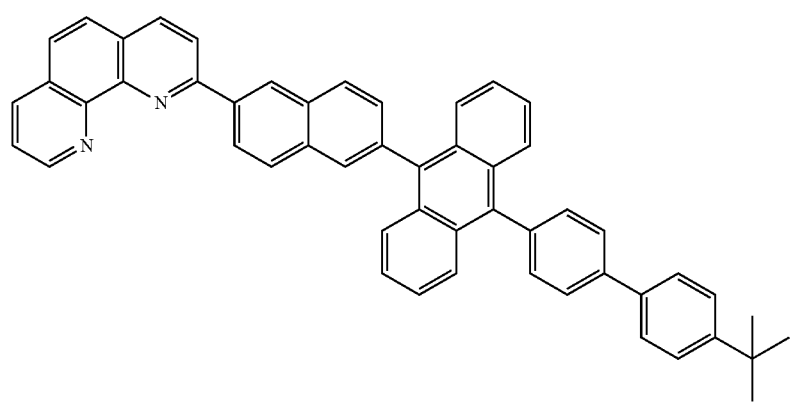

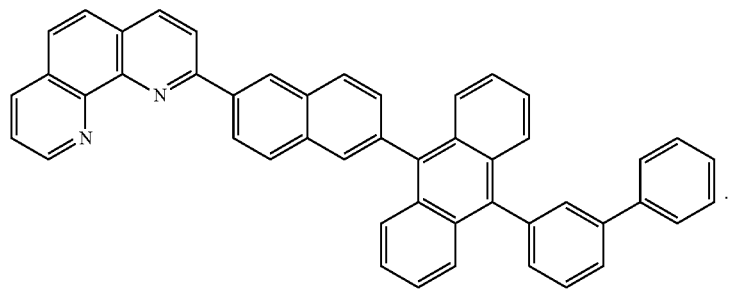
NC48
6. The organic light emitting display device of claim 1 wherein the electron transport layer includes one of the following compounds:
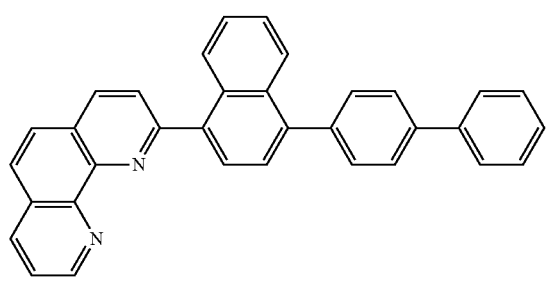
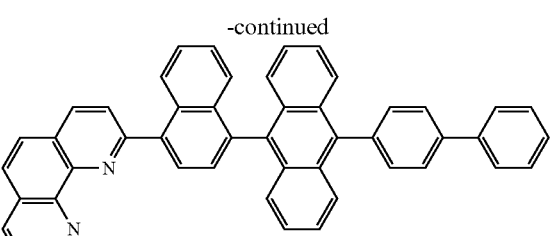
-continued
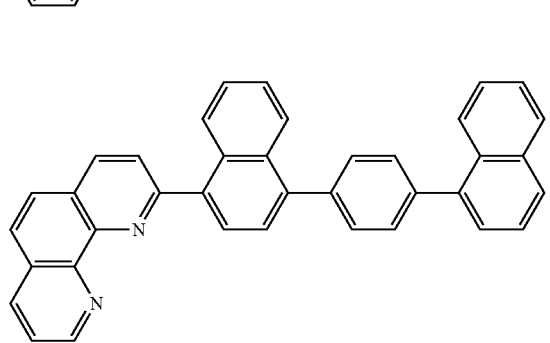
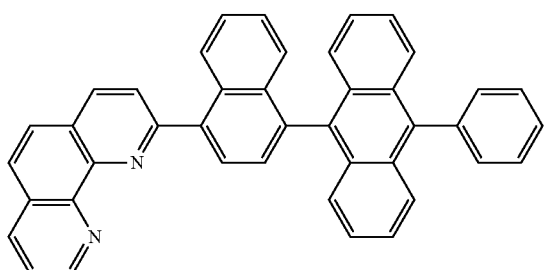
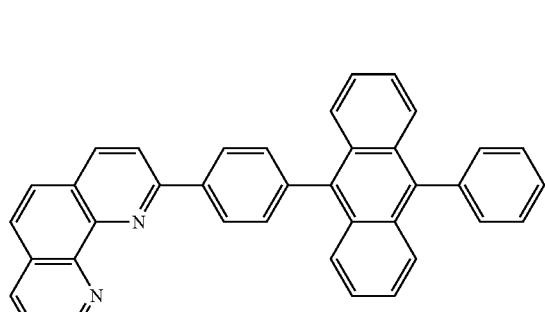
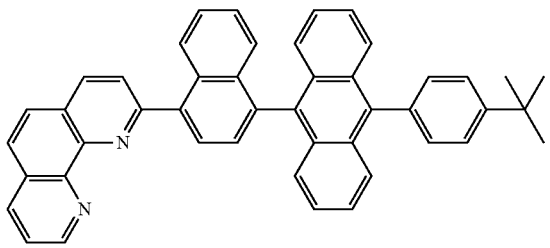
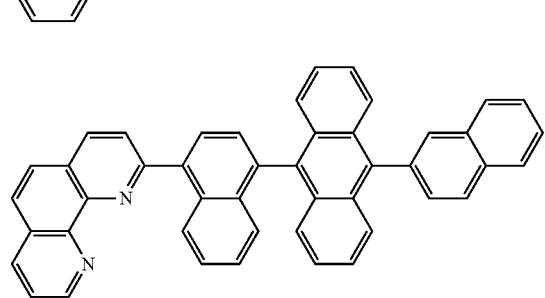
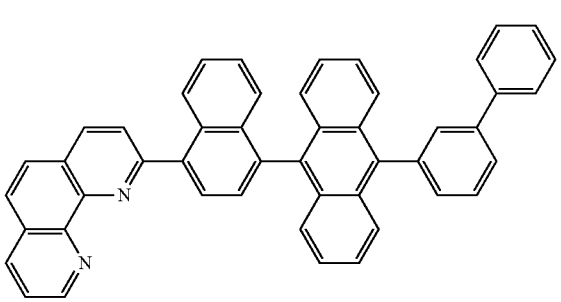

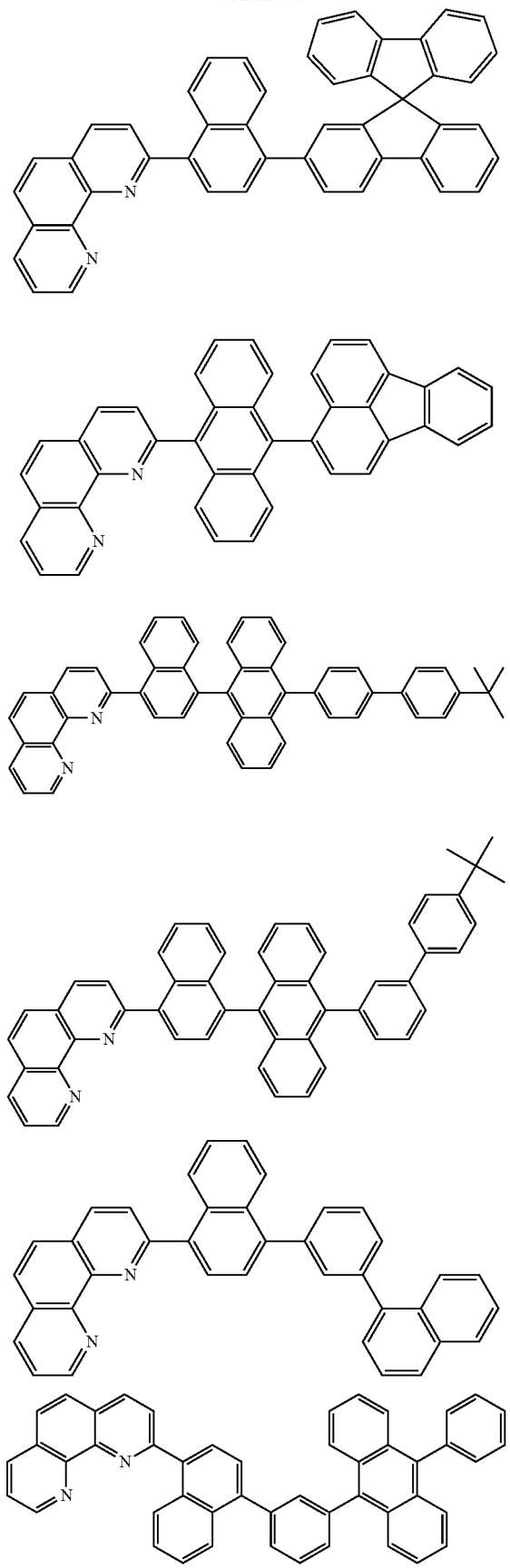
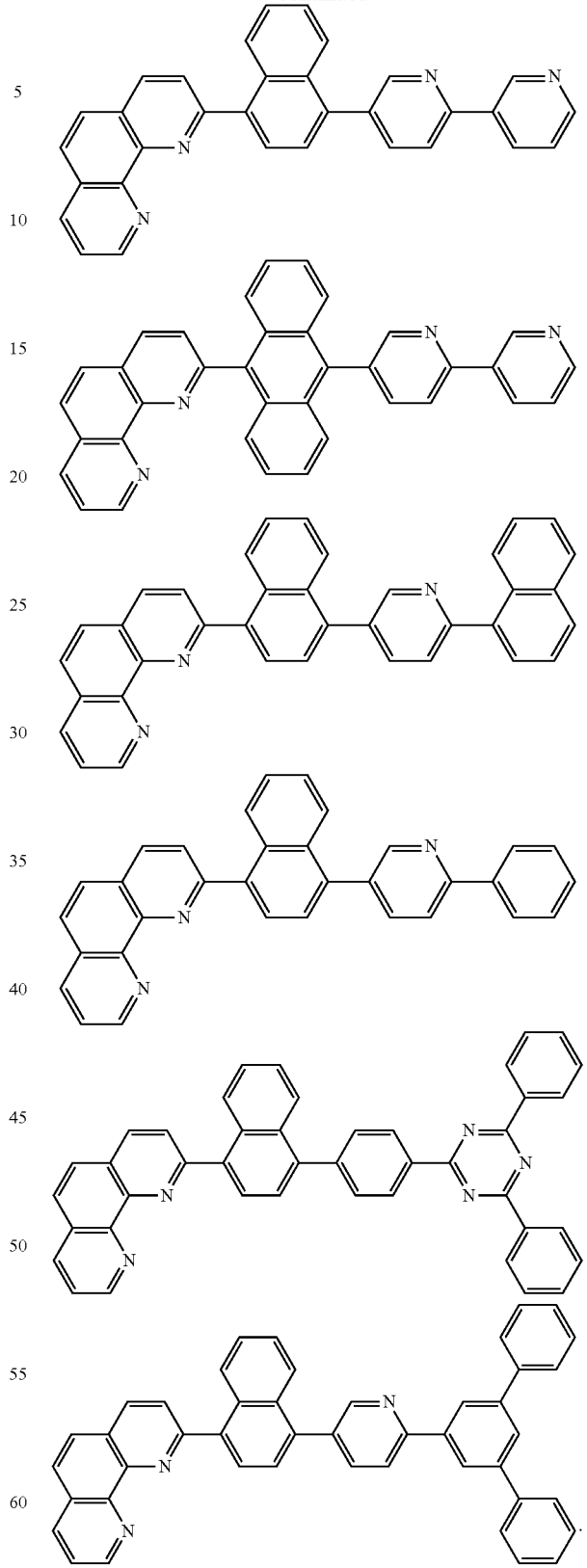
7. The organic light emitting display device of claim 1, wherein the charge generation layer includes one of the following compounds:

217
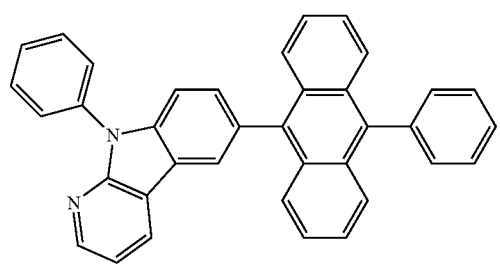
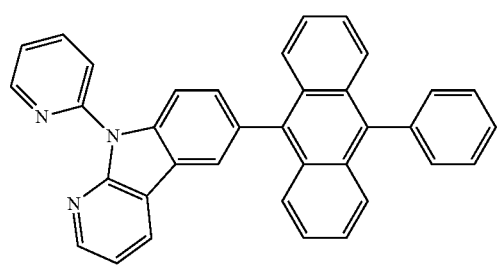
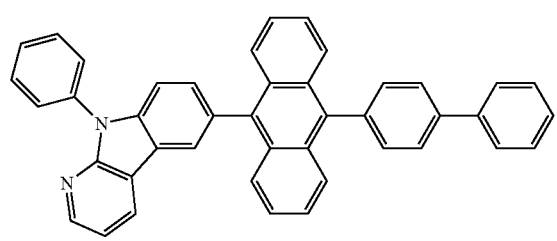
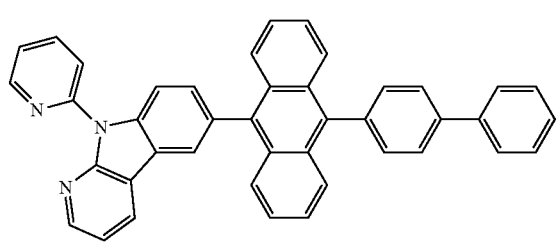
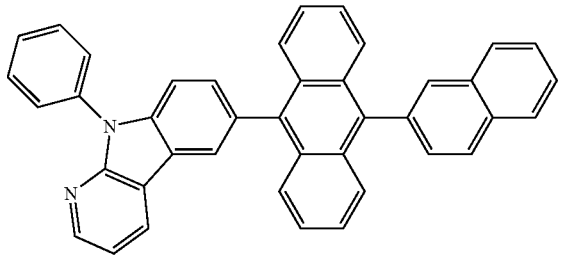
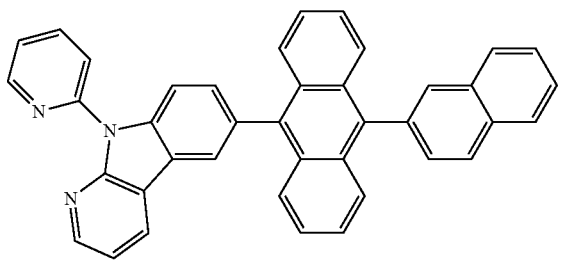
218
-continued
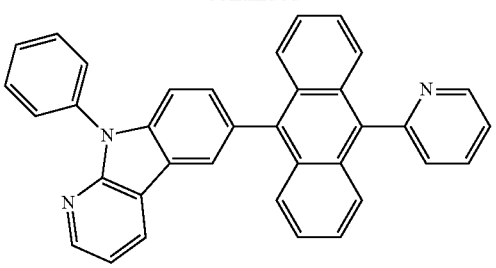
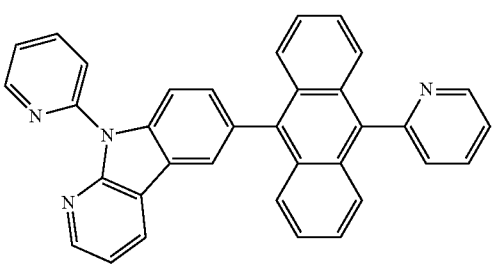
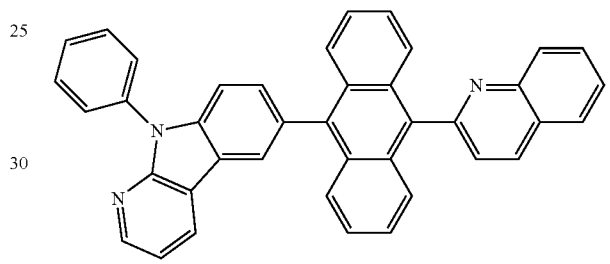
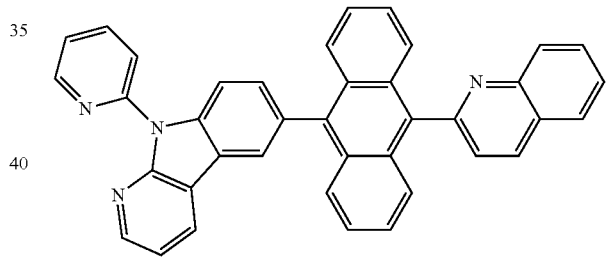
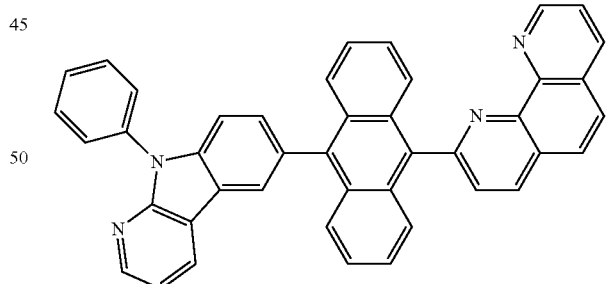
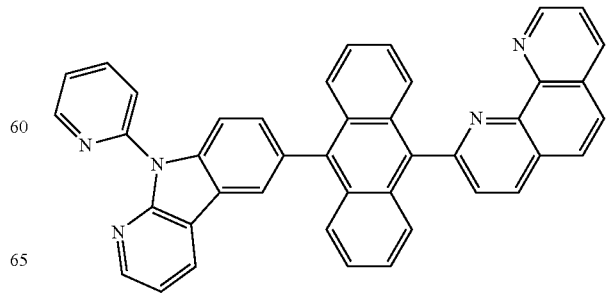

219
-continued
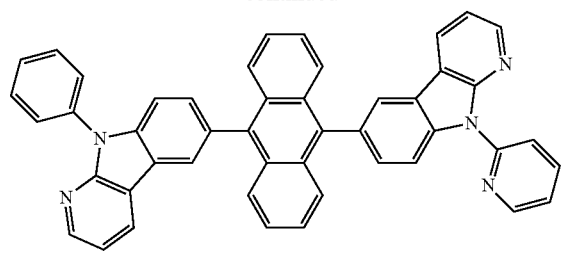
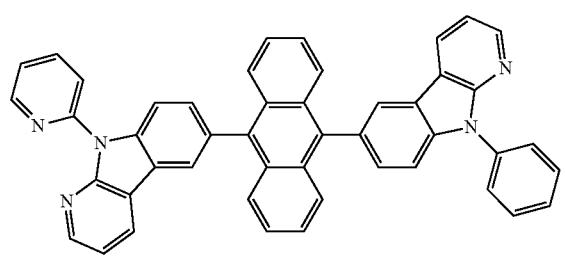
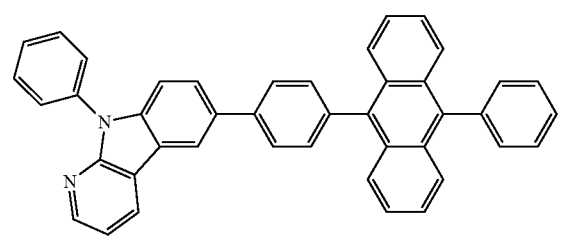
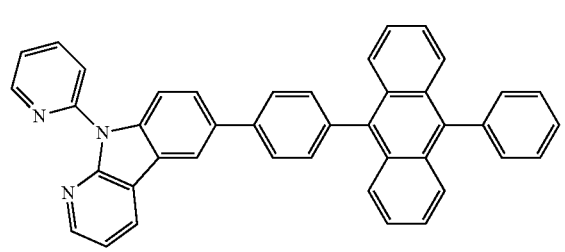
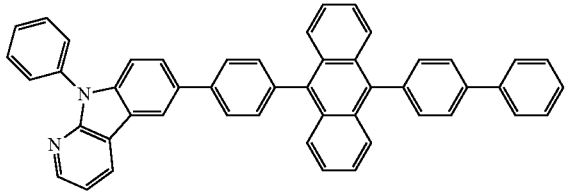
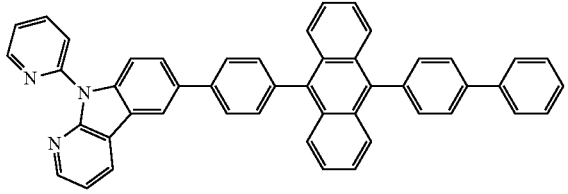
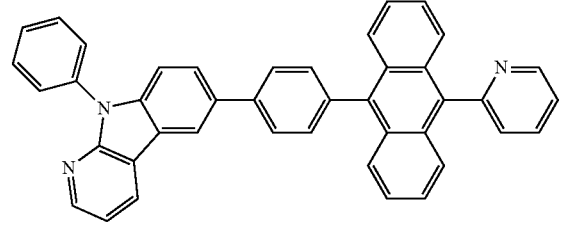
220
-continued
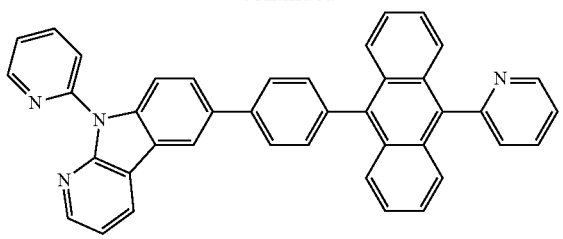
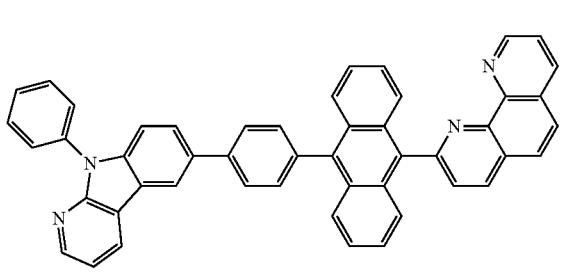
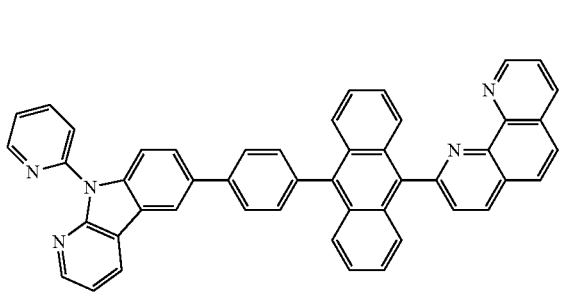
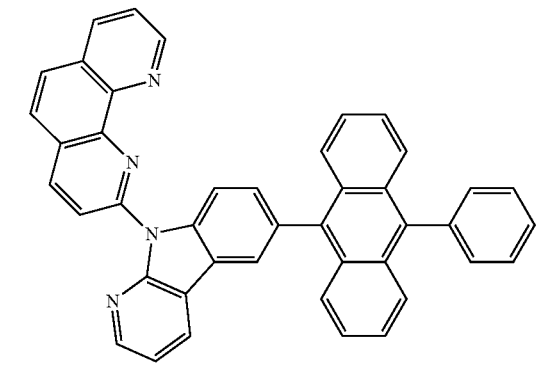
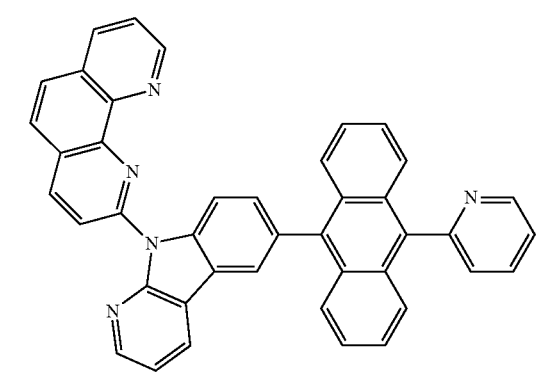

221
-continued
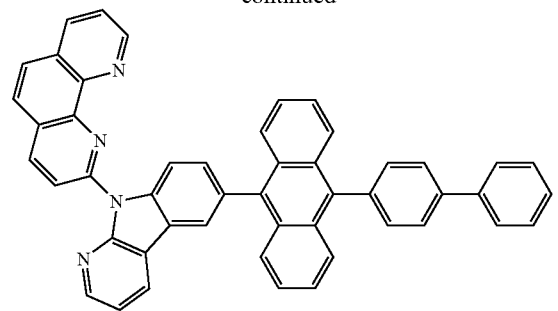
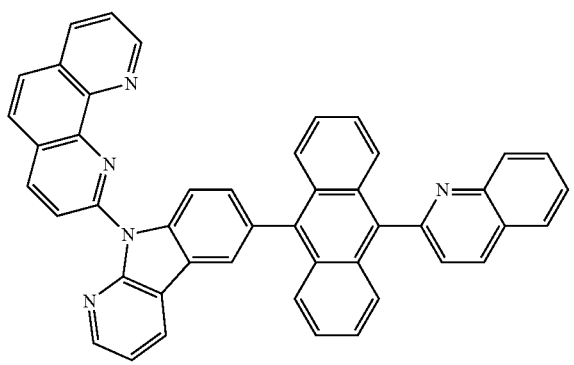
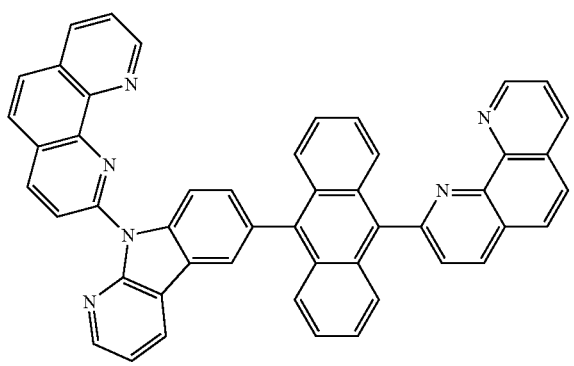
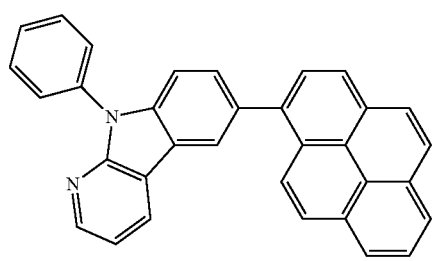
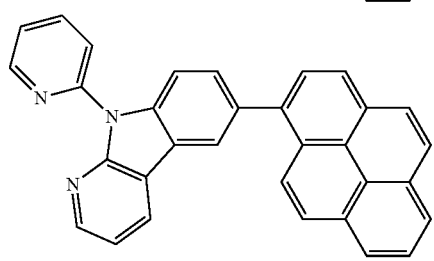
222
-continued
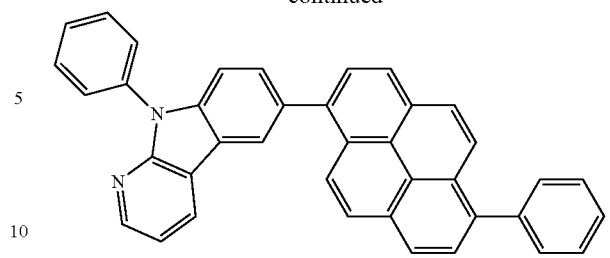
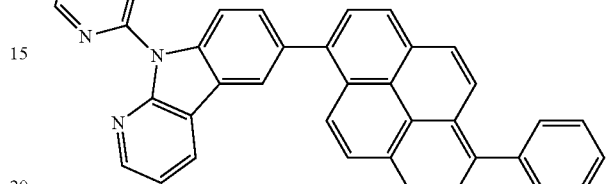
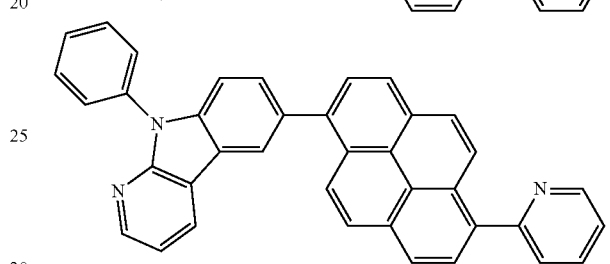
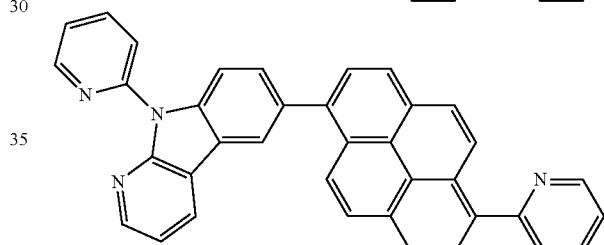
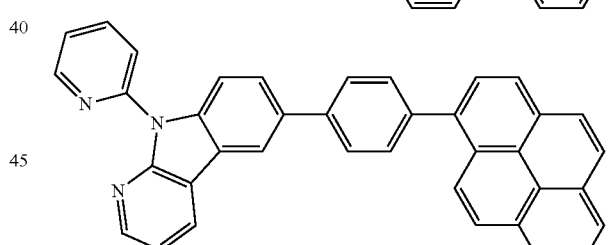
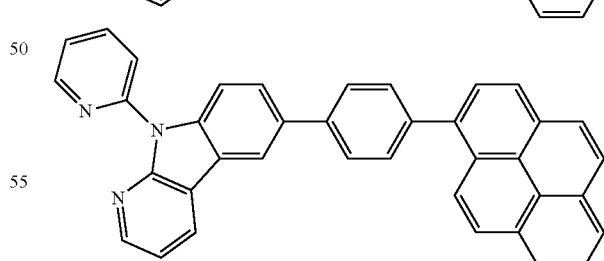
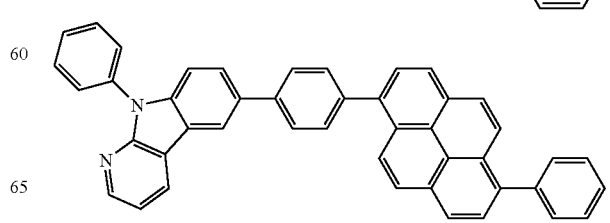

223
-continued
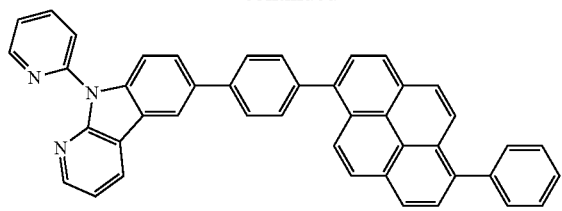
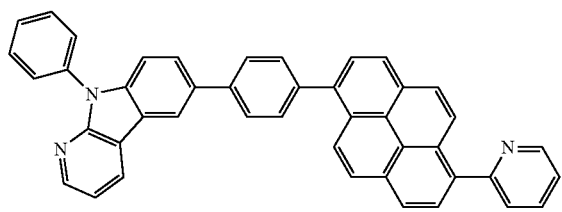
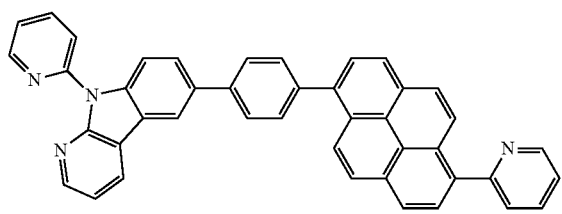
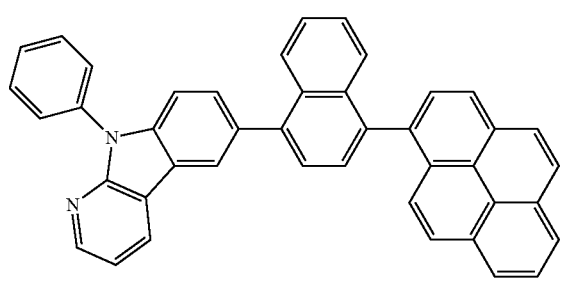
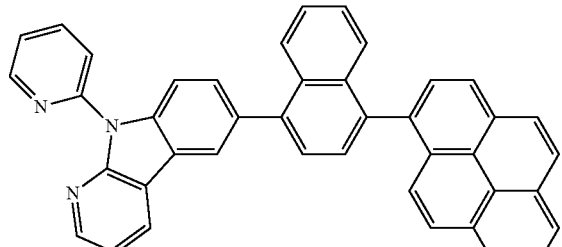
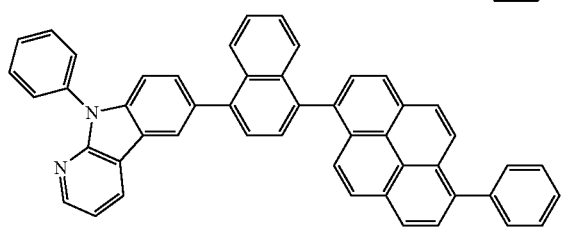
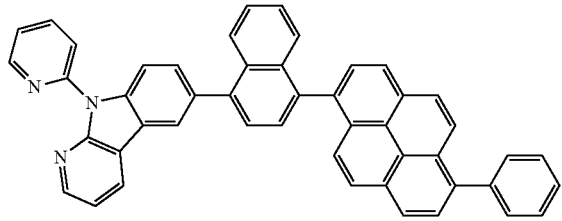
224
-continued
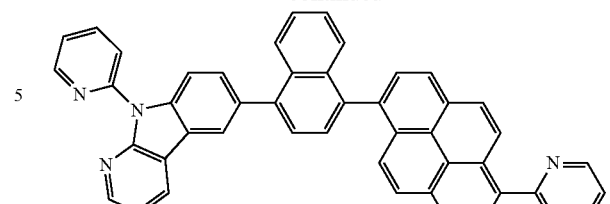
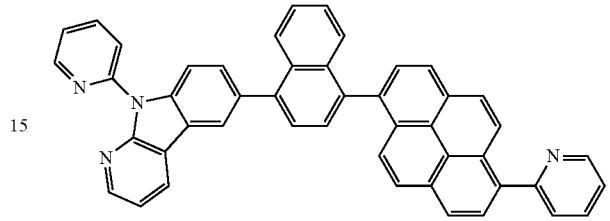
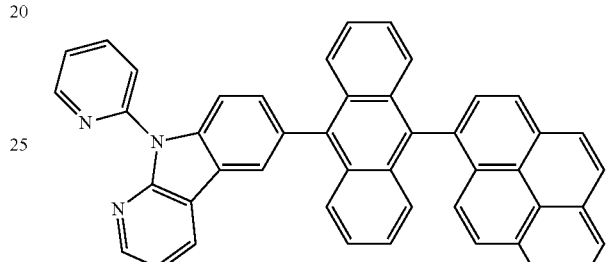
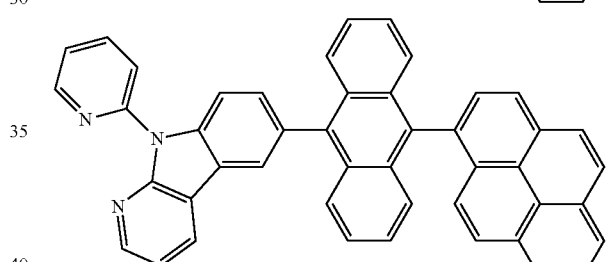
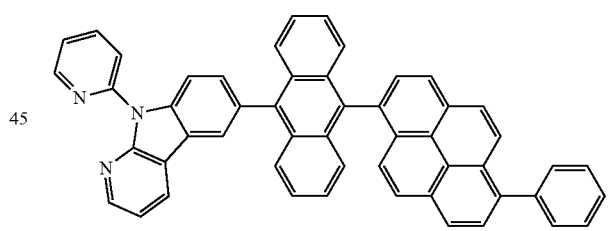
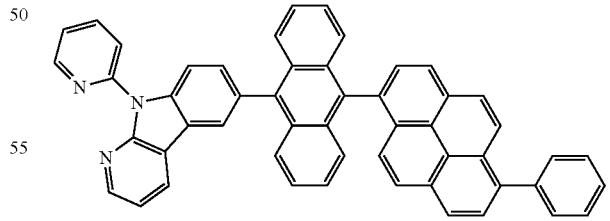
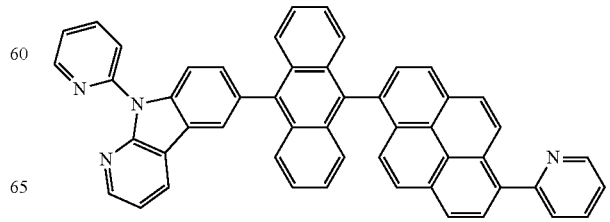

-continued

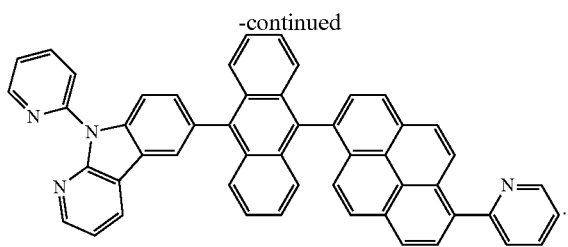

8. The organic light emitting display device of claim 1, wherein the N-type charge generation layer includes the compound.

9. The organic light emitting display device of claim 1, further comprising:
   a third light emitting part on the at least two light emitting parts, the third light emitting part having a third light emitting layer and a third electron transport layer; and
   a second charge generation layer between the at least two light emitting parts and the third light emitting part,
   wherein at least one among the charge generation layer, the electron transport layer, the third electron transport layer, and the second charge generation layer includes the compound.

10. The organic light emitting display device of claim 9, wherein the second charge generation layer includes a second N-type charge generation layer and a second P-type generation layer, and the N-type generation layer includes the compound.

11. The organic light emitting display device of claim 9, wherein the third light emitting part includes a blue light emitting part.

* * * * *